United States Patent [19]
Saitoh et al.

[11] Patent Number: 4,705,734
[45] Date of Patent: Nov. 10, 1987

[54] MEMBER HAVING SUBSTRATE WITH IRREGULAR SURFACE AND LIGHT RECEIVING LAYER OF AMORPHOUS SILICON

[75] Inventors: Keishi Saitoh, Ibaraki; Tetsuo Sueda, Chofu; Kyosuke Ogawa, Tokyo; Teruo Misumi, Kawasaki; Yoshio Tsuezuki, Toride; Masahiro Kanai, Tokyo, all of Japan

[73] Assignee: Canon Kabushiki Kaisha, Tokyo, Japan

[21] Appl. No.: 740,714

[22] Filed: Jun. 30, 1985

[30] Foreign Application Priority Data

| Jun. 5, 1984 | [JP] | Japan | 59-113851 |
| Jun. 6, 1984 | [JP] | Japan | 59-115749 |
| Jun. 7, 1984 | [JP] | Japan | 59-115604 |
| Jun. 9, 1984 | [JP] | Japan | 59-117459 |
| Jun. 11, 1984 | [JP] | Japan | 59-118097 |
| Jun. 12, 1984 | [JP] | Japan | 59-119092 |
| Jun. 13, 1984 | [JP] | Japan | 59-119750 |
| Jun. 15, 1984 | [JP] | Japan | 59-122071 |
| Jun. 18, 1984 | [JP] | Japan | 59-123855 |
| Nov. 1, 1984 | [JP] | Japan | 59-228993 |
| Nov. 2, 1984 | [JP] | Japan | 59-230356 |
| Nov. 5, 1984 | [JP] | Japan | 59-231245 |
| Nov. 6, 1984 | [JP] | Japan | 59-232358 |
| Nov. 7, 1984 | [JP] | Japan | 59-233281 |
| Nov. 8, 1984 | [JP] | Japan | 59-234112 |

[51] Int. Cl.$^4$ ............................................. G03G 5/085
[52] U.S. Cl. ........................................ 430/57; 430/69; 430/84
[58] Field of Search .............. 430/56, 57, 58, 65, 430/69, 84, 126

[56] References Cited

U.S. PATENT DOCUMENTS

| 4,359,514 | 11/1982 | Shirnizu et al. | 430/65 |
| 4,492,745 | 1/1985 | Mimura et al. | 430/67 |
| 4,514,483 | 4/1985 | Matsuura et al. | 430/84 |
| 4,592,981 | 6/1986 | Saitoh et al. | 430/69 |
| 4,592,983 | 6/1986 | Saitoh et al. | 430/69 |
| 4,595,644 | 6/1986 | Saitoh et al. | 430/69 |
| 4,600,671 | 7/1986 | Saitoh et al. | 430/69 |

FOREIGN PATENT DOCUMENTS

| 2733187 | 1/1978 | Fed. Rep. of Germany | 430/65 |
| 56-150754 | 11/1981 | Japan | 430/65 |
| 60-31144 | 2/1985 | Japan | 430/69 |

Primary Examiner—John L. Goodrow
Attorney, Agent, or Firm—Fitzpatrick, Cella, Harper & Scinto

[57] ABSTRACT

A light-receiving member comprises a substrate having a large number of protruding portions on a surface thereof, each of said protruding portions having at a predetermined cut position a sectional shape comprising a main projection and a subprojection, the main projection and the subprojection overlapping each other, and a light-receiving layer comprising a layer comprising an amorphous material containing silicon atoms, at least a part of the layer region of which has photosensitivity and a surface layer comprising an amorphous material containing silicon atoms and carbon atoms.

81 Claims, 85 Drawing Figures

FIG. 6
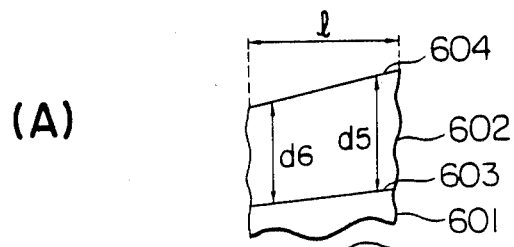
(A)
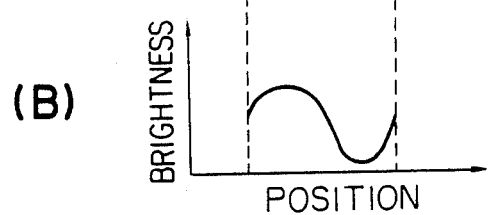
(B)
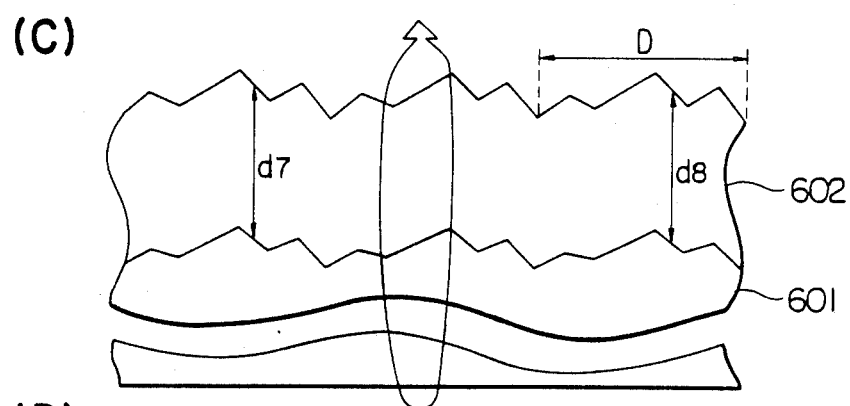
(C)
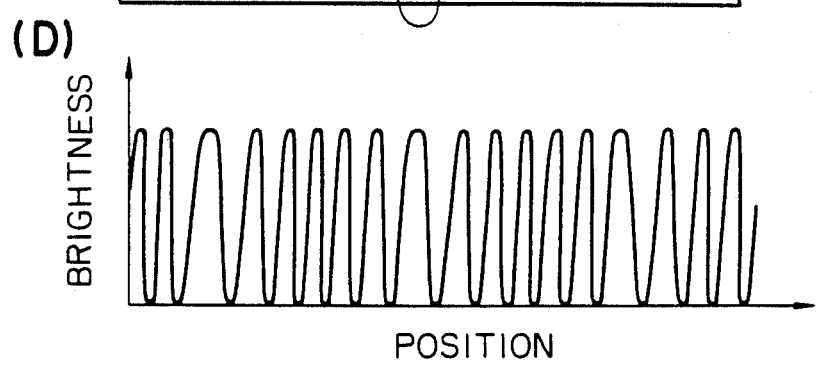
(D)

FIG. 7
(A)
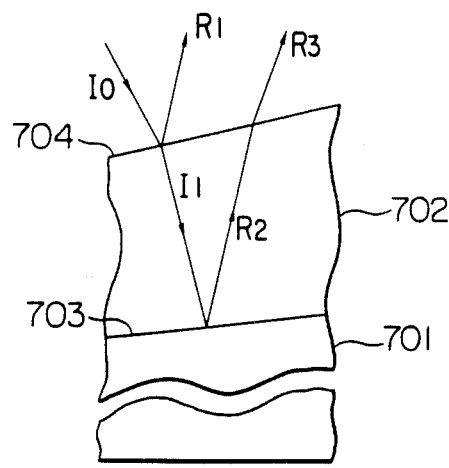
(B)
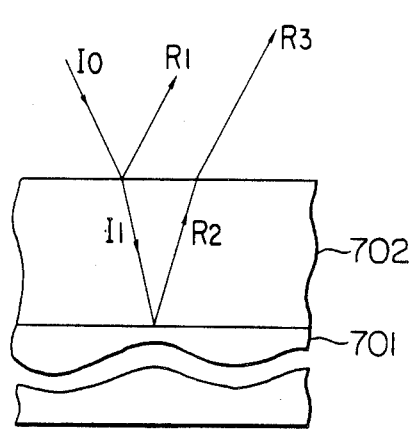
(C)
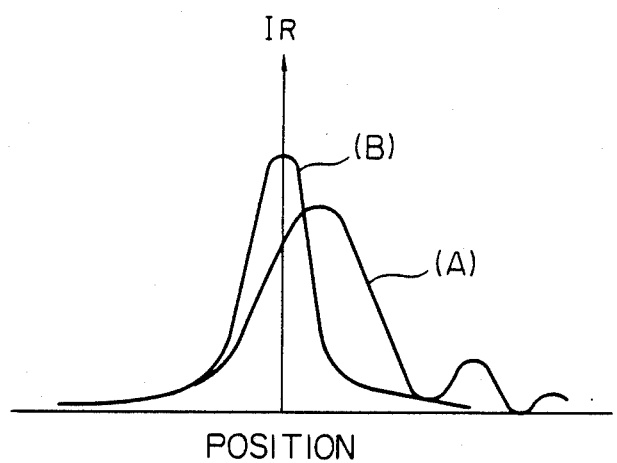

FIG. 25
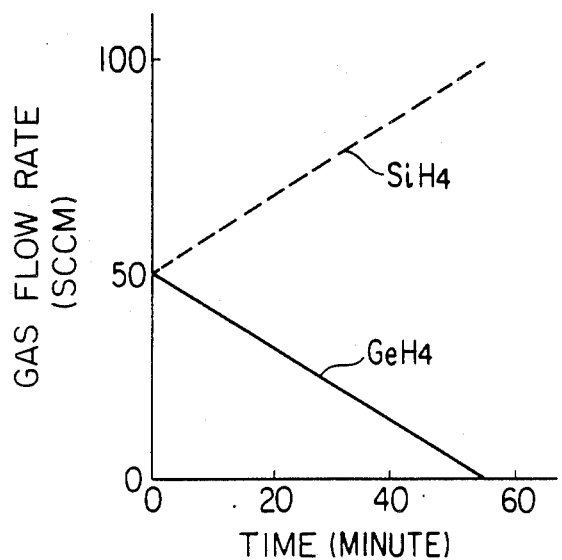
FIG. 26
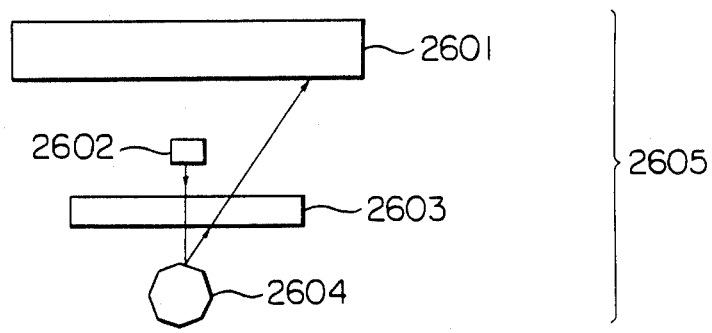
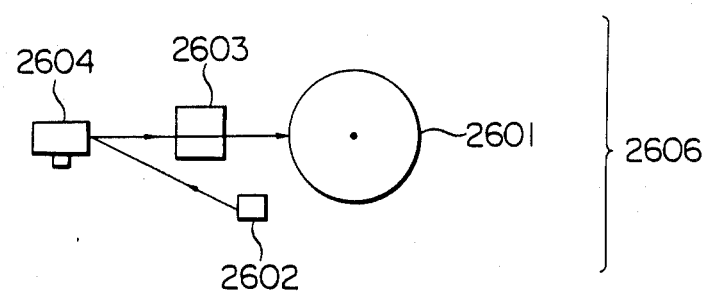

FIG. 64
(A)
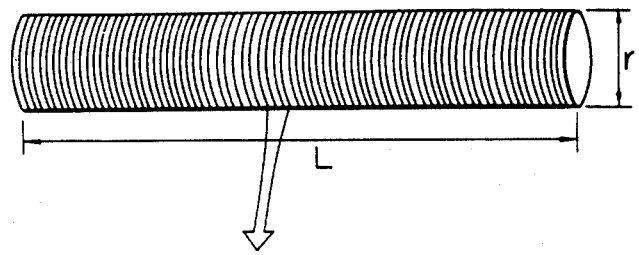
(B)
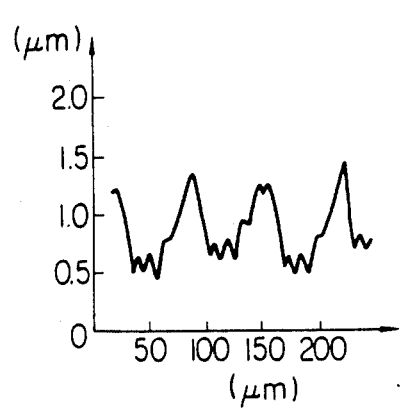
(C)
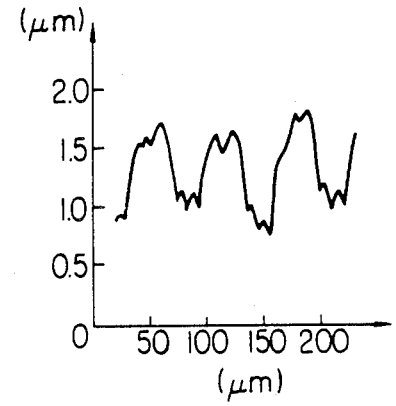
FIG. 65
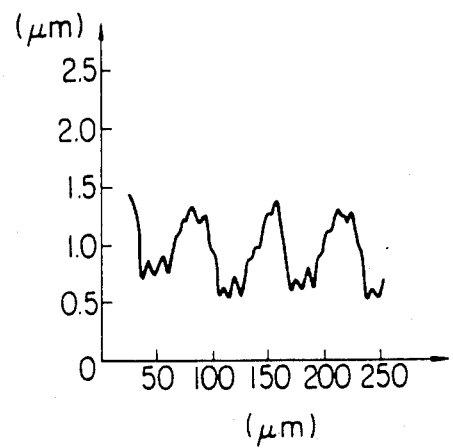

MEMBER HAVING SUBSTRATE WITH IRREGULAR SURFACE AND LIGHT RECEIVING LAYER OF AMORPHOUS SILICON

CROSS-REFERENCE TO RELATED APPLICATIONS

This application contains subject matter related to commonly assigned, copending application Ser. Nos. 697,141; 699,868; 705,516; 709,888; 720,011; 740,901; 786,970; 725,751; 726,768; 719,980; 739,867; 740,714; 741,300; 753,048; 752,920 and 753,011.

BACKGROUND OF THE INVENTION

1. Field of the Invention

This invention relates to a light receiving-member having sensitivity to electromagnetic waves such as light (herein used in a broad sense, including ultraviolet rays, visible light, infrared rays, X-rays and gamma-rays). More particularly, it pertains to a light-receiving member suitable for using a coherent light such as laser beam.

2. Description of the Prior Art

As the method for recording a digital image information as an image, there have been well known the methods in which an electrostatic latent image is formed by scanning optically a light-receiving member with a laser beam modulated corresponding to a digital image information, then said latent image is developed, followed by processing such as transfer or fixing, if desired, to record an image. Among them, in the image forming method employing electrophotography, image recording has been generally practiced with the use of a small size and inexpensive He-Ne laser or a semiconductor laser (generally having an emitted wavelength of 650–820 nm).

In particular, as the light-receiving member for electrophotography which is suitable when using a semiconductor laser, an amorphous material containing silicon atoms (hereinafter written briefly as "A-Si") as disclosed in Japanese Laid-open Patent Application Nos. 86341/1979 and 83746/1981 is attracting attention for its high Vickers hardness and non-polluting properties in social aspect in addition to the advantage of being by far superior in matching in its photosensitive region as compared with other kinds of light-receiving members.

However, when the photosensitive layer is made of a single A-Si layer, for ensuring dark resistance of $10^{12}$ ohm.cm or higher required for electrophotography while maintaining high photosensitivity, it is necessary to incorporate structurally hydrogen atoms or halogen atoms or boron atoms in addition thereto in controlled form within specific ranges of amounts. Accordingly, control of layer formation is required to be performed severely, whereby tolerance in designing of a light-receiving member is considerably limited.

As attempts to enlarge this tolerance in designing, namely to enable effective utilization of its high photosensitivity in spite of somewhat lower dark resistance, there have been proposed a light-receiving layer with a multi-layer structure of two or more laminated layers with different conductivity characteristics with formation of a depletion layer within the light-receiving layer, as disclosed in Japanese Laid-open Patent Application Nos. 121743/1979, 4053/1982 and 4172/1982, or a light receiving member with a multi-layer structure in which a barrier layer is provided between the substrate and the photosensitive layer and/or on the upper surface of the ohotosensitive layer, thereby enhancing apparent dark resistance of the light-receiving layer as a whole, as disclosed in Japanese Laid-open Patent Application Nos. 52178/1982, 52179/1982, 52180/1982, 58159/1982, 58160/1982 and 58161/1982.

According to such proposals, A-Si type light-receiving members have been greatly advanced in tolerance in designing of commercialization thereof or easiness in management of its production and productivity, and the speed of development toward commercialization is now further accelerated.

When carrying out laser recording by use of such a light-receiving member having a light receiving layer of a multi-layer structure, due to irregularity in thickness of respective layers, and also because of the laser beam which is an coherent monochromatic light, it is possible that the respective reflected lights reflected from the free surface on the laser irradiation side of the light-receiving layer and the layer interface between the respective layers constituting the light-receiving layer and between the substrate and the light-receiving layer (hereinafter "interface" is used to mean comprehensively both the free surface and the layer interface) may undergo interference.

Such an interference phenomenon results in the so-called interference fringe pattern in the visible image formed and causes a poor image. In particular, in the case of forming a halftone image with high gradation, bad appearance of the image will become marked.

Moreover, as the wavelength region of the semiconductor laser beam is shifted toward longer wavelength, absorption of said laser beam in the photosensitive layer becomes reduced, whereby the above interference phenomenon becomes more marked.

This point is explained by referring to the drawings.

FIG. 1 shows a light $I_0$ entering a certain layer constituting the light-receiving layer of a light-receiving member, a reflected light $R_1$ from the upper interface 102 and a reflected light $R_2$ reflected from the lower interface 101.

Now, the average layer thickness of the layer is defined as d, its refractive index as n and the wavelength of the light as $\lambda$, and when the layer thickness of a certain layer is ununiform gently with a layer thickness difference of $\lambda/2n$ or more, changes in absorbed light quantity and transmitted light quantity occur depending on to which condition of $2nd = m\lambda$ (m is an integer, reflected lights are strengthened with each other) and $2nd = (m+\frac{1}{2})\lambda$ (m is an integer, reflected lights are weakened with each other) the reflected lights $R_1$ and $R_2$ conform In the light-receiving member of a multi-layer structure, the interference effect as shown in FIG. 1 occurs at each layer, and there ensues a synergistic deleterious influence through respective interferences as shown in FIG. 2. For this reason, the interference fringe corresponding to said interference fringe pattern appears on the visible image transferred and fixed on the transfer member to cause bad images.

As the method for cancelling such an inconvenience, it has been proposed to subject the surface of the substrate to diamond cutting to provide unevenness of $\pm 500$ Å–$\pm 10000$ Å, thereby forming a light scattering surface (as disclosed in Japanese Laid-open Patent Application No. 162975/1983); to provide a light absorbing layer by subjecting the aluminum substrate surface to black Alumite treatment or dispersing carbon, color pigment or dye in a resin (as disclosed in Japanese Laid-open Patent Application No. 165845/1982); and to provide a light scattering reflection preventive layer on the substrate surface by subjecting the aluminum substrate surface to satin-like Alumite treatment or by providing a sandy fine unevenness by sand blast (as disclosed in Japanese Laid-open Patent Application No. 16554/1982).

However, according to these methods of the prior art, the interference fringe pattern appearing on the image could not completely be cancelled.

For example, because only a large number of unevenness with specific sized are formed on the substrate surface according to the first method, although prevention of appearance of interference fringe through light scattering is indeed effected, regular reflection light component yet exists. Therefore, in addition to remaining of the interference fringe by said regular reflection light, enlargement of irradiated spot occurs due to the light scattering effect on the surface of the substrate to be a cause for substantial lowering of resolution.

As for the second method, such a black Alumite treatment is not sufficient for complete absorption, but reflected light from the substrate surface remains. Also, there are involved various inconveniences. For example, in providing a resin layer containing a color pigment dispersed therein, a phenomenon of degassing from the resin layer occurs during formation of the A-Si photosensitive layer to markedly lower the layer quality of the photosensitive layer formed, and the resin layer suffers from a damage by the plasma during formation of A-Si photosensitive layer to be deteriorated in its inherent absorbing function. Beside, worsening of the surface state deleteriously affects subsequent formation of the A-Si photosensitive layer.

In the case of the third method of irregularly roughening the substrate surface, as shown in FIG. 3, for example, the incident light $I_0$ is partly reflected from the surface of the light-receiving layer 302 to become a reflected light $R_1$, with the remainder progressing internally through the light-receiving layer 302 to become a transmitted light $I_1$. The transmitted light $I_1$ is partly scattered on the surface of the substrate 301 to become scattered lights $K_1, K_2, K_3 \ldots K_n$, with the remainder being regularly reflected to become a reflected light $R_2$, a part of which goes outside as an emitted light $R_3$. Thus, since the reflected light $R_1$ and the emitted light $R_3$ which is an interferable component remain, it is not yet possible to extinguish the interference fringe pattern.

On the other hand, if diffusibility of the surface of the substrate 301 is increased in order to prevent multiple reflections within the light-receiving layer 302 through prevention of interference, light will be diffused within the light-receiving layer 302 to cause halation, whereby resolution is disadvantageously lowered.

Particularly, in a light-receiving member of a multilayer structure, as shown in FIG. 4, even if the surface of the substrate 401 may be irregularly roughened, the reflected light $R_2$ from the first layer 402, the reflected light $R_1$ from the second layer 403 and the regularly reflected light $R_3$ from the surface of the substrate 401 are interfered with each other to form an interference fringe pattern depending on the respective layer thicknesses of the light receiving member. Accordingly, in a light receiving member of a multi-layer structure, it was impossible to completely prevent appearance of interference fringes by irregularly roughening the surface of the substrate 401.

In the case of irregularly roughening the substrate surface according to the method such as sand blasting, etc., the roughness will vary so much from lot to lot, and there is also nonuniformity in roughness even in the same lot, and therefore production control could be done with inconvenience. In addition, relatively large projections with random distributions are frequently formed, hence causing local breakdown of the light-receiving layer during charging treatment.

On the other hand, in the case of simply roughening the surface of the substrate 501 regularly, as shown in FIG. 5, since the light-receiving layer 502 is deposited along the uneven shape of the surface of the substrate 501, the slanted plane of the unevenness of the substrate 501 becomes parallel to the slanted plane of the unevenness of the light-receiving layer 502.

Accordingly, for the incident light on that portion, $2nd_1 = m\lambda$ or $2nd_1 = (m+\frac{1}{2})\lambda$ holds, to make it a light portion or a dark portion. Also, in the light receiving layer as a whole, since there is nonuniformity in which the maximum difference among the layer thicknesses $d_1$, $d_2$, $d_3$ and $d_4$ of the light receiving layer is $\lambda/2n$ or more, there appears a light and dark fringe pattern.

Thus, it is impossible to completely extinguish the interference fringe pattern by only roughening regularly the surface of the substrate 501.

Also, in the case of depositing a light receiving layer of a multi-layer structure on the substrate, the surface of which is regularly roughened, in addition to the interference between the regularly reflected light from the substrate surface and the reflected light from the light receiving layer surface as explained for light-receiving member of a single layer structure in FIG. 3, interferences by the reflected lights from the interfaces between the respective layers participate to make the extent of appearance of interference fringe pattern more complicated than in the case of the light-receiving member of a single layer structure.

SUMMARY OF THE INVENTION

An object of the present invention is to provide a novel substrate for use in a light-receiving member sensitive to light, which has cancelled the drawbacks as described above, and a light-receiving member having said substrate.

Another object of the present invention is to provide a substrate for use in a light-receiving member which is suitable for image formation by use of a coherent monochromatic light and also easy in production management, and a light-receiving member having said substrate.

Still another object of the present invention is to provide a light-receiving member which can cancel the interference fringe pattern appearing during image formation and appearance of speckles on reversal developing at the same time and completely.

Further, another object of the present invention is to provide a light-receiving member which can perform digital image recording utilizing electrophotography, above all digital image recording having a halftone information, clearly and at high resolution with high quality.

Still another object of the present invention is to provide a light-receiving member having high photosensitivity, high SN ratio characteristic and good electrical contact with a substrate.

According to one aspect of the present invention, there is provided a light-receiving member comprising a substrate having a large number of protruding portions on a surface thereof, each of said protruding portions having at a predetermined cut position a sectional shape comprising a main projection and a subprojection, the main projection and the subprojection overlapping each other, and a light-receiving layer comprising a layer comprising an amorphous material containing silicon atoms, at least a part of the layer region of which has photosensitivity and a surface layer comprising an amorphous material containing silicon atoms and carbon atoms.

According to another aspect of the present invention, there is provided a light-receiving member comprising a substrate having a large number of protruding portions on a surface thereof, each of said protruding portions having at a predetermined cut position a sectional shape comprising a main projection and a subprojection, the main projection and the subprojection overlapping each other, and a light-receiving layer with a multi-layer structure having a first layer comprising an amorphous material containing silicon atoms and germanium atoms, a second layer comprising an amorphous material containing silicon atoms and exhibiting photoconductivity and a surface layer comprising an amorphous material containing silicon atoms and carbon atoms provided successively from the substrate side.

BRIEF DESCRIPTION OF THE DRAWINGS

FIGS. 6(A), (B), (C) and (D) are schematic illustrations of no appearance of interference fringe in the case of non-parallel interfaces between respective layers of a light-receiving member;

FIGS. 7(A), (B) and (C) are schematic illustration of comparison of the reflected light intensity between the case of parallel interfaces and non-parallel interfaces between the respective layers of a light-receiving member;

FIG. 64, FIG. 65, FIG. 78 and FIG. 79 are schematic illustrations of the surface states of the aluminum substrates employed in Examples;

FIGS. 22 through 25, FIGS. 36 through 42, FIGS. 52 through 62, FIGS. 66 through 77, FIGS. 80 through 85 are schematic illustrations of the changes in gas flow rates of the respective gases in Examples;

FIG. 26 is a schematic illustration of the image exposure device employed in Examples;

DESCRIPTION OF THE PREFERRED EMBODIMENTS

Figure 1:
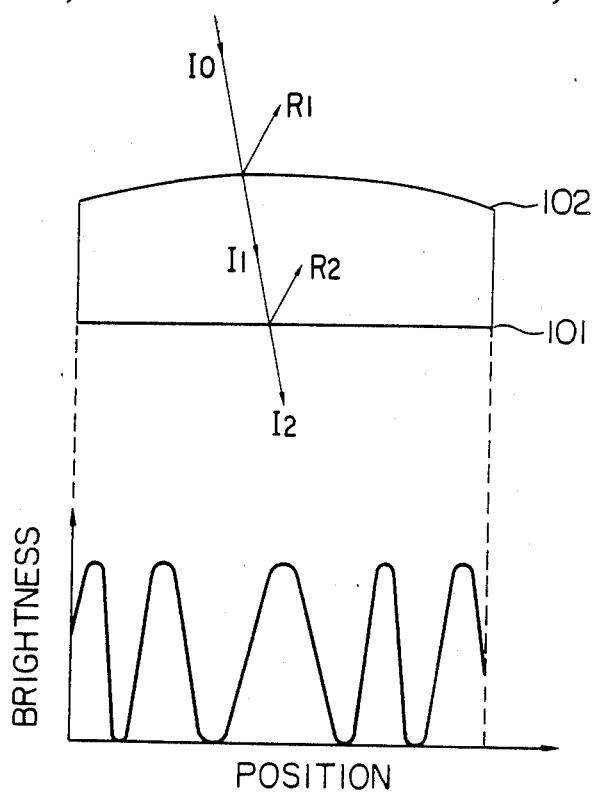
FIG. 1 is a schematic illustration of interference fringe in general.
Figure 2:
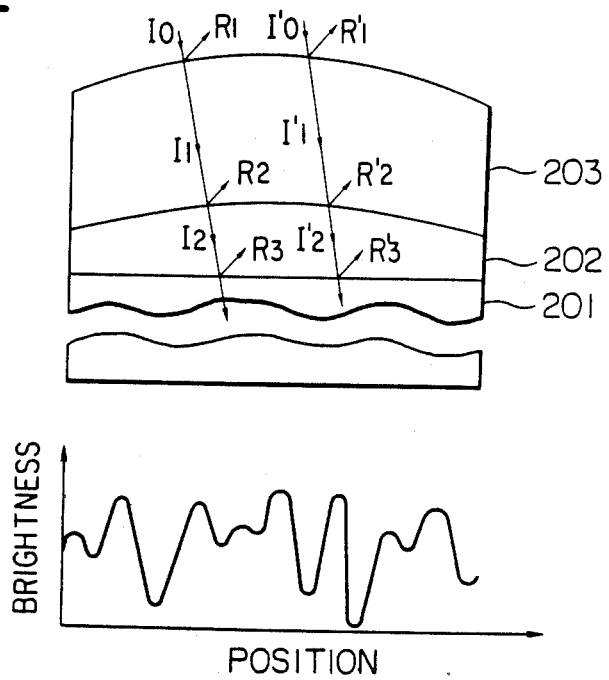
FIG. 2 is a schematic illustration of interference fringe in the case of a multi-layer light-receiving member.
Figure 3:
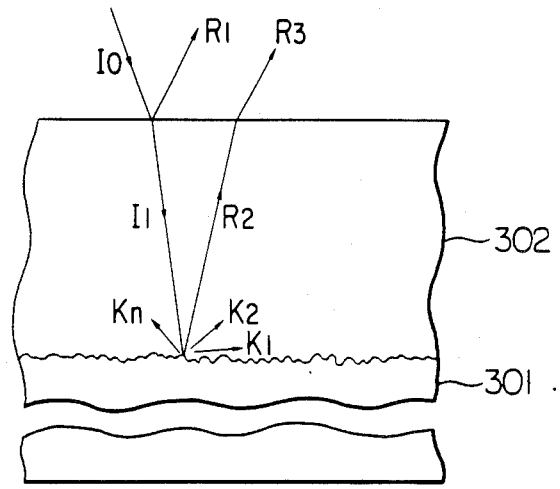
FIG. 3 is a schematic illustration of interference fringe by scattered light.
Figure 4:
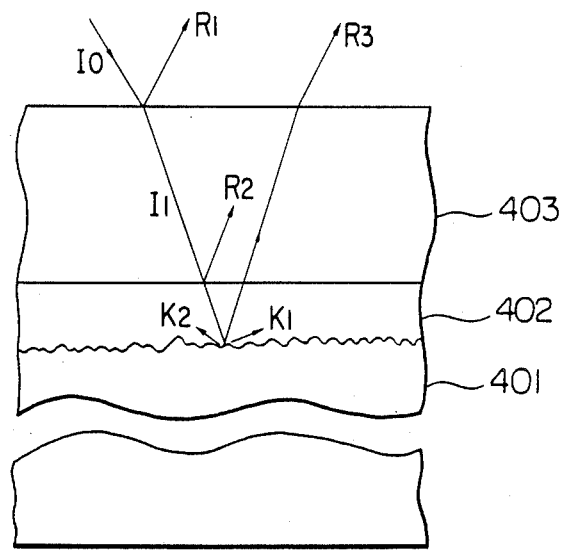
FIG. 4 is a schematic illustration of interference fringe by scattered light in the case of a multi-layer light-receiving member.

Referring now to the accompnaying drawings, the present invention is to be described in detail.

FIG. 6 is a schematic illustration for explanation of the basic principle of the present invention.

In the present invention, on a substrate (not shown) having a fine uneven shape smaller than the resolution required for the device, a light-receiving layer of a multi-layer constitution is provided along the uneven slanted plane, with the thickness of the second layer 602 being continuously changed from $d_5$ to $d_6$, as shown enlarged in a part of FIG. 6, and therefore the interface 603 and the interface 604 have respective gradients. Accordingly, the coherent light incident on this minute portion (short range region ) 1 [indicated schematically in FIG. 6 (C), and its enlarged view shown in FIG. 6 (A)] undergoes interference at said minute portion 1 to form a minute interference fringe pattern.

Also, as shown in FIG. 7, when the interface 703 between the first layer 701 and the second layer 702 and the free surface 704 are non-parallel to each other, the reflected light $R_1$ and the emitted light $R_3$ are different in direction of progress from each other relative to the incident light $I_0$ as shown in FIG. 7 (A), and therefore the degree of interference will be reduced as compared with the case (FIG. 7 (B)) when the interfaces 703 and 704 are parallel to each other.

Accordingly, as shown in FIG. 7 (C), as compared with the case "(B)" where a pair of the interfaces are in parallel relation, the difference in lightness and darkness in the interference fringe pattern becomes negligibly small even if interfered, if any, in the non-parallel case "(A)".

The same is the case, as shown in FIG. 6, even when the layer thickness of the layer 602 may be macroscopically ununiform ($d_7 \neq d_8$), and therefore the incident light quantity becomes uniform all over the layer region (see FIG. 6 (D)).

Figure 8:
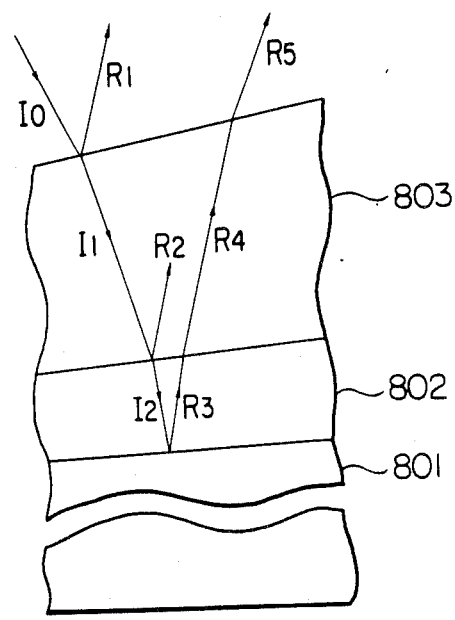
FIG. 8 is a schematic illustration of no appearance of interference fringe in the case of non-parallel interfaces between respective layers.

To describe about the effect of the present invention when coherent light is transmitted from the irradiation side to the first layer in the case of a light-receiving layer of a multi-layer structure, reflected lights $R_1$, $R_2$, $R_3$, $R_4$ and $R_5$ exist in connection with the incident light $I_0$ as shown in FIG. 8.

Accordingly, at the respective layers, the same phenomenon as described with reference to FIG. 7 occurs.

Moreover, the interfaces between the respective layers at a minute portion function as a kind of slit, at which diffraction phenomenon will occur.

Accordingly, interference at respective layers appears as the effect of the product of interference due to difference in layer thickness and the interference due to difraction at the respective layer interfaces.

Therefore, when considered for the light-receiving layer as a whole, interference occurs as a synergetic effect of the respective layers and, according to the present invention, appearance of interference can further be prevented as the number of layers constituting the light-receiving layer is increased.

The interference fringe occurring within the minute portion cannot appear on the image, because the size of the minute portion is smaller than the spot size of the irradiated light, namely smaller than the resolution limit. Further, even if appeared on the image, there is no problem at all, since it is less than resolving ability of the eyes.

In the present invention, the slanted plane of unevenness should desirably be mirror finished in order to direct the reflected light assuredly in one direction.

The size l (one cycle of uneven shape) of the minute portion suitable for the present invention is $l \leq L$, wherein L is the spot size of the irradiation light.

Further, in order to accomplish more effectively the objects of the present invention, the layer thickness difference $(d_5-d_6)$ at the minute portion l should desirably be as follows:

$d_5-d_6 \geq \lambda/2n$ (where $\lambda$ is the wavelength of the irradiation light and n is the refractive index of the second layer 602).

In the present invention, within the layer thickness of the minute portion l (hereinafter called as "minute column") in the light-receiving layer of a multi-layer structure, the layer thicknesses of the respective layers are controlled so that at least two interfaces between layers may be in non-parallel relationship, and, provided that this condition is satisfied, any other pair of two interfaces between layers may be in parallel relationship within said minute column.

However, it is desirable that the layers forming parallel interfaces should be formed to have uniform layer thicknesses so that the difference in layer thickness at any two positions may be not more than:

$\lambda/2n$ (n: refractive index of the layer).

For formation of the respective layers of the photosensitive layer constituting the light-receiving layer, the charge injection preventive layer, the barrier layer consisting of a insulating material or the first and second layers in order to accomplish more effectively and easily the objects of the present invention, the plasma chemical vapor deposition method (PCVD method), the optical CVD method and thermal CVD method can be employed, because the layer thickness can accurately be controlled on the optical level thereby.

As the method for working the substrate to accomplish the objects of the present invention, it is possible to utilize the chemical methods such as chemical etching, electric plating, etc., the physical methods such as vapor deposition, sputtering etc. and the mechanical methods such as lathe working, etc. However, the mechanical working method by lathe, etc. are preferred for easy production management. For example, a substrate may be worked with a lathe by fixing a bite having a V-shaped cutting blade at a predetermined position on a cutting working machine such as milling machine, lathe, etc, and cut working accurately the substrate surface by, for example, moving regularly in a certain direction while rotating a cylindrical substrate according to a program previously designed as desired, thereby forming to a desired unevenness shape, pitch and depth. The linear projection produced by the unevenness formed by such a cutting working has a spiral structure with the center axis of the cylindrical substrate as its center. The spiral structure of the projection may be made into a multiple spiral structure such as double or triple structure or a crossed spiral structure.

Alternatively, a straight line structure along the center axis may also be introduced in addition to the spiral structure.

Each of the protruding portions formed on the surface of the substrate is preferred to have the same shape as the first order approximation at a predetermined section in order to make the working control easy.

At a predetermined cut position, each of the protruding portions has a sectional shape comprising a main projection (main peak) and a subprojection (subpeak), the main projection and the subprojection overlapping each other.

Figure 9:
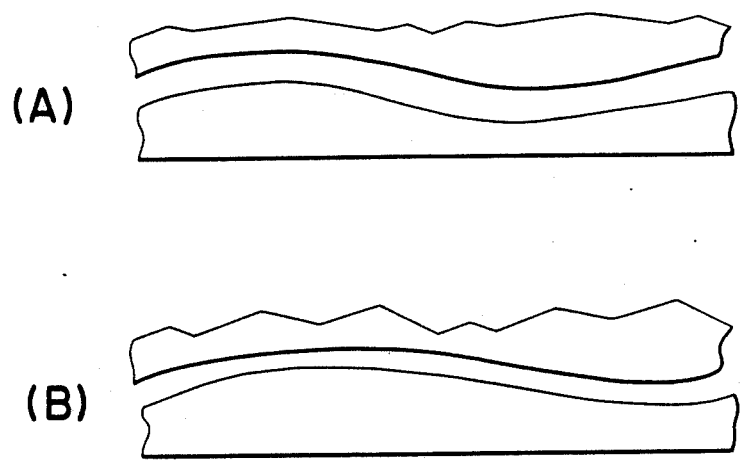
FIGS. 9(A) and (B) are schematic illustrations of the surface condition of typical substrates.

Preferably, the above-mentioned protruding portions may be arranged regularly or periodically in order to enhance the effect of the invention. Further, the above-mentioned protruding portion, for further enhancing the effect of the invention and enhancing adhesion between the light-receiving layer and the substrate, may preferably have multiple subprojections which may overlap each other. In addition to these, for scattering with good efficiency the incident light in one direction, the above-mentioned protruding portion may preferably be united in symmetrically [FIG. 9(A)] or asymmetrically [FIG. 9(B)] with the main projection at its center. However, for enhancing the degree of freedom in management of substrate working, it is preferred that both exist mixed in the substrate.

In the present invention, the respective dimensions of the unevenness provided on the substrate surface under managed condition are set so as to accomplish effectively the objects of the present invention in view of the following points.

More specifically, in the first place, the A-Si layer constituting the light receiving layer is sensitive to the structure of the surface on which the layer formation is effected, and the layer quality will be changed greatly depending on the surface condition.

Accordingly, it is desirable to set dimensions of the unevenness to be provided on the substrate surface so that lowering in layer quality of the A-Si layer may not be brought about.

Secondly, when there is extreme unevenness on the free surface of the light-receiving layer, cleaning cannot frequently be performed completely in cleaning step after image formation.

Further, in case of practicing blade cleaning, there is involved the problem that the blade will be damaged more earlier.

As the result of investigations of the problems is layer deposition as described above, problems in process of electrophotography and the conditions for prevention of interference fringe pattern, it has been found that the pitch at the recessed portion on the substrate surface should preferably be 500 μm to 0.3 μm, more preferably 200 μm to 1 μm, most preferably 50 μm to 5 μm.

It is also desirable that the maximum depth of the recessed portion should preferably be made 0.1 μm to 5 μm, more preferably 0.3 μm to 3 μm, most preferably 0.6 μm to 2 μm. When the pitch and the maximum depth of the recessed portions on the substrate surface are within the ranges as specified above, the gradient of the slanted plane at the recessed portion (or linear projection) may preferably be 1° to 20°, more preferably 3° to 15°, most preferably 4° to 10°.

On the other hand, the maximum of the difference in the layer thickness based on such an uniformness in layer thickness of the respective layers formed on such a substrate should preferably be made 0.1 μm to 2 μm within the same pitch, more preferably 0.1 μm to 1.5 μm, most preferably 0.2 μm to 1 μm.

The light-receiving layer in the light-receiving member of the present invention has a multi-layer structure comprising a layer comprising an amorphous material containing silicon atoms, at least a part of the layer region of which has photosensitivity and a surface layer comprising an amorphous material containing silicon atoms and carbon atoms or a multi-layer structure having a first layer comprising an amorphous material containing silicon atoms and germanium atoms, second layer comprising an amorphous material containing silicon atoms and exhibiting photoconductivity and a surface layer comprising an amorphous material containing silicon atoms and carbon atoms provided successively from the substrate side, and therefore can exhibit very excellent electrical, optical, photoconductive characteristics, dielectric strength and use environmental characteristics.

In particular, the light-receiving member of the present invention is free from any influence from residual potential on image formation when applied for a light-receiving member for electrophotography, with its electrical characteristics being stable with high sensitivity, having a high SN ratio as well as excellent fatigue resistance and excellent repeated use characteristic and being capable of providing images of high quality of high density, clear halftone and high resolution repeatedly and stably.

Further, in the case of the light-receiving member of the present invention comprising a first layer comprising an amorphous material containing silicon atoms and germanium atoms, a second layer comprising an amorphous material containing silicon atoms and exhibiting photoconductivity and a surface layer, it is high in photosensitivity over all the visible light regions, particularly in photosensitivity to the light of longer wavelength region and is therefore excellent in matching to semiconductor laser and also rapid in light response.

Referring now the drawings, the light-receiving member of the present invention is to be described in detail.

Figure 21:
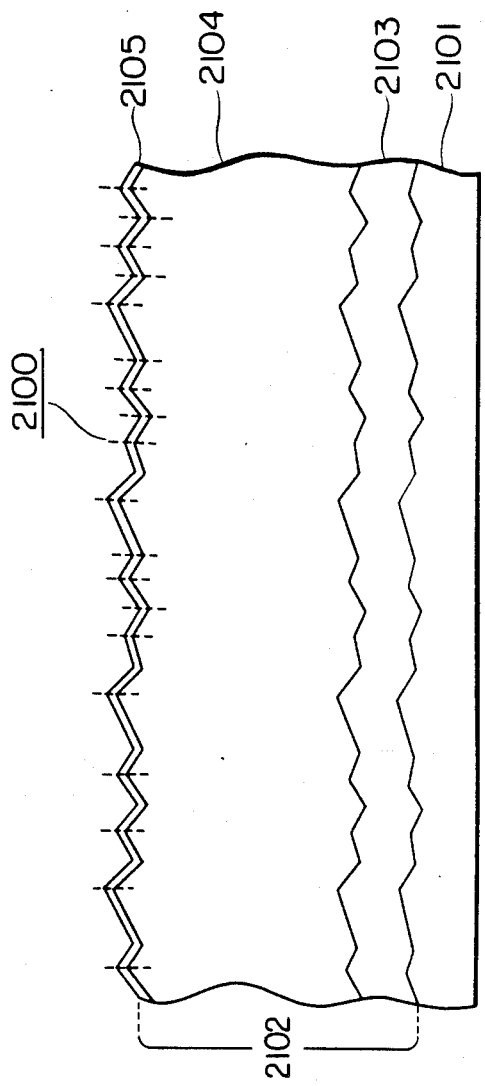

The light-receiving member 2100 shown in Fig. 21 has a light-receiving layer 2102 on a substrate 2101 which is subjected to surface cutting working so as to achieve the objects of the invention, said light-receiving layer 2102 being constituted of a charge injection preventive layer 2103, a photosensitive layer 2104 and a surface layer 2105 from the side of the substrate 2101.

The substrate 2101 may be either electroconductive or insulating. As the electroconductive substrate, there may be mentioned metals such as NiCr, stainless steel, Al, Cr, Mo, Au, Nb, Ta, V, Ti, Pt, Pd etc. or alloys thereof.

As insulating substrates, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. At least one side surface of these substrates is preferably subjected to treatment for imparting electroconductivity, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3+SnO_2$) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The substrate may be shaped in any form such as cylinders, belts, plates or others, and its form may be determined as desired. For example, when the light-receiving member 2100 in FIG. 21 is to be used as the light-receiving member for electrophotography, it may desirably be formed into an endless belt or a cylinder for use in continuous high speed copying. The substrate may have a thickness, which is conveniently determined so that the lightreceiving member as desired may be formed. When the light-receiving member is required to have a flexibility, the substrate is made as thin as possible, so far as the function of a support can be exhibited. However, in such a case, the thickness is generally 10μ or more from the points of fabrication and handling of the substrate as well as its mechanical strength.

The charge injection preventive layer 2103 is provided for the purpose of preventing injection of charges into the photosensitive layer 2104 from the substrate 2101 side, thereby increasing apparent resistance.

The charge injection preventive layer 2103 is constituted of A-Si containing hydrogen atoms and/or halogen atoms (X) [hereinafter written as "A-Si(H,X)"] and also contains a substance (C) for controlling conductivity. As the substance (C) for controlling conductivity, there may be mentioned so called impurities in the field of semiconductors. In the present invention, there may be included p-type impurities giving p-type conductivity characteristics and n-type impurities giving n-type conductivity characteristics to Si. More specifically, there may be mentioned as p-type impurities atoms belonging to the group III of the periodic table (Group III atoms), such as B (boron), Al (aluminum), Ga (gallium), In (indium), Tl (thallium), etc., particularly preferably B and Ga.

As n-type impurities, there may be included the atoms belonging to the group V of the periodic table (Group V atoms), such as P (phosphorus), As (arsenic), Sb (antimony). Bi (bismuth), etc., particularly preferably P and As.

In the present invention, the content of the substance (C) for controlling conductivity contained in the charge injection preventing layer 2103 may be suitably be selected depending on the charge injection preventing characteristic required, or when the charge injection preventive layer 2103 is provided on the substrate 2101 directly contacted therewith, the organic relationship such as relation with the characteristic at the contacted interface with said substrate 2101. Also, the content of the substance (C) for controlling conductivity is selected suitably with due considerations of the relationships with characteristics of other layer regions provided in direct contact with the above charge injection preventive layer or the characteristics at the contacted interface with said other layer regions.

In the present invention, the content of the substance (C) for controlling conductivity contained in the charge injection preventive layer 2103 should preferably be 0.001 to $5 \times 10^4$ atomic ppm, more preferably 0.5 to $1 \times 10^4$ atomic ppm, most preferably 1 to $5 \times 10^3$ atomic ppm.

In the present invention, by making the content of the substance (C) in the charge injection preventive layer 2103 preferably 30 atomic ppm or more, more preferably 50 atomic ppm or more, most preferably 100 atomic ppm or more, the effect as described below can more markedly be obtained. For example, in the case when said substance (C) to be incorporated is a p-type impurity as mentioned above, migration of electrons injected from the substrate 2101 side into the photosensitive layer 2104 can be effectively inhibited when the free surface of the light-receiving layer 2102 is subjected to the charging treatment to ⊕ polarity. On the other hand, when the substance (C) to be incorporated is a n-type impurity as mentioned above, migration of positive holes injected from the substrate 2101 side into the photosensitive layer 2104 can be more effectively inhibited when the free surface of the light-receiving layer 2102 is subjected to the charging treatment to ⊖ polarity.

The charge injection preventive layer 2103 may have a thickness preferably of 30 Å to 10μ, more preferably of 40 Å to 8μ, most preferably of 50 Å to 5μ.

The photosensitive layer 2104 is constituted of A-Si(H,X) and has both the charge generating function to generate photocarriers by irradiation with a laser beam and the charge transporting function to transport the charges.

The photosensitive layer 2104 may have a thickness preferably of 1 to 100μ, more preferably of 1 to 80μ, most preferably of 2 to 50μ.

The photosensitive layer 2104 may contain a substance for controlling conductivity of the other polarity than that of the substance for controlling conductivity contained in the charge injection preventive layer 2103, or when a substance for controlling conductivity is contained in the charge injection preventive layer 2103 in a large amount, a substance for controlling conductivity of the same polarity may be contained in the photosensitive layer 2104 in an amount by far smaller than that practically contained in the charge injection preventive layer 2103.

In such a case, the content of the substance for controlling conductivity contained in the above photosensitive layer 2104 can be determined adequately as desired depending on the polarity or the content of the substance contained in the charge injection preventive layer 2103, but it is preferably 0.001 to 1000 atomic ppm, more preferably 0.05 to 500 atomic ppm, most preferably 0.1 to 200 atomic ppm.

In the present invention, when the same kind of a substance for controlling conductivity is contained in the charge injection preventive layer 2103 and the photosensitive layer 2104, the content in the photosensitive layer 2104 should preferably be 30 atomic ppm or less.

In the present invention, the amount of hydrogen atoms (H) or the amount of halogen atoms (X) or the sum of the amounts of hydrogen atoms and halogen atoms (H+X) to be contained in the charge injection preventive layer 2103 and the photosensitive layer 2104 should preferably be 1 to 40 atomic %, more preferably 5 to 30 atomic %.

As halogen atoms (X), F, Cl, Br and I may be included and among them, F and Cl may preferably be employed.

In the light-receiving member shown in FIG. 21, a so-called barrier layer comprising an electrically insulating material may be provided in place of the charge injection preventive layer 2103. Alternatively, it is also possible to use a barrier layer in combination with the charge injection preventive layer 2103.

As the material for forming the barrier layer, there may be included inorganic insulating materials such as $Al_2O_3$, $SiO_2$, $Si_3N_4$, etc. or organic insulating materials such as polycarbonate, etc.

Figure 10:
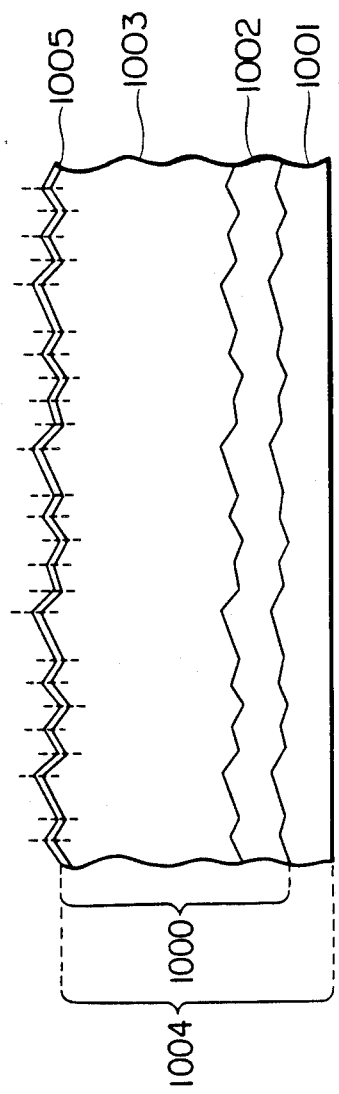
FIG. 10 and FIG. 21 are schematic illustrations of the layer constitution of light-receiving members.

FIG. 10 shows a schematic sectional view for illustration of the layer structure of the second embodient of the light-receiving member of the present invention.

The light-receiving member 1004 as shown in FIG. 10 has a light-receiving layer 1000 on a substrate for light-receiving member 1001, said light-receiving layer 1000 having a free surface 1005 on one end surface.

The light-receiving layer 1000 has a layer structure constituted of a first layer (G) 1002 comprising an amorphous material containing silicon atoms and germanium atoms and, if desired, hydrogen atoms (H) and/or halogen atoms (X) (hereinafter abbreviated as "A-SiGe(H,X)"), a second layer (S) 1003 comprising A-Si containing, if desired, hydrogen atoms (H) and/or halogen atoms (X) (hereinafter abbreviated as A-Si(H,X)) and exhibiting photoconductivity and a surface layer 1005 laminated successively from the substrate 1001 side.

The germanium atoms contained in the first layer (G) 1002 may be contained so that the distribution state may be uniform within the first layer (G), or they can be contained continuously in the layer thickness direction in said first layer (G) 1002, being more enriched at the substrate 1001 side toward the side opposite to the side where said substrate 1001 is provided (the surface layer 1005 side of the light-receiving layer 1001).

When the distribution state of the germanium atoms contained in the first layer (G) is ununiform in the layer thickness direction, it is desirable that the distribution state should be made uniform in the interplanar direction in parallel to the surface of the substrate.

In the present invention, in the second layer (S) provided on the first layer (G), no germanium atoms is contained and by forming a light-receiving layer to such a layer structure, the light-receiving member obtained can be excellent in photosensitivity to the light with wavelengths of all the regions from relatively shorter wavelength to relatively longer wavelength, including visible light region.

Also, when the distribution state of germanium atoms in the first layer (G) is ununiform in the layer thickness direction, the germanium atoms are distributed continuously throughout the whole layer region while giving a change in distribution concentration C of the germanium atoms in the layer thickness g direction which is decreased from the substrate toward the second layer (S), and therefore affinity between the first layer (G) and the second layer (S) is excellent. Also, as described as hereinafter, by extremely increasing the distribution concentration C of germanium atoms at the end portion on the substrate side extremely great, the light on the longer wavelength side which cannot substantially be absorbed by the second layer (S) can be absorbed in the first layer (G) substantially completely, when employing a semiconductor laser, whereby interference by reflection from the substrate surface can be prevented.

Also, in the light-receiving member of the present invention, the respective amorphous materials constituting the first layer (G) and the second layer (S) have the common constituent of silicon atoms, and therefore chemical stability can sufficiently be ensured at the laminated interface.

FIGS. 11 through 19 show typical examples of distribution in the layer thickness direction of germanium atoms contained in the first layer region (G) of the light-receiving member in the present invention.

In FIGS. 11 through 19, the abscissa indicates the content C of germanium atoms and the ordinate the layer thickness of the first layer (G), $t_B$ showing the position of the end surface of the first layer (G) on the substrate side and $t_T$ the position of the end surface of the first layer (G) on the side opposite to the substrate side. That is, layer formation of the first layer (G) containing germanium atoms proceeds from the $t_B$ side toward the $t_T$ side.

Figure 11:
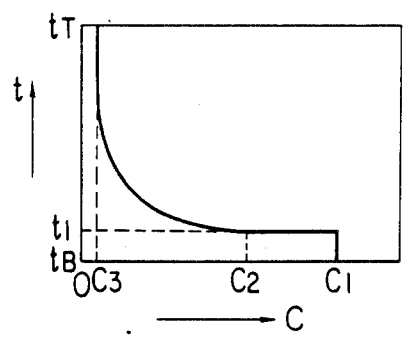
FIGS. 11 through 19 are schematic illustrations of the distribution states of germanium atoms in the first layer.

In FIG. 11, there is shown a first typical embodiment of the depth profile of germanium atoms in the layer thickness direction contained in the first layer (G).

In the embodiment as shown in FIG. 11, from the interface position $t_B$ at which the surface, on which the first layer (G) containing germanium atoms is to be formed, comes into contact with the surface of said first layer (G) to the position $t_1$, germanium atoms are contained in the first layer (G) formed, while the distribution concentration C of germanium atoms taking a constant value of $C_1$, the concentration being gradually decreased from the concentration $C_2$ continuously from the position $t_1$ to the interface position $t_T$. At the interface position $t_T$, the distribution concentration C of germanium atoms is made $C_3$.

Figure 12:
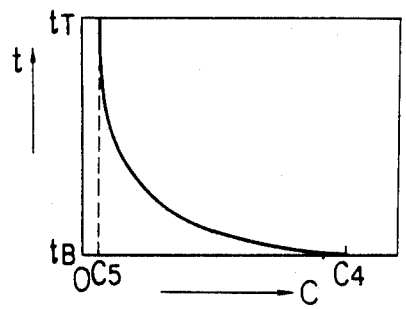

In the embodiment shown in FIG. 12, the distribution concentration C of germanium atoms contained is decreased gradually and continuously from the position $t_B$ to the position $t_T$ from the concentration $C_4$ until it becomes the concentration $C_5$ at the position $t_T$.

Figure 13:
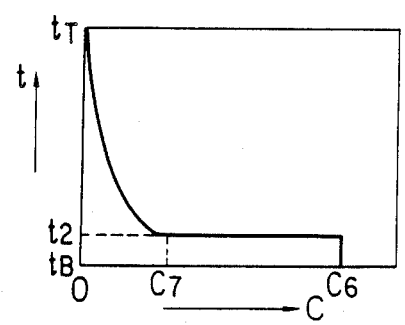

In case of FIG. 13, the distribution concentration C of germanium atoms is made constant as $C_6$ at the position $t_B$, gradually decreased continuously from the position $t_2$ to the position $t_T$, and the concentration C is made substantially zero at the position $t_T$ (substantially zero herein means the content less than the detectable limit).

Figure 14:
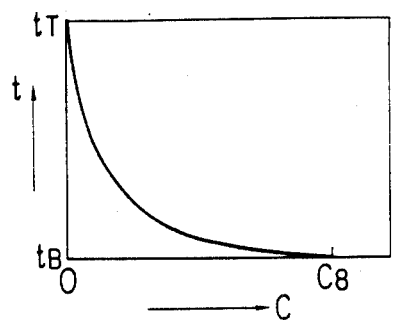

In case of FIG. 14, germanium atoms are decreased gradually and continuously from the position $t_B$ to the position $t_T$ from the concentration $C_8$, until it is made substantially zero at the position $t_T$.

Figure 15:
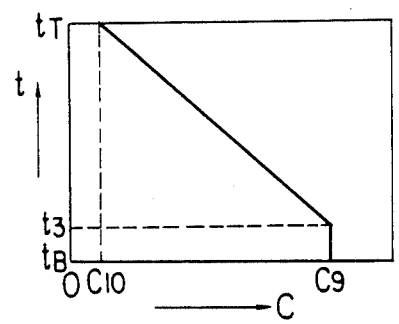

In the embodiment shown in FIG. 15, the distribution concentration C of germanium atoms is constantly $C_9$ between the position $t_B$ and the position $t_3$, and it is made $C_{10}$ at the position $t_T$. Between the position $t_3$ and the position $t_T$, the concentration C is decreased as a first order function from the position $t_3$ to the position $t_T$.

Figure 16:
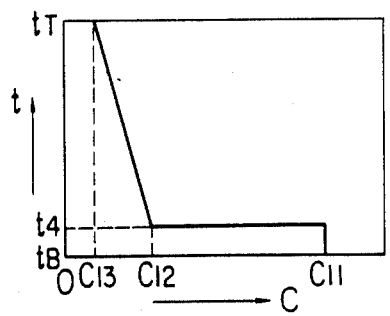

In the embodiment shown in FIG. 16, there is formed a depth profile such that the distribution concentration C takes a constant value of $C_{11}$ from the position $t_B$ to the position $t_4$, and is decreased as a first order function from the concentration $C_{12}$ to the concentration $C_{13}$ from the position $t_4$ to the position $t_T$.

Figure 17:
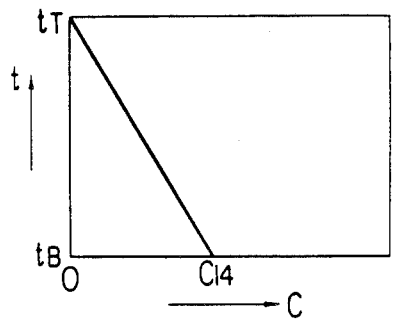

In the embodiment shown in FIG. 17, the distribution concentration C of germanium atoms is decreased as a first order function from the concentration $C_{14}$ to zero from the position $t_B$ to the position $t_T$.

Figure 18:
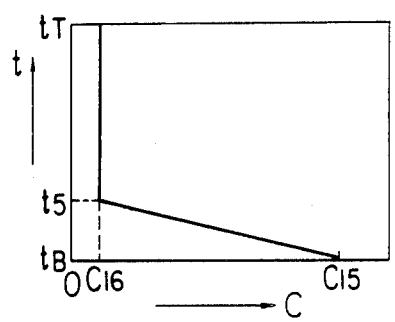

In FIG. 18, there is shown an embodiment, where the distribution concentration C of germanium atoms is decreased as a first order function from the concentration $C_{15}$ to $C_{16}$ from the position $t_B$ to $t_5$ and made constantly at the concentration $C_{16}$ between the position $t_5$ and $t_T$.

Figure 19:
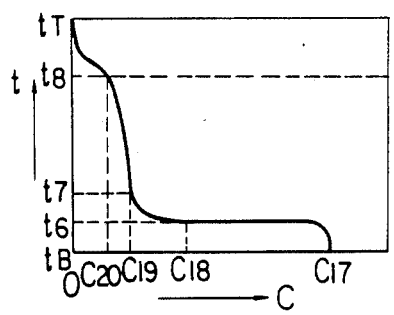

In the embodiment shown in FIG. 19, the distribution concentration C of germanium atoms is at the concentration $C_{17}$ at the position $t_B$, which concentration $C_{17}$ is initially decreased gradually and abruptly near the position $t_6$ to the position $t_6$, until it is made the concentration $C_{18}$ at the position $t_6$.

Between the position $t_6$ and the position $t_7$, the concentration is initially decreased abruptly and thereafter gradually, until it is made the concentration $C_{19}$ at the position $t_7$. Between the position $t_7$ and the position $t_8$, the concentration is decreased very gradually to the concentration $C_{20}$ at the position $t_8$. Between the position $t_8$ and the position $t_T$, the concentration is decreased along the curve having a shape as shown in the Figure from the concentration $C_{20}$ to substantially zero.

As described above about some typical examples of depth profiles of germanium atoms contained in the first layer (G) in the direction of the layer thickness by referring to FIGS. 11 through 19, when the distribution state of germanium atoms is ununiform in the layer thickness direction, the first layer (G) is provided desirably in a depth profile so as to have a portion enriched in distribution concentration C of germanium atoms on the substrate side and a portion depleted in distribution concentration C of germanium atoms considerably lower than that of the substrate side on the interface $t_T$ side.

The first layer (G) constituting the light-receiving member in the present invention is desired to have a localized region (A) containing germanium atoms at a relatively higher concentration on the substrate side as described above.

In the present invention, the localized region (A), as explained in terms of the symbols shown in FIG. 11 through FIG. 19, may be desirably provided within $5\mu$ from the interface position $t_B$.

In the present invention, the above localized region (A) may be made to be identical with the whole of the layer region ($L_T$) on the interface position $t_B$ to the thickness of $5\mu$, or alternatively a part of the layer region ($L_T$).

It may suitably be determined depending on the characteristics required for the light-receiving layer to be formed, whether the localized region (A) is made a part or whole of the layer region ($L_T$).

The localized region (A) may preferably be formed according to such a layer formation that the maximum value Cmax of the concentrations of germanium atoms in a distribution in the layer thickness direction may preferably be 1000 atomic ppm or more, more preferably 5000 atomic ppm or more, most preferably $1 \times 10^4$ atomic ppm or more based on silicon atoms.

That is, according to the present invention, it is desirable that the layer region (G) containing germanium atoms is formed so that the maximum value Cmax of the distribution concentration C may exist within a layer thickness of $5\mu$ from the substrate side (the layer region within $5\mu$ thickness from $t_B$).

In the present invention, the content of germanium atoms in the first layer (G), which may suitably be determined as desired so as to acheive effectively the objects of the present invention, may preferably be 1 to $9.5 \times 10^5$ atomic ppm, more preferably 100 to $8 \times 10^5$ atomic ppm, most preferably 500 to $7 \times 10^5$ atomic ppm.

In the present invention, the layer thickness of the first layer (G) and the thickness of the second layer (S) are one of the important factors for accomplishing effectively the objects of the present invention, and therefore sufficient care should desirably be paid in designing of the light-receiving member so that desirable characteristics may be imparted to the light-receiving member formed.

In the present invention, the layer thickness $T_B$ of the first layer (G) may preferably be 30 Å to 50μ, more preferably 40 Å to 40μ, most preferably 50 Å to 30μ.

On the other hand, the layer thickness T of the second layer (S) may be preferably 0.5 to 90μ, more preferably 1 to 80μ, most preferably 2 to 50μ.

The sum of the above layer thicknesses T and $T_B$, namely $(T+T_B)$ may be suitably determined as desired in designing of the layers of the light-receiving member, based on the mutual organic relationship between the characteristics required for both layer regions and the characteristics required for the whole light-receiving layer.

In the light-receiving member of the present invention, the numerical range for the above $(T_B+T)$ may generally be from 1 to 100μ, preferably 1 to 80μ, most preferably 2 to 50μ.

In a more preferred embodiment of the present invention, it is preferred to select the numerical values for respective thicknesses $T_B$ and T as mentioned above so that the relation of $T_B/T \leq 1$ may be satisfied.

In selection of the numerical values for the thicknesses $T_B$ and T in the above case, the values of $T_B$ and T should preferably be determined so that the relation $T_B/T \leq 0.9$, most preferably, $T_B/T \leq 0.8$, may be satisfied.

In the present invention, when the content of germanium atoms in the first layer (G) is $1 \times 10^5$ atomic ppm or more, the layer thickness $T_B$ should desirably be made considerably thinner, preferably 30μ or less, more preferably 25μ or less, most preferably 20μ or less.

In the present invention, illustrative of halogen atoms (X), which may optionally be incorporated in the first layer (G) and the second layer (S) constituting the light-receiving layer, are fluorine, chlorine, bromine and iodine, particularly preferably fluorine and chlorine.

In the present invention, formation of the first layer (G) constituted of A-SiGe(H,X) may be conducted according to the vacuum deposition method utilizing discharging phenomenon, such as glow discharge method, sputtering method or ion-plating method. For example, for formation of the first layer (G) constituted of A-SiGe(H,X) according to the glow discharge method, the basic procedure comprises introducing a starting gas for Si supply capable of supplying silicon atoms (Si), a starting gas for Ge supply capable of supplying germanium atoms (Ge) optionally together with a starting gas for introduction of hydrogen atoms (H) and/or a starting gas for introduction of halogen atoms (X) into a deposition chamber which can be internally brought to a reduced pressure, and exciting glow discharge in said deposition chamber, thereby effecting layer formation on the surface of a substrate placed at a predetermined position while controlling the depth profile of germanium atoms according to a desired rate of change curve to form a layer constituent of A-SiGe (H,X). Alternatively, for formation according to the sputtering method, when carrying out sputtering by use of two sheets of targets of a target constituted of Si and a target constituted of Ge, or a target of a mixture of Si and Ge in an atmosphere of an inert gas such as Ar, He, etc. or a gas mixture based on these gases, a gas for introduction of hydrogen atoms (H) and/or a gas for introduction of halogen atoms (X) may be introduced, if desired, into a deposition chamber for sputtering.

The starting gas for supplying Si to be used in the present invention may include gaseous or gasifiable hydrogenated silicons (silanes) such as $SiH_4$, $Si_2H_6$, $Si_3H_8$, $Si_4H_{10}$ and others as effective materials. In particular, $SiH_4$ and $Si_2H_6$ are preferred because of easiness in handling during layer formation and high efficiency for supplying Si.

As the substances which can be used as the starting gases for Ge supply, there may be effectively employed gaseous or gasifiable hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. In particular, $GeH_4$, $Ge_2H_6$ and $Ge_3H_8$ are preferred because of easiness in handling during layer formation and high efficiency for supplying Ge.

Effective starting gases for introduction of halogen atoms to be used in the present invention may include a large number of halogenic compounds, as exemplified preferably by halogenic gases, halides, interhalogen compounds, or gaseous or gasifiable halogenic compounds such as silane derivatives substituted with halogens.

Further, there may also be included gaseous or gasifiable hydrogenated silicon compounds containing halogen atoms constituted of silicon atoms and halogen atoms as constituent elements as effective ones in the present invention.

Typical examples of halogen compounds preferably used in the present invention may include halogen gases such as of fluorine, chlorine, bromine or iodine, interhalogen compounds such as BrF, ClF, $ClF_3$, $BrF_5$, $BrF_3$, $IF_3$, $IF_7$, ICl, IBr, etc.

As the silicon compounds containing halogen atoms, namely so called silane derivatives substituted with halogens, there may preferably be employed silicon halides such as $SiF_4$, $Si_2F_6$, $SiCl_4$, $SiBr_4$ and the like.

When the light-receiving member of the present invention is formed according to the glow discharge method by employment of such a silicon compound containing halogen atoms, it is possible to form the first layer (G) constituted of A-SiGe containing halogen atoms on a desired substrate without use of a hydrogenated silicon gas as the starting gas capable of supplying Si together with the starting gas for Ge supply.

In the case of forming the first layer (G) containing halogen atoms according to the glow discharge method, the basic procedure comprises introducing, for example, a silicon halide as the starting gas for Si supply, a hydrogenated germanium as the starting gas for Ge supply and a gas such as Ar, $H_2$, He, etc. at a predetermined mixing ratio into the deposition chamber for formation of the first layer (G) and exciting glow discharge to form a plasma atmosphere of these gases, whereby the first layer (G) can be formed on a desired substrate. In order to control the ratio of hydrogen atoms incorporated more easily, hydrogen gas or a gas of a silicon compound containing hydrogen atoms may also be mixed with these gases in a desired amount to form the layer.

Also, each gas is not restricted to a single species, but multiple species may be available at any desired ratio.

For formation of the first layer (G) comprising A-SiGe(H,X) according to the reactive sputtering method or the ion plating method, for example, in the case of the sputtering method, two sheets of a target of Si and a target of Ge or a target of Si and Ge is employed and subjected to sputtering in a desired gas plasma atmosphere. In the case of the ion-plating method, for example, a vaporizing source such as a polycrystalline silicon or a single crystalline silicon and a polycrystalline germanium or a single crystalline germanium may be placed as vaporizing source in an evaporating boat, and the vaporizing source is heated by the resistance heating method or the electron beam method (EB method) to be vaporized, and the flying vaporized product is permitted to pass through a desired gas plasma atmosphere.

In either case of the sputtering method and the ion-plating method, introduction of halogen atoms into the layer formed may be performed by introducing the gas of the above halogen compound or the above silicon compound containing halogen atoms into a deposition chamber and forming a plasma atmosphere of said gas.

On the other hand, for introduction of hydrogen atoms, a starting gas for introduction of hydrogen atoms, for example, $H_2$ or gases such as silanes and/or hydrogenated germanium as mentioned above, may be introduced into a deposition chamber for sputtering, followed by formation of the plasma atmosphere of said gases.

In the present invention, as the starting gas for introduction of halogen atoms, the halides or halo-containing silicon compounds as mentioned above can effectively be used. Otherwise, it is also possible to use effectively as the starting material for formation of the first layer (G) gaseous or gasifiable substances, including halides containing hydrogen atom as one of the constituents, e.g. hydrogen halide such as HF, HCl, HBr, HI, etc.; halo-substituted hydrogenated silicon such as $SiH_2F_2$, $SiH_2I_2$, $SiH_2Cl_2$, $SiHCl_3$, $SiH_2Br_2$, $SiHBr_3$, etc.; hydrogenated germanium halides such as $GeHF_3$, $GeH_2F_2$, $GeH_3F$, $GeHCl_3$, $GeH_2Cl_2$, $GeH_3Cl$, $GeHBr_3$, $GeH_2Br_2$, $GeH_3Br$, $GeHI_3$, $GeH_2I_2$, $GeH_3I$, etc.; germanium halides such as $GeF_4$, $GeCl_4$, $GeBr_4$, $GeI_4$, $GeF_2$, $GeCl_2$, $GeBr_2$, $GeI_2$, etc.

Among these substances, halides containing halogen atoms can preferably be used as the starting material for introduction of halogens, because hydrogen atoms, which are very effective for controlling electrical or photoelectric characteristics, can be introduced into the layer simultaneously with introduction of halogen atoms during formation of the first layer (G).

For introducing hydrogen atoms structurally into the first layer (G), other than those as mentioned above, $H_2$ or a hydrogenated silicon such as $SiH_4$, $Si_2H_6$, $Si_3H_8$, $Si_4H_{10}$, etc. together with germanium or a germanium compound for supplying Ge, or a hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. together with silicon or a silicon compound for supplying Si can be permitted to co-exist in a deposition chamber, followed by excitation of discharging.

According to a preferred embodiment of the present invention, the amount of hydrogen atoms (H) or the amount of halogen atoms (X) or the sum of the amounts of hydrogen atoms and halogen atoms (H+X) to be contained in the first layer (G) constituting the light-receiving layer to be formed should preferably be 0.01 to 40 atomic %, more preferably 0.05 to 30 atomic %, most preferably 0.1 to 25 atomic %.

For controlling the amount of hydrogen atoms (H) and/or halogen atoms (X) to be contained in the first layer (G), for example, the substrate temperature and/or the amount of the starting materials used for incorporation of hydrogen atoms (H) or halogen atoms (X) to be introduced into the deposition device system, discharging power, etc. may be controlled.

In the present invention, for formation of the second layer (S) constituted of A-Si(H,X), the starting materials (I) for formation of the first layer (G), from which the starting materials for the starting gas for supplying Ge are omitted, are used as the starting materials (II) for formation of the second layer (S), and layer formation can be effected following the same procedure and conditions as in formation of the first layer (G).

More specifically, in the present invention, formation of the second layer region (S) constituted of a-Si(H,X) may be carried out according to the vacuum deposition method utilizing discharging phenomenon such as the glow discharge method, the sputtering method or the ion-plating method. For example, for formation of the second layer (S) constituted of A-Si(H,X) according to the glow discharge method, the basic procedure comprises introducing a starting gas for Si supply capable of supplying silicon atoms (Si) as described above, optionally together with starting gases for introduction of hydrogen atoms (H) and/or halogen atoms (X), into a deposition chamber which can be brought internally to a reduced pressure and exciting glow discharge in said deposition chamber, thereby forming a layer comprising A-Si(H,X) on a desired substrate placed at a predetermined position. Alternatively, for formation according to the sputtering method, gases for introduction of hydrogen atoms (H) and/or halogen atoms (X) may be introduced into a deposition chamber when effecting sputtering of a target constituted of Si in an inert gas such as Ar, He, etc. or a gas mixture based on these gases.

In the present invention, the amount of hydrogen atoms (H) or the amount of halogen atoms (X) or the sum of the amounts of hydrogen atoms and halogen atoms (H+X) to be contained in the second layer (S) constituting the light-receiving layer to be formed should preferably be 1 to 40 atomic %, more preferably 5 to 30 atomic %, most preferably 5 to 25 atomic %.

In the light-receiving member 1004, by incorporating a substance (C) for controlling conductivity in at least the first layer (G) 1002 and/or the second layer (S) 1003, desired conductivity characteristics can be given to the layer containing said substance (C).

In this case, the substance (C) for controlling conductivity may be contained throughout the whole layer region in the layer containing the substance (C) or contained locally in a part of the layer region of the layer containing the substance (C).

Also, in the layer region (PN) containing said substance (C), the distribution state of said substance (C) in the layer thickness direction may be either uniform or nonuniform, but desirably be made uniform within the plane in parallel to the substrate surface. When the distribution state of the substance (C) is nonuniform in the layer thickness direction, and when the substance (C) is to be incorporated in the whole layer region of the first layer (G), said substance (C) is contained in the first layer (G) so that it may be more enriched on the substrate side of the first layer (G).

Thus, in the layer region (PN), when the distribution concentration in the layer thickness direction of the above substance (C) is made nonuniform, optical and electrical junction at the contacted interface with other layers can further be improved.

In the present invention, when the substance (C) for controlling conductivity is incorporated in the first layer (G) so as to be locally present in a part of the layer region, the layer region (PN) in which the substance (C) is to be contained is provided as an end portion layer region of the first layer (G), which is to be determined case by case suitably as desired depending on.

In the present invention, when the above substance (C) is to be incorporated in the second layer (S), it is desirable to incorporate the substance (C) in the layer region including at least the contacted interface with the first layer (G).

When the substance (C) for controlling conductivity is to be incorporated in both the first layer (G) and the second layer (S), it is desirable that the layer region containing the substance (C) in the first layer (G) and the layer region containing the substance (C) in the second layer (S) may contact each other.

Also, the above substance (C) contained in the first layer (G) may be either the same as or different from that contained in the second layer (S), and their contents may be either the same or different.

However, in the present invention, when the above substance (C) is of the same kind in the both layers, it is preferred to make the content in the first layer (G) sufficiently greater, or alternatively to incorporate substances (C) with different electrical characteristics in respective layers desired.

In the present invention, by incorporating a substance (C) for controlling conductivity in at least the first layer (G) and/or the second layer (S) constituting the light-receiving layer, conductivity of the layer region containing the substance (C) [which may be either a part or the whole of the layer region of the first layer (G) and/or the second layer (S)] can be controlled as desired. As a substance (C) for controlling conductivity characteristics, there may be mentioned so called impurities in the field of semiconductors. In the present invention, there may be included p-type impurities giving p-type condutivity characteristics and n-type impurities and/or giving n-type conductivity characteristics to A-Si(H,X) and/or A-SiGe(H,X) constituting the light receiving layer to be formed.

More specifically, there may be mentioned as p-type impurities atoms belonging to the group III of the periodic table (Group III atoms), such as B (boron), Al- (aluminum), Ga(gallium), In(indium), Tl(thallium), etc., particularly preferably B and Ga.

As n-type impurities, there may be included the atoms belonging to the group V of the periodic table, such as P (phosphorus), As (arsenic), Sb (antimony), Bi (bismuth), etc., particularly preferably P and As.

In the present invention, the content of the substance (C) for controlling conductivity in the layer region (PN) may be suitably be determined depending on the conductivity required for said layer region (PN), or when said layer region (PN) is provided in direct contact with the substrate, the organic relationships such as relation with the characteristics at the contacted interface with the substrate, etc.

Also, the content of the substance (C) for controlling conductivity is determined suitably with due considerations of the relationships with characteristics of other layer regions provided in direct contact with said layer region or the characteristics at the contacted interface with said other layer regions.

In the present invention, the content of the substance (C) for controlling conductivity contained in the layer region (PN) should preferably be 0.01 to $5 \times 10^4$ atomic ppm, more preferably 0.5 to $1 \times 10^4$ atomic ppm, most preferably 1 to $5 \times 10^3$ atomic ppm.

In the present invention, by making the content of said substance (C) in the layer region (PN) preferably 30 atomic ppm or more, more preferably 50 atomic ppm or more, most preferably 100 atomic ppm or more, for example, in the case when said substance (C) to be incorporated is a p-type impurity as mentioned above, migration of electrons injected from the substrate side into the light-receiving layer can be effectively inhibited when the free surface of the light-receiving layer is subjected to the charging treatment to $\oplus$ polarity. On the other hand, when the substance to be incorporated is a n-type impurity, migration of positive holes injected from the substrate side into the light-receiving layer may be effectively inhibited when the free surface of the light-receiving layer is subjected to the charging treatment to $\ominus$ polarity.

In the case as mentioned above, the layer region (Z) at the portion excluding the above layer region (PN) under the basic constitution of the present invention as described above may contain a substance for controlling conductivity of the other polarity, or a substance for controlling conductivity having characteristics of the same polarity may be contained therein in an amount by far smaller than that practically contained in the layer region (PN).

In such a case, the content of the substance (C) for controlling conductivity contained in the above layer region (Z) can be determined adequately as desired depending on the polarity or the content of the substance contained in the layer region (PN), but it is preferably 0.001 to 1000 atomic ppm, more preferably 0.05 to 500 atomic ppm, most preferably 0.1 to 200 atomic ppm.

In the present invention, when the same kind of a substance for controlling conductivity is contained in the layer region (PN) and the layer region (Z), the content in the layer region (Z) should preferably be 30 atomic ppm or less.

In the present invention, it is also possible to provide a layer region containing a substance for controlling conductivity having one polarity and a layer region containing a substance for controlling conductivity having the other polarity in direct contact with each other, thus providing a so called depletion layer at said contact region.

In short, for example, a layer containing the aforesaid p-type impurity and a layer region containing the aforesaid n-type impurity are provided in the light-receiving layer in direct contact with each other to form the so called p-n junction, whereby a depletion layer can be provided.

FIGS. 27 through 35 show typical examples of the depth profiles in the layer thickness direction of the substance (C) contained in the layer region (PN) in the light-receiving layer of the present invention. In each of these Figures, representations of layer thickness and concentration are shown in rather exaggerated forms for illustrative purpose, since the difference between respective Figures will be indistinct if represented by the real values as such, and it should be understood that these Figures are schematic in nature. As practical distribution, the values of ti ($1 < i < 9$) or Ci ($1 < i < 17$) should be chosen so as to obtain desired distribution concentration lines, or values obtained by multiplying the distribution curve as a whole with an appropriate coefficient should be used.

In FIGS. 27 through 35, the abscissa shows the distribution concentration C of the substance (C), and the ordinate the layer thickness of the layer region (PN), $t_B$ indicating the position of the end surface on the substrate side of the layer region (G) and $t_T$ the position of the end surface on the side opposite to the substrate side. Thus, layer formation of the layer region (PN) containing the substance (C) proceeds from the $t_B$ side toward the $t_T$ side.

Figure 27:
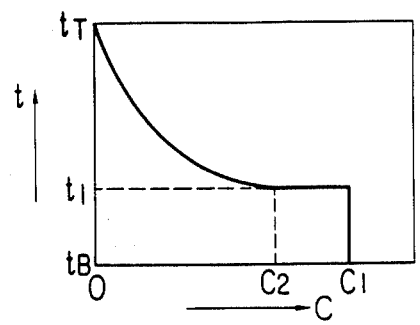
FIGS. 27 through 35 are schematic illustrations of the distribution state of the substance (C) in the layer region (PN)

FIG. 27 shows a first typical example of the depth profile of the substance (C) in the layer thickness direction contained in the layer region (PN).

In the embodiment shown in FIG. 27, from the interface position $t_B$ where the surface at which the layer region (PN) containing the substance (C) contacts the surface of said layer (G) to the position $t_1$, the substance (C) is contained in the layer region (PN) formed while the distribution concentration C of the substance (C) taking a constant value of $C_1$, and the concentration is gradually decreased from the concentration $C_2$ continuously from the position $t_1$ to the interface position $t_T$. At the interface position $t_T$, the distribution concentration C of the substance (C) is made substantially zero (here substantially zero means the case of less than detectable limit).

Figure 28:
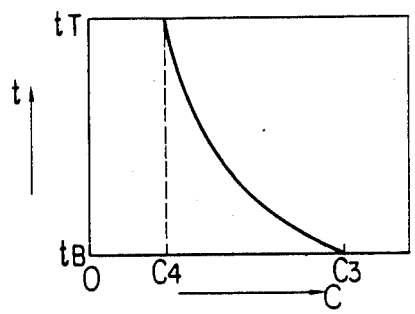

In the embodiment shown in FIG. 28, the distribution concentration C of the substance (C) contained is decreased from the position $t_B$ to the position $t_T$ gradually and continuously from the concentration $C_3$ to the concentration $C_4$ at $t_T$.

Figure 29:
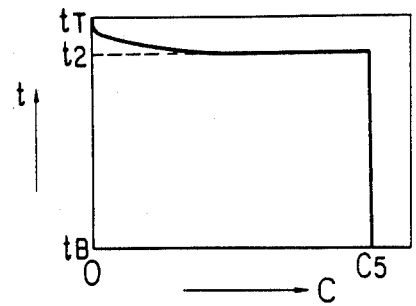

In the case of FIG. 29, from the position $t_B$ to the position $t_2$, the distribution concentration C of the substance (C) is made constantly at $C_5$, while between the position $t_2$ and the position $t_T$, it is gradually and continuously decreased, until the distribution concentration is made substantially zero at the position $t_T$.

Figure 30:
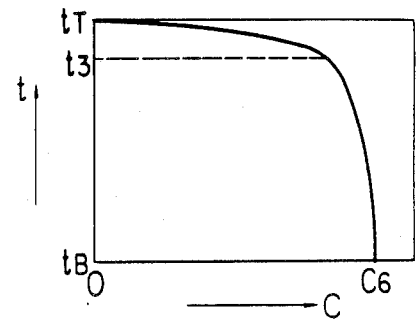

In the case of FIG. 30, the distribution concentration C of the substance (C) is first decreased continuously and gradually from the concentration $C_6$ from the position $t_B$ to the position $t_3$, from where it is abruptly decreased to substantially zero at the position $t_T$.

Figure 31:
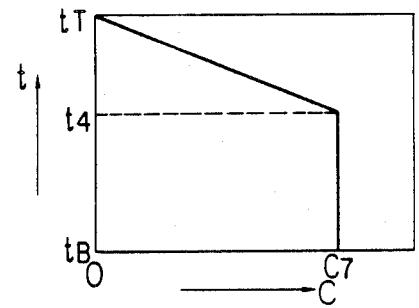

In the embodiment shown in FIG. 31, the distribution concentration of the substance (C) is constantly $C_7$ between the position $t_B$ and the position $t_T$, and the distribution concentration is made zero at the position $t_T$. Between the $t_4$ and the position $t_T$, the distribution concentration C is decreased as a first order function from the position $t_4$ to the position $t_T$.

Figure 32:
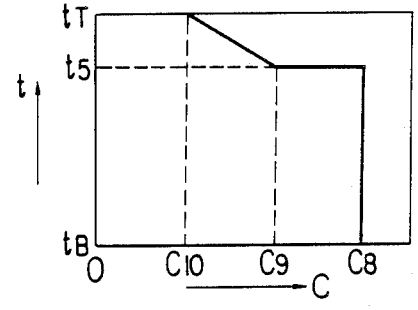

In the embodiment shown in FIG. 32, the distribution concentration C takes a constant value of $C_8$ from the position $t_B$ to the position $t_5$, while it was decreased as a first order function from the concentration $C_9$ to the concentration $C_{10}$ from the position $t_5$ to the position $t_T$.

Figure 33:
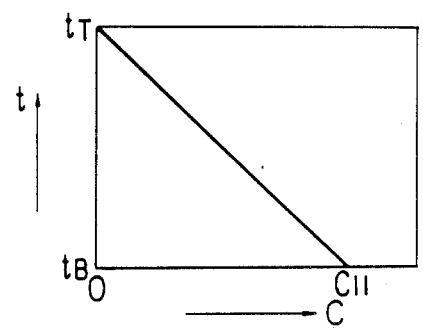

In the embodiment shown in FIG. 33, from the position $t_B$ to the position $t_T$, the distribution concentration C of the substance (C) is decreased continuously as a first order function from the concentration $C_{11}$ to zero.

Figure 34:
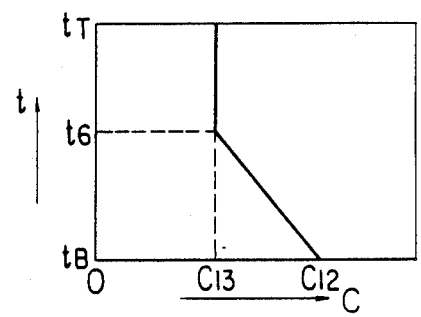

In FIG. 34, there is shown an embodiment, in which, from the position $t_B$ to the position $t_6$, the distribution concentration C of the substance C is decreased as a first order function from the concentration $C_{12}$ to the concentration $C_{13}$, and the concentration is made a constant value of $C_{13}$ between the position $t_6$ and the position $t_T$.

Figure 35:
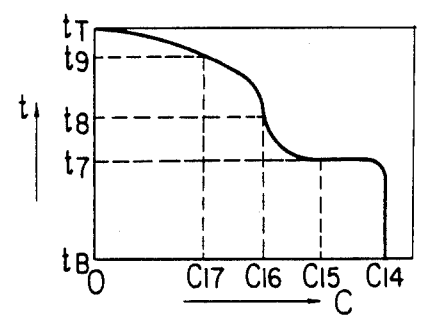

In the embodiment shown in FIG. 35, the distribution concentration C of the substance (C) is $C_{14}$ at the position $t_B$, which is gradually decreased initially from $C_{14}$ and then abruptly near the position $t_7$, where it is made $C_{15}$ at the position $t_7$.

Between the position $t_7$ and the position $t_8$, the concentration is initially abruptly decreased and then moderately gradually, until it becomes $C_{16}$ at the position $t_8$, and between the position $t_8$ and the position $t_9$, the concentration is gradually decreased to reach $C_{17}$ at the position $t_9$. Between the position $t_9$ and the position $t_T$, the concentration is decreased from $C_{17}$, following the curve with a shape as shown in Figure, to substantially zero.

As described above by referring to some typical examples of depth profiles in the layer thickness direction of the substance (C) contained in the layer region (PN) shown FIGS. 27 through 35, it is desirable in the present invention that a depth profile of the substance (C) should be provided in the layer region (PN) so as to have a portion with relatively higher distribution concentration C of the substance (C) on the substrate side, while having a portion on the interface $t_T$ side where said distribution concentration is made considerably lower as compared with the substrate side.

The layer region (PN) constituting the light-receiving member in the present invention is desired to have a localized region (B) containing the substance (C) preferably at a relatively higher concentration on the substrate side as described above.

In the present invention, the localized region (B) as explained in terms of the symbols shown in FIGS. 27 through 35, may be desirably provided within 5µ from the interface position $t_B$.

In the present invention, the above localized region (B) may be made to be identical with the whole of the layer region (L) from the interface position $t_B$ to the thickness of 5µ, Or alternatively a part of the layer region (L).

It may suitably be determined depending on the characteristics required for the light-receiving layer to be formed whether the localized region (B) should be made a part or the whole of the layer region (L).

For formation of the layer region (PN) containing the aforesaid substance (C) by incorporating a substance (C) for controlling conductivity such as the group III atoms or the group V atoms structurally into the light-receiving layer, a starting material for introduction of the group III atoms or a starting material for introduction of the group V atoms may be introduced under gaseous state into a deposition chamber together with other starting materials for formation of the respective layers during layer formation.

As the starting material which can be used for introduction of the group III atoms, it is desirable to use those which are gaseous at room temperature under atmospheric pressure or can readily be gasified under layer forming conditions. Typical examples of such starting materials for introduction of the group III atoms, there may be included as the compounds for * introduction of boron atoms boron hydrides such as $B_2H_6$, $B_4H_{10}$, $B_5H_9$, $B_5H_{11}$, $B_6H_{10}$, $B_6H_{12}$, $B_6H_{14}$, etc. and boron halides such as $BF_3$, $BCl_3$, $BBr_3$, etc. Otherwise, it is also possible to use $AlCl_3$, $GaCl_3$, $Ga(CH_3)_3$, $InCl_3$, $TlCl_3$ and the like.

The starting materials which can effectively be used in the present invention for introduction of the group V atoms may include, for introduction of phosphorus atoms, phosphorus hydrides such as $PH_3$, $P_2H_4$, etc., phosphorus halides such as $PH_4I$, $PF_3$, $PF_5$, $PCl_3$, $PCl_5$, $PBr_3$, $PBr_5$, $PI_3$ and the like. Otherwise, it is possible to utilize $AsH_3$, $AsF_3$, $AsCl_3$, $AsBr_3$, $AsF_5$, $SbH_3$, $SbF_3$, $SbF_5$, $SbCl_3$, $SbCl_5$, $SbCl$, $BiH_3$, $BiCl_3$, $BiBr_3$ and the like effectively as the starting material for introduction of the group V atoms.

In the light-receiving member of the present invention, for the purpose of obtaining higher photosensitivity and dark resistance, and further for the purpose of improving adhesion between the substrate and the light-receiving layer, at least one kind of atoms selected from oxygen atoms and nitrogen atoms can be contained in the light-receiving layer in either uniform or ununiform distribution state in the layer thickness direction. Such atoms (ON) to be contained in the light-receiving layer may be contained therein throughout the whole layer region of the light-receiving layer or localized by being contained in a part of the layer region of the light-receiving layer.

The distribution concentration C (O N) of the atoms (O N) should desirably be uniform within the plane parallel to the surface of the substrate.

In the present invention, the layer region (O N) where atoms (O N) are contained is provided so as to occupy the whole layer region of the light-receiving layer when it is primarily intended to improve photosensitivity and dark resistance, while it is provided so as to occupy the end portion layer region on the substrate side of the light-receving layer when it is primarily intended to strengthen adhesion between the substrate and the light-receiving layer.

In the former case, the content of atoms (O N) contained in the layer region (O N) should desirably be made relatively smaller in order to maintain high photosensitivity, while in the latter case relatively larger in order to ensure reinforcement of adhesion to the substrate.

In the present invention, the content of the atoms (O N) to be contained in the layer region (O N) provided in the light-receiving layer can be selected suitably in organic relationship with the characteristics required for the layer region (O N) itself, or with the characteristic at the contacted interface with the substrate when the said layer region (O N) is provided in direct contact with the substrate, etc.

When other layer regions are to be provided in direct contact with the layer region (O N), the content of the atoms (O N) may suitably be selected with due considerations about the characteristics of said other layer regions or the characteristics at the contacted interface with said other layer regions.

The amount of the atoms (O N) contained in the layer region (O N) may be determined as desired depending on the characteristics required for the light-receiving member to be formed, but it may preferably be 0.001 to 50 atomic %, more preferably 0.002 to 40 atomic %, most preferably 0.003 to 30 atomic %.

In the present invention, when the layer region (O N) occupies the whole region of the light-receiving layer or, although not occupying the whole region, the proportion of the layer thickness $T_O$ of the layer region (O N) occupied in the layer thickness T of the light-receiving layer is sufficiently large, the upper limit of the content of the atoms (O N) contained in the layer region (O N) should desirably be made sufficiently smaller than the value as specified above.

In the case of the present invention, when the proportion of the layer thickness $T_O$ of the layer region (O N) occupied relative to the layer thickness T of the light-receiving layer is 2/5 or higher, the upper limit of the atoms (O N) contained in the layer region (O N) should desirably be made 30 atomic % or less, more preferably 20 atomic % or less, most preferably 10 atomic % or less.

According to a preferred embodiment of the present invention, it is desirable that the atoms (O N) should be contained in at least the above first layer to be provided directly on the substrate. In short, by incorporating the atoms (O N) at the end portion layer region on the substrate side in the light-receiving layer, it is possible to effect reinforcement of adhesion between the substrate and the light-receiving layer.

Further, in the case of nitrogen atoms, for example, under the co-presence with boron atoms, improvement of dark resistance and improvement of photosensitivity can further be ensured, and therefore they should preferably be contained in a desired amount in the light-receiving layer.

Plural kinds of these atoms (O N) may also be contained in the light-receiving layer. For example, oxygen atoms may be contained in the first layer, nitrogen atoms in the second layer, or alternatively oxygen atoms and nitrogen atoms may be permitted to be co-present in the same layer region.

FIGS. 43 through 51 show typical examples of ununiform depth profiles in the layer thickness direction of the atoms (O N) contained in the layer region (O N) in the light-receiving member of the present invention.

In FIGS. 43 through 51, the abscissa indicates the distribution concentration C of the atoms (O N), and the ordinate the layer thickness of the layer region (O N), $t_B$ showing the position of the end surface of the layer region on the substrate side, while $t_T$ shows the position of the end face of the layer region (O N) opposite to the substrate side. Thus, layer formation of the layer region (O N) containing the atoms (O N) proceeds from the $t_B$ side toward the $t_T$ side.

Figure 43:
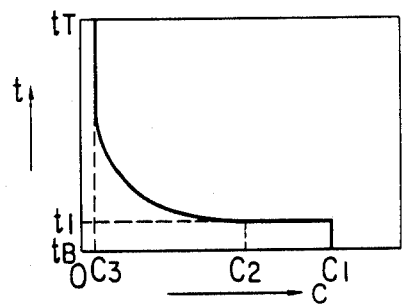
FIGS. 43 through 51 are schematic illustrations of the distribution states of the atoms (OCN) in the layer region (ON).

FIG. 43 shows a first typical embodiment of the depth profile in the layer thickness direction of the atoms (O N) contained in the layer region (O N).

In the embodiment shown in FIG. 43, from the interface position $t_B$ where the surface on which the layer region (O N) containing the atoms (O N) is formed contacts the surface of said layer region (O N) to the position of $t_1$, the atoms (O N) are contained in the layer region (O N) to be formed while the distribution concentration of the atoms (O N) taking a constant value of $C_1$, said distribution concentration being gradually continuously reduced from $C_2$ from the position $t_1$ to the interface position $t_T$, until at the interface position $t_T$, the distribution concentration C is made $C_3$.

Figure 44:
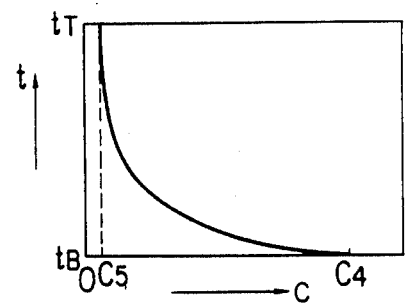

In the embodiment shown in FIG. 44, the distribution concentration C of the atoms (O N) contained is reduced gradually continuously from the concentration $C_4$ from the position $t_B$ to the position $t_T$, at which it becomes the concentration $C_5$.

Figure 45:
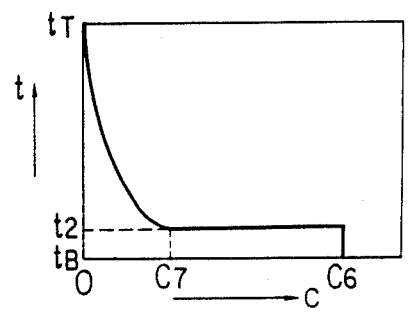

In the case of FIG. 45, from the position $t_B$ to the position $t_2$, the distribution concentration of the atoms (O N) is made constantly at $C_6$, reduced gradually continuously from the concentration $C_7$ between the position $t_2$ and the position $t_T$, until at the position $t_T$, the distribution concentration C is made substantially zero (here substantially zero means the case of less than the detectable level).

Figure 46:
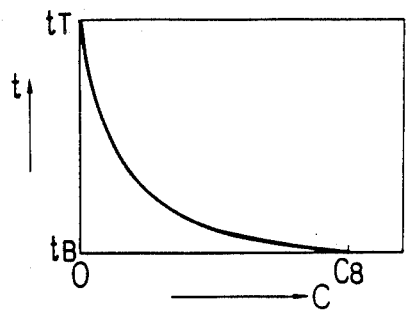

In the case of FIG. 46, the distribution concentration C of the atoms (O N) is reduced gradually continuously from the concentration $C_8$ from the position $t_B$ up to the position $t_T$, to be made substantially zero at the position $t_T$.

Figure 47:
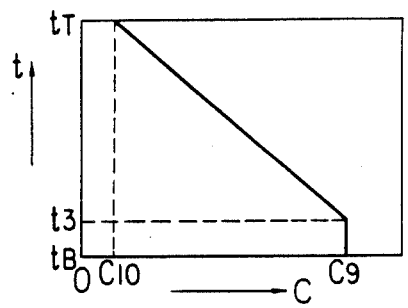

In the embodiment shown in FIG. 47, the distribution concentration C of the atoms (O N) is made constantly $C_9$ between the position $t_B$ and the position $t_3$, and it is made the concentration $C_{10}$ at the position $t_T$. Between the position $t_3$ and the position $t_T$, the distribution concentration C is reduced from the concentration $C_9$ to substantially zero as a first order function from the position $t_3$ to the position $t_T$.

Figure 48:
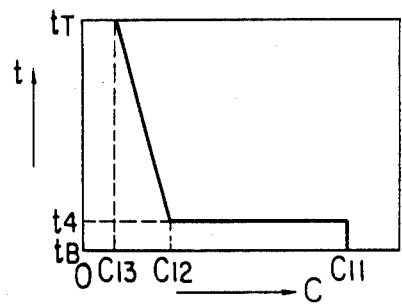

In the embodiment shown in FIG. 48, from the position $t_B$ to the position $t_4$, the distribution concentration C takes a constant value of $C_{11}$, while the distribution state is changed to a first order function in which the concentration is decreased from the concentration $C_{12}$ to the concentration $C_{13}$ from the position $t_4$ to the position $t_T$, and the concentration C is made substantially zero at the position $t_T$.

Figure 49:
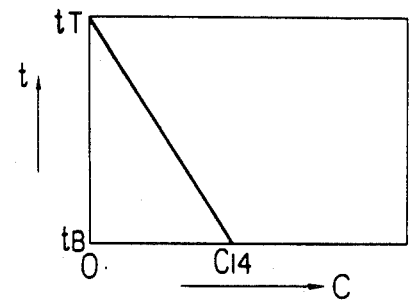

In the embodiment shown in FIG. 49, from the position $t_B$ to the position $t_T$, the distribution concentration C of the atoms (O N) is reduced as a first order function from the concentration $C_{14}$ to substantially zero.

Figure 50:
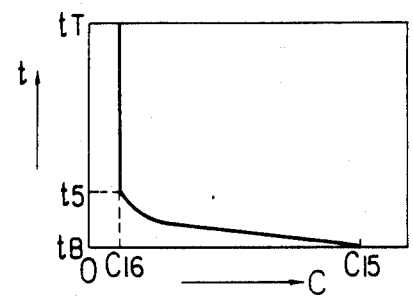

In FIG. 50, there is shown an embodiment, wherein from the position $t_B$ to the position $t_5$, the distribution concentration of the atoms (O N) is reduced approximately as a first order function from the concentration $C_{15}$ to $C_{16}$, and it is made constantly $C_{16}$ between the position $t_5$ and the position $t_T$.

Figure 51:
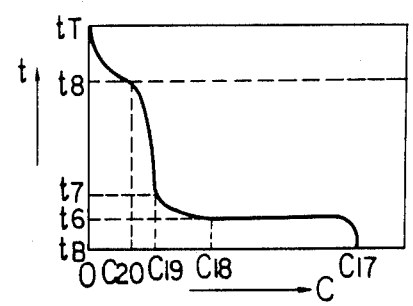

In the embodiment shown in FIG. 51, the distribution concentration C of the atoms (O N) is $C_{17}$ at the position $t_B$, and, toward the position $t_6$, this $C_{17}$ is initially reduced gradually and then abruptly reduced near the position $t_6$, until it is made the concentration $C_{18}$ at the position $t_6$.

Between the position $t_6$ and the position $t_7$, the concentration is initially reduced abruptly and thereafter gently gradually reduced to become $C_{19}$ at the position $t_7$, and between the position $t_7$ and the position $t_8$, it is reduced very gradually to become $C_{20}$ at the position $t_8$. Between the position $t_8$ and the position $t_T$, the concentration is reduced from the concentration $C_{20}$ to substantially zero along a curve with a shape as shown in the Figure.

As described above about some typical examples of depth profiles in the layer thickness direction of the atoms (O N) contained in the layer region (O N) by referring to FIGS. 43 through 51, it is desirable in the present invention that, when the atoms (O N) are to be contained ununiformly in the layer region (O N), the atoms (O N) should be distributed in the layer region (O N) with higher concentration on the substrate side while having a portion considerably depleted in concentration on the interface $t_T$ side as compared with the substrate side.

The layer region (O N) containing atoms (O N) should desirably be provided so as to have a localized region (B) containing the atoms (O N) at a relatively higher concentration on the substrate side as described above, and in this case, adhesion between the substrate and the light-receiving layer can be further improved.

The above localized region (B) should desirably be provided within $5\mu$ from the interface position $t_B$, as explained in terms of the symbols indicated in FIGS. 43 through 51.

In the present invention, the above localized region (B) may be made the whole of the layer region ($L_T$) from the interface position $t_B$ to $5\mu$ thickness or a part of the layer region ($L_T$).

It may suitably be determined depending on the characteristics required for the light-receiving layer to be formed whether the localized region (B) is made a part or the whole of the layer region ($L_T$).

The localized region (B) should preferably be formed to have a depth profile in the layer thickness direction such that the maximum value Cmax of the distribution concentration of the atoms (O N) may preferably be 500 atomic ppm or more, more preferably 800 atomic ppm or more, most preferably 1000 atomic ppm or more.

In other words, in the present invention, the layer region (O N) containing the atoms (O N) should preferably be formed so that the maximum value Cmax of the distribution concentration C may exist within $5\mu$ layer thickness from the substrate side (in the layer region with $5\mu$ thickness from $t_B$).

In the present invention, when the layer region (O N) is provided so as to occupy a part of the layer region of the light-receiving layer, the depth profile of the atoms (O N) should desirably be formed so that the refractive index may be changed moderately at the interface between the layer region (O N) and other layer regions.

By doing so, reflection of the light incident upon the light-receiving layer from the interface between contacted interfaces can be inhibited, whereby appearance of interference fringe pattern can more effectively be prevented.

It is also preferred that the distribution concentration C of the atoms (O N) in the layer region (O N) should be changed along a line which is changed continuously and moderately, in order to give smooth refractive index change.

In this regard, it is preferred that the atoms (O N) should be contained in the layer region (O N) so that the depth profiles as shown, for example, in FIGS. 43 through 46, FIG. 49 and FIG. 51 may be assumed.

In the present invention, for provision of a layer region (O N) containing the atoms (O N) in the light-receiving layer, a starting material for introduction of the atoms (O N) may be used together with the starting material for formation of the light-receiving layer during formation of the light-receiving layer and incorporated in the layer formed while controlling its amount.

When the glow discharge method is employed for formation of the layer region (O N), a starting material for introduction of the atoms (O N) is added to the material selected as desired from the starting materials for formation of the light-receiving layer as described above. For such a starting material for introduction of the atoms (O N), there may be employed most of gaseous or gasified gasifiable substances containing at least the atoms (O N) as the constituent atoms.

More specifically, there may be included, for example, oxygen ($O_2$), ozone ($O_3$), nitrogen monoxide (NO), nitrogen dioxide ($NO_2$), dinitrogen monoxide ($N_2O$), dinitrogen trioxide ($N_2O_3$), dinitrogen tetraoxide ($N_2O_4$), dinitrogen pentaoxide ($N_2O_5$), nitrogen trioxide ($NO_3$); lower siloxanes containing silicon atom (Si), oxygen atom (O) and hydrogen atom (H) as constituent atoms, such as disiloxane ($H_3SiOSiH_3$), trisiloxane ($H_3SiOSiH_2OSiH_3$), and the like; nitrogen ($N_2$), ammonia ($NH_3$), hydrazine ($H_2NNH_2$), hydrogen azide ($HN_3$), ammonium azide ($NH_4N_3$), nitrogen trifluoride ($F_3N$), nitrogen tetrafluoride ($F_4N$) and so on.

In the case of the sputtering method, as the starting material for introduction of the atoms (O N), there may also be employed solid starting materials such as $SiO_2$, Si and carbon black in addition to those gasifiable as enumerated for the glow discharge method. These can be used in the form of a target for sputtering together with the target of Si, etc.

In the present invention, when forming a layer region (O N) containing the atoms (O N) during formation of the light-receiving layer, formation of the layer region (O N) having a desired depth profile in the direction of layer thickness formed by varying the distribution concentration C of the atoms (O N) contained in said layer region (O N) may be conducted in the case of glow discharge by introducing a starting gas for introduction of the atoms (O N) the distribution concentration C of which is to be varied into a deposition chamber, while varying suitably its gas flow rate according to a desired change rate curve.

For example, by the manual method or any other method conventionally used such as an externally driven motor, etc., the opening of a certain needle valve provided in the course of the gas flow channel system may be gradually varied. During this operation, the rate of variation is not necessarily required to be linear, but the flow rate may be controlled according to a variation rate curve previously designed by means of, for example, a microcomputer to give a desired content curve.

When the layer region (O N) is formed according to the sputtering method, formation of a desired depth profile of the atoms (O N) in the layer thickness direction by varying the distribution concentration C of the atoms (O N) may be performed first similarly as in the case of the glow discharge method by employing a starting material for introduction of the atoms (O N) under gaseous state and varying suitably as desired the gas flow rate of said gas when introduced into the deposition chamber. Secondly, formation of such a depth profile can also be achieved by previously changing the composition of a target for sputtering. For example, when a target comprising a mixture of Si and $SiO_2$ is to be used, the mixing ratio of Si to $SiO_2$ may be varied in the direction of layer thickness of the target.

In the light-receiving members 2100 and 1004 shown in FIG. 21 and FIG. 10, the surface layer 2105 or 1005 formed on the photosensitive layer 2104 or the second layer 1003 has a free surface and is provided for accomplishing the objects of the present invention primarily in humidity resistance, continuous repeated use characteristic, dielectric strength, use environmental characteristic, mechanical durability and light-receiving characteristic.

The surface layer in the present invention is constituted of an amorphous material containing silicon atoms (Si) and carbon atoms (C), optionally together with hydrogen atoms (H) and/or halogen atoms (X)(hereinafter written as "a-$(Si_xC_{1-x})_y(H,X)_{1-y}$", where $0<x, y\leq 1$).

Formation of the surface layer constituted of a-$(Si_xC_{1-x})_y(H,X)_{1-y}$ may be performed according to the plasma chemical vapor deposition method (PCVD method) such as glow discharge method, the optical CVD method, the thermal CVD method, the sputtering method, the electron beam method, etc.

These preparation methods may be suitably selected depending on various factors such as the preparation conditions, the extent of the load for capital investment for installations, the production scale, the desirable characteristics required for the light-receiving member to be prepared, etc. For the advantages of relatively easy control of the preparation conditions for preparing light-receiving members having desired characteristics and easy introduction of carbon atoms and halogen atoms together with silicon atoms into the surface layer to be prepared, there may preferably be employed the glow discharge method or the sputtering method. Further, in the present invention, the glow discharge method and the sputtering method may be used in combination in the same device system to form the surface layer.

For formation of the surface layer according to the glow discharge method, starting gases for formation of a-$(Si_xC_{1-x})_y(H,X)_{1-y}$, which may optionally be mixed with a diluting gas at a predetermined mixing ratio, may be introduced into a vacuum deposition chamber in which a substrate is placed, and glow discharge is excited in said deposition chamber to form the gases introduced into a gas plasma, thereby depositing a-$(Si_xC_{1-x})_y(H,X)_{1-y}$ on the layer formed on the above substrate.

In the present invention, as the starting gases for formation of a-$(Si_xC_{1-x})_y(H,X)_{1-y}$, there may be employed most of substances containing at least one of silicon atom (Si), carbon atom (C), hydrogen atoms (H) and halogen atoms (X) as constituent atoms which are gaseous substances or gasified substances of readily gasifiable ones.

When employing a starting gas containing Si as constituent atom as one of Si, C, H and X, for example, there may be employed a mixture of a starting gas containing Si as constituent atom, a starting gas containing C as constituent atom and optionally a starting gas containing H as constituent atom and/or a starting gas containing X as constituent atom at a desired mixing ratio, or a mixture of a starting gas containing Si as constituent atom and a starting gas containing C and H as constituent atoms and/or a starting gas containing C and X as constituent atoms also at a desired mixing ratio, or a mixture of a starting gas containing Si as constituent atom and a starting gas containing three constituent atoms of Si, C and H or a starting gas containing three constituent atoms of Si, C and X.

Alternatively, it is also possible to use a mixture of a starting gas containing Si and H as constituent atoms with a starting gas containing C as constituent atom or a mixture of a starting gas containing Si and X as constituent atoms and a starting gas containing C as constituent atom.

In the present invention, suitable halogen atoms (X) contained in the surface layer are F, Cl, Br and I, particularly preferably F and Cl.

In the present invention, the starting gases which can be effectively used for formation of the surface layer may preferably include those which are gaseous under conditions of ordinary temperature and atmospheric pressure or can be readily gasified.

In the present invention, the starting gases effectively used for formation of the surface layer may include silicon hydride gases containing silicon atoms and hydrogen atoms as constituent atoms such as silanes, for example, $SiH_4$, $Si_2H_6$, $Si_3H_8$, $Si_4H_{10}$, etc., compounds containing carbon atoms and hydrogen atoms as constituent atoms such as saturated hydrocarbons having 1 to 4 carbon atoms, ethylenic hydrocarbons having 2 to 4 carbon atoms and acetylenic hydrocarbons having 2 to 3 carbon atoms, single substances of halogen, hydrogen halides, interhalogen compounds, silicon halide, halogen-substituted silicon hydride, silicon hydride, etc.

More specifically, they may include, as the saturated hydrocarbons, methane ($CH_4$), ethane ($C_2H_6$), propane ($C_3H_8$), n-butane (n-$C_4H_{10}$), pentane ($C_5H_{12}$); as the ethylenic hydrocarbons, ethylene ($C_2H_4$), propylene ($C_3H_6$), butene-1 ($C_4H_8$), butene-2 ($C_4H_8$), isobutylene ($C_4H_8$), pentene ($C_5H_{10}$); as the acetylenic hydrocarbons, acetylene ($C_2H_2$), methyl acetylene ($C_3H_4$), butyne ($C_4H_6$); as the single substances of halogen, fluorine, chlorine, bromine and iodine; as the hydrogen halides, HF, HI, HCl and HBr; as the interhalogen compounds, BrF, ClF, $ClF_3$, $ClF_5$, $BrF_5$, $BrF_3$, $IF_5$, $IF_7$, ICl, IBr; as the silicon halides, $SiF_4$, $Si_2F_6$, $SiCl_3Br$, $SiCl_2Br_2$, $SiClBr_3$, $SiCl_3I$, $SiBr_4$; as the halogen-substituted silicon hydride, $SiH_2F_2$, $SiH_2Cl_2$, $SiH_3Cl$, $SiH_3Br$, $SiH_2Br_2$, $SiHBr_3$, etc.; and so on.

Besides, it is also possible to use halogen-substituted paraffinic hydrocarbons such as $CF_4$, $CCl_4$, $CBr_4$, $CHF_3$, $CH_2F_2$, $CH_3F$, $CH_3Cl$, $CH_3Br$, $CH_3I$, $C_2H_5Cl$, etc.; fluorinated sulfur compounds such as $SF_4$, $SF_6$, etc.; silane derivatives, including alkyl silanes such as $Si(CH_3)_4$, $Si(C_2H_5)_4$, etc. and halogen-containing alkyl silanes such as $SiCl(CH_3)_3$, $SiCl_2(CH_3)_2$, $SiCl_3CH_3$, etc. as effective ones.

These materials for formation of the surface layer may be selected and used as desired in formation of the surface layer so that silicon atoms, carbon atoms and halogen atoms, optionally together with hydrogen atoms, may exist in a predetermined composition ratio in the surface layer.

For example, $Si(CH_3)_4$ as the material capable of easily adding silicon atoms, carbon atoms and hydrogen atoms and forming a layer having desired characteristics and $SiHCl_3$, $SiCl_4$, $SiH_2Cl_2$ or $SiH_3Cl$ as the material for adding halogen atoms may be mixed in a predetermined mixing ratio and introduced under a gaseous state in to a device for formation of a surface layer, followed by excitation of glow discharge, whereby a surface layer comprising a-$(Si_xC_{1-x})_y(Cl+H)_{1-y}$ can be formed.

For formation of the surface layer according to the sputtering method, any of single crystalline or polycrystalline Si wafer, C wafer and wafer containing Si and C as mixed therein is used as a target and subjected to sputtering in an atmosphere of various gases containing, if necessary, halogen atoms and/or hydrogen atoms as constituents. For example, when an Si wafer is used as a target, starting gases for introducing C and H and/or X, which may be diluted with a dilution gas, if desired, are introduced into a a deposition chamber for sputtering to form a gas plasma of these gases therein and effect sputtering of said silicon wafer.

Alternatively, Si and C as separate targets or one target sheet of a mixture of Si and C can be used and sputtering is effected in a gas atmosphere containing, if desired, hydrogen atoms and/or halogen atoms. As the starting gases for introduction of C, H and X, sunstances for forming the surface layer as shown in the example of the glow discharge method as described above can be used as effective materials also for the sputtering.

In the present invention, the dilution gas to be used in the formation of the surface layer by the glow discharge method or the sputtering method may include the so-called rare gases such as He, Ne and Ar as preferable ones.

The surface layer in the present invention should be carefully formed so that the required characteristics may be given exactly as desired. That is, the substance containing silicon atoms, carbon atoms, and, if necessary, hydrogen atoms and/or halogen atoms as the constituent atoms can take structural forms ranging from crystalline to amorphous and show electrical properties ranging from conductive through semi-conductive to insulating and photoconductive properties ranging from photoconductive to non-photoconductive. Therefore, in the present invention, the preparation conditions are strictly selected as desired so as to form a-$(Si_xC_{1-x})_y(H,X)_{1-y}$ having characteristics desired for the purpose. For example, when the surface layer is to be provided primarily for the purpose of improvement of dielectric strength, a-$(Si_xC_{1-x})_y(H,X)_{1-y}$ is prepared as an amorphous material having marked electric insulating behaviours under the service environment.

Alternatively, when the primary purpose of the formation of the surface layer is an improvement of continuous repeated use characteristics or service environmental characteristics, the degree of the above electric insulating property may be alleviated to some extent and a-$(Si_xC_{1-x})_y(H,X)_{1-y}$ may be prepared as an amorphous material having a sensitivity to some extent to the irradiation light.

In forming the surface layer consisting of a-$(Si_xC_{1-x})_y(H,X)_{1-y}$, the substrate temperature during the layer formation is an important factor having influences on the constitution and the characteristics of the layer to be formed, and it is desired in the present invention to strictly control the substrate temperature during the layer formation so as to obtain a-$(Si_xC_{1-x})_y(H,X)_{1-y}$ having the desired characteristics.

For forming the surface layer, an optimum temperature range is selected in conformity with the method for forming the surface layer to effectively attain the disired objects of the present invention. During the formation of the layer, the substrate temperature is preferably 20° to 400° C., more prererably 50° to 350° C., and most preferably 100° to 300° C. For the formation of the surface layer, the glow discharge method or the sputtering method may be advantageously used, because fine control of the composition ratio of atoms existing in the layer or control of layer thickness can be conducted with relative ease as compared with other methods. In case that the surface layer is formed according to these layer forming methods, the discharging power during the formation of the layer is one of important factors influencing the characteristics of a-$(Si_xC_{1-x})_y(H,X)_{1-y}$ similarly to the aforesaid substrate temperature.

The discharging power condition for the effective preparation with a good productivity of the a-$(Si_xC_{1-x})_y(H,X)_{1-y}$ having characteristics for accomplishing the objects of the present invention may preferably be 10 to 1000 W more preferably 20 to 750 W, and most preferably 50 to 650 W.

The gas pressure in a deposition chamber may preferably be 0.01 to 1 Torr, and more preferably 0.1 to 0.5 Torr.

In the present invention, the above numerical ranges can be mentioned as preferable ones for the substrate temperature, discharging power for the preparation of the surface layer. However, these factors for the formation of the layer are not selected separately and independently of each other, but it is desirable that the optimum values of respective layer forming factors are selected on the basis of mutual organic relationships so that the a-$(Si_xC_{1-x})_y(H,X)_{1-y}$ having desired characteristics may be formed.

The contents of carbon atoms existing in the surface layer are important factors for obtaining the desired characteristics to accomplish the objects of the present invention, similarly to the conditions for preparation of the surface layer. The content of carbon atoms existing in the surface layer in the present invention are selected as desired in view of the species of amorphous material constituting the surface layer and its characteristics.

More specifically, the amorphous material represented by the above formula a-$(Si_xC_{1-x})_y(H,X)_{1-y}$ may be roughly classified into an amorphous material constituted of silicon atoms and carbon atoms (hereinafter referred to as "a-$Si_aC_{1-a}$", where $0<a<1$), an amorphous material constituted of silicon atoms, carbon atoms and hydrogen atoms (hereinafter referred to as a-$(Si_bC_{1-b})_cH_{1-c}$, where $0<b$, $c<1$) and an amorphous material constituted of silicon atoms, carbon atoms, halogen atoms and, if necessary, hydrogen atoms (hereinafter referred to as "a-$(Si_dC_{1-d})_e(H,X)_{1-e}$", where $0<d, e<1$).

In the present invention, when the surface layer is made of a-$Si_aC_{1-a}$, the content of carbon atoms in the surface layer may be preferably $1\times10^{-3}$ to 90 atomic %, more preferably 1 to 80 atomic %, and most preferably 10 to 75 atomic %, namely in terms of representation by a in the above a-$Si_aC_{1-a}$, a being preferably 0.1 to 0.99999, more preferably 0.2 to 0.99, and most preferably 0.25 to 0.9.

In the present invention, when the surface layer is made of a-$(Si_bC_{1-b})_cH_{1-c}$, the content of carbon atoms in the surface layer may be preferably $1\times10^{-3}$ to 90 atomic %, more preferably 1 to 90 atomic %, and most preferably 10 to 80 atomic %, the content of hydrogen atoms preferably 1 to 40 atomic %, more preferably 2 to 35 atomic %, and most preferably 5 to 30 atomic %, and the light-receiving member formed when the hydrogen content is within these ranges can be sufficiently applicable as excellent one in the practical aspect.

That is, in terms of the representation by the above a-$(Si_bC_{1-b})_cH_{1-c}$, b is preferably 0.1 to 0.99999, more preferably 0.1 to 0.99, and most preferably 0.15 to 0.9, and c preferably 0.6 to 0.99, more preferably 0.65 to 0.98, and most preferably 0.7 to 0.95.

When the surface layer is made of a-$(Si_dC_{1-d})_e(H,X)_{1-e}$, the content of carbon atoms in the surface layer may be preferably $1\times10^{-3}$ to 90 atomic %, more preferably 1 to 90 atomic %, and most preferably 10 to 80 atomic %, the content of halogen atoms preferably 1 to 20 atomic %. When the content of halogen atoms is within these ranges, the light-receiving member thus prepared is sufficiently applicable in the practical aspect. The content of hydrogen atoms contained if desired may be preferably 19 atomic % or less, and more preferably 13 atomic % or less.

That is, in terms of representation by d and e in the above a-$(Si_dC_{1-d})_e(H,X)_{1-e}$, d is preferably 0.1 to 0.99999, more preferably 0.1 to 0.99, and most preferably 0.15 to 0.9, and e preferably 0.8 to 0.99, more preferably 0.82–0.99, and most preferably 0.85 to 0.98.

The range of the numerical value of layer thickness of the surface layer is one of the important factors for effectively accomplishing the objects of the present invention, and is selected as desired in view of the intended purpose so as to effectively accomplish the objects of the present invention.

The layer thickness of the surface layer must be also selected as desired with due considerations about the relationships with the content of carbon atoms, the relationship with the layer thicknesses of the first layer and the second layer, as well as other organic relationships to the characteristics required for respective layer regions.

In addition, the layer thickness is desirably given considerations from economical view-point such as productivity or capability of mass production.

The surface layer in the present invention desirably has a layer thickness preferably of 0.003 to 30μ, more preferably 0.004 to 20μ, and most preferably 0.005 to 10μ.

The surface layer may be borne to have a function as the protective layer for mechanical durability and an optical function as the reflection preventive layer.

The surface layer should satisfy the following condition in order to exhibit fully its reflection preventive function.

That is, when the refractive index of the surface layer is defined as n, the layer thickness as d, and the wavelength of the light irradiated is as λ, the surface layer is suitable for a reflection preventive layer, if the following condition is satisfied:

$$d = \frac{\lambda}{4n} \text{ (or multiplied by an odd number).}$$

Also, when the refractive index of the second layer is defined as an $n_a$, the refractive index of the surface layer should satisfy the following condition:

$$n = \sqrt{n_a},$$

and the layer thickness d of the surface layer should be:

$$d = \frac{\lambda}{4n} \text{ (or multiplied by an odd number).}$$

to give the surface layer most suitable for reflection preventive layer. When a-Si:H is employed as the second layer, the refractive index of a-Si:H is about 3.3 and therefore a material with a refractive index of 1.82 is suitable as the surface layer. Since a-Si:H can be made to have such a value of refractive index by controlling the content of C and it can also fully satisfy mechanical durability, tight adhesion between layers and electrical characteristics, it is most suitable as the material for the surface layer.

When the surface layer poses priority on the function of reflection preventive layer, the layer thickness of the surface layer should more desirably be 0.05 to 2 μm.

The substrate to be used in the present invention may be either electroconductive or insulating. As the electroconductive substrate, there may be mentioned metals such as NiCr, stainless steel, Al, Cr, Mo, Au, Nb, Ta, V, Ti, Pt, Pd etc. or alloys thereof.

As insulating substrates, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. At least one side surface of these substrates is preferably subjected to treatment for imparting electroconductivity, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3+SnO_2$) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The substrate may be shaped in any form such as cylinders, belts, plates or others, and its form may be determined as desired. For example, when the light-receiving member 1004 in FIG. 10 is to be used as the light-receiving member for electrophotography, it may desirably be formed into an endless belt or a cylinder for use in continuous high speed copying. The substrate may have a thickness, which is conveniently determined so that the light-receiving member as desired may be formed. When the light-receiving member is required to have a flexibility, the substrate is made as thin as possible, so far as the function of a support can be exhibited. However, in such a case, the thickness is generally 10μ or more from the points of fabrication and handling of the substrate as well as its mechanical strength.

Next, an example of the process for producing the light-receiving member of this invention is to be briefly described.

Figure 20:
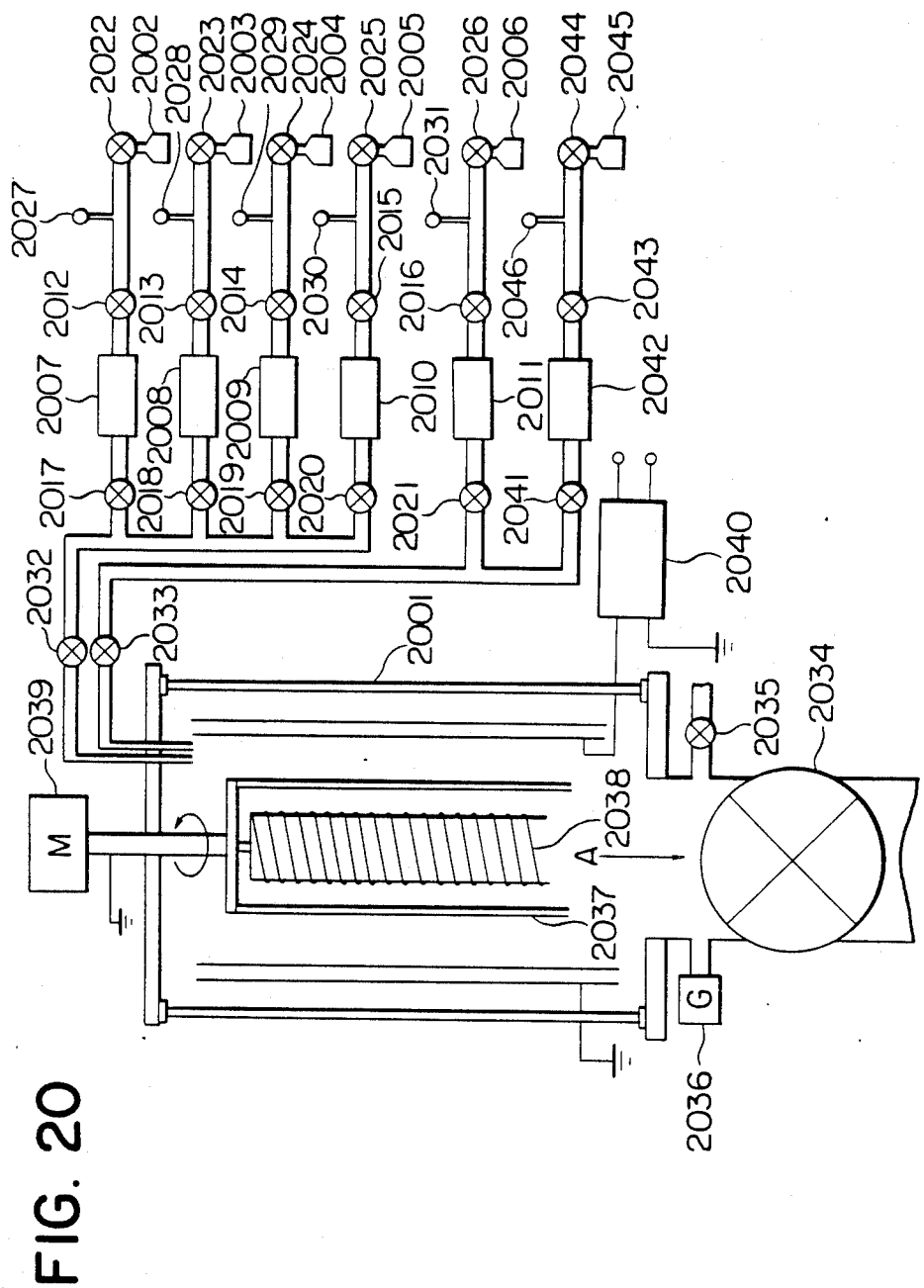
FIG. 20 and FIG. 63 are schematic illustrations of the vacuum deposition devices for preparation of the light-receiving members employed in Examples.

FIG. 20 shows one example of a device for producing a light-receiving member.

In the gas bombs 2002 to 2006, there are hermetically contained starting gases for formation of the light-receiving member of the present invention. For example, 2002 is a bomb containing $SiH_4$ gas (purity 99.999%, hereinafter abbreviated as $SiH_4$), 2003 is a bomb contaiing $GeH_4$ gas (purity 99.999%, hereinafter abbreviated as $GeH_4$), 2004 is a bomb containing NO gas (purity 99.99%, hereinafter abbreviated as NO), 2005 is bomb containing $B_2H_6$ gas diluted with $H_2$ (purity 99.999%, hereinafter abbreviated as $B_2H_6/H_2$), 2006 is a bomb containing $H_2$ gas (purity: 99.999%) and 2045 is a bomb containing $CH_4$ gas (purity: 99.999%).

For allowing these gases to flow into the reaction chamber 2001, on confirmation of the valves 2022 to 2026 and 2044 of the gas bombs 2002 to 2006 and 2045 and the leak valve 2035 to be closed, and the inflow valves 2012 to 2016 and 2043, the outflow valves 2017 to 2021 and 2041 and the auxiliary valves 2032 and 2033 to be opened, the main valve 2034 is first opened to evacuate the reaction chamber 2001 and the gas pipelines. As the next step, when the reading on the vacuum indicator 2036 becomes $5\times10^{-6}$ Torr, the auxiliary valves 2032, 2033 and the outflow valves 2017 to 2021 and 2041 are closed.

Referring now to an example of forming a light-receiving layer on the cylindrical substrate 2037, $SiH_4$ gas from the gas bomb 2002, $GeH_4$ gas from the gas bomb 2003, NO gas from the gas bomb 2004, $B_2H_6/H_2$ gas from the gas bomb 2005 and $H_2$ gas from the gas bomb 2006 are permitted to flow into the mass-flow controllers 2007, 2008, 2009, 2010 and 2011, respectively, by opening the valves 2022, 2023, 2024, 2025 and 2026 and controlling the pressures at the output pressure gauges 2027, 2028, 2029 2030 and 2031 to 1 Kg/cm² and opening gradually the inflow valves 2012, 2013, 2014, 2015 and 2016, respectively. Subsequently, the outflow valves 2017, 2018, 2019, 2020 and 2021 and the auxiliary valves 2032 and 2033 were gradually opened to permit respective gases to flow into the reaction chamber 2001. The outflow valves 2017, 2018, 2019, 2020 and 2021 are controlled so that the flow rate ratio of $SiH_4$ gas, $GeH_4$ gas, $B_2H_6/H_2$ gas, NO gas and $H_2$ may have a desired value and opening of the main valve 2034 is also controlled while watching the reading on the vacuum indicator 2036 so that the pressure in the reaction chamber 2001 may reach a desired value. And, after confirming that the temperature of the substrate 2037 is set at 50° to 400° C. by the heater 2038, the power source 2040 is set at a desired power to excite glow discharge in the reaction chamber 2001, simultaneously with controlling of the distributed concentrations of germanium atoms and boron atoms to be contained in the layer formed by carrying out the operation to change gradually the openings of the valves 2018, 2020 by the manual method or by means of an externally driven motor, etc. thereby changing the flow rates of $GeH_4$ gas and $B_2H_6$ gas according to previously designed change rate curves.

By maintaining the glow discharge as described above for a desired period time, the first layer (G) is formed on the substrate 2037 to a desired thickness. At the stage when the first layer (G) is formed to a desired thickness, the second layer (S) containing substantially no germanium atom can be formed on the first layer (G) by maintaining glow discharge according to the same conditions and procedure as those in formation of the first layer (G) except for closing completely the outflow valve 2018 and changing, if desired, the discharging conditions. Also, in the respective layers of the first layer (G) and the second layer (S), by opening or closing as desired the outflow valves 2019 or 2020, oxygen atoms or boron atoms may be contained or not, or oxygen atoms or boron atoms may be contained only in a part of the layer region of the respective layers.

When nitrogen atoms are to be contained in place of oxygen atoms, layer formation may be conducted by replacing NO gas in the gas bomb 2004 with $NH_3$ gas. Also, when the kinds of the gases employed are desired to be increased, bombs of desirable gases may be provided additionally before carrying out layer formation similarly. After the formation of the second layer (S), a surface layer mainly consisiting of silicon atoms and carbon atoms may be formed on the second layer (S) to a desired layer thickness by maintaining glow discharge for a desired period of time according to the same conditions and procedure except for adjusting the mass-flow controllers 2007 and 2042 to a predetermined flow rate ratio. During layer formation, for uniformization of the layer formation, it is desirable to rotate the substrate 2037 by means of a motor 2039 at a constant speed.

The present invention is described in more detail by referring to the following Examples. The present invention is described by referring to the following Examples.

EXAMPLE 1

In this Example, a semiconductor laser (wavelength: 780 nm) with a spot size of 80 μm was employed. Thus, on a cylindrical aluminum substrate [length (L) 357 mm, outer diameter (r) 80 mm] on which A-Si:H is to be deposited, a spiral groove was prepared by a lathe. The form of the groove is shown in FIG. 64(B).

Figure 63:
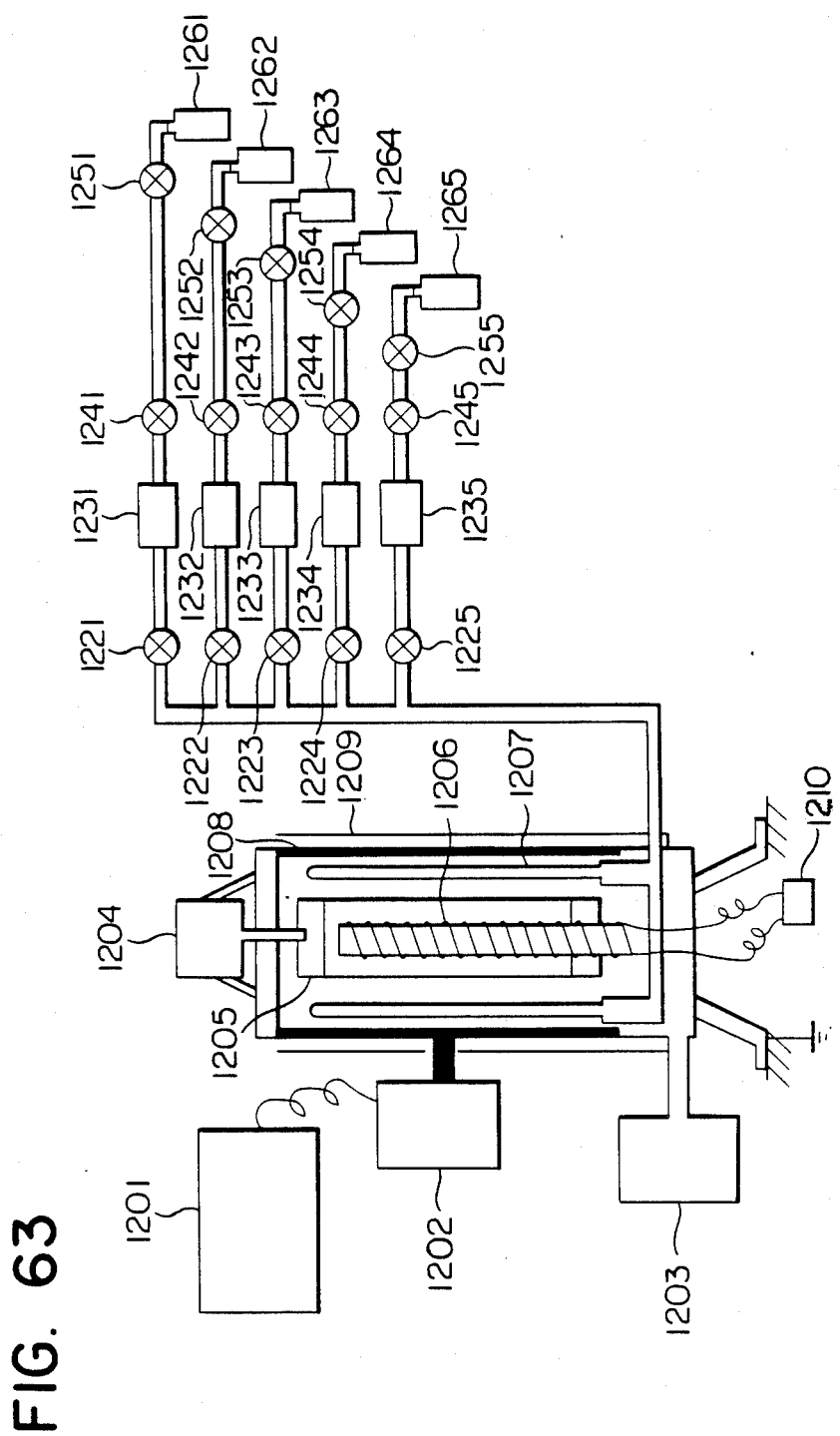

On this aluminum substrate, the charge injection preventive layer and the photosensitive layer were deposited by means of the device as shown in FIG. 63 in the following manner.

First, the constitution of the device is to be explained. 1201 is a high frequency power source, 1202 is a matching box, 1203 is a diffusion pump and a mechanical booster pump, 1204 is a motor for rotation of the aluminum substrate, 1205 is an aluminum substrate, 1206 is a heater for heating the aluminum substrate, 1207 is a gas inlet tube, 1208 is a cathode electrode for introduction of high frequency, 1209 is a shield plate, 1210 is a power source for heater, 1221 to 1225, 1241 to 1245 are valves, 1231 to 1235 are mass flow controllers, 1251 to 1255 are regulators, 1261 is a hydrogen ($H_2$) bomb, 1262 is a silane ($SiH_4$) bomb, 1263 is a diborane ($B_2H_6$) bomb, 1264 is a nitrogen oxide (NO) bomb and 1265 is a methane ($CH_4$) bomb.

Next, the preparation procedure is to be explained. All of the main cocks of the bombs 1261-1265 were closed, all the mass flow controllers and the valves were opened and the deposition device was internally evacuated by the diffusion pump 1203 to $10^{-7}$ Torr. At the same time, the aluminum substrate 205 was heated by the heater 1206 to 250° C. and maintained constantly at 250° C. After the aluminum substrate 1205 became constantly at 250° C., the valves 1221-1225, 1241-1245 and 1251-1255 were closed, the main cocks of bombs 1261-1265 opened and the diffusion pump 1203 was changed to the mechanical booster pump. The secondary pressure of the valve equipped with regulators was set at 1.5 Kg/cm$^2$. The mass flow controller 1231 was set at 300 SCCM, and the valves 1241 and 1221 were successively opened to introduce $H_2$ gas into the deposition device.

Next, by setting the mass flow controller 1232 at 150 SCCM, $SiH_4$ gas in 1261 was introduced into the deposition device according to the same procedure as introduction of $H_2$ gas. Then, by setting the mass flow controller 1233 so that $B_2H_6$ gas flow rate of the bomb 1263 may be 1600 Vol. ppm relative to $SiH_4$ gas flow rate, $B_2H_6$ gas was introduced into the deposition device according to the same procedure as introduction of $H_2$ gas.

And, when the inner pressure in the deposition device was stabilized at 0.2 Torr, the high frequency power source 1201 was turned on and glow discharge is generated between the aluminum substrate 1205 and the cathode electrode 1208 by controlling the matching box 1202, and an A-Si:H layer (p-type A-Si:H layer containing B) was deposited to a thickness of 5 μm at a high frequency power of 150 W (charge injection preventive layer). After deposition of a 5 μm thick A-Si:H layer (p-type), inflow of $B_2H_6$ was stopped by closing the valves 1223 without discontinuing discharging.

And, A-Si:H layer (non-doped) with a thickness of 20 μm was deposited at a high frequency power of 150 W (photosensitive layer). Then, with the high frequency power source and all the valves being closed, the deposition device was evacuated, the temperature of the aluminum substrate lowered to room temperature and the substrate having formed layers up to the photosensitive layer thereon was taken out.

Thereafter, with the setting of the mass flow controller 1232 being changed to 35 SCCM, from the mass flow controller 1235 where the $CH_4$ gas flow rate in 1265 is previously set at a flow rate ratio relative to $SiH_4$ gas flow rate of $SiH_4/CH_4=1/30$, $CH_4$ was introduced by opening the valve 1225, and a-SiC(H) with a thickness of 0.5 μm was deposited at a high frequency power of 150 W (surface layer).

The high frequency power source and all the valves were closed, the temperature of the aluminum substrate was lowered to room temperature and the substrate having formed the light-receiving layer was taken out.

In this light-receiivng member, as shown in FIG. 64 (B) and (C), the surface of the substrate and the surface of the photosensitive layer were non-parallel to each other. In this case, the difference in average layer thickness between the center and the both ends of the aluminum substrate was 2 μm.

For the light-receiving member for electrophotography as described above, image exposure was effected by means of the device shown in FIG. 26 with a semiconductor laser of a wavelength 780 nm with a spot size of 80 μm, and the steps of image formation, developing and cleaning were repeated about 50,000 times, followed by image evaluation. As the result, no interference fringe pattern was observed and there could be obtained a member exhibiting practically satisfactory electrophotographic characteristics.

EXAMPLE 2

According to the same procedure as in Example 1, seven substrates having formed layers to the photosensitive layer thereon were prepared.

Next, the hydrogen ($H_2$) bomb 1261 was replaced with argon (Ar) gas bomb, the deposition device cleaned and the surface layer materials as shown in Table 1A (condition No. 101 A) are placed over the entire surface of the cathode electrode. One of the substrates having formed layers to the above photosensitive layer is set, and the deposition device is sufficiently evacuated by means of a diffusion pump. Thereafter, argon gas was introduced to 0.015 Torr, and glow discharge was excited at a high frequency power of 150 W to effect sputtering the surface material, thereby forming a surface layer of Table 1A (Condition No. 101A) on the above substrate (Sample No. 101A). For remaining six substrates, the surface layers were formed under the conditions as shown in Table 1A (Condition No. 102A-107A) to deposit surface layers thereon (Sample No. 102A-107A).

In these light-receiving members, as shown in FIG. 64 (B) and (C), the surface of the substrate and the surface of the photosensitive layer were non-parallel to each other. In this case, the difference in average layer thickness between the center and the both ends of the aluminum substrate was 2 μm.

For the seven kinds of light-receiving member for electrophotography as described above, image exposure was effected by means of the device shown in FIG. 26 with a semiconductor laser of a wavelength 780 nm with a spot size of 80 μm, and the steps of image formation, developing and cleaning were repeated about 50,000 times, followed by image evaluation. The results as shown in Table 1A were obtained.

EXAMPLE 3

Example 1 was repeated except that the flow rate ratio of $SiH_4$ gas to $CH_4$ gas was varied during formation of the surface layer to vary the contents of silicon atoms and carbon atoms in the surface layer to prepare respective light-receiving members for electrophotography. For each of the light-receiving members for electrophotography thus obtained, image exposure was effected by laser similarly as in Example 1 and the steps up to transfer were repeated about 50,000 times, followed by image evaluation to obtain the results as shown in Table 2A.

EXAMPLE 4

Example 1 was repeated except that the flow rate ratio of SiH$_4$ gas, SiF$_4$ gas and CH$_4$ gas was varied during formation of the surface layer to vary the contents of silicon atoms and carbon atoms in the surface layer to prepare respective light-receiving members for electrophotography. For each of the light-receiving members for electrophotography thus obtained, image exposed was effected by laser similarly as in Example 1 and the steps up to transfer were repeated about 50,000 times, followed by image evaluation to obtain the results as shown in Table 3A.

EXAMPLE 5

Example 1 was repeated except that the layer thickness of the surface layer was varied to prepare respective light-receiving members for electrophotography. For each of the light-receiving members for electrophotography thus obtained, image exposed was effected by laser similarly as in Example 1 and the steps up to transfer were repeated about 50,000 times, followed by image evaluation to obtain the results as shown in Table 4A.

EXAMPLE 6

A light-receiving member for electrophotography prepared according to the same procedure as described in Example 1 except that the discharging power during formation of the surface layer was changed to 300 W and the average layer thickness was made 2 μm, was found to have a difference in average layer thickness of the surface layer between center and both ends of 0.5 μm, with the layer thickness difference at minute portions of 0.1 μm.

In such a light-receiving member for electrophotography, no interference fringe pattern was observed, and practically satisfactory results could be obtained when it was subjected repeatedly to the steps of image formation, developing and cleaning by means of the same device as used in Example 1.

EXAMPLE 7

The surface of a cylindrical aluminum substrate was worked with a lathe as shown in FIG. 64.

Each of the cylindrical aluminum substrates was used for preparation of a light-receiving member for electrophotography of A-Si:H under the same conditions as in Example 1.

The light-receiving member for electrophotography was subjected to image exposure in a way similar to Example 1 by means of the device as shown in FIG. 26, followed by developing and transfer to obtain an image. In this case, the transferred image was found to have practically satisfactory characteristics without interference pattern observed.

EXAMPLE 8

Figure 78:
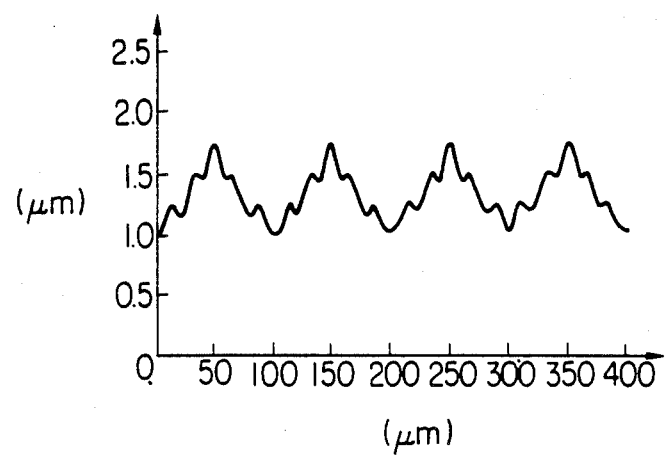
Figure 79:
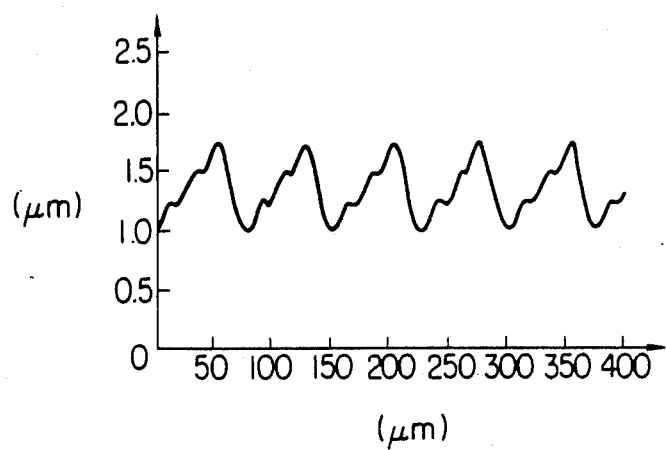

On cylindrical aluminum substrates having the surface characteristics as shown in FIG. 78 and FIG. 79, light-receiving members for electrophotography were prepared under the conditions as shown in Table 5A.

For these light-receiving members for electrophotography image exposure was effected by means of the same image exposure device as in Example 1, followed by developing, transfer and fixing, to obtain visible images on plain papers. Such an image forming process was repeated continuously 100,000 times.

In this case, no interference fringe pattern was observed in all of the images obtained, thus giving practically satisfactory characteristics. There was also no difference observed at all between the initial image and the image after 100,000 copying, all being of high quality images.

EXAMPLE 9

On cylindrical aluminum substrates having the surface characteristics as shown in FIG. 78 and FIG. 79, light-receiving members for electrophotography were formed under the conditions shown in Table 6A.

For these light-receiving members for electrophotography, by means of the same device as in Example 1, image exposure was effected, followed by developing, transfer and fixing, to obtain visible images on plain papers.

In this case, in all the images obtained, no interference fringe pattern was observed to give practically satisfactory characteristics.

EXAMPLE 10

On cylindrical aluminum substrates having the surface characteristics as shown in FIG. 78 and FIG. 79, light-receiving members for electrophotography were formed under the conditions shown in Table 7A.

For these light-receiving members for electrophotography, by means of the same device as in Example 1, image exposure was effected, followed by developing, transfer and fixing, to obtain visible images on plain papers.

In this case, in the images obtained, no interference fringe pattern was observed to give practically satisfactory characteristics.

EXAMPLE 11

On cylindrical aluminum substrates having the surface characteristics as shown in FIG. 78 and FIG. 79, light-receiving members for electrophotography were formed under the conditions shown in Table 8A.

For these light-receiving members for electrophotography, by means of the same device as in Example 1, image exposure was effected, followed by developing, transfer and fixing, to obtain visible images on plain papers.

In this case, in the images obtained, no interference fringe pattern was observed to give practically satisfactory characteristics.

EXAMPLE 12

In this Example, a semiconductor laser (wavelength: 780 μm) with a spot size of 80 μm was employed. Thus, on a cylindrical aluminum substrate [length (L) 357 mm, outer diameter (r) 80 mm] on which A-Si:H is to be deposited, a spiral groove was prepared by a lathe. The cross sectional form of the groove is shown in FIG. 64 (B).

On this aluminum substrate, the charge injection preventive layer and the photosensitive layer were deposited by means of the device as shown in FIG. 63 in the following manner.

First, the constitution of the device is to be explained. 1201 is a high frequency power source, 1202 is a matching box, 1203 is a diffusion pump and a mechanical booster pump, 1204 is a motor for rotation of the aluminum substrate, 1205 is an aluminum substrate, 1206 is a heater for heating the aluminum substrate, 1207 is a gas inlet tube, 1208 is a cathode electrode for introduction of high frequency, 1209 is a shield plate, 1210 is a power source for heater, 1221 to 1225, 1241 to 1245 are valves, 1231 to 1235 are mass flow controllers, 1251 to 1255 are regulators, 1261 is a hydrogen ($H_2$) bomb, 1262 is a silane ($SiH_4$) bomb, 1263 is a diborane ($B_2H_6$) bomb, 1264 is a nitrogen oxide (NO) bomb and 1265 is a methane ($CH_4$) bomb.

Next, the preparation procedure is to be explained. All of the main cocks of the bombs 1261-1265 were closed, all the mass flow controllers and the valves were opened and the deposition device was internally evacuated by the diffusion pump 1203 to $10^{-7}$ Torr. At the same time, the aluminum substrate 1205 was heated by the heater 1206 to 250° C. and maintained constantly at 250° C. After the aluminum substrate 1205 became constantly at 250° C., the valves 1221-1225, 1241-1245 and 1251-1255 were closed, the main cocks of bombs 1261-1266 opened and the diffusion pump 1203 was changed to the mechanical booster pump. The secondary pressure of the valves 1251-1255 equipped with regulators was set at 1.5 Kg/cm². The mass flow controller 1231 was set at 300 SCCM, and the valves 1241 and 1221 were successively opened to introduce $H_2$ gas into the deposition device.

Next, by setting the mass flow controller 1232 at 150 SCCM, $SiH_4$ gas in 1261 was introduced into the deposition device according to the same procedure as introduction of $H_2$ gas. Then, by setting the mass flow controller 1233 so that $B_2H_6$ gas flow rate of the bomb 1263 may be 1600 Vol. ppm relative to $SiH_4$ gas flow rate, $B_2H_6$ gas was introduced into the deposition device according to the same procedure as introduction of $H_2$ gas.

Next, the mass flow controller 1234 was set to control the NO gas flow rate through 1264 at 3.4 Vol. % relative to the $SiH_4$ gas flow rate, and NO gas was introduced into the deposition device according to the same operation as in introduction of $H_2$ gas.

And, when the inner pressure in the deposition device was stabilized at 0.2 Torr, the high frequency power source 1201 was turned on and glow discharge is generated between the aluminum substrate 1205 and the cathode electrode 1208 by controlling the matching box 1202, and an A-Si:H:B layer (p-type A-Si:H layer containing B) was deposited to a thickness of 5 μm at a high frequency power of 150 W (charge injection preventive layer). After deposition of a 5 μm thick A-Si:H:B layer (p-type), inflow of $B_2H_6$ was stopped by closing the valve 1223 without discontinuing discharging.

And, A-Si:H layer (non-doped) with a thickness of 20 μm was deposited at a high frequency power of 150 W (photosensitive layer). Thereafter, with the setting of the mass flow controller 1232 being changed to 35 SCCM, from the mass flow controller 1235 where the $CH_4$ gas flow rate in 1265 is previously st at a flow rate ratio relative to $SiH_4$ gas flow rate of $SiH_4/CH_4=1/30$, $CH_4$ was introduced by opening the valve 1225, and a-SiC(H) with a thickness of 0.5 μm was deposited at a high frequency power of 150 W (surface layer).

The high frequency power source and all the valves were closed, the deposition device was evacuated, the temperature of the aluminum substrate was lowered to room temperature and the substrate having formed the light-receiving layer was taken out.

In this light-receiving member, as shown in FIGS. 64 (B) and (C), the surface of the substrate and the surface of the photosensitive layer were non-parallel to each other. In this case, the difference in average layer thickness between the center and the both ends of the aluminum substrate was 2 μm.

For the light-receiving member for electrophotography as described above, image exposure was effected by means of the device shown in FIG. 13 with a semiconductor laser of a wavelength 780 nm with a spot size of 80 μm, and the steps of image formation, developing and cleaning were repeated about 50,000 times, followed by image evaluation. As the result, no interference fringe pattern was observed and there could be obtained a member exhibiting practically satisfactory electrophotographic characteristics.

EXAMPLE 13

According to the same procedure as in Example 12, seven substrates having formed layers to the photosensitive layer thereon were prepared.

Next, the hydrogen ($H_2$) bomb 1261 was replaced with argon (Ar) gas bomb, the deposition device cleaned and the surface layer materials as shown in Table 1B (condition No. 101 B) are placed over the entire surface of the cathode electrode. One of the substrates having formed layers to the above photosensitive layer is set, and the deposition device is sufficiently evacuated by means of a diffusion pump. Thereafter, argon gas was introduced to 0.015 Torr, and glow discharge was excited at a high frequency power of 150 W to effect sputtering the surface material, thereby forming a surface layer of Table 1B (Condition No. 101 B) on the above substrate (Sample No. 101 B). For the remaining six substrates, the surface layers were formed under the conditions as shown in Table 1B (Condition No. 102 B-107 B) to deposit surface layers thereon (Sample No. 102B-107B).

In these light-receiving members, as shown in FIGS. 64 (B) and (C), the surface of the substrate and the surface of the photosensitive layer were non-parallel to each other. In this case, the difference in average layer thickness between the center and the both ends of the aluminum substrate was 2 μm.

For the seven kinds of light-receiving member for electrophotography as described above, image exposure was effected by means of the device shown in FIG. 26 with a semiconductor laser of a wavelength 780 nm with a spot size of 80 μm, and the steps of image formation, developing and cleaning were repeated about 50,000 times, followed by image evaluation. The results as shown in Table 1B were obtained.

EXAMPLE 14

Example 12 was repeated except that the flow rate ratio of $SiH_4$ gas to $CH_4$ gas was varied during formation of the surface layer to vary the contents of silicon atoms and carbon atoms in the surface layer to prepare respective light-receiving members for electrophotography. For each of the light-receiving members for electrophotography thus obtained, image exposured was effected by laser similarly as in Example 12 and the steps to transfer were repeated about 50,000 times, followed by image evaluation to obtain the results as shown in Table 2B.

EXAMPLE 15

Example 12 was repeated except that the flow rate ratio of SiH$_4$ gas, SiF$_4$ gas and CH$_4$ gas was varied during formation of the surface layer to vary the contents of silicon atoms and carbon atoms in the surface layer to prepare respective light-receiving members for electrophotography. For each of the light-receiving members for electrophotography thus obtained, image exposed was effected by laser similarly as in Example 12 and the steps to transfer were repeated about 50,000 times, followed by image evaluation to obtain the results as shown in Table 3B.

EXAMPLE 16

Example 12 was repeated except that the layer thickness of the surface layer was varied to prepare respective light-receiving members for electrophotography. For each of the light-receiving members for electrophotography thus obtained, image exposed was effected by laser similarly as in Example 12 and the steps to transfer were repeated about 50,000 times, followed by image evaluation to obtain the results as shown in Table 4B.

EXAMPLE 17

A light-receiving member for electrophotography prepared according to the same procedure as described in Example 12 except that the discharging power during formation of the surface layer was changed to 300 W and the average layer thickness was made 2 μm, was found to have a difference in average layer thickness of the surface layer between center and both ends of 0.5 μm, with the layer thickness difference at minute portions of 0.1 μm.

In such a light-receiving member for electrophotography, no interference fringe pattern was observed, and practically satisfactory results could be obtained when it was subjected repeatedly to the steps of image formation, developing and cleaning by means of the same device as used in Example 12.

EXAMPLE 18

The surface of a cylindrical aluminum substrate was worked with a lathe as shown in FIG. 65.

Each of the cylindrical aluminum substrates was used for preparation of a light-receiving member for electrophotography of A-Si:H under the same conditions as in Example 12.

The light-receiving member for electrophotography was similarly as in Example 12 subjected to image exposure by means of the device as shown in FIG. 26, followed by developing and transfer to obtain an image. In this case, the transferred image was found to have practically satisfactory characteristics without interference fringe pattern observed.

EXAMPLE 19

Figure 5:
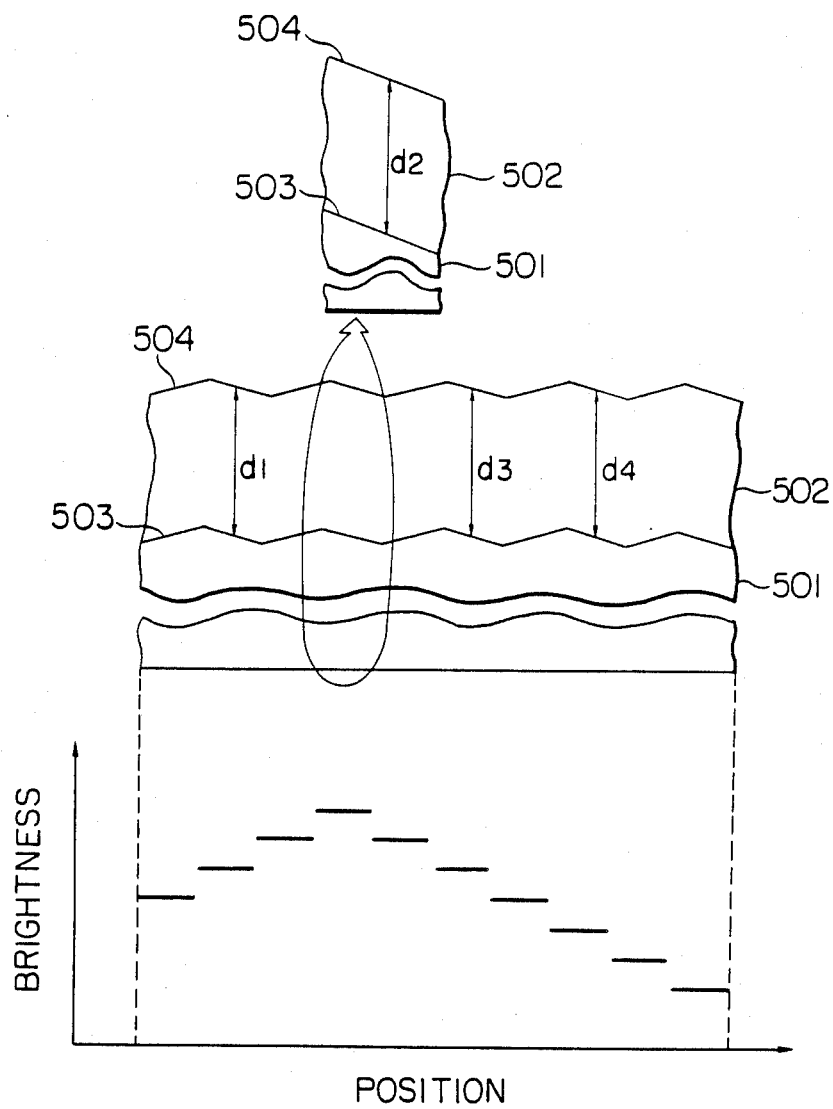
FIG. 5 is a schematic illustration of interference fringe in the case where the interfaces of respective layers of a light-receiving member are parallel to each other.

On cylindrical aluminum substrates having the surface characteristics as shown in FIG. 78 and FIG. 79, light-receiving members for electrophotography were prepared under the conditions as shown in FIG. 5B.

For these light-receiving members for electrophotography, image exposure was effected by means of the same image exposure device as in Example 12, followed by developing, transfer and fixing, to obtain visible images on plain papers. Such an image forming process was repeated continuously 100,000 times.

In this case, no interference fringe pattern was observed in all of the images obtained, thus giving practically satisfactory characteristics. There was also no difference observed at all between the initial image and the image after 100,000 copying, all being of high quality images.

EXAMPLE 20

On cylindrical aluminum substrates having the surface characteristics as shown in FIG. 78 and FIG. 79, light-receiving members for electrophotography were formed under the conditions shown in Table 6B.

For these light-receiving members for electrophotography, by means of the same device as in Example 12, image exposure was effected, followed by developing, transfer and fixing, to obtain visible images on plain papers.

In this case, in all the images obtained, no interference fringe pattern was observed to give practically satisfactory characteristics.

EXAMPLE 21

On cylindrical aluminum substrates having the surface characteristics as shown in FIG. 78 and FIG. 79, light-receiving members for electrophotography were formed under the conditions shown in Table 7B.

For these light-receiving members for electrophotography, by means of the same device as in Example 12, image exposure was effected, followed by developing, transfer and fixing, to obtain visible images on plain papers.

In this case, in the image obtained, no interference fringe pattern was observed to give practically satisfactory characteristics.

EXAMPLE 22

On cylindrical aluminum substrates having the surface characteristics as shown in FIG. 78 and FIG. 79, light-receiving members for electrophotography were formed under the conditions shown in Table 8B.

For these light-receiving members for electrophotography, by means of the same device as in Example 12, image exposure was effected, followed by developing, transfer and fixing, to obtain visible images on plain paper.

In this case, in the image obtained, no interference fringe pattern was observed to give practically satisfactory characteristics.

EXAMPLE 23

In this Example, a semiconductor laser (wavelength: 780 nm) with a spot size of 80 μm was employed. Thus, on a cylindrical aluminum substrate [length (L) 357 mm, outer diameter (r) 80 mm] on which A-Si:H is to be deposited, a spiral groove was prepared by a lathe. The cross sectional form of the groove is shown in FIG. 64 (B).

On this aluminum substrate, the charge injection preventive layer and the photosensitive layer were deposited by means of the device as shown in FIG. 63 in the following manner.

First, the constitution of the device is to be explained. 1201 is a high frequency power source, 1202 is a matching box, 1203 is a diffusion pump and a mechanical booster pump, 1204 is a motor for rotation of the aluminum substrate, 1205 is an aluminum substrate, 1206 is a heater for heating the aluminum substrate, 1207 is a gas inlet tube, 1208 is a cathode electrode for introduction of high frequency, 1209 is a shield plate, 1210 is a power source for heater, 1221 to 1225, 1241 to 1245 are valves, 1231 to 1235 are mass flow controllers, 1251 to 1255 are regulators, 1261 is a hydrogen ($H_2$) bomb, 1262 is a silane ($SiH_4$) bomb, 1263 is a diborane ($B_2H_6$) bomb, 1264 is a nitrogen oxide (NO) bomb and 1265 is a methane ($CH_4$) bomb.

Next, the preparation procedure is to be explained. All of the main cocks of the bombs 1261-1265 were closed, all the mass flow controllers and the valves were opened and the deposition device was internally evacuated by the diffusion pump 1203 to $10^{-7}$ Torr. At the same time, the aluminum substrate 1205 was heated by the heater 1206 to 250° C. and maintained constantly at 250° C. After the aluminum substrate 1205 became constantly at 250° C., the valves 1221-1225, 1241-1245 and 1251-1255 were closed, the main cocks of bombs 1261-1265 opened and the diffusion pump 1203 was changed to the mechanical booster pump. The secondary pressure of the valves 1251-1255 equipped with regulators was set at 1.5 Kg/cm$^2$. The mass flow controller 1231 was set at 300 SCCM, and the valves 1241 and 1221 were successively opened to introduce $H_2$ gas into the deposition device.

Next, by setting the mass flow controller 1232 at 150 SCCM, $SiH_4$ gas in 1261 was introduced into the deposition device according to the same procedure as introduction of $H_2$ gas. Then, by setting the mass flow controller 1233 so that $B_2H_6$ gas flow rate of the bomb 1263 may be 1600 Vol. ppm relative to $SiH_4$ gas flow rate, $B_2H_6$ gas was introduced into the deposition device according to the same procedure as introduction of $H_2$ gas.

Next, the mass flow controller 1234 was set to control the NO gas flow rate through 1264 at 3.4 Vol. % relative to the $SiH_4$ gas flow rate, and NO gas was introduced into the deposition device according to the same operation as in introduction of $H_2$ gas.

And, when the inner pressure in the deposition device was stabilized at 0.2 Torr, the high frequency power source 1201 was turned on and glow discharge is generated between the aluminum substrate 1205 and the cathode electrode 1208 by controlling the matching box 1202, and a A-Si:H:B:O layer (p-type A-Si:H layer containing B and O) was deposited to a thickness of 5 μm at a high frequency power of 150 W (charge injection preventive layer).

During this operation, NO gas flow rate was changed relative to $SiH_4$ gas flow rate as shown in FIG. 49 until the NO gas flow rate was made zero on completion of the layer formation. After deposition of a 5 μm thick A-Si:H:B:O layer (p-type), inflow of $B_2H_6$ was stopped by closing the valve 1223 without discontinuing discharging.

And, A-Si:H layer (non-doped) with a thickness of 20 μm was deposited at a high frequency power of 150 W (photosensitive layer). Thereafter, with the setting of the mass flow controller 1232 being changed to 35 SCCM, from the mass flow controller 1235 where the $CH_4$ gas flow rate in 1265 is previously set at a flow rate ratio relative to $SiH_4$ gas flow rate of $SiH_4/CH_4=1/30$, $CH_4$ was introduced by opening the valve 1225, and a-SiC(H) with a thickness of 0.5 μm was deposited at a high frequency power of 150 W (surface layer).

The high frequency power source and all the valves were closed, the deposition device was evacuated, the temperature of the aluminum substrate was lowered to room temperature and the substrate having formed the light-receiving layer was taken out.

In this light-receiving member, as shown in FIGS. 64 (B) and (C), the surface of the substrate and the surface of the photosensitive layer were non-parallel to each other. In this case, the difference in average layer thickness between the center and the both ends of the aluminum substrate was 2 μm.

For the light-receiving member for electrophotography photography as described above, image exposure was effected by means of the device shown in FIG. 26 with a semiconductor laser of a wavelength 780 nm with a spot size of 80 μm, and the steps of image formation, developing and cleaning were repeated about 50,000 times, followed by image evaluation. As the result, no interference fringe pattern was observed and there could be obtained a member exhibiting practically satisfactory electrophotographic characteristics.

EXAMPLE 24

According to the same procedure as in Example 23, seven substrates having formed layers to the photosensitive layer thereon were prepared.

Next, the hydrogen ($H_2$) bomb 1261 was replaced with argon (Ar) gas bomb, the deposition device cleaned and the surface layer materials as shown in Table 1C (Condition No. 101 C) are placed over the entire surface of the cathode electrode. One of the substrates having formed layers to the above photosensitive layer is set, and the deposition device is sufficiently evacuated by means of a diffusion pump. Thereafter, argon gas was introduced to 0.015 Torr, and glow discharge was excited at a high frequency power of 150 W to effect sputtering the surface material, thereby forming a surface layer of Table 1C (Condition No. 101 C) on the above substrate (Sample No. 101 C). For remaining six substrates, the surface layers were formed under the conditions as shown in Table 1C (Condition No. 102C-107C) to deposit surface layers thereon (Sample No. 102C-107C).

In these light-receiving members, as shown in FIGS. 64 (B) and (C), the surface of the substrate and the surface of the photosensitive layer were non-parallel to each other. In this case, the difference in average layer thickness between the center and the both ends of the aluminum substrate was 2 μm.

For the seven kinds of light-receiving member for electrophotography as described above, image exposure was effected by means of the device shown in FIG. 26 with a semiconductor laser of a wavelength 780 nm with a spot size of 80 μm, and the steps of image formation, developing and cleaning were repeated for about 50,000 times, followed by image evaluation. The results as shown in Table 1C were obtained.

EXAMPLE 25

Example 23 was repeated except that the flow rate ratio of $SiH_4$ gas to $CH_4$ gas was varied during formation of the surface layer to vary the contents of silicon atoms and carbon atoms in the surface layer to prepare respective light-receiving members for electrophotography. For each of the light-receiving members for electrophotography thus obtained, image exposure was effected similarly as in Example 23 and the steps up to transfer were repeated about 50,000 times, followed by image evaluation to obtain the results as shown in Table 2C.

EXAMPLE 26

Example 23 was repeated except that the flow rate ratio of $SiH_4$ gas, $SiF_4$ gas and $CH_4$ gas was varied during formation of the surface layer to vary the contents of silicon atoms and carbon atoms in the surface layer to prepare respective light-receiving members for electrophotography. For each of the light-receiving members for electrophotography thus obtained, image exposured was effected by laser similarly as in Example 23 and the steps to transfer were repeated about 50,000 times, followed by image evaluation to obtain the results as shown in Table 3C.

EXAMPLE 27

Example 23 was repeated except that the layer thickness of the surface layer was varied to prepare respective light-receiving members for electrophotography. For each of the light-receiving members for electrophotography thus obtained, image exposured was effected by laser similarly as in Example 23 and the steps to transfer were repeated for about 50,000 times, followed by image evaluation to obtain the results as shown in Table 4C.

EXAMPLE 28

A light-receiving member for electrophotography prepared according to the same procedure as described in Example 23 except that the discharging power during formation of the surface layer was changed to 300 W and the average layer thickness was made 2 μm, was found to have a difference in average layer thickness of the surface layer between center and both ends of 0.5 μm, with the layer thickness difference at minute portions of 0.1 μm.

In such a light-receiving member for electrophotography, no interference fringe pattern was observed, and practically satisfactory results could be obtained when it was subjected repeatedly to the steps of image formation, developing and cleaning by means of the same device as used in Example 23.

EXAMPLE 29

The surface of a cylindrical aluminum substrate was worked with a lathe as shown in FIG. 65.

Each of the cylindrical aluminum substrates was used for preparation of a light-receiving member for electrophotography of A-Si:H under the same conditions as in Example 23.

The light-receiving member for electrophotography was similarly as in Example 23 subjected to image exposure by means of the device as shown in FIG. 26, followed by developing and transfer to obtain an image. In this case, the transferred image was found to have practically satisfactory characteristics without interference fringe pattern observed.

EXAMPLE 30

On cylindrical aluminum substrates having the surface characteristics as shown in FIG. 78 and FIG. 79, light-receiving members for electrophotography were prepared under the conditions as shown in FIG. 5C.

During this operation, $NH_3$ gas flow rate was changed relative to $SiH_4$ gas flow rate as shown in FIG. 49 until the $NH_3$ gas flow rate was made zero on completion of the layer formation.

For these light-receiving members for electrophotography, image exposure was effected by means of the same image exposure device as in Example 23, followed by developing, transfer and fixing, to obtain visible images on plain papers. Such an image forming process was repeated continuously for 100,000 times.

In this case, no interference fringe pattern was observed in all of the images obtained, thus giving practically satisfactory characteristics. There was also no difference observed at all between the initial image and the image after 100,000 copying, all being of high quality images.

EXAMPLE 31

On cylindrical aluminum substrates having the surface characteristics as shown in FIG. 78 and FIG. 79, light-receiving members for electrophotography were formed under the conditions shown in Table 6C. During this operation, $NH_3$ gas flow rate was changed relative to gas flow rate as shown in FIG. 49 until the $NH_3$ gas flow rate was made zero on completion of the layer formation.

For these light-receiving members for electrophotography, by means of the same device as in Example 23, image exposure was effected, followed by developing, transfer and fixing, to obtain visible images on plain papers.

In this case, in all the images obtained, no interference fringe pattern was observed to give practically satisfactory characteristics.

EXAMPLE 32

On cylindrical aluminum substrates having the surface characteristics as shown in FIG. 78 and FIG. 79, light-receiving members for electrophotography were formed under the conditions shown in Table 7C. During this operation, $CH_4$ gas flow rate was changed relative to $SiH_4$ gas flow rate as shown in FIG. 49 until the $CH_4$ gas flow rate was made zero on completion of the layer formation.

For these light-receiving members for electrophotography, by means of the same device as in Example 23, image exposure was effected, followed by developing, transfer and fixing, to obtain visible images on plain papers.

In this case, in the images obtained, no interference fringe pattern was observed to give practically satisfactory characteristics.

EXAMPLE 33

On cylindrical aluminum substrates having the surface characteristics as shown in FIG. 78 and FIG. 79, light-receiving members for electrophotography were formed under the conditions shown in Table 8C. During this operation, $CH_4$ gas flow rate was changed relative to $SiH_4$ gas flow rate as shown in FIG. 49 until the $CH_4$ gas flow rate was made zero on completion of the layer formation.

For these light-receiving members for electrophotography, by means of the same device as in Example 23, image exposure was effected, followed by developing, transfer and fixing, to obtain visible images on plain papers.

In this case, in the images obtained, no interference fringe pattern was observed to give practically satisfactory characteristics.

EXAMPLE 34

On cylindrical aluminum substrates having the surface characteristics as shown in FIG. 78 and FIG. 79, light-receiving members for electrophotography were formed under the conditions shown in Table 9C and according to the change rate curve of the gas flow rate ratio of NO to SiH$_4$ as shown in FIG. 26, following otherwise the same conditions and procedure as in Example 23.

For these light-receiving member for electrophotography, by means of the same device as in Example 23, image exposure was effected, followed by developing, transfer and fixing, to obtain visible images on plain papers.

In this case, in the images obtained, no interference fringe pattern was observed to give practically satisfactory characteristics.

EXAMPLE 35

Figure 67:
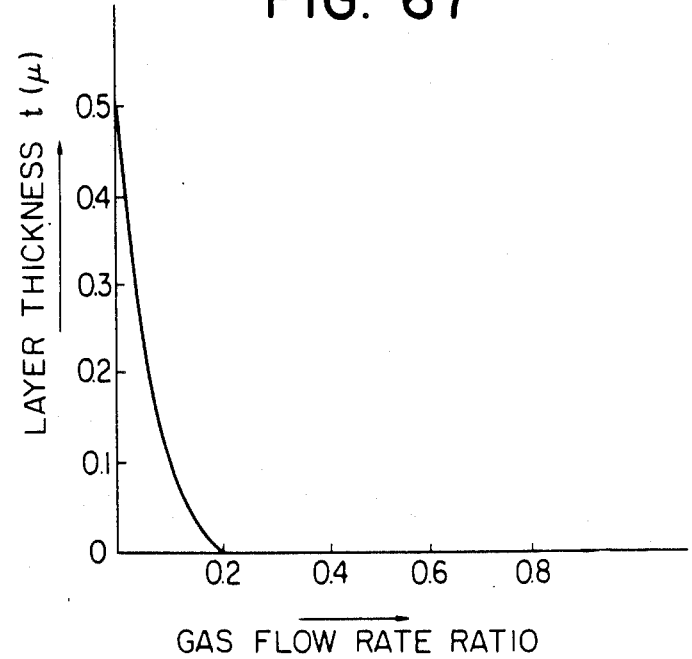

On cylindrical aluminum substrates having the surface characteristics as shown in FIG. 78 and FIG. 79, light-receiving members for electrophotography were formed under the conditions shown in Table 10C and according to the change rate curve of the gas flow rate ratio of NO to SiH$_4$ as shown in FIG. 67, following otherwise the same conditions and procedure as in Example 23.

For these light-receiving members for electrophotography, by means of the same device as in Example 23, image exposure was effected, followed by developing, transfer and fixing, to obtain visible images on plain papers.

In this case, in the images obtained, no interference fringe pattern was observed to give practically satisfactory characteristics.

EXAMPLE 36

Figure 68:
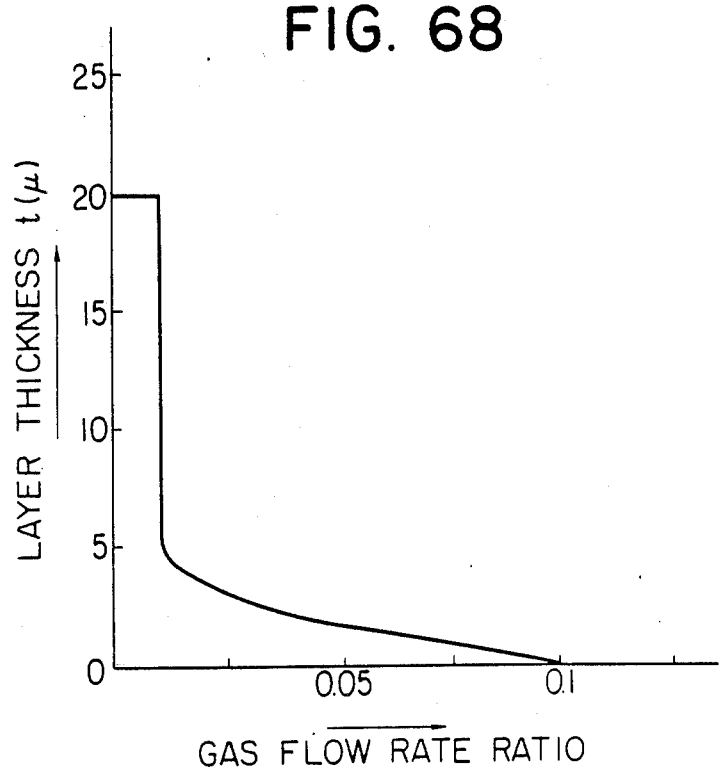

On cylindrical aluminum substrates having the surface characteristics as shown in FIG. 78 and FIG. 79, light-receiving members for electrophotography were formed under the conditions shown in Table 11C and according to the change rate curve of the gas flow rate ratio of NO to SiH$_4$ as shown in FIG. 68, following otherwise the same conditions and procedure as in Example 23.

For these light-receiving members for electrophotography, by means of the same device as in Example 23, image exposure was effected, followed by developing, transfer and fixing, to obtain visible images on plain papers.

In this case, in the images obtained, no interference fringe pattern was observed to give practically satisfactory characteristics.

EXAMPLE 37

Figure 69:
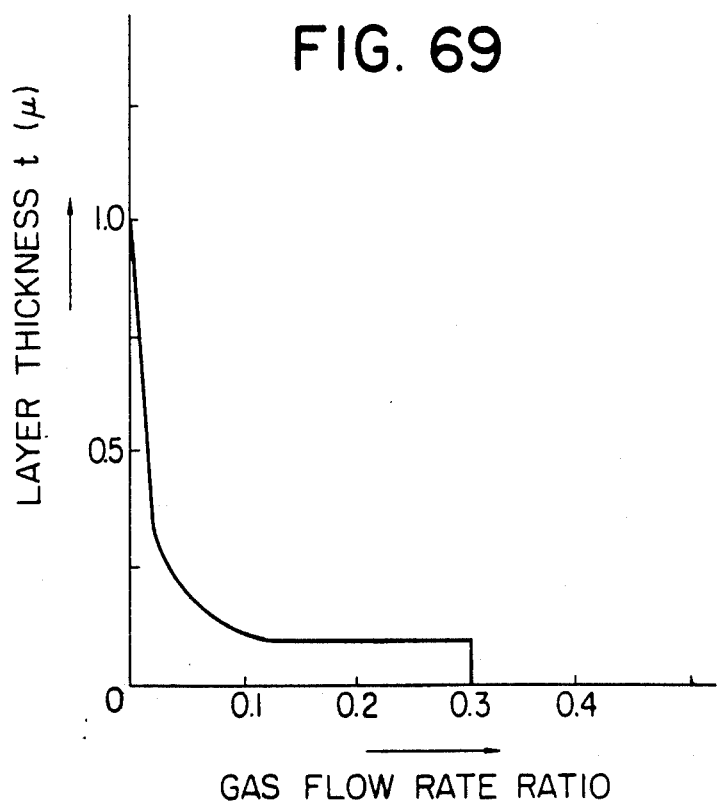

On cylindrical aluminum substrates having the surface characteristics as shown in FIG. 78 and FIG. 79, light-receiving members for electrophotography were formed under the conditions shown in Table 12C and according to the change rate curve of the gas flow rate ratio of NO to SiH$_4$ as shown in FIG. 69, following otherwise the same conditions and procedure as in Example 23.

For these light-receiving members for electrophotography, by means of the same device as in Example 23, image exposure was effected, followed by developing, transfer and fixing, to obtain visible images on plain papers.

In this case, in the images obtained, no interference fringe pattern was observed to give practically satisfactory characteristics.

EXAMPLE 38

On cylindrical aluminum substrates having the surface characteristics as shown in FIG. 78 and FIG. 79, light-receiving members for electrophotography were formed under the conditions shown in Table 13C and according to the change rate curve of the gas flow rate ratio of NO to SiH$_4$ as shown in FIG. 69, following otherwise the same conditions and procedure as in Example 23.

For these light-receiving members for electropotography, by means of the same device as in Example 23, image exposure was effected, followed by developing, transfer and fixing, to obtain visible images on plain papers.

In this case, in the images obtained, no interference fringe pattern was observed to give practically satisfactory characteristics.

EXAMPLE 39

By means of a lathe, an aluminum substrate (length (L): 357 mm, outer diameter (r): 80 mm) was worked to have the surface characteristic as shown in FIG. 64 (B).

Next, a light-receiving member for electrophotography of A-Si was deposited on the above aluminum substrate following various procedures using the deposition device as shown in FIG. 20 under the conditions as shown in Table 5D.

Deposition of the surface layer was carried out as follows.

After deposition of the second layer, the mass flow controllers corresponding to the respective gases were set so that the flow rate ratio of CH$_4$ gas to SiH$_4$ gas became SiH$_4$/CH$_4$=1/30 as shown in Table 5D, and a-SiC(H) with a thickness of 0.5 $\mu$m was deposited at a high frequency power of 150 W.

The surface state of the light-receiving member for electrography of A-Si:H thus prepared was as shown in FIG. 64(C).

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application.

EXAMPLE 40

After deposition up to the second layer similarly as described in Example 39, the hydrogen (H$_2$) bomb was replaced with argon (Ar) gas bomb, the deposition device cleaned and the target for sputtering comprising Si and the target for sputtering comprising graphite were placed on the entire surface of the cathode electrode so that the area ratio might be the value as shown for Sample No. 101D in Table 1D. The above photosensitive layer was set, and the deposition device was sufficiently evacuated by means of a diffusion pump. Thereafter, argon gas was introduced to 0.015 Torr, and glow discharge was excited at a high frequency power of 150 W to effect sputtering the surface material, thereby forming a surface layer of Table 1D (Sample No. 101D) on the above substrate.

Similarly, by varying the target area ratio of Si to graphite, the surface layers were formed as shown for Samples No. 102D to 107D in Table 1D, following otherwise the same procedures as described above to prepare light-receiving members.

For each of the light-receiving member for electrophotography as described above, image exposure was effected by laser similarly as in Example 39, and the steps up to tranfer were repeated about 50,000 times, followed by image evaluation. The results as shown in Table 1D were obtained.

EXAMPLE 41

Example 39 was repeated except that the flow rate ratio of $SiH_4$ gas to $CH_4$ gas was varied during formation of the surface layer to vary the contents of silicon atoms and carbon atoms in the surface layer to prepare respective light-receiving members for electrophotography.

For each of the light-receiving members for electrophotography thus obtained, image exposure was effected by laser similarly as in Example 39 and the steps up to transfer were repeated about 50,000 times, followed by image evaluation to obtain the results as shown in Table 2D.

EXAMPLE 42

Example 39 was repeated except that the flow rate ratio of $SiH_4$ gas, $SiF_4$ gas and $CH_4$ gas was varied during formation of the surface layer to vary the contents of silicon atoms and carbon atoms in the surface layer to prepare respective light-receiving members for electrophotography. For each of the light-receiving members for electrophotography thus obtained, image exposured was effected by laser similarly as in Example 39 and the steps to transfer were repeated about 50,000 times, followed by image evaluation to obtain the results as shown Table 3D.

EXAMPLE 43

Example 39 was repeated except that the layer thickness of the surface layer was varied to prepare respective light-receiving members for electrophotography. For each of the light-receiving members for electrophotography thus obtained, image exposured was effected similarly as in Example 39 and the steps of image forming, developing and cleaning were repeated about 50,000 times, followed by image evaluation to obtain the results as shown in Table 4D.

EXAMPLE 44

A light-receiving member for electrophotography prepared according to the same procedure as described in Example 39 except that the discharging power during formation of the surface layer was changed to 300 W and the average layer thickness was made 2 μm, was found to have a difference in average layer thickness of the surface layer between center and both ends of 0.5 μm, with the layer thickness difference at minute portions of 0.1 μm.

In such a light-receiving member for electrophotography, no interference fringe pattern was observed, and practically satisfactory results could be obtained when it was subjected repeatedly to the steps of image formation, developing and cleaning by means of the same device as used in Example 39.

EXAMPLE 45

On cylindrical aluminum substrates having the surface characteristics as shown in FIG. 65, FIG. 78 and FIG. 79, light-receiving members for electrophotography were prepared under the conditions as shown in Table 6D, following otherwise the same procedure as in Example 39.

For these light-receiving members for electrophotography, image exposure was effected by means of the same image exposure device as in Example 39, followed by developing, transfer and fixing, to obtain visible images on plain papers. Such an image forming process was repeated continuously 100,000 times.

In this case, no interference fringe pattern was observed in all of the images obtained, thus giving practically satisfactory characteristics. There was also no difference observed at all between the initial image and the image after 100,000 copying, all being high quality images.

EXAMPLE 46

On cylindrical aluminum substrates having the surface characteristics as shown in FIG. 65, FIG. 78 and FIG. 79, light-receiving members for electrophotography were prepared under the conditions as shown in Table 7D, following otherwise the same procedure as in Example 39.

For these light-receiving members for electrophotography, image exposure was effected by means of the same image exposure device as in Example 39, followed by developing, transfer and fixing, to obtain visible images on plain papers. Such an image forming process was repeated continuously 100,000 times.

In this case, no interference fringe pattern was observed in all of the images obtained, thus giving practically satisfactory characteristics. There was also no difference observed at all between the initial image and the image after 100,000 copying, all being high quality images.

EXAMPLE 47

On cylindrical aluminum substrates having the surface characteristics as shown in FIG. 65, FIG. 78 and FIG. 79, light-receiving members for electrophotography were prepared under the conditions as shown in Table 8D, following otherwise the same procedure as in Example 39.

For these light-receiving members for electrophotography, image exposure was effected by means of the same image exposure device as in Example 39, followed by developing, transfer and fixing, to obtain visible images on plain papers. Such an image forming process was repeated continuously 100,000 times.

In this case, no interference fringe observed in all of the images obtained, thus giving practically satisfactory characteristics. There was also no difference observed at all between the initial image and the image after 100,000 copying, all being high quality images.

EXAMPLE 48

By means of a lathe, an aluminum substrate (length (L): 357 mm, outer diameter (r): 80 mm) was worked to have the surface characteristic as shown in FIG. 64 (B).

Next, a light-receiving member for electrophotography of A-Si was deposited on the above aluminum substrate following various procedures using the deposition device as shown in FIG. 20 under the conditions as shown in Table 5E.

Figure 22:
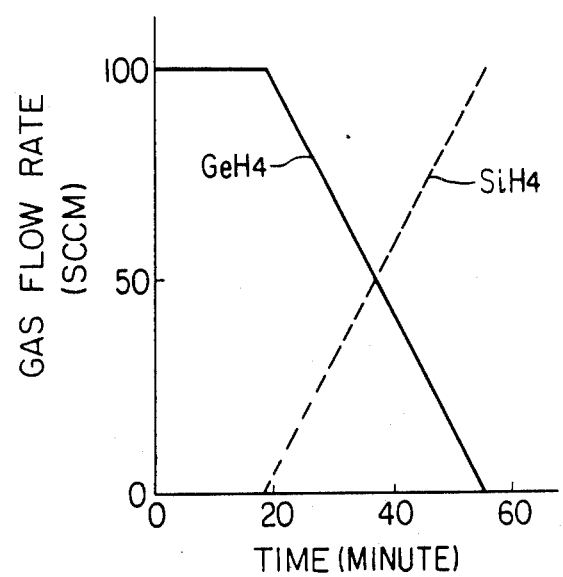

In preparation of the first layer of a-(Si:Ge) :H:B layer, the mass flow controllers 2007 and 2008 for $GeH_4$ and $SiH_4$ were controlled by a computer (HP9845B) so that the flow rates of $GeH_4$ and $SiH_4$ might be as shown in FIG. 22. of the cathode electrode so that the area ratio may be the value as shown for Sample No. 101E in Table 1E. The above photosensitive layer is set, and the deposition device is sufficiently evacuated by means of a diffusion pump. Thereafter, argon gas was introduced to 0.015 Torr, and glow discharge was excited at a high frequency power of 150 W to effect sputtering the surface material, thereby forming a surface layer of Table 1E, Sample No. 101E on the above substrate.

Similarly, by varying the target area ratio of Si to graphite, the surface layers were formed as shown for Samples No. 102E to 107E in Table 1E, following otherwise the same procedure as described above to prepare light-receiving members.

For each of the light-receiving member for electrophotography as described above, image exposure was effected with laser similarly as in Example 48, and the steps to transfer were repeated about 50,000 times, followed by image evaluation. The results as shown in Table 1E were obtained.

EXAMPLE 50

Example 48 was repeated except that the flow rate ratio of $SiH_4$ gas to $CH_4$ gas was varied during formation of the surface layer to vary the contents of silicon atoms and carbon atoms in the silicon Deposition of the surface layer was carried out as follows.

After deposition of the second layer, the mass flow controllers corresponding to the respective gases were set so that the flow rate ratio of $CH_4$ gas to $SiH_4$ gas became $SiH_4/CH_4=1/30$ as shown in Table 5E, and a-SiC(H) with a thickness of 0.5 μm was deposited at a high frequency power of 150 W.

The surface state of the light-receiving member for electrography of A-Si:H thus prepared was as shown in FIG. 64 (C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 49

After deposition up to the second layer similarly as described in Example 48, the hydrogen ($H_2$) bomb was replaced with argon (Ar) gas bomb, the deposition device cleaned and the target for sputtering comprising Si and the target for sputtering comprising graphite are placed on the entire surface layer in the surface layer to prepare respective light-receiving members for electrophotography.

For each of the light-receiving members for electrophotography thus obtained, image exposure was effected by laser similarly as in Example 48 and the steps to transfer were repeated about 50,000 times, followed by image evaluation to obtain the results as shown in Table 2E.

EXAMPLE 51

Example 48 was repeated except that the flow rate ratio of $SiH_4$ gas, $SiF_4$ gas and $CH_4$ gas was varied during formation of the surface layer to vary the contents of silicon atoms and carbon atoms in the silicon layer in the surface layer to prepare respective light-receiving members for electrophotography. For each of the light-receiving members for electrophotography thus obtained, image exposured was effected by laser similarly as in Example 48 and the steps to transfer were repeated for about 50,000 times, followed by image evaluation to obtain the results as shown in Table 3E.

EXAMPLE 52

Example 48 was repeated except that the layer thickness of the surface layer was varied to prepare respective light-receiving members for electrophotography. For each of the light-receiving members for electrophotography thus obtained, image exposured was effected similarly as in Example 48 and the steps to transfer were repeated followed by image evaluation to obtain the results as shown in Table 4E.

EXAMPLE 53

A light-receiving member for electrophotography prepared according to the same procedure as described in Example 48 except that the discharging power during formation of the surface layer was changed to 300 W and the average layer thickness was made 2 μm, was found to have a difference in average layer thickness of the surface layer between center and both ends of 0.5 μm, with the layer thickness difference at minute portions of 0.1 μm.

In such a light-receiving member for electrophotography, no interference fringe pattern was observed, and practically satisfactory results could be obtained when it was subjected repeatedly to the steps of image formation, developing and cleaning by means of the same device as used in Example 48.

EXAMPLE 54

On cylindrical aluminum substrates having the surface characteristics as shown in FIG. 65, FIG. 68 and FIG. 79, light-receiving members for electrophotography were prepared under the conditions as shown in FIG. 5E, following otherwise the same procedure as in Example 48.

Figure 23:
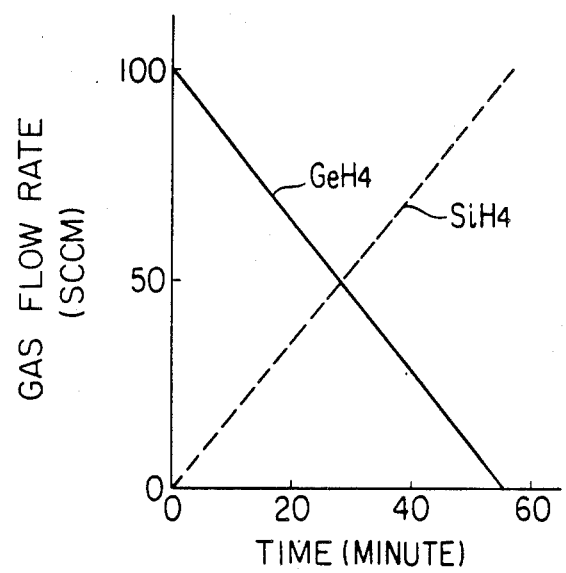

In preparation of the first layer of a(Si:Ge):H:B layer, the mass flow controllers 2007 and 2008 for $GeH_4$ and $SiH_4$ were controlled by a computer (HP9845B) so that the flow rates of $GeH_4$ and $SiH_4$ might be as shown in FIG. 23.

For these light-receiving members for electrophotography, image exposure was effected by means of the same image exposure device as in Example 48, followed by developing, tarnsfer and fixing, to obtain visible images on plain papers. Such an image forming process was repeated continuously 100,000 times.

In this case, no interference fringe was observed in all of the images obtained, thus giving practically satisfactory characteristics. There was also no difference observed at all between the initial image and the image after 100,000 copying, all being high quality images.

EXAMPLE 55

On cylindrical aluminum substrates having the surface characteristics as shown in FIG. 65, FIG. 78 and FIG. 79, light-receiving members for electrophotography were prepared under the conditions as shown in FIG. 6E, following otherwise the same procedure as in Example 48.

Figure 24:
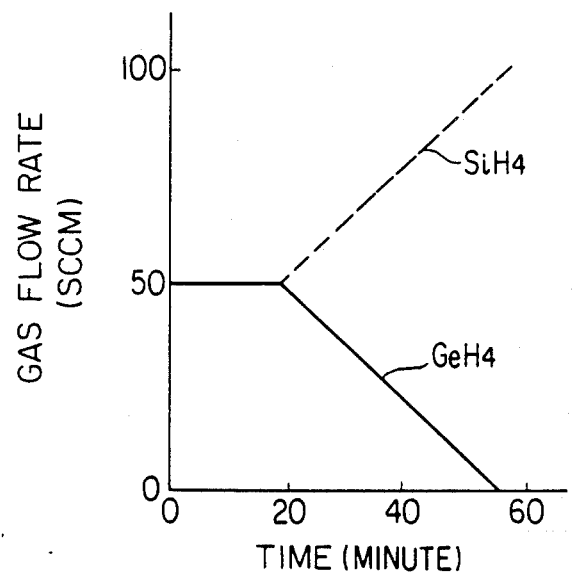

In preparation of the first layer of a(Si:Ge):H:B layer, the mass flow controllers 2007 and 2008 for $GeH_4$ and $SiH_4$ were controlled by a computer (HP9845B) so that the flow rates of $GeH_4$ and $SiH_4$ might be as shown in FIG. 24.

For these light-receiving members for electrophotography, image exposure was effected by means of the same image exposure device as in Example 48, followed by developing, transfer and fixing, to obtain visible images on plain papers. Such an image forming process was repeated continuously for 100,000 times.

In this case, no interference fringe was observed in all of the images obtained, thus giving practically satisfactory characteristics. There was also no difference observed at all between the initial image and the image after 100,000 copying, all being high quality images.

EXAMPLE 56

On cylidrical aluminum substrates having the surface characteristics as shown in FIG. 65, FIG. 78 and FIG. 79, light-receiving members for electrophotography were prepared under the conditions as shown in FIG. 6E, following otherwise the same procedure as in Example 48.

In preparation of the first layer of a(Si:Ge):H:B layer, the mass flow controllers 2007 and 2008 for $GeH_4$ and $SiH_4$ were controlled by a computer (HP9845B) so that the flow rates of $GeH_4$ and $SiH_4$ might be as shown in FIG. 25.

For these light-receiving members for electrophotography, image exposure was effected by means of the same image exposure device as in Example 48, followed by developing, transfer and fixing, to obtain visible images on plain papers. Such an image forming process was repeated continuously 100,000 times.

In this case, no interference fringe was observed in all of the images obtained, thus giving practically satisfactory characteristics. There was also no difference observed at all between the initial image and the image after 100,000 copying, all being high quality images.

EXAMPLE 57

By means of a lathe, an aluminum substrate (length (L): 357 mm, outer diameter (r) 80 mm) was worked to have the surface characteristic as shown in FIG. 64 (B).

Next, a light-receiving member for electrophotography of A-Si was deposited on the above aluminum substrate following various procedures using the deposition device as shown in FIG. 20 under the conditions as shown in Table 5F.

Deposition of the surface layer was carried out as follows.

After deposition of the second layer, the mass controllers corresponding to the respective gases were set so that the flow rate ratio of $CH_4$ gas to $SiH_4$ gas became $SiH_4/CH_4=1/30$ as shown in Table 5F, and a-SiC(H) with a thickness of 0.5 μm was deposited at a high frequency power of 150 W.

The surface state of the light-receiving member for electrography of A-Si:H thus prepared was as shown in FIG. 64 (C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference pattern observed and proved to be satisfactory for practical application.

EXAMPLE 58

After deposition up to the second layer similarly as described in Example 57, the hydrogen ($H_2$) bomb was replaced with argon (Ar) gas bomb, the deposition device cleaned and the target for sputtering comprising Si and the target for sputtering comprising graphite are placed on the entire surface of the cathode electrode so that the area ratio may be the value as shown for Sample No. 101F in Table 1F. The above photosensitive layer is set, and the deposition device is sufficiently evacuated by means of a diffusion pump. Thereafter, argon gas was introduced to 0.015 Torr, and glow discharge was excited at a high frequency power of 150 W to effect sputtering the surface material, thereby forming a surface layer of Table 1F, Sample No. 101F on the above substrate.

Similarly, by varying the target area ratio of Si to graphite, the surface layers were formed as shown for Samples No. 102F to 107F in Table 1F, following otherwise the same procedure as described above to prepare light-receiving members.

For each of the light-receiving member for electrophotography as described above, image exposure was effected with laser similarly as in Example 57, and the steps to transfer were repeated about 50,000 times, followed by image evaluation. The results as shown in Table 1F were obtained.

EXAMPLE 59

Example 57 was repeated except that the flow rate ratio of $SiH_4$ gas to $CH_4$ gas was varied during formation of the surface layer to vary the contents of silicon atoms and carbon atoms in the surface layer to prepare respective light-receiving members for electrophotography.

For each of the light-receiving members for electrophotography thus obtained, image exposure was effected by laser similarly as in Example 57 and the steps up to transfer were repeated about 50,000 times, followed by image evaluation to obtain the results as shown in Table 2F.

EXAMPLE 60

Example 57 was repeated except that the flow rate ratio of $SiH_4$ gas, $SiF_4$ gas and $CH_4$ gas was varied during formation of the surface layer to vary the contents of silicon atoms and carbon atoms in the surface layer to prepare respective light-receiving members for electrophotography. For each of the light-receiving members for electrophotography thus obtained, image exposured was effected similarly as in Example 57 and the steps to transfer were repeated about 50,000 times, followed by image evaluation to obtain the reuslts as shown in Table 3F.

EXAMPLE 61

Example 57 was repeated except that the layer thickness of the surface layer was varied to prepare respective light-receiving members for electrophotography. For each of the light-receiving members for electrophotography thus obtained, image exposured was effected similarly as in Example 57 and the steps of image formation, developing and cleaning were repeated times, followed by image evaluation to obtain the results as shown in Table 4F.

EXAMPLE 62

A light-receiving member for electrophotography prepared according to the same procedure as described in Example 57 except that the discharging power during formation of the surface layer was changed to 300 W and the average layer thickness was made 2 µm, was found to have a difference in average layer thickness of the surface layer between center and both ends of 0.5 µm, with the layer thickness difference at minute portions of 0.1 µm.

In such a light-receiving member for electrophotography, no interference fringe pattern was observed, and practically satisfactory results could be obtained when it was subjected repeatedly to the steps of image formation, developing and cleaning by means of the same device as used in Example 57.

EXAMPLE 63

On cylindrical aluminum substrates having the surface characteristics as shown in FIG. 65, FIG. 78 and FIG. 79, light-receiving members for electrophotography were prepared under the conditions as shown in Table 6F, following otherwise the same procedure as in Example 57.

For these light-receiving members for electrophotography, image exposure was effected by means of the same image exposure device as in Example 57, followed by developing, transfer and fixing, to obtain visible images on plain papers. Such an image forming process was repeated continuously 100,000 times.

In this case, no interference fringe was observed in all of the images obtained, thus giving practically satisfactory characteristics. There was also no difference observed at all between the initial image and the image after 100,000 copying, all being high quality images.

EXAMPLE 64

On cylindrical aluminum substrates having the surface characteristics as shown in FIG. 65, FIG. 78 and FIG. 79, light-receiving members for electrophotography were prepared under the conditions as shown in Table 7F, following otherwise the same procedure as in Example 57.

For these light-receiving members for electrophotography, image exposure was effected by means of the same image exposure device as in Example 57, followed by developing, transfer and fixing, to obtain visible images on plain papers. Such an image forming process was repeated continuously 100,000 times.

In this case, no interference fringe was observed in all of the images obtained, thus giving practically satisfactory characteristics. There was also no difference observed at all between the initial image and the image after 100,000 copying, all being high quality images.

EXAMPLE 65

On cylindrical aluminum substrates having the surface characteristics as shown in FIG. 65, FIG. 78 and FIG. 79, light-receiving members for electrophotography were prepared under the conditions as shown in Table 8F, following otherwise the same procedure as in Example 57.

For these light-receiving members for electrophotography, image exposure was effected by means of the same image exposure device as in Example 57, followed by developing, transfer and fixing, to obtain visible images on plain papers. Such an image forming process was repeated continuously for 100,000 times.

In this case, no interference fringe was observed in all of the images obtained, thus giving practically satisfactory characteristics. There was also no difference observed at all between the initial image and the image after 100,000 copying, all being high quality images.

EXAMPLE 66

On cylindrical aluminum substrates having the surface characteristics as shown in FIG. 65, FIG. 78 and FIG. 79, light-receiving members for electrophotography were prepared under the conditions as shown in Table 9F, following otherwise the same procedure as in Example 57.

For these light-receiving members for electrophotography, image exposure was effected by means of the same image exposure device as in Example 57, followed by developing, transfer and fixing, to obtain visible images on plain papers. Such an image forming process was repeated continuously 100,000 times.

In this case, no interference fringe was observed in all of the images obtained, thus giving practically satisfactory characteristics. There was also no difference observed at all between the initial image and the image after 100,000 copying, all being high quality images.

EXAMPLE 67

On cylindrical aluminum substrates having the surface characteristics as shown in FIG. 65, FIG. 78 and FIG. 79, light-receiving members for electrophotography were prepared under the conditions as shown in Table 10F, following otherwise the same procedure as in Example 57.

For these light-receiving members for electrophotography, image exposure was effected by means of the same image exposure device as in Example 57, followed by developing, transfer and fixing, to obtain visible images on plain papers. Such an image forming procss was repeated continuously for 100,000 times.

In this case, no interference fringe was observed in all of the images obtained, thus giving practically satisfactory characteristics. There was also no difference observed at all between the initial image and the image after 100,000 copying all being high quality images.

EXAMPLE 68

On cylindrical aluminum substrates having the surface characteristics as shown in FIG. 65, FIG. 78 and FIG. 79, light-receiving members for electrophotography were prepared under the conditions as shown in Table 11F, following otherwise the same procedure as in Example 57.

For these light-receiving members for electrophotography, image exposure was effected by means of the same image exposure device as in Example 57, followed by developing, transfer and fixing, to obtain visible images on plain papers. Such an image forming process was repeated continuously 100,000 times.

In this case, no interference fringe was observed in all of the images obtained, thus giving practically satisfactory characteristics. There was also no difference observed at all between the initial image and the image after 100,000 copying, all being high quality images.

EXAMPLE 69

On cylindrical aluminum substrates having the surface characteristics as shown in FIG. 65, FIG. 78 and FIG. 79, light-receiving members for electrophotography were prepared under the conditions as shown in Table 12F, following otherwise the same procedure as in Example 57.

For these light-receiving members for electrophotography, image exposure was effected by means of the same image exposure device as in Example 57, followed by developing, transfer and fixing, to obtain visible images on plain papers. Such an image forming process was repeated continuously 100,000 times.

In this case, no interference fringe was observed in all of the images obtained, thus giving practically satisfactory characteristics. There was also no difference observed at all between the initial image and the image after 100,000 copying, all being high quality images.

EXAMPLE 70

On cylindrical aluminum substrates having the surface characteristics as shown in FIG. 65, FIG. 78 and FIG. 79, light-receiving members for electrophotography were prepared under the conditions as shown in Table 13F, following otherwise the same procedure as in Example 57.

For these light-receiving members for electrophotography, image exposure was effected by means of the same image exposure device as in Example 57, followed by developing, transfer and fixing, to obtain visible images on plain papers. Such an image forming process was repeated continuously for 100,000 times.

In this case, no interference fringe was observed in all of the images obtained, thus giving practically satisfactory characteristics. There was also no difference observed at all between the initial image and the image after 100,000 copying, all being high quality images.

EXAMPLE 71

On cylindrical aluminum substrates having the surface characteristics as shown in FIG. 65, FIG. 78 and FIG. 79, light-receiving members for electrophotography were prepared under the conditions as shown in Table 14F, following otherwise the same procedure as in Example 57.

For these light-receiving members for electrophotography, image exposure was effected by means of the same image exposure device as in Example 57, followed by developing, transfer and fixing, to obtain visible images on plain papers. Such an image forming process was repeated continuously for 100,000 times.

In this case, no interference fringe was observed in all of the images obtained, thus giving practically satisfactory characteristics. There was also no difference observed at all between the initial image and the image after 100,000 copying all being high quality images.

EXAMPLE 72

On cylindrical aluminum substrates having the surface characteristics as shown in FIG. 65, FIG. 78 and FIG. 79, light-receiving members for electrophotography were prepared under the conditions as shown in Table 15F, following otherwise the same procedure as in Example 57.

For these light-receiving members for electrophotography, image exposure was effected by means of the same image exposure device as in Example 57, followed by developing, transfer and fixing, to obtain visible images on plain papers. Such an image forming process was repeated continuously for 100,000 times.

In this case, no interference fringe was observed in all of the images obtained, thus giving practically satisfactory characteristics. There was also no difference observed at all between the initial image and the image after 100,000 copying, all being high quality images.

EXAMPLE 73

On cylindrical aluminum substrates having the surface characteristics as shown in FIG. 65, FIG. 78 and FIG. 79, light-receiving members for electrophotography were prepared under the conditions as shown in Table 16F, following otherwise the same procedure as in Example 57.

For these light-receiving members for electrophotography, image exposure was effected by means of the same image exposure device as in Example 57, followed by developing, transfer and fixing, to obtain visible images on plain papers. Such an image forming process was repeated continuously 100,000 times.

In this case, no interference fringe was observed in all of the images obtained, thus giving practically satisfactory characteristics. There was also no difference observed at all between the initial image and the image after 100,000 copying, all being high quality images.

EXAMPLE 74

On cylindrical aluminum substrates having the surface characteristics as shown in FIG. 65, FIG. 78 and FIG. 79, light-receiving members for electrophotography were prepared under the conditions as shown in Table 17F, following otherwise the same procedure as in Example 57.

For these light-receiving members for electrophotography, image exposure was effected by means of the same image exposure device as in Example 57, followed by developing, transfer and fixing, to obtain visible images on plain papers. Such an image forming process was repeated continuously for 100,000 times.

In this case, no interference fringe pattern was observed in all of the images obtained, thus giving practically satisfactory characteristics. There was also no difference observed at all between the initial image and the image after 100,000 copying, all being high quality images.

EXAMPLE 75

On cylindrical aluminum substrates having the surface characteristics as shown in FIG. 65, FIG. 78 and FIG. 79, light-receiving members for electrophotography were prepared under the conditions as shown in Table 18F, following otherwise the same procedure as in Example 57.

For these light-receiving members for electrophotography, image exposure was effected by means of the same image exposure device as in Example 57, followed by developing, transfer and fixing, to obtain visible images on plain papers. Such an image forming process was repeated continuously 100,000 times.

In this case, no interference fringe pattern was observed in all of the images obtained, thus giving practically satisfactory characteristics. There was also no difference observed at all between the initial image and the image after 100,000 copying, all being high quality images.

EXAMPLE 76

Examples 57 to 75 were repeated except that $PH_3$ gas diluted to 3000 vol ppm with $H_2$ was employed in place of $B_2H_6$ gas diluted to 3000 vol ppm with $H_2$ to prepare light-receiving members for electrophotography respectively.

Other preparation conditions were the same as in Examples 57 to 75.

For these light-receiving members for electrophotography, image exposure was effected by means of the same image exposure device as in Example 57, followed by developing, transfer and fixing, to obtain visible images on plain papers. Such an image forming process was repeated continuously 100,000 times.

In this case, no interference fringe was observed in all of the images obtained, thus giving practically satisfactory characteristics. There was also no difference observed at all between the initial image and the image after 100,000 copying, all being high quality images.

EXAMPLE 77

By means of a lathe, an aluminum substrate (length (L): 357 mm, outer diameter (r): 80 mm) was worked to have the surface characteristic as shown in FIG. 64 (B).

Next, a light-receiving member for electrophotography of A-Si was deposited on the above aluminum substrate following various procedures using the deposition device as shown in FIG. 20 under the conditions as shown in Table 5G.

In preparation of the first layer of a-(Si:Ge):H:B layer, the mass flow controllers 2007 and 2008 for $GeH_4$ and $SiH_4$ were controlled by a computer (HP9845B) so that the flow rates of $GeH_4$ and $SiH_4$ might be as shown in FIG. 22.

Deposition of the surface layer was carried out as follows.

After deposition of the second layer, the mass controllers corresponding to the respective gases were set so that the flow rate ratio of $CH_4$ gas to $SiH_4$ gas became $SiH_4/CH_4 = 1/30$ as shown in Table 5G, and a-SiC(H) with a thickness of 0.5 μm was deposited at a high frequency power of 150 W.

The surface state of the light-receiving member for electrography of A-Si:H thus prepared was as shown in FIG. 64(C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference pattern observed and proved to be satisfactory for practical application.

EXAMPLE 78

After deposition up to the second layer similarly as described in Example 77, the hydrogen ($H_2$) bomb was replaced with argon (Ar) gas bomb, the deposition device cleaned and the target for sputtering comprising Si and the target for sputtering comprising graphite are placed on the entire surface of the cathode electrode so that the area ratio may be the value as shown for Sample No. 101G in Table 1G. The above photosensitive layer is set, and the deposition device is sufficiently evacuated by means of a diffusion pump. Thereafter, argon gas was introduced to 0.015 Torr, and glow discharge was excited at a high frequency power of 150 W to effect sputtering the surface material, thereby forming a surface layer of Table 1G, Sample No. 101G on the above substrate.

Similarly, by varying the target area ratio of Si to graphite, the surface layers were formed as shown for Samples No. 102G to 107G in Table 1G, following otherwise the same procedure as described above to prepare light-receiving members.

For each of the light-receiving member for electrophotography as described above, image exposure was effected by laser with laser similarly as in Example 77, and the steps up to transfer were repeated for about 50,000 times, followed by image evaluation. The results as shown in Table 1G were obtained.

EXAMPLE 79

Example 77 was repeated except that the flow rate ratio of $SiH_4$ gas to $CH_4$ gas was varied during formation of the surface layer to vary the contents of silicon atoms and carbon atoms in the surface layer to prepare respective light-receiving members for electrophotography.

For each of the light-receiving members for electrophotography thus obtained, image exposure was effected by laser similarly as in Example 77 and the steps up to transfer were repeated for about 50,000 times, followed by image evaluation to obtain the results as shown in Table 2G.

EXAMPLE 80

Example 77 was repeated except that the flow rate ratio of $SiH_4$ gas, $SiF_4$ gas and $CH_4$ gas was varied during formation of the surface layer to vary the contents of silicon atoms and carbon atoms in the surface layer to prepare respective light-receiving members for electrophotography. For each of the light-receiving members for electrophotography thus obtained, image exposured was effected by laser similarly as in Example 77 and the steps to transfer were repeated for about 50,000 times, followed by image evaluation to obtain the results as shown in Table 3G.

EXAMPLE 81

Example 77 was repeated except that the layer thickness of the surface layer was varied to prepare respective light-receiving members for electrophotography. For each of the light-receiving members for electrophotography thus obtained, image exposured was effected similarly as in Example 77 and the steps of image formation, developing and cleaning were repeated for about 50,000 times, followed by image evaluation to obtain the results as shown in Table 4G.

EXAMPLE 82

A light-receiving member for electrophotography prepared according to the same procedure as described in Example 77 except that the discharging power during formation of the surface layer was changed to 300 W and the average layer thickness was made 2 μm, was found to have a difference in average layer thickness of the surface layer between center and both ends of 0.5 μm, with the layer thickness difference at minute portions of 0.1 μm.

In such a light-receiving member for electrophotography, no interference fringe pattern was observed, and practically satisfactory results could be obtained when it was subjected repeatedly to the steps of image formation, developing and cleaning by means of the same device as used in Example 77.

EXAMPLE 83

On an aluminum cylinder having the surface characteristic as shown in FIG. 27, a light-receiving member for electrophotography was prepared similarly as in Example 77 under the conditions as shown in Table 5G.

In preparation of the first layer of a-(Si:Ge):H:B layer, the mass flow controllers 2007 and 2008 for GeH$_4$ and SiH$_4$ were controlled by a computer (HP9845B) so that the flow rates of GeH$_4$ and SiH$_4$ might be as shown in FIG. 23.

For these light-receiving members for electrophotography, image exposure was effected by means of the same image exposure device as in Example 77, followed by developing, transfer and fixing, to obtain visible images on plain papers. Such an image forming process was repeated continuously for 100,000 times.

In this case, no interference fringe was observed in all of the images obtained, thus giving practically satisfactory characteristics. There was also no difference observed at all between the initial image and the image after 100,000 copying, all being high quality images.

EXAMPLE 84

On an aluminum cylinder having the surface characteristic as shown in FIG. 65, a light-receiving member for electrophotography was prepared similarly as in Example 77 under the conditions as shown in Table 6G.

In preparation of the first layer of a-(Si:Ge):H:B layer, the mass flow controllers 2007 and 2008 for GeH$_4$ and SiH$_4$ were controlled by a computer (HP9845B) so that the flow rates of GeH$_4$ and SiH$_4$ might be as shown in FIG. 22.

For these light-receiving members for electrophotography, image exposure was effected by means of the same image exposure device as in Example 77, followed by developing, transfer and fixing, to obtain visible images on plain papers. Such an image forming process was repeated continuously for 100,000 times.

In this case, no interference fringe was observed in all of the images obtained, thus giving practically satisfactory characteristics. There was also no difference observed at all between the initial image and the image after 100,000 copying, all being high quality images.

EXAMPLE 85

On an aluminum cylinder having the surface characteristic as shown in FIG. 78, a light-receiving member for electrophotography was prepared similarly as in Example 77 under the conditions as shown in Table 6G.

In preparation of the first layer of a-(Si:Ge):H:B layer, the mass flow controllers 2007 and 2008 for GeH$_4$ and SiH$_4$ were controlled by a computer (HP 9845B) so that the flow rates of GeH$_4$ and SiH$_4$ might be as shown in FIG. 23.

For these light-receiving members for electrophotography, image exposure was effected by means of the same image exposure device as in Example 77, followed by developing, transfer and fixing, to obtain visible images on plain papers. Such an image forming process was repeated continuously 100,000 times.

In this case, no interference fringe was observed in all of the images obtained, thus giving practically satisfactory characteristics. There was also no difference observed at all between the initial image and the image after 100,000 copying, all being high quality images.

EXAMPLE 86

On an aluminum cylinder having the surface characteristic as shown in FIG. 79, a light-receiving member for electrophotography was prepared similarly as in Example 77 under the conditions as shown in Table 7G.

In preparation of the first layer of a-(Si:Ge):H:B layer, the mass flow controllers 2007 and 2008 for GeH$_4$ and SiH$_4$ were controlled by a computer (HP9845B) so that the flow rates of GeH$_4$ and SiH$_4$ might be as shown in FIG. 22.

For these light-receiving members for electrophotography, image exposure was effected by means of the same image exposure device as in Example 77, followed by developing, transfer and fixing, to obtain visible images on plain papers. Such an image forming process was repeated continuously for 100,000 times.

In this case, no interference fringe was observed in all of the images obtained, thus giving practically satisfactory characteristics. There was also no difference observed at all between the initial image and the image after 100,000 copying, all being high quality images.

EXAMPLE 87

On an aluminum cylinder having the surface characteristic as shown in FIG. 65, a light-receiving member for electrophotography was prepared similarly as in Example 77 under the conditions as shown in Table 8G.

In preparation of the first layer of a-(Si:Ge):H:B layer, the mass flow controllers 2007 and 2008 for GeH$_4$ and SiH$_4$ were controlled by a computer (HP9845B) so that the flow rates of GeH$_4$ and SiH$_4$ might be as shown in FIG. 24.

For these light-receiving members for electrophotography, image exposure was effected by means of the same image exposure device as in Example 77, followed by developing, transfer and fixing, to obtain visible images on plain papers. Such an image forming process was repeated continuously for 100,000 times.

In this case, no interference fringe was observed in all of the images obtained, thus giving practically satisfactory characteristics. There was also no difference observed at all between the initial image and the image after 100,000 copying, all being high quality images.

EXAMPLE 88

On an aluminum cylinder having the surface characteristic as shown in FIG. 78, a light-receiving member for electrophotography was prepared similarly as in Example 77 under the conditions as shown in Table 9G.

In preparation of the first layer of a-(Si:Ge):H:B layer, the mass flow controllers 2007 and 2008 for GeH$_4$ and SiH$_4$ were controlled by a computer (HP9845B) so that the flow rates of GeH$_4$ and SiH$_4$ might be as shown in FIG. 25.

For these light-receiving members for electrophotography, image exposure was effected by means of the same image exposure device as in Example 77, followed by developing, transfer and fixing, to obtain visible images on plain papers. Such an image forming process was repeated continuously for 100,000 times.

In this case, no interference fringe was observed in all of the images obtained, thus giving practically satisfactory characteristics. There was also no difference observed at all between the initial image and the image after 100,000 copying, all being high quality images.

EXAMPLE 89

On an aluminum cylinder having the surface characteristic as shown in FIG. 79, a light-receiving member for electrophotography was prepared similarly as in Example 77 under the conditions as shown in Table 10G.

In preparation of the first layer of a-(Si:Ge):H:B layer, the mass flow controllers 2007 and 2008 for GeH$_4$ and SiH$_4$ were controlled by a computer (HP9845B) so that the flow rates of GeH$_4$ and SiH$_4$ might be as shown in FIG. 23.

For these light-receiving members for electrophotography, image exposure was effected by means of the same image exposure device as in Example 77, followed by developing, transfer and fixing, to obtain visible images on plain papers. Such an image forming process was repeated continuously for 100,000 times.

In this case, no interference fringe was observed in all of the images obtained, thus giving practically satisfactory characteristics. There was also no difference observed at all between the initial image and the image after 100,000 copying, all being high quality images.

EXAMPLE 90

Examples 77 to 89 were repeated except that PH$_3$ gas diluted to 3000 vol ppm with H$_2$ was employed in place of B$_2$H$_6$ gas diluted to 3000 vol ppm with H$_2$ to prepare light-receiving members for electrophotography respectively.

Other preparation conditions were the same as in Examples 77 to 89.

For these light-receiving members for electrophotography, image exposure was effected by means of an image exposure device as shown in FIG. 26 (wavelength of laser beam: 780 nm, spot diameter 80 $\mu$m), followed by development and transfer, to obtain images. All of the images were free from interference fringe pattern and practically satisfactory.

EXAMPLE 91

By means of a lathe, an aluminum substrate (length (L): 357 mm, outer diameter (r): 80 mm) was worked to have the surface characteristic as shown in FIG. 64 (B).

Next, a light-receiving member for electrophotography of A-Si was deposited on the above aluminum substrate following various procedures using the deposition device as shown in FIG. 20 under the conditions as shown in Table 5H.

Deposition of the surface layer was carried out as follows.

After deposition of the second layer, the mass controllers corresponding to the respective gases were set so that the flow rate ratio of CH$_4$ gas to SiH$_4$ gas became SiH$_4$/CH$_4$=1/30 as shown in Table 5H, and a-SiC(H) with a thickness of 0.5 $\mu$m was deposited at a high frequency power of 150 W.

The surface state of the light-receiving member for electrography of A-Si:H thus prepared was as shown in FIG. 64(C).

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference pattern observed and proved to be satisfactory for practical application.

EXAMPLE 92

After deposition up to the second layer similarly as described in Example 91, the hydrogen (H$_2$) bomb was replaced with argon (Ar) gas bomb, the deposition device cleaned and the target for sputtering comprising Si and the target for sputtering comprising graphite are placed on the entire surface of the cathode electrode so that the area ratio may be the value as shown for Sample No. 101H in Table 1H. The above photosensitive layer is set, and the deposition device is sufficiently evacuated by means of a diffusion pump. Thereafter, argon gas was introduced to 0.015 Torr, and glow discharge was excited at a high frequency power of 150 W to effect sputtering the surface material, thereby forming a surface layer of Table 1H, Sample No. 101H on the above substrate.

Similarly, by varying the tartet area ratio of Si to graphite, the surface layers were formed as shown for Samples No. 102H to 107H in Table 1H, following otherwise the same procedure as described above to prepare light-receiving members.

For each of the light-receiving member for electrophotography as described above, image exposure was effected with laser similarly as in Example 91, and the steps to transfer were repeated about 50,000 times, followed by image evaluation. The results as shown in Table 1H were obtained.

EXAMPLE 93

Example 91 was repeated except that the flow rate ratio of SiH$_4$ gas to CH$_4$ gas was varied during formation of the surface layer to vary the contents of silicon atoms and carbon atoms in the silicon layer in the surface layer to prepare respective light-receiving members for electrophotography.

For each of the light-receiving members for electrophotography thus obtained, image exposure was effected by laser similarly as in Example 91 and the steps up to transfer were repeated about 50,000 times, followed by image evaluation to obtain the results as shown in Table 2H.

EXAMPLE 94

Example 91 was repeated except that the flow rate ratio of SiH$_4$ gas, SiF$_4$ gas and CH$_4$ gas was varied during formation of the surface layer to vary the contents of silicon atoms and carbon atoms in the surface layer to prepare respective light-receiving members for electrophotography. For each of the light-receiving members for electrophotography thus obtained, image exposured was effected by laser similarly as in Example 91 and the steps to transfer were repeated about 50,000 times, followed by image evaluation to obtain the results as shown in Table 3H.

EXAMPLE 95

Example 91 was repeated except that the layer thickness of the surface layer was varied to prepare respective light-receiving members for electrophotography. For each of the light-receiving members for electrophotography thus obtained, image exposured was effected similarly as in Example 91 and the steps of image formation, developing and cleaning were repeated, followed by image evaluation to obtain the results as shown in Table 4H.

EXAMPLE 96

A light-receiving member for electrophotography prepared according to the same procedure as described in Example 91 except that the discharging power during formation of the surface layer was changed to 300 W and the average layer thickness was made 2 $\mu$m, was found to have a difference in average layer thickness of the surface layer between center and both ends of 0.5

μm, with the layer thickness difference at minute portions of 0.1 μm.

In such a light-receiving member for electrophotography, no interference fringe pattern was observed, and practically satisfactory results could be obtained when it was subjected repeatedly to the steps of image formation, developing and cleaning by means of the same device as used in Example 91.

EXAMPLE 97

On cylindrical aluminum substrates having the surface characteristics as shown in FIG. 65, light-receiving members for electrophotography were prepared under the conditions as shown in Table 6H, following otherwise the same procedure as in Example 91.

For these light-receiving members for electrophotography, image exposure was effected by means of the same image exposure device as in Example 91, followed by developing, transfer and fixing, to obtain visible images on plain papers. Such an image forming process was repeated continuously 100,000 times.

In this case, no interference fringe was observed in all of the images obtained, thus giving practically satisfactory characteristics. There was also no difference observed at all between the initial image and the image after 100,000 copying, all being high quality images.

EXAMPLE 98

On cylindrical aluminum substrates having the surface characteristics as shown in FIG. 78, light-receiving members for electrophotography were prepared under the conditions as shown in Table 7H, following otherwise the same procedure as in Example 91.

For these light-receiving members for electrophotography, image exposure was effected by means of the same image exposure device as in Example 91, followed by developing, transfer and fixing, to obtain visible images on plain papers. Such an image forming process was repeated continuously 100,000 times.

In this case, no interference fringe was observed in all of the images obtained, thus giving practically satisfactory characteristics. There was also no difference observed at all between the initial image and the image after 100,000 copying, all being high quality images.

EXAMPLE 99

On cylindrical aluminum substrates having the surface characteristics as shown in FIG. 79, light-receiving members for electrophotography were prepared under the conditions as shown in Table 8H, following otherwise the same procedure as in Example 91.

For these light-receiving members for electrophotography, image exposure was effected by means of the same image exposure device as in Example 91, followed by developing, transfer and fixing, to obtain visible images on plain papers. Such an image forming process was repeated continuously 100,000 times.

In this case, no interference fringe was observed in all of the images obtained, thus giving practically satisfactory characteristics. There was also no difference observed at all between the initial image and the image after 100,000 copying, all being high quality images.

EXAMPLE 100

On cylindrical aluminum substrates having the surface characteristics as shown in FIG. 65, light-receiving members for electrophotography were prepared under the conditions as shown in Table 9H, following otherwise the same procedure as in Example 91.

Figure 60:
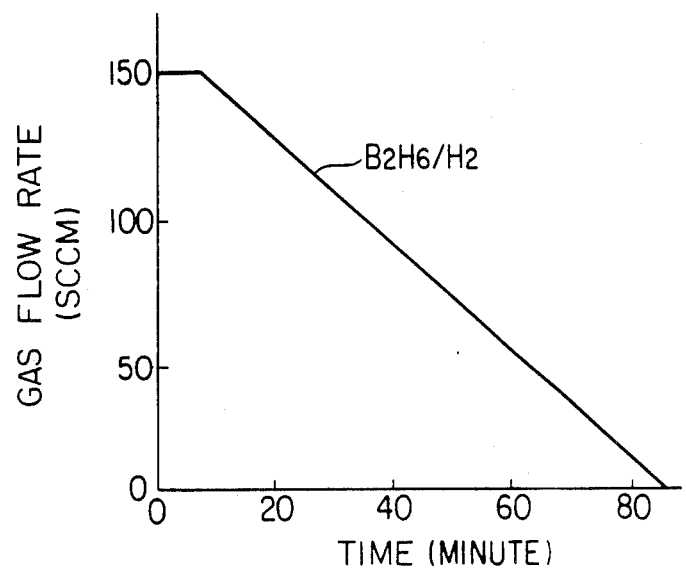

The boron-containing layer was formed by controlling the mass flow controller 2010 for $B_2H_6/H_2$ by means of a computer (HP9845B) so that the flow rate of $B_2H_6/H_2$ might be as shown in FIG. 60.

For these light-receiving members for electrophotography, image exposure was effected by means of the same image exposure device as in Example 91, followed by developing, transfer and fixing, to obtain visible images on plain papers. Such an image forming process was repeated continuously 100,000 times.

In this case, no interference fringe was observed in all of the images obtained, thus giving practically satisfactory characteristics. There was also no difference observed at all between the initial image and the image after 100,000 copying, all being high quality images.

EXAMPLE 101

On cylindrical aluminum substrates having the surface characteristics as shown in FIG. 78, light-receiving members for electrophotography were prepared under the conditions as shown in Table 10H, following otherwise the same procedure as in Example 91.

Figure 61:
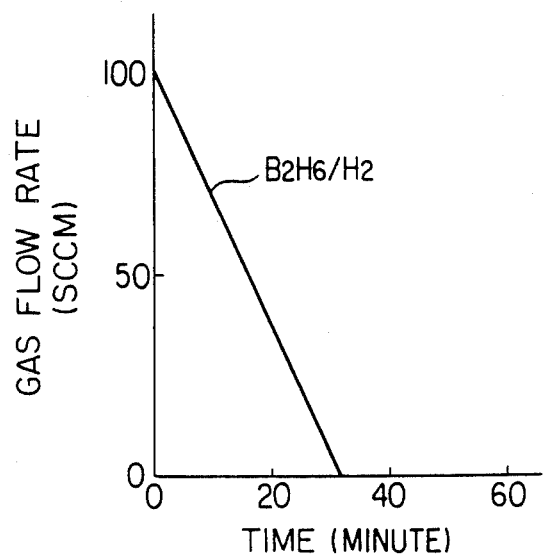

The boron-containing layer was formed by controlling the mass flow controller 2010 for $B_2H_6/H_2$ by means of a computer (HP9845B) so that the flow rate of $B_2H_6/H_2$ might be as shown in FIG. 61.

For these light-receiving members for electrophotography, image exposure was effected by means of the same image exposure device as in Example 91, followed by developing, transfer and fixing, to obtain visible images on plain papers. Such an image forming process was repeated continuously 100,000 times.

In this case, no interference fringe was observed in all of the images obtained, thus giving practically satisfactory characteristics. There was also no difference observed at all between the initial image and the image after 100,000 copying, all being high quality images.

EXAMPLE 102

On cylindrical aliminum substrates having the surface characteristics as shown in FIG. 79, light-receiving members for electrophotography were prepared under the conditions as shown in Table 11H, following otherwise the same procedure as in Example 91.

Figure 84:
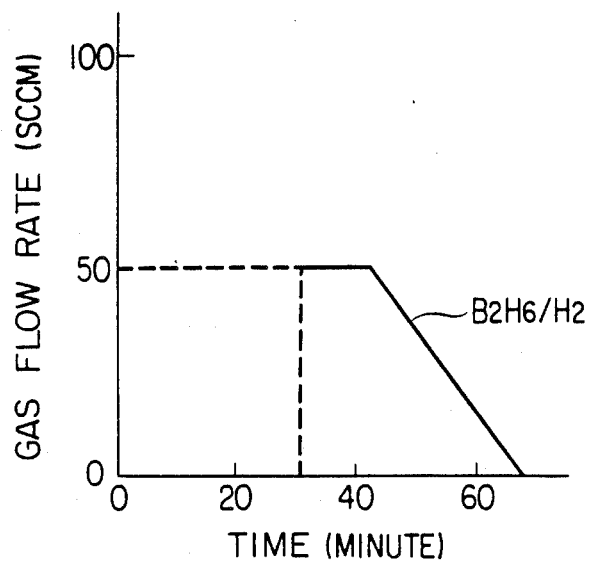

The boron-containing layer was formed by controlling the mass flow controller 2010 for $B_2H_6/H_2$ by means of a computer (HP9845B) so that the flow rate of $B_2H_6/H_2$ might be as shown in FIG. 84.

For these light-receiving members for electrophotography, image exposure was effected by means of the same image exposure device as in Example 91, followed by developing, transfer and fixing, to obtain visible images on plain papers. Such an image forming process was repeated continuously 100,000 times.

In this case, no interference fringe was observed in all of the images obtained, thus giving practically satisfactory characteristics. There was also no difference observed at all between the initial image and the image after 100,000 copying, all being high quality images.

EXAMPLE 103

On cylindrical aluminum substrates having the surface characteristics as shown in FIG. 65, light-receiving members for electrophotography were prepared under the conditions as shown in Table 12H, following other wise the same procedure as in Example 91.

Figure 85:
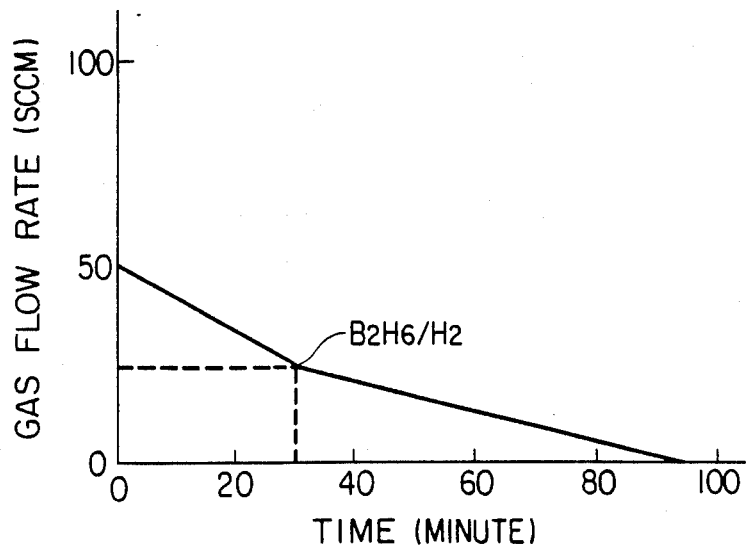

The boron-containing layer was formed by controlling the mass flow controller 2010 for $B_2H_6/H_2$ by means of a computer (HP9845B) so that the flow rate of $B_2H_6/H_2$ might be as shown in FIG. 85.

For these light-receiving members for electrophotography, image exposure was effected by means of the same image exposure device as in Example 91, followed by developing, transfer and fixing, to obtain visible images on plain papers. Such an image forming process was repeated continuously for 100,000 times.

In this case, no interference fringe was observed in all of the images obtained, thus giving practically satisfactory characteristics. There was also no difference observed at all between the initial image and the image after 100,000 copying, all being high quality images.

EXAMPLE 104

Examples 91 to 103 were repeated except that $PH_3$ gas diluted to 3000 vol ppm with $H_2$ was employed in place of $B_2H_6$ gas diluted to 3000 vol ppm with $H_2$ to prepare light-receiving members for electrophotography respectively.

Other preparation conditions were the same as in Examples 91 to 103.

For these light-receiving members for electrophotography, image exposure was effected by means of an image exposure device as shown in FIG. 26 (wavelength of laser beam: 780 nm, spot diameter 80 $\mu$m), followed by development and transfer, to obtain images. All of the images were free from interference fringe pattern and practically satisfactory.

EXAMPLE 105

By means of a lathe, an aluminum substrate (length (L): 357 mm, outer diameter (r): 80 mm) was worked to have the surface characteristic as shown in FIG. 64 (B).

Next, a light-receiving member for electrophotography of A-Si was deposited on the above aluminum substrate following various procedures using the deposition device as shown in FIG. 20 under the conditions as shown in Table 5I.

Figure 36:
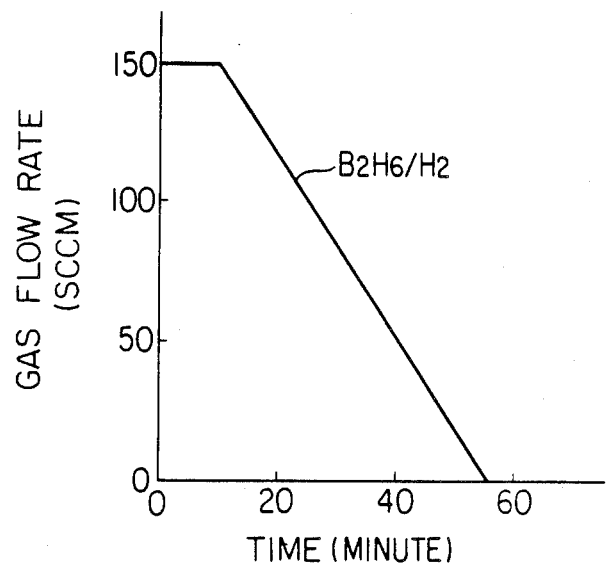

In preparation of the first layer, the mass flow controllers 2007, 2008 and 2010 were controlled by a computer (HP9845B) so that the flow rates of $GeH_4$, $SiH_4$ and $B_2H_6/H_2$ might be as shown in FIG. 22 and FIG. 36.

Deposition of the surface layer was carried out as follows.

After deposition of the second layer, the mass controllers corresponding to the respective gases were set so that the flow rate ratio of $CH_4$ gas to $SiH_4$ gas became $SiH_4/CH_4 = 1/30$ as shown in Table 5I, and a-SiC(H) with a thickness of 0.5 $\mu$m was deposited at a high frequency power of 150 W.

The surface state of the light-receiving member for electrography of A-Si:H thus prepared was as shown in FIG. 64(C).

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference pattern observed and proved to be satisfactory for practical application.

EXAMPLE 106

After deposition up to the second layer similarly as described in Example 105, the hydrogen ($H_2$) bomb was replaced with argon (Ar) gas bomb, the deposition device cleaned and the target for sputtering comprising Si and the target for sputtering comprising graphite are placed on the entire surface of the cathode electrode so that the area ratio may be the value as shown for Sample No. 101I in Table 1I. The above photosensitive layer is set, and the deposition device is sufficiently evacuated by means of a diffusion pump. Thereafter, argon gas was introduced to 0.015 Torr, and glow discharge was excited at a high frequency power of 150 W to effect sputtering the surface material, thereby forming a surface layer of Table 1I, Sample No. 101I on the above substrate.

Similarly, by varying the tartet area ratio of Si to graphite, the surface layers were formed as shown for Samples No. 102I to 107I in Table 1I, following otherwise the same procedure as described above to prepare light-receiving members.

For each of the light-receiving member for electrophotography as described above, image exposure was effected with laser similarly as in Example 105, and the steps to transfer were repeated about 50,000 times, followed by image evaluation. The results as shown in Table 1I were obtained.

EXAMPLE 107

Example 105 was repeated except that the flow rate ratio of $SiH_4$ gas to $CH_4$ gas was varied during formation of the surface layer to vary the contents of silicon atoms and carbon atoms in the silicon layer in the surface layer to prepare respective light-receiving members for electrophotography.

For each of the light-receiving members for electrophotography thus obtained, image exposure was effected similarly as in Example 105 and the steps to transfer were repeated about 50,000 times, followed by image evaluation to obtain the results as shown in Table 2I.

EXAMPLE 108

Example 105 was repeated except that the flow rate ratio of $SiH_4$ gas, $SiF_4$ gas and $CH_4$ gas was varied during formation of the surface layer to vary the contents of silicon atoms and carbon atoms in the surface layer to prepare respective light-receiving members for electrophotography. For each of the light-receiving members for electrophotography thus obtained, image exposure was effected similarly as in Example 105 and the steps up to transfer were repeated about 50,000 times, followed by image evaluation to obtain the results as shown in Table 3I.

EXAMPLE 109

Example 105 was repeated except that the layer thickness of the surface layer was varied to prepare respective light-receiving members for electrophotography. For each of the light-receiving members for electrophotography thus obtained, image exposure was effected similarly as in Example 105 and the steps of image formation, developing and cleaning were repeated, followed by image evaluation to obtain the results as shown in Table 4I.

EXAMPLE 110

A light-receiving member for electrophotography prepared according to the same procedure as described in Example 105 except that the discharging power during formation of the surface layer was changed to 300

W and the average layer thickness was made 2 μm, was found to have a difference in average layer thickness of the surface layer between center and both ends of 0.5 μm, with the layer thickness difference at minute portions of 0.1 μm.

In such a light-receiving member for electrophotography, no interference fringe pattern was observed, and practically satisfactory results could be obtained when it was subjected repeatedly to the steps of image formation, developing and cleaning by means of the same device as used in Example 105.

EXAMPLE 111

On an aluminum cylinder having the surface characteristic as shown in FIG. 65, a light-receiving member for electrophotography was prepared similarly as in Example 105 under the conditions as shown in Table 5I.

Figure 37:
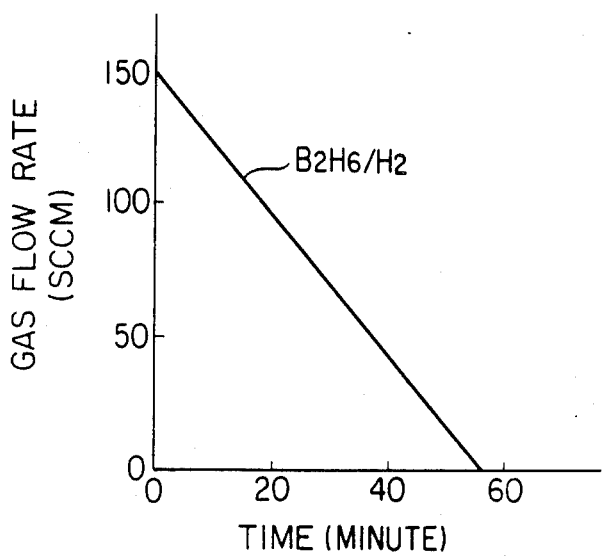

In preparation of the first layer the mass flow controllers 2007, 2008 and 2010 were controlled by a computer (HP9845B) so that the flow rates of $GeH_4$, $SiH_4$ and $B_2H_6/H_2$ might be as shown in FIGS. 23 and 37.

For these light-receiving members for electrophotography, image exposure was effected by means of the same image exposure device as in Example 105, followed by developing, transfer and fixing, to obtain visible images on plain papers. Such an image forming process was repeated continuously 100,000 times.

In this case, no interference fringe was observed in all of the images obtained, thus giving practically satisfactory characteristics. There was also no difference observed at all between the initial image and the image after 100,000 copying, all being high quality images.

EXAMPLE 112

On an aluminum cylinder having the surface characteristic as shown in FIG. 78, a light-receiving member for electrophotography was prepared similarly as in Example 105 under the conditions as shown in Table 6I.

Figure 38:
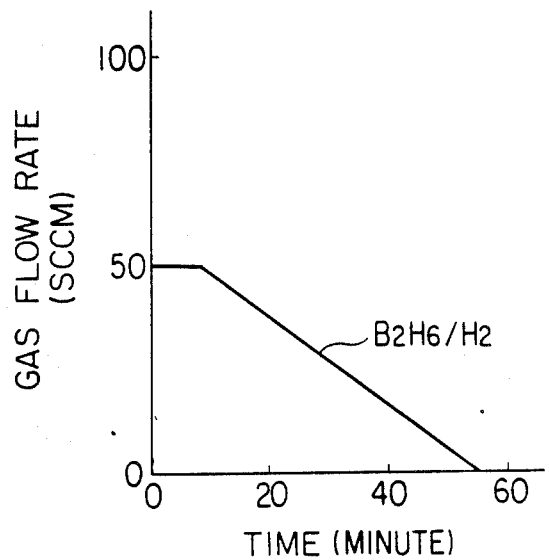

In preparation of the first layer, the mass flow controllers 2007, 2008 and 2010 were controlled by a computer (HP9845B) so that the flow rates of $GeH_4$, $SiH_4$ and $B_2H_6/H_2$ might be as shown in FIG. 24 and FIG. 38.

For these light-receiving members for electrophotography, image exposure was effected by means of the same image exposure device as in Example 105, followed by developing, transfer and fixing, to obtain visible images on plain papers. Such an image forming process was repeated continuously 100,000 times.

In this case, no interference fringe was observed in all of the images obtained, thus giving practically satisfactory characteristics. There was also no difference observed at all between the initial image and the image after 100,000 copying, all being high quality images.

EXAMPLE 113

On an aluminum cylinder having the surface characteristic as shown in FIG. 45, a light-receiving member for electrophotography was prepared similarly as in Example 105 under the conditions as shown in Table 6I.

Figure 39:
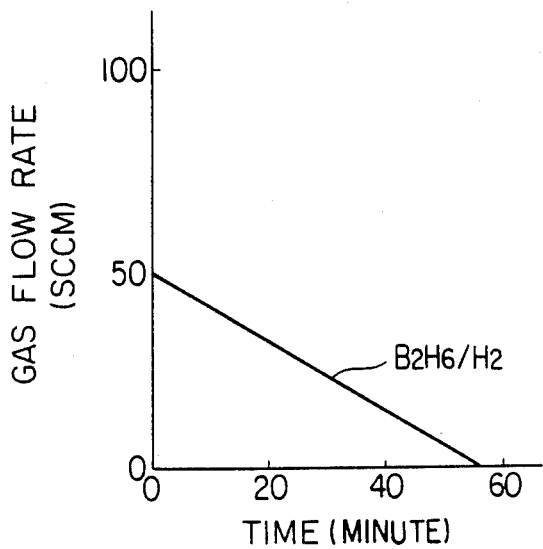

In preparation of the first layer, the mass flow controllers 2007, 2008 and 2010 were controlled by a computer (HP9845B) so that the flow rates of $GeH_4$, $SiH_4$ and $B_2H_6/H_2$ might be as shown in FIG. 25 and FIG. 39.

For these light-receiving members for electrophotography, image exposure was effected by means of the same image exposure device as in Example 105, followed by developing, transfer and fixing, to obtain visible images on plain papers. Such an image forming process was repeated continuously 100,000 times.

In this case, no interference fringe was observed in all of the images obtained, thus giving practically satisfactory characteristics. There was also no difference observed at all between the initial image and the image after 100,000 copying, all being high quality images.

EXAMPLE 114

On an aluminum cylinder having the surface characteristic as shown in FIG. 65, a light-receiving member for electrophotography was prepared similarly as in Example 105 under the conditions as shown in Table 7I.

Figure 40:
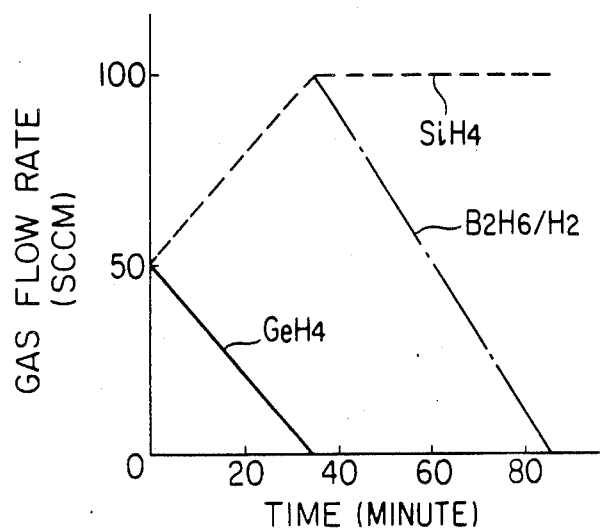

In preparation of the first layer, the mass flow controllers 2007, 2008 and 2010 were controlled by a computer (HP9845B) so that the flow rates of $GeH_4$, $SiH_4$ and $B_2H_6/H_2$ might be as shown in FIG. 40.

For these light-receiving members for electrophotography, image exposure was effected by means of the same image exposure device as in Example 105, followed by developing, transfer and fixing, to obtain visible images on plain papers. Such an image forming process was repeated continuously 100,000 times.

In this case, no interference fringe was observed in all of the images obtained, thus giving practically satisfactory characteristics. There was also no difference observed at all between the initial image and the image after 100,000 copying, all being high quality images.

EXAMPLE 115

On an aluminum cylinder having the surface characteristic as shown in FIG. 78, a light-receiving member for electrophotography was prepared similarly as in Example 105 under the conditions as shown in Table 8I.

Figure 41:
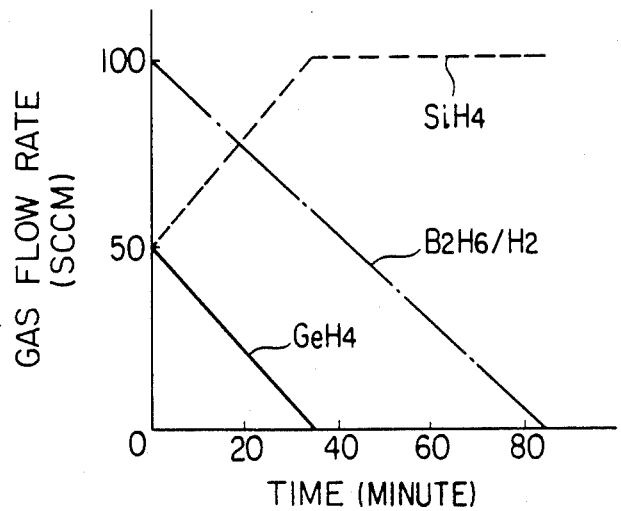

In preparation of the first layer, the mass flow controllers 2007, 2008 and 2010 were controlled by a computer (HP9845B) so that the flow rates of $GeH_4$, $SiH_4$ and $B_2H_6/H_2$ might be as shown in FIG. 41.

For these light-receiving members for electrophotography, image exposure was effected by means of the same image exposure device as in Example 105, followed by developing, transfer and fixing, to obtain visible images on plain papers. Such an image forming process was repeated continuously for 100,000 times.

In this case, no interference fringe was observed in all of the images obtained, thus giving practically satisfactory characteristics. There was also no difference observed at all between the initial image and the image after 100,000 copying, all being high quality images.

EXAMPLE 116

On an aluminum cylinder having the surface characteristic as shown in FIG. 79, a light-receiving member for electrophotography was prepared similarly as in Example 105 under the conditions as shown in Table 9I.

Figure 42:
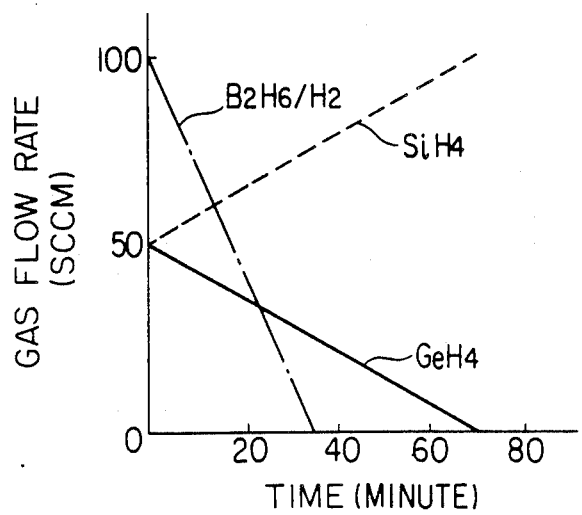

In preparation of the first layer, the mass flow controllers 2007, 2008 and 2010 were controlled by a computer (HP9845B) so that the flow rates of $GeH_4$, $SiH_4$ and $B_2H_6/H_2$ might be as shown in FIG. 42.

For these light-receiving members for electrophotography, image exposure was effected by means of the same image exposure device as in Example 105, followed by developing, transfer and fixing, to obtain visible images on plain papers. Such an image forming process was repeated continuously 100,000 times.

In this case, no interference fringe was observed in all of the images obtained, thus giving practically satisfactory characteristics. There was also no difference observed at all between the initial image and the image after 100,000 copying, all being high quality images.

EXAMPLE 117

In this Example, a semiconductor laser (wavelength: 780 nm) with a spot size of 80 μm was employed. Thus, on a cylindrical aluminum substrate [length (L) 357 mm, outer diameter (r) 80 mm] as shown in FIG. 64 (B) was prepared.

Next, under the conditions as shown in Table 1aJ, by use of the film deposition device as shown in FIG. 20, an a-Si type light-receiving member for electrography having a surface laminated thereon was prepared following predetermined operational procedures.

NO gas was introduced, while controlling the flow rate by setting the mass flow controller so that its initial value may be 3.4 vol % based on the sum of SiH$_4$ gas flow rate and GeH$_4$ gas flow rate.

Also, deposition of the surface layer formed primarily of silicon atoms and carbon atoms was carried out as follows.

That is, after deposition of the second layer, the mass controllers corresponding to the respective gases were set so that the flow rate ratio of CH$_4$ gas to SiH$_4$ gas became SiH$_4$/CH$_4$=1/30 as shown in Table 1aJ, and a surface layer was formed by causing glow discharge at a high frequency power of 300 W.

In this case, the surface of the light-receiving member and the surface of the substrate were non-parallel to each other, as shown in FIG. 64 (B) and (C).

The light-receiving member for electrophotography as prepared above was subjected to image exposure by means of a device as shown in FIG. 26 (wavelength of laser beam: 780 nm, spot diameter 80 μm), followed by development and transfer to obtain an image. In this case, the image obtained was free from any interference fringe pattern observed and exhibited electrophotographic characteristics which were satisfactory for practical application.

EXAMPLE 118

The surface of a cylindrical aluminum substrate was worked by a lathe as shown in FIG. 78, FIG. 79. On these aluminum substrates were prepared light-receiving members for electrophotography under the same conditions as in Example 117.

For these light-receiving members, image exposure was effected by use of a semiconductor laser with wavelength of 780 nm and spot diameter 80 μm in the device as shown in FIG. 26, similarly as in Example 117, with the result that no interference fringe pattern was observed in the image, to give a product exhibiting practically satisfactory electrophotographic characteristics.

EXAMPLE 119

A light-receiving member was prepared under the same conditions as in Example 118 except for the following point. The layer thickness of the first layer was changed to 10 μm.

For these light-receiving members, image exposure was effected by means of the device similarly as in Example 117, with the result that no interference fringe pattern was observed in the image, to give a product exhibiting practically satisfactory electrophotographic characteristics.

EXAMPLE 120

On cylindrical aluminum substrates having the surface characteristics as shown in FIG. 78 and FIG. 79, light-receiving members for electrophotography were formed under the conditions shown in Table 1J.

The cross-sections of the light-receiving members were observed with an electron microscope. The average layer thickness of the first layer was 0.09 μm at the center and both ends of the cylinder. The average layer thickness of the second layer was 3 μm at the center and both ends of the cylinder.

For these light-receiving members for electrophotography, by means of the same device as in Example 117, image exposure was effected, with the result that no interference fringe pattern was observed in the image, to give a product exhibiting practically satisfactory electrophotographic characteristics.

EXAMPLE 121

On cylindrical aluminum substrates having the surface characteristics as shown in FIG. 78 and FIG. 79, light-receiving members for electrophotography were formed under the conditions shown in Table 2J.

For these light-receiving members for electrophotography, image exposure was effected with laser beam similarly as in Example 117, with the result that no interference fringe pattern was observed in the image, to give a product exhibiting practically satisfactory electrophotographic characteristics.

EXAMPLE 122

On cylindrical aluminum substrates having the surface characteristics as shown in FIG. 78 and FIG. 79, light-receiving members for electrophotography were formed under the conditions shown in Table 3J.

For these light-receiving members for electrophotography, image exposure was effected with laser beam similarly as in Example 117, with the result that no interference fringe pattern was observed in the image, to give a product exhibiting practically satisfactory electrophotographic characteristics.

EXAMPLE 123

On cylindrical aluminum substrates having the surface characteristics as shown in FIG. 78 and FIG. 79, light-receiving members for electrophotography were formed under the conditions shown in Table 4J.

For these light-receiving members for electrophotography, image exposure was effected with laser beam similarly as in Example 117, with the result that no interference fringe pattern was observed in the image, to give a product exhibiting practically satisfactory electrophotographic characteristics.

EXAMPLE 124

During formation of the first layer, NO gas flow rate was changed relative to the sum of SiH$_4$ gas flow rate and GeH$_4$ gas flow rate as shown in FIG. 49 until the NO gas flow rate was made zero on completion of the layer formation, and following otherwise the same conditions as in Example 117, a light-receiving member for electrography was prepared.

The light-receiving member for electrophotography as prepared above was subjected to image exposure by means of a device as shown in FIG. 26 (wavelength of laser beam: 780 nm, spot diameter 80 μm), followed by development and transfer to obtain an image.

In this case, the image obtained was free from any interference fringe pattern observed and exhibited electrophotographic characteristics which were satisfactory for practical application.

EXAMPLE 125

The surface of a cylindrical aluminum substrate was worked as shown in FIG. 78, FIG. 79 by using a lathe. On these aluminum substrates were prepared light-receiving members for electrophotography under the same conditions as in Example 124.

For these light-receiving members, image exposure was effected by use of a semiconductor laser with wavelength of 780 nm and spot diameter 80 μm in the device as shown in FIG. 26, similarly as in Example 124, with the result that no interference fringe pattern was observed in the image, to give a product exhibiting practically satisfactory electrophotographic characteristics.

EXAMPLE 126

A light-receiving member was prepared under the same conditions as in Example 125 except for the following point. The layer thickness of the first layer was changed to 10 μm.

For these light-receiving members, image exposure was effected in the same device as in Example 117, with the result that no interference fringe pattern was observed in the image, to give a product exhibiting practically satisfactory electrophotographic characteristics.

EXAMPLE 127

On cylindrical aluminum substrates having the surface characteristics as shown in FIG. 78 and FIG. 79, light-receiving members for electrophotography were formed under the conditions shown in Table 5J.

For these light-receiving members for electrophotography, image exposure was effected with laser beam similarly as in Example 117, with the result that no interference fringe pattern was observed in the image, to give a product exhibiting practically satisfactory electrophotographic characteristics.

EXAMPLE 128

On cylindrical aluminum substrates having the surface characteristics as shown in FIG. 78 and FIG. 79, light-receiving members for electrophotography were formed under the conditions shown in Table 6J.

For these light-receiving members for electrophotography, image exposure was effected with laser beam similarly as in Example 117, with the result that no interference fringe pattern was observed in the image, to give a product exhibiting practically satisfactory electrophotographic characteristics.

EXAMPLE 129

On cylindrical aluminum substrates having the surface characteristics as shown in FIG. 78 and FIG. 79, light-receiving members for electrophotography were formed under the conditions shown in Table 7J.

For these light-receiving members for electrophotography, image exposure was effected with laser beam similarly as in Example 117, with the result that no interference fringe pattern was observed in the image, to give a product exhibiting practically satisfactory electrophotographic characteristics.

EXAMPLE 130

On cylindrical aluminum substrates having the surface characteristics as shown in FIG. 78 and FIG. 79, light-receiving members for electrophotography were formed under the conditions shown in Table 8J.

For these light-receiving members for electrophotography, image exposure was effected with laser beam similarly as in Example 117, with the result that no interference fringe pattern was observed in the image, to give a product exhibiting practically satisfactory electrophotographic characteristics.

EXAMPLE 131

By means of the preparation device as shown in FIG. 20, on cylindrical aluminum substrates (Cylinder B), layer formation was conducted by varying the gas flow rate ratio of NO to $SiH_4$ according to the change rate curve of gas flow rate ratio as shown in FIGS. 66 through 69 under the respective conditions as shown in Table 9J through 12J with lapse of time for layer formation, to prepare light-receiving members for electrophotography, respectively.

The characteristic evaluations were performed for the respective light-receiving members thus obtained under the same conditions and by the same means as in Example 117, with the result that no interference fringe pattern was observed with naked eyes at all and satisfactorily good electrophotographic characteristics were exhibited to be suited for the object of the present invention.

EXAMPLE 132

Figure 66:
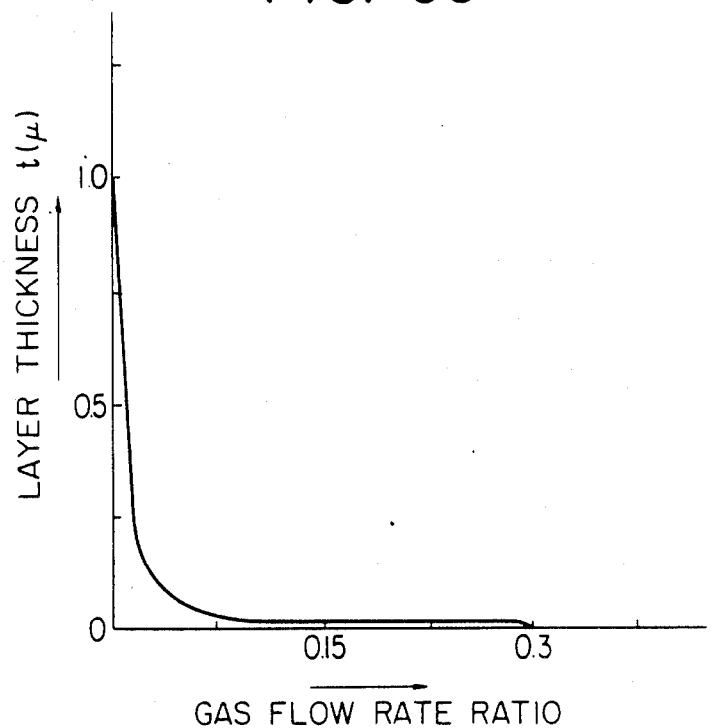

By means of the preparation device as shown in FIG. 20, on cylindrical aluminum substrates (Cylinder B), layer formation was conducted by varying the gas flow rate ratio of NO to $SiH_4$ according to the change rate curve of gas flow rate ratio as shown in FIG. 66 under the respective conditions as shown in Table 13J with lapse of time for layer formation, to prepare light-receiving members for electrophotography, respectively.

The characteristic evaluations were performed for the respective light-receiving members thus obtained under the same conditions and by the same means as in Example 117, with the result that no interference fringe pattern was observed with naked eyes at all and satisfactorily good electrophotographic characteristics were exhibited to be suited for the object of the present invention.

EXAMPLE 133

By means of the preparation device as shown in FIG. 20, on cylindrical aluminum substrates (Cylinder B), layer formation was conducted by varying the gas flow rate ratio of $NH_3$ to $SiH_4$ and that of $N_2O$ to $SiH_4$ according to the change rate curve of gas flow rate ratio as shown in FIG. 68 under the respective conditions as shown in Table 14J through 15J with lapse of time for layer formation, to prepare light-receiving members for electrophotography, respectively.

The characteristic evaluations were performed for the respective light-receiving members thus obtained under the same conditions and by the same means as in Example 117, with the result that no interference fringe pattern was observed with naked eyes at all and satisfactorily good electrophotographic characteristics were exhibited to be suited for the object of the present invention.

EXAMPLE 134

Except for using the aluminum substrate as used in Example 117 (length (L) 357 mm, outer diamter (r) 80 mm) and forming the surface layer according to the sputtering method, an a-Si type light-receiving member for electrophotography was prepared according to the same procedure and under the same conditions as in Example 117 (Sample Nos. 2901J–2907J). During this operation, the areas of Si target and C target were varied to vary the contents of Si and C as shown in Table 16, respectively.

Formation of the surface layer was carried out as follows. That is, after formation of the second layer, the substrate having formed layers to said layer was taken out from the deposition device as shown in FIG. 20, the hydrogen ($H_2$) bomb was replaced with argon (Ar) gas bomb, the deposition device cleaned and the target for sputtering comprising Si with a thickness of 5 mm and the target for sputtering comprising graphite with a thickness of 5 mm are placed on the entire surface of the cathode electrode so that the area ratio may be the value as shown in Table 16J. Then, the substrate having formed layers to the second layer is set and, after reduction of pressure, argon gas is introduced and glow discharging excited at a high frequency power of 300 W to sputter the surface layer material on the cathode electrode, thereby forming the surface layer.

For these light-receiving members for electrophotography, image exposure was effected by means of the device as shown in FIG. 26 (wavelength of laser beam 780 nm, spot diameter 80 μm), and the steps of image formation, development and cleaning were repeated 50,000 times, followed by image evaluation. The results as shown in Table 16J were obtained.

EXAMPLE 135

Example 117 was repeated under the same condition and according to the same procedure in which the interference fringe pattern disappeared except that the flow rate ratio of $SiH_4$ gas to $CH_4$ gas was varied during formation of the surface layer to vary the contents of silicon atoms and carbon atoms in the silicon layer in the surface layer to prepare respective light-receiving members for electrophotography.

For each of the light-receiving members for electrophotography thus obtained, image exposed was effected by laser similarly as in Example 117 and the steps to transfer were repeated about 50,000 times, followed by image evaluation to obtain the results as shown in Table 17J.

EXAMPLE 136

Example 117 was repeated under the same condition and according to the same procedure in which the interference fringe pattern disappeared except that the flow rate ratio of $SiH_4$ gas, $SiF_4$ gas and $CH_4$ gas was varied during formation of the surface layer to vary the contents of silicon atoms and carbon atoms in the silicon layer in the surface layer to prepare respective light-receiving members for electrophotography. For each of the light-receiving members for electrophotography thus obtained, image exposure was effected by laser similarly as in Example 117 and the steps to transfer were repeated about 50,000 times, followed by image evaluation to obtain the results as shown in Table 18J.

EXAMPLE 137

Example 117 was repeated under the same condition and according to the same procedure in which the interference fringe pattern disappeared except that the layer thickness of the surface layer was varied to prepare respective light-receiving members for electrophotography. For each of the light-receiving members for electrophotography thus obtained, image exposure was effected similarly as in Example 117 and the steps of image formation, developing and cleaning were repeated, followed by image evaluation to obtain the results as shown in Table 19J.

EXAMPLE 138

Example 117 was repeated under the same condition and according to the same procedure in which the interference fringe pattern disappeared except that the discharging power during formation of the surface layer was changed to 300 W and the average layer thickness was made 2 μm to prepare a light-receiving member for electrophotography, which was found to have a difference in average layer thickness of the surface layer between center and both ends of 0.5 μm, with the layer thickness difference at minute portions of 0.1 μm.

In such a light-receiving member for electrophotography, no interference fringe pattern was observed, and practically satisfactory durability could be obtained when it was subjected repeatedly to the steps of image formation, developing and cleaning by means of the same device as used in Example 117.

EXAMPLE 139

By means of a lathe, an aluminum substrate (length (L): 357 mm, outerdiameter (r): 80 mm) was worked by a lathe to have the surface characteristic as shown in FIG. 64 (B).

Next, an a-Si type light-receiving member for electrophotography was deposited on the above aluminum substrate following predetermined procedures using the film deposition device as shown in FIG. 20 under the conditions as shown in Table 1K.

In preparation of the first layer, the mass flow controllers 2007 and 2008 were controlled by a computer (HP9845B) so that the flow rates of $GeH_4$ and $SiH_4$ might be as shown in FIG. 22. Deposition of the surface layer formed primarily of silicon atoms and carbon atoms was carried out as follows. That is, after deposition of the second layer, the mass controllers corresponding to the respective gases were set so that the flow rate ratio of $CH_4$ gas to $SiH_4$ gas became $SiH_4/CH_4=1/30$ as shown in Table 1K, and the surface layer was formed by exciting glow discharging at a high frequency power of 300 W.

The surface state of the light-receiving member for electrophotography thus prepared was as shown in FIG. 64 (C). In this case, the difference in average layer thickness between the center and the both ends of the aluminum substrate was found to be 2 μm.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference pattern observed and proved to be satisfactory for practical application.

EXAMPLE 140

Except for the conditions as shown in Table 2K, in the same manner as in Example 139, a-Si type light-receiving members for electrophotography were prepared following various procedures by means of the film deposition device as shown in FIG. 20.

In preparation of the first layer, the mass flow controllers 2007 and 2008 were controlled by a computer (HP9845B) so that the flow rates of GeH$_4$ and SiH$_4$ might be as shown in FIG. 23.

The light-receiving member for electrophotography as prepared above was subjected to image exposure by means of a device as shown in FIG. 26 (wavelength of laser beam: 780 nm, spot diameter 80 μm), similarly as in Example 139 followed by development and transfer to obtain an image. The image was free from any interference fringe pattern observed and proved to be satisfactory for practical application.

EXAMPLE 141

Except for the conditions as shown in Table 3K, in the same manner as in Example 139, a-Si type light-receiving members for electrophotography were prepared following various procedures by means of the film deposition device as shown in FIG. 20.

In preparation of the first layer, the mass flow controllers 2007 and 2008 were controlled by a computer (HP9845B) so that the flow rates of GeH$_4$ and SiH$_4$ might be as shown in FIG. 24.

The light-receiving member for electrophotography as prepared above was subjected to image exposure by means of a device as shown in FIG. 26 (wavelength of laser beam: 780 nm, spot diameter 80 μm), similarly as in Example 139 followed by development and transfer to obtain an image. The image was free from any interference fringe pattern observed and proved to be satisfactory for practical application.

EXAMPLE 142

By means of a lathe, aluminum substrates (length (L): 357 mm, outerdiameter (r): 80 mm) were worked by a lathe to have the three kinds of surface characteristics as shown in FIG. 64 (B), FIG. 78 and FIG. 79.

Next, except for the conditions as shown in Table 4K, in the same manner as in Example 139, a-Si type light-receiving members for electrophotography were prepared following various procedures by means of the film deposition device as shown in FIG. 20.

In preparation of the first layer, the mass flow controllers 2007 and 2008 were controlled by a computer (HP9845B) so that the flow rates of GeH$_4$ and SiH$_4$ might be as shown in FIG. 25.

The light-receiving members for electrophotography as prepared above were subjected to image exposure by means of a device as shown in FIG. 26 (wavelength of laser beam: 780 nm, spot diameter 80 μm), followed by development and transfer to obtain images in the same manner as in Example 139. All of the images obtained were free from any interference fringe pattern observed and proved to be satisfactory for practical application.

EXAMPLE 143

Except for changing NH$_3$ gas employed in Example 142 to NO gas, following the same conditions and procedure as in Example 142, a-Si type light-receiving members for electrophotography were prepared.

The light-receiving members for electrophotography as prepared above were subjected to image exposure by means of a device as shown in FIG. 26 (wavelength of laser beam: 780 nm, spot diameter 80 μm), followed by development and transfer to obtain images. All of the images obtained were free from any interference fringe pattern observed and proved to be satisfactory for practical application.

EXAMPLE 144

Except for changing NH$_3$ gas employed in Example 142 to N$_2$O gas, following the same conditions and procedure as in Example 142, a-Si type light-receiving members for electrophotography were prepared.

The light-receiving members for electrophotography as prepared above were subjected to image exposure by means of a device as shown in FIG. 26 (wavelength of laser beam: 780 nm, spot diameter 80 μm), followed by development and transfer to obtain images. All of the images obtained were free from any interference fringe pattern observed and proved to be satisfactory for practical application.

EXAMPLE 145

Figure 70:
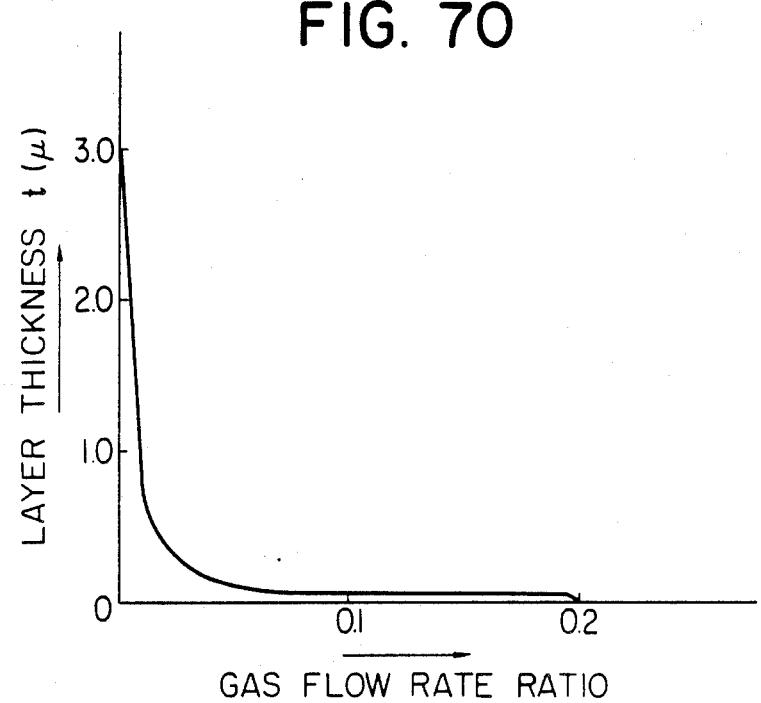

By means of a lathe, an aluminum substrate (length (L): 357 mm, outer diameter (r): 80 mm) was worked by a lathe to have the surface characteristic as shown in FIG. 64 (B), and a light-receiving member for electrophotography was prepared by means of the film deposition device as shown in FIG. 20 under the same conditions as in Example 139 except for varying the NO gas flow rate ratio with the time for layer formation according to the change rate curve of gas flow rate ratio as shown in FIG. 70 under the conditions as shown in Table 5K.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 146

Figure 71:
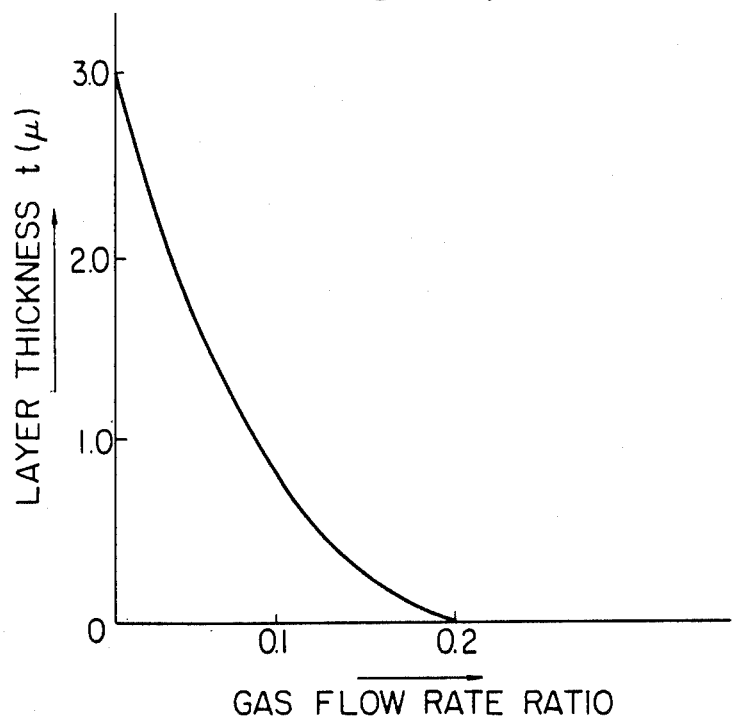

By means of a lathe, an aluminum substrate (length (L): 357 mm, outerdiameter (r): 80 mm) was worked to have the surface characteristic as shown in FIG. 64 (B), and a light-receiving member for electrophotography was prepared by means of the film deposition device as shown in FIG. 20 under the same conditions as in Example 139 except for varying the NH$_3$ gas flow rate ratio with the time for layer formation according to the change rate curve of gas flow rate ratio as shown in FIG. 71 under the conditions as shown in Table 6K.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 147

Figure 58:
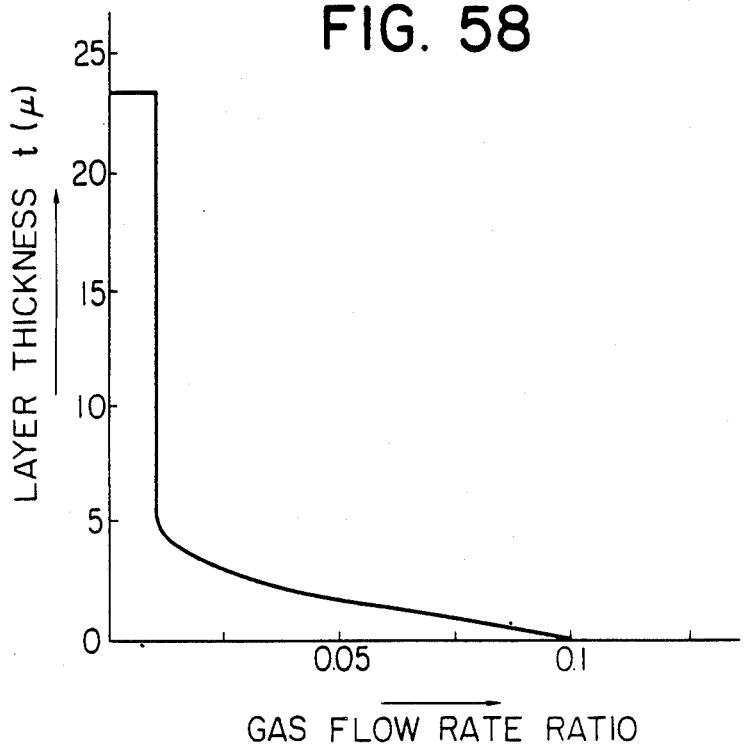

By means of a lathe, an aluminum substrate (length (L): 357 mm, outer diameter (r): 80 mm) was worked to have the surface characteristic as shown in FIG. 64 (B), and a light-receiving member for electrophotography was prepared by means of the film deposition device as shown in FIG. 20 under the same conditions as in Example 139 except for varying the NO gas flow rate ratio with the time for layer formation according to the change rate curve of gas flow rate ratio as shown in FIG. 58 under the conditions as shown in Table 7K.

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application.

EXAMPLE 148

Except for changing NO gas employed in Example 147 to $NH_3$ gas, following the same conditions and procedure as in Example 147, an a-Si type light-receiving member for electrophotography was prepared.

The light-receiving member for electrophotography as prepared above was subjected to image exposure by means of a device as shown in FIG. 26 (wavelength of laser beam: 780 nm, spot diameter 80 $\mu$m), followed by development and transfer to obtain images. The image obtained was free from any interference fringe pattern observed and proved to be satisfactory for practical application.

EXAMPLE 149

Except for changing NO gas employed in Example 147 to $N_2O$ gas, following the same conditions and procedure as in Example 147, an a-Si type light-receiving member for electrophotography was prepared.

The light-receiving member for electrophotography as prepared above was subjected to image exposure by means of a device as shown in FIG. 26 (wavelength of laser beam: 780 nm, spot diameter 80 $\mu$m), followed by development and transfer to obtain images. The image obtained was free from any interference fringe pattern observed and proved to be satisfactory for practical application.

EXAMPLE 150

Figure 72:
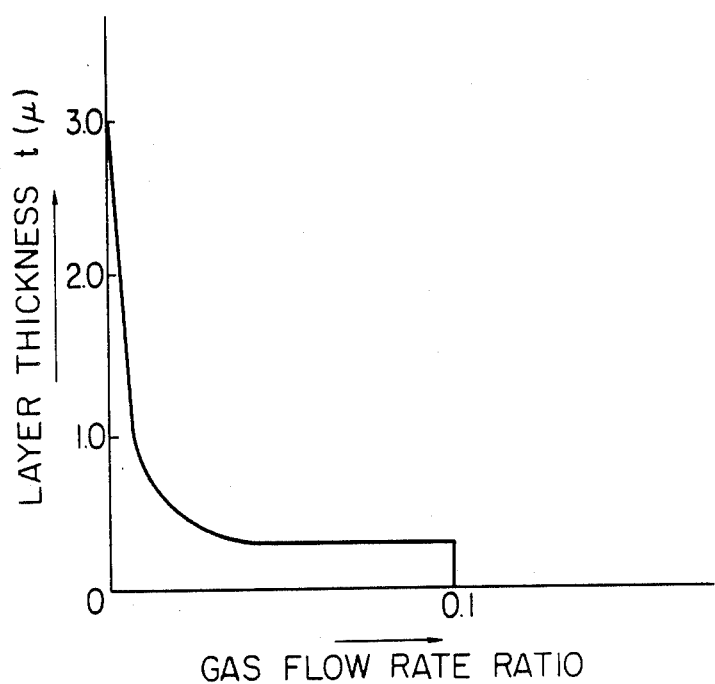
Figure 73:
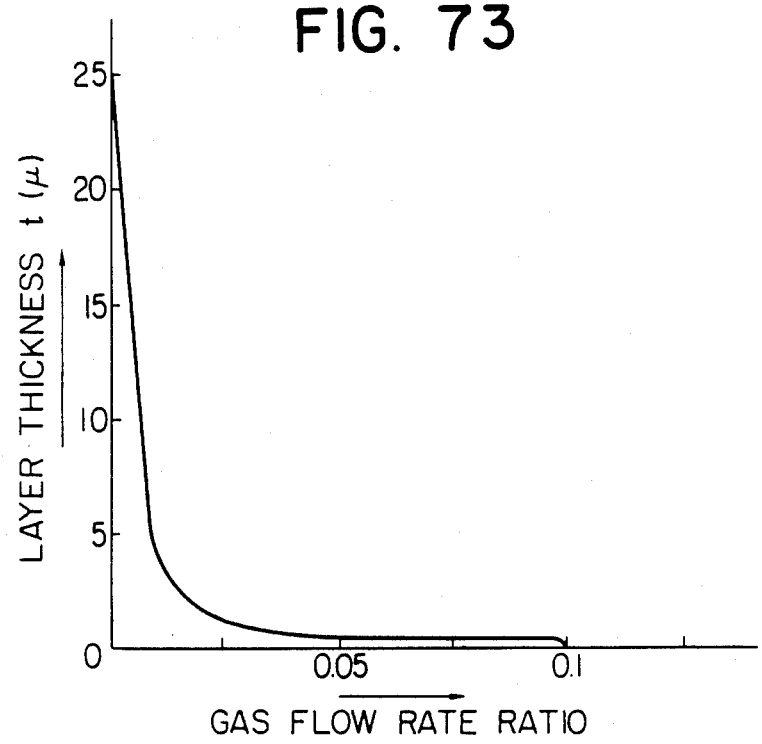

By means of a lathe, an aluminum substrate (length (L): 357 mm, outer diameter (r): 80 mm) was worked to have the surface characteristic as shown in FIG. 64(B), and a light-receiving member for electrophotography was prepared by means of the film deposition device as shown in FIG. 20 under the same conditions as in Example 139 except for varying the $N_2O$ gas flow rate ratio with the time for layer formation according to the change rate curve of gas flow rate ratio as shown in FIG. 72 under the conditions as shown in Table 8K.

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application.

EXAMPLE 151

By means of a lathe, an aluminum substrate (length (L): 357 mm, outerdiameter (r): 80 mm) was worked to have the surface characteristic as shown in FIG. 64(B), and a-Si type light-receiving members for electrophotography were prepared following the same conditions and procedure as in Example 139 except for varying the gas flow rate ratio of $SiH_4$ gas to $CH_4$ gas during surface layer formation as shown in Table 9K to change the content ratio of silicon atoms to carbon atoms in the surface layer (Sample Nos.2701K–2708K).

The light-receiving members for electrophotography were subjected to image exposure by means of a device as shown in FIG. 26 (wavelength of laser beam: 780 nm, spot diameter 80 $\mu$m), and the steps of image formation, development and cleaning were repeated 50,000 times, followed by image evaluation to obtain the results as shown in Table 9K.

EXAMPLE 152

By means of a lathe, an aluminum substrate (length (L): 357 mm, outer diameter (r): 80 mm) was worked to have the surface characteristic as shown in FIG. 64(B), and a-Si type light-receiving members for electrophotography were prepared following the same conditions and procedure as in Example 151 except for using $SiH_4$ gas, $CH_4$ gas and $SiF_4$ as starting gases during surface layer formation and varying the gas flow rate ratio of these gases during surface layer formation as shown in Table 10K (Sample Nos. 2801K–2808K).

The light-receiving members for electrophotography were subjected to image exposure by means of a device as shown in FIG. 26 (wavelength of laser beam: 780 nm, spot diameter 80 $\mu$m), and the steps of image formation, development and cleaning were repeated 50,000 times, followed by image evaluation to obtain the results as shown in Table 10K.

EXAMPLE 153

Except for using the aluminum substrate worked with a lathe to have the surface characteristic as shown in FIG. 64(B) (length (L) 357 mm, outer-diameter (r) 80 mm) and forming the surface layer according to the sputtering method, a-Si type light-receiving members for electrophotography were prepared according to the same procedure and under the same conditions as in Example 139. During this operation, the areas of Si target and C target were varied to vary the contents of Si and C as shown in Table 11K, respectively (Sample Nos. 2901K–2907K).

Formation of the surface layer was carried out as follows. That is, after formation of the second layer, the substrate having formed layers to said layer was taken out from the deposition device as shown in FIG. 20, the hydrogen ($H_2$) bomb was replaced with argon (Ar) gas bomb, the deposition device cleaned and the target for sputtering comprising Si with a thickness of 5 mm and the target for sputtering comprising graphite with a thickness of 5 mm were placed on the entire surface of the cathode electrode so that the area ratio may be the value as shown in Table 11K. Then, the substrate having formed layers to the second layer was set and, after reduction of pressure, argon gas was introduced and glow discharging excited at a high frequency power of 300 W to sputter the surface layer material on the cathode electrode, thereby forming the surface layer.

For these light-receiving members for electrophotography, image exposure was effected by means of the device as shown in FIG. 26 (wavelength of laser beam 780 nm, spot diameter 80 $\mu$m), and the steps of image formation, development and cleaning were repeated 50,000 times, followed by image evaluation. The results as shown in Table 11K were obtained.

EXAMPLE 154

By means of a lathe, an aluminum substrate (length (L): 357 mm, outer diameter (r): 80 mm) was worked to have the surface characteristic as shown in FIG. 64(B).

Next, an a-Si type light-receiving member for electrophotography was deposited on the above aluminum substrate following predetermined procedures using the film deposition device as shown in FIG. 20 under the conditions as shown in Table 1L. Deposition of the surface layer formed primarily of silicon atoms and carbon atoms was carried out as follows.

That is, after deposition of the second layer, the mass flow controllers corresponding to the respective gases were set so that the flow rate ratio of $CH_4$ gas to $SiH_4$ gas became $SiH_4/CH_4 = 1/30$ as shown in Table 1L, and the surface layer was formed by exciting glow discharging at a high frequency power of 300 W.

The surface state of the light-receiving member for electrography of A-Si:H thus prepared was as shown in FIG. 64(C). In this case, the difference in average layer thickness between the center and the both ends of said substrate was found to be 2 $\mu$m.

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application.

EXAMPLE 155

Except for the conditions as shown in Table 2L, in the same manner as in Example 154, a-Si type light-receiving members for electrophotography were prepared following various procedures by means of the film deposition device as shown in FIG. 20.

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application.

EXAMPLE 156

Except for the conditions as shown in Table 3L, in the same manner as in Example 154, a-Si type light-receiving members for electrophotography were prepared following various procedures by means of the film deposition device as shown in FIG. 20.

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application.

EXAMPLE 157

By means of a lathe, aluminum substrates (length (L): 357 mm, outer diameter (r): 80 mm) were worked to have the three kinds of surface characteristics as shown in FIG. 64(B), FIG. 78 and FIG. 79.

Next, under the conditions as shown in Table 4L, a-Si type light-receiving members for electrophotography were prepared following various procedures by means of the film deposition device as shown in FIG. 20. The surface layer was formed in the same manner as in Example 154.

The light-receiving members for electrophotography as prepared above were subjected to image exposure by means of a device as shown in FIG. 26 (wavelength of laser beam: 780 nm, spot diameter 80 $\mu$m), followed by development and transfer to obtain images. All of the images obtained were free from any interference fringe pattern observed and proved to be satisfactory for practical application.

EXAMPLE 158

By means of a lathe, aluminum substrates (length (L): 357 mm, outer diameter (r): 80 mm) were worked to have the three kinds of surface characteristics as shown in FIG. 64(B), FIG. 78 and FIG. 79.

Next, except for the conditions as shown in Table 5L, in the same manner as in Example 157, a-Si type light-receiving members for electrophotography were prepared following various procedures by means of the film deposition device as shown in FIG. 20.

The light-receiving members for electrophotography as prepared above were subjected to image exposure by means of a device as shown in FIG. 26 (wavelength of laser beam: 780 nm, spot diameter 80 $\mu$m), followed by development and transfer to obtain images. All of the images obtained were free from any interference fringe pattern observed and proved to be satisfactory for practical application.

EXAMPLE 159

By means of a lathe, aluminum substrates (length (L): 357 mm, outer diameter (r): 80 mm) were worked to have the three kinds of surface characteristics as shown in FIG. 64(B), FIG. 78 and FIG. 79.

Next, except for the conditions as shown in Table 6L, in the same manner as in Example 157, a-Si type light-receiving members for electrophotography were prepared following various procedures by means of the film deposition device as shown in FIG. 20.

The light-receiving members for electrophotography as prepared above were subjected to image exposure by means of a device as shown in FIG. 26 (wavelength of laser beam: 780 nm, spot diameter 80 $\mu$m), followed by development and transfer to obtain images. All of the images obtained were free from any interference fringe pattern observed and proved to be satisfactory for practical application.

EXAMPLE 160

By means of a lathe, an aluminum substrate (length (L): 357 mm, outer diameter (r): 80 mm) was worked to have the surface characteristic as shown in FIG. 64(B).

Next, using this substrate, a light-receiving member for electrophotography was prepared by means of the film deposition device as shown in FIG. 20 under the same conditions as in Example 154 except under the conditions as shown in Table 7L.

Figure 74:
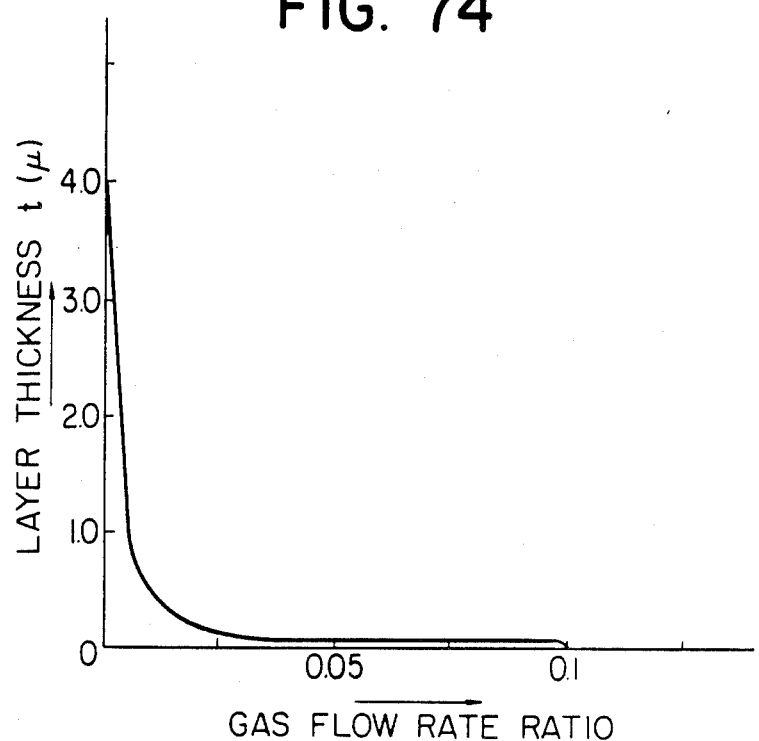

In the preparation of the first layer, the mass flow controller 2009 for $N_2O$ was controlled by a computer (HP9845B) so that $N_2O$ gas flow rate was changed relative to $SiH_4$ gas flow rate as shown in FIG. 74.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 161

By means of a lathe, an aluminum substrate (length (L): 357 mm, outer diameter (r): 80 mm) was worked to have the surface characteristic as shown in FIG. 64(B).

Next, using this substrate, a light-receiving member for electrophotography was prepared by means of the film deposition device as shown in FIG. 20 under the same conditions as in Example 154 except under the conditions as shown in Table 8L.

Figure 75:
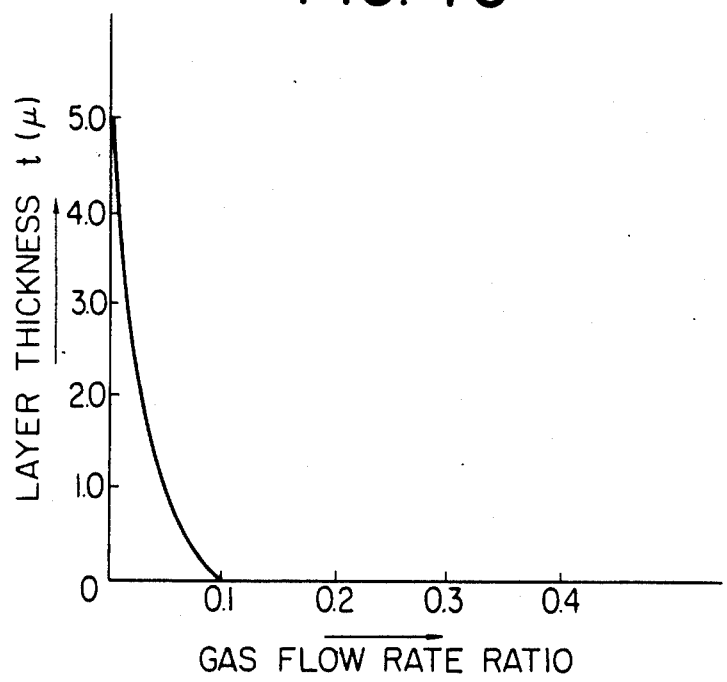

In the preparation of the first layer, the mass flow controller 2009 for NO gas was controlled by a computer (HP9845B) so that NO gas flow rate was changed relative to the sum of $SiH_4$ gas flow rate and $GeH_4$ gas flow rate as shown in FIG. 75.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 162

By means of a lathe, an aluminum substrate (length (L): 357 mm, outer diameter (r): 80 mm) was worked to have the surface characteristic as shown in FIG. 64(B).

Next, using this substrate, a light-receiving member for electrophotography was prepared by means of the film deposition device as shown in FIG. 20 under the same conditions as in Example 154 except under the conditions as shown in Table 9L.

Figure 57:
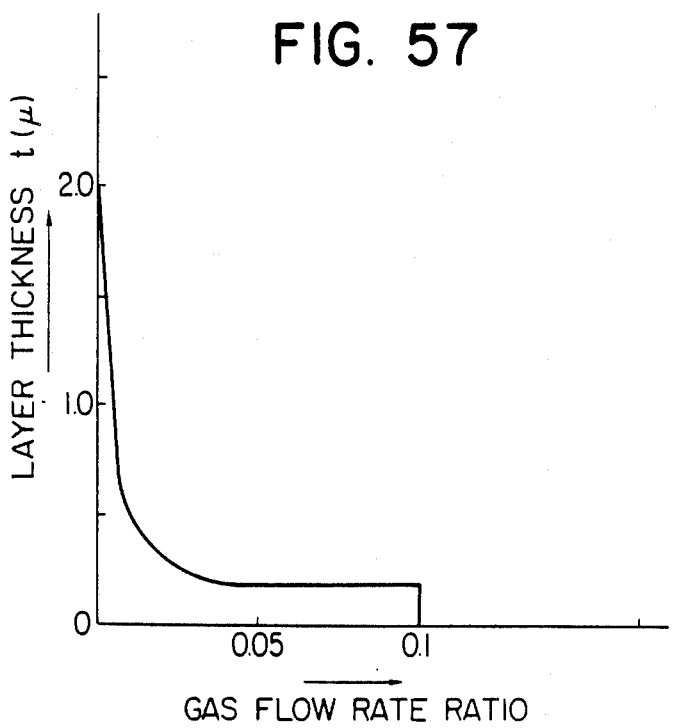

In the preparation of the first layer, the mass flow controller 2009 for $NH_3$ was controlled by a computer (HP9845B) so that $NH_3$ gas flow rate was changed relative to the sum of $SiH_4$ gas flow rate and $GeH_4$ gas flow rate as shown in FIG. 57.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 163

By means of a lathe, an aluminum substrate (length (L): 357 mm, outer diameter (r): 80 mm) was worked to have the surface characteristic as shown in FIG. 64(B), and a light-receiving member for electrophotography was prepared by means of the deposition device as shown in FIG. 20 similarly as in Example 154 except for under the conditions as shown in Table 10L.

Figure 76:
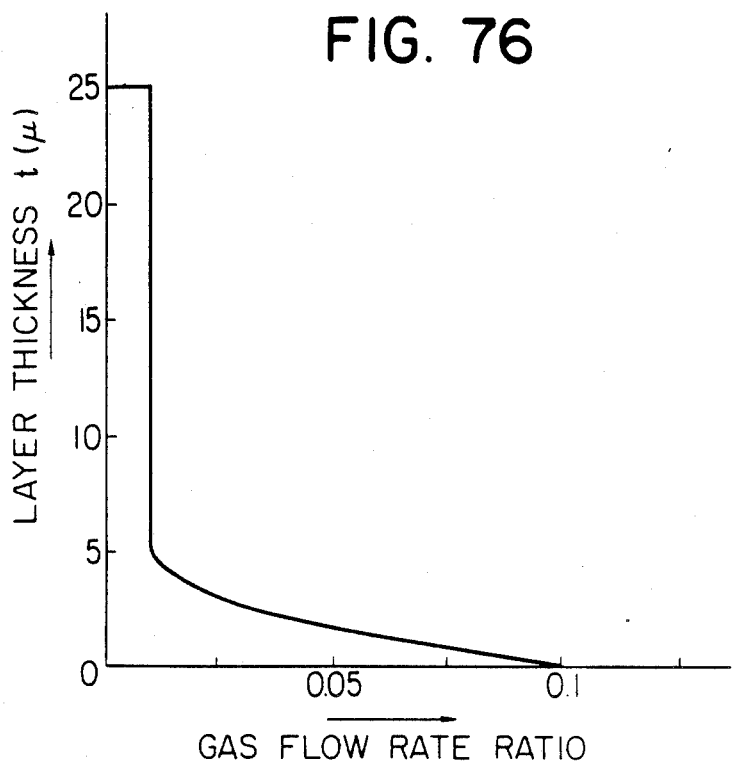

The mass flow controller 2009 for $N_2O$ was controlled by a computer (HP9845B) so that $N_2O$ gas flow rate was changed relative to the sum of $SiH_4$ gas flow rate and $GeH_4$ gas flow rate as shown in FIG. 76.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 164

By means of a lathe, an aluminum substrate (length (L): 357 mm, outer diameter (r): 80 mm) was worked to have the surface characteristic as shown in FIG. 64(B), and a light-receiving member for electrophotography was prepared by means of the deposition device as shown in FIG. 20 similarly as in Example 154 except for under the conditions as shown in Table 11L.

Figure 77:
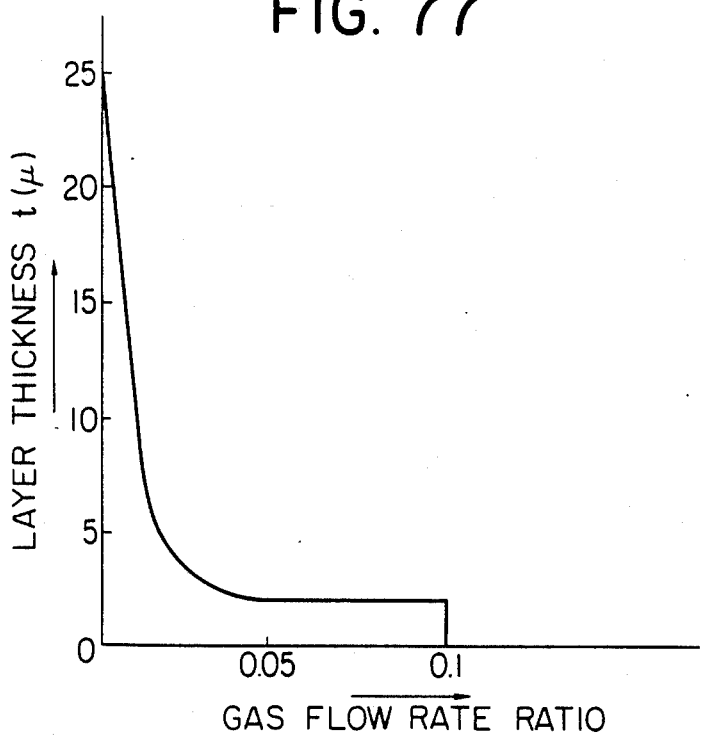

The mass flow controller 2009 for NO was controlled by a computer (HP9845B) so that NO gas flow rate was changed relative to the sum of $SiH_4$ gas flow rate and $GeH_4$ gas flow rate as shown in FIG. 77.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 165

By means of a lathe, an aluminum substrate (length (L): 357 mm, outerdiameter (r): 80 mm) was worked to have the surface characteristic as shown in FIG. 64(B).

Next, using this substrate a light-receiving member for electrophotography was prepared by means of the deposition device as shown in FIG. 20 similarly as in Example 154 except for under the conditions as shown in Table 12L.

Figure 80:
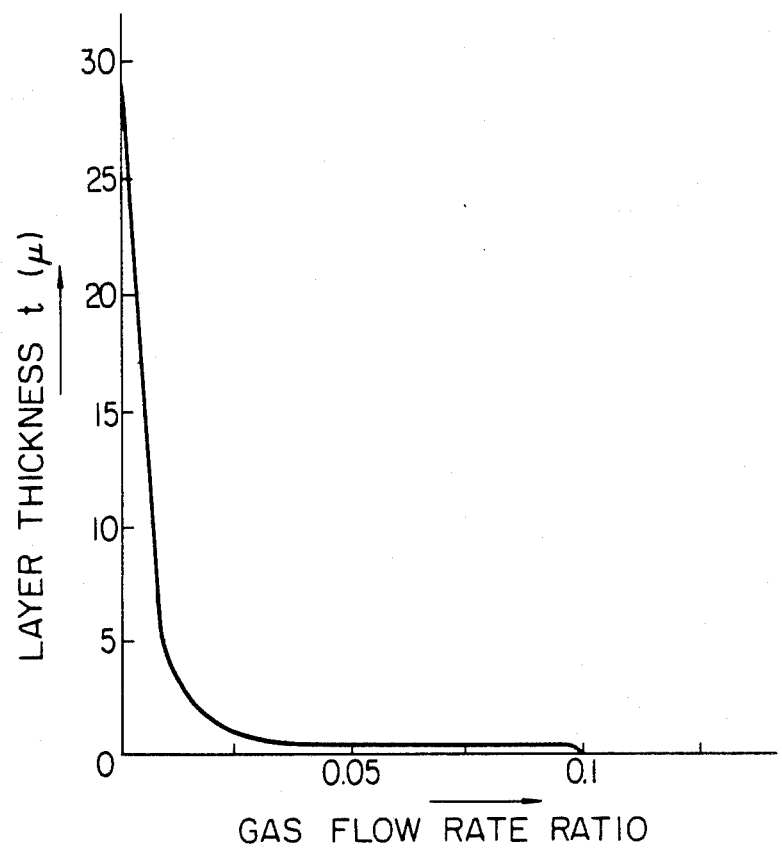
Figure 81:
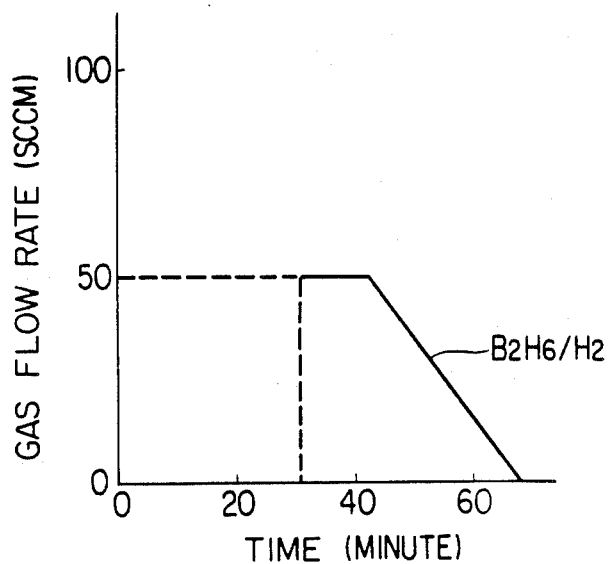
Figure 82:
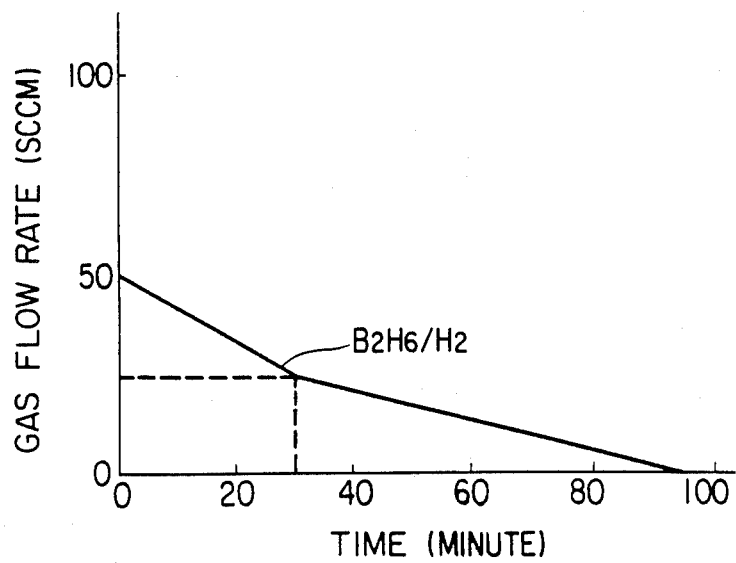

The mass flow controller 2009 for $NH_3$ was controlled by a computer (HP9845B) so that $NH_3$ gas flow rate was changed relative to the sum of $SiH_4$ gas flow rate and $GeH_4$ gas flow rate as shown in FIG. 80.

The light-receiving members for electrophotography as prepared above were subjected to image exposure by means of a device as shown in FIG. 26 (wavelength of laser beam: 780 nm, spot diameter 80 μm), followed by development and transfer to obtain images. All of the images obtained were free from any interference fringe pattern observed and proved to be satisfactory for practical application.

EXAMPLE 166

By means of a lathe, an aluminum substrate (length (L): 357 mm, outerdiameter (r): 80 mm) was worked to have the surface characteristic as shown in FIG. 64(B).

Next, using this substrate a light-receiving member for electrophotography was prepared by means of the deposition device as shown in FIG. 20 similarly as in Example 154 except for under the conditions as shown in Table 13L.

The light-receiving members for electrophotography as prepared above were subjected to image exposure by means of a device as shown in FIG. 26 (wavelength of laser beam: 780 nm, spot diameter 80 μm), followed by development and transfer to obtain images. All of the images obtained were free from any interference fringe pattern observed and proved to be satisfactory for practical application.

EXAMPLE 167

By means of a lathe, an aluminum substrate (length (L): 357 mm, outer diameter (r): 80 mm) was worked to have the surface characteristic as shown in FIG. 64(B).

Next, using this substrate a light-receiving member for electrophotography was prepared by means of the deposition device as shown in FIG. 20 similarly as in Example 154 except for under the conditions as shown in Table 14L.

The light-receiving members for electrophotography as prepared above were subjected to image exposure by means of a device as shown in FIG. 26 (wavelength of laser beam: 780 nm, spot diameter 80 μm), followed by development and transfer to obtain images. All of the images obtained were free from any interference fringe pattern observed and proved to be satisfactory for practical application.

EXAMPLE 168

Examples 154 to 167 were repeated except that $PH_3$ gas diluted to 3000 vol ppm with $H_2$ was employed in place of $B_2H_6$ gas diluted to 3000 vol ppm with $H_2$ to prepare light-receiving members for electrophotography respectively.

Other preparation conditions were the same as in Examples 154 to 167.

The light-receiving member for electrophotography as prepared above was subjected to image exposure by means of a device as shown in FIG. 26 (wavelength of laser beam: 780 nm, spot diameter 80 μm), followed by development and transfer to obtain images. The image obtained was free from any interference fringe pattern observed and proved to be satisfactory for practical application.

EXAMPLE 169

By means of a lathe, an aluminum substrate (length (L): 357 mm, outer diameter (r): 80 mm) was worked to have the surface characteristic as shown in FIG. 64(B), and using this substrate a-Si type light-receiving members for electrophotography was prepared following the same conditions and procedure as in Example 154 except for varying the gas flow rate ratio of $SiH_4$ gas to $CH_4$ gas during surface layer formation as shown in Table 15L (Sample No. 2701L–2708L).

These light-receiving members for electrophotography were subjected to image exposure by means of a device as shown in FIG. 26 (wavelength of laser beam: 780 nm, spot diameter 80 μm), and the steps of image formation, development and cleaning were repeated 50,000 times, followed by image evaluation to obtain the results as shown in Table 15L.

EXAMPLE 170

By means of a lathe, an aluminum substrate (length (L): 357 mm, outer diameter (r): 80 mm) was worked to have the surface characteristic as shown in FIG. 64(B), and a-Si type light-receiving members for electrophotography was prepared following the same conditions and procedure as in Example 169 except for using $SiH_4$ gas, $CH_4$ gas and $SiF_4$ gas as starting gases during surface layer formation and varying the gas flow rate ratio of these gases during surface layer formation as shown in Table 16L (Sample No. 2801L–2808L).

The light-receiving members for electrophotography were subjected to image exposure by means of a device as shown in FIG. 26 (wavelength of laser beam: 780 nm, spot diameter 80 μm), and the steps of image formation, development and cleaning were repeated 50,000 times, followed by image evaluation to obtain the results as shown in Table 16L.

EXAMPLE 171

Using the aluminum substrate worked with a lathe to have the surface characteristic as shown in FIG. 64(B) (length (L): 357 mm, outer diameter (r): 80 mm), a-Si type light-receiving members for electrophotography were prepared according to the same procedure and under the same conditions as in Example 154 except that during this operation, the areas of Si target and C target were varied to vary the contents of Si and C as shown in Table 17L, respectively (Sample Nos. 2901L–2908L).

That is, after formation of the second layer, the substrate having formed layers to said layer was taken out from the deposition device as shown in FIG. 20, the hydrogen ($H_2$) bomb was replaced with argon (Ar) gas bomb, the deposition device cleaned and the target for sputtering comprising Si with a thickness of 5 mm and the target for sputtering comprising graphite with a thickness of 5 mm were placed on the entire surface of the cathode electrode so that the area ratio may be the value as shown in Table 17L. Then, the substrate having formed layers to the second layer was set and, after reduction of pressure, argon gas was introduced and glow discharging excited at a high frequency power of 300 W to sputter the surface layer material on the cathode electrode to the surface of the second layer, thereby forming the surface layer consisting of silicon atoms and carbon atoms at a desired ratio.

For these light-receiving members for electrophotography, image exposure was effected by means of the device as shown in FIG. 26 (wavelength of laser beam 780 nm, spot diameter 80 μm), and the steps of image formation, development and cleaning were repeated 50,000 times, followed by image evaluation. The results as shown in Table 17L were obtained.

EXAMPLE 172

By means of a lathe, an aluminum substrate (length (L): 357 mm, outer diameter (r): 80 mm) was worked to have the surface characteristic as shown in FIG. 64(B).

Next, an a-Si type light-receiving member for electrophotography was produced on the above aluminum substrate following predetermined procedures using the film deposition device as shown in FIG. 20 under the conditions as shown in Table 1M.

In preparation of the first layer of a-SiGe:H:B:O layer, the mass flow controllers 2007, 2008 and 2010 were controlled by a computer (HP9845B) so that the flow rates of $GeH_4$ and $SiH_4$ might be as shown in FIG. 22. Deposition of the surface layer formed primarily of silicon atoms and carbon atoms was carried out as follows. That is, after deposition of the second layer, the mass flow controllers corresponding to the respective gases were set so that the flow rate ratio of $CH_4$ gas to $SiH_4$ gas became $SiH_4/CH_4 = 1/30$ as shown in Table 1M, and the surface layer was formed by exciting glow discharging at a high frequency power of 300 W.

The surface state of the light-receiving member thus prepared was as shown in FIG. 64(C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 173

Under conditions as shown in Table 1M, in the same manner as in Example 172, a-Si type light-receiving members for electrophotography were prepared following various procedures by means of the film deposition device as shown in FIG. 20 except that in preparation of the first layer of a-SiGe:H:B:O layer, the mass flow controllers 2008 and 2007 for GeH$_4$ and SiH$_4$ were controlled by a computer (HP9845B) so that the flow rates of GeH$_4$ and SiH$_4$ might be as shown in FIG. 23.

The surface state of the light-receiving member thus prepared was as shown in FIG. 64(C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 174

Except for changing NO gas employed in Example 172 to NH$_3$ gas, following the same conditions and procedure as in Example 172, a-Si type light-receiving members for electrophotography were prepared.

The light-receiving members for electrophotography as prepared above were subjected to image exposure by means of a device as shown in FIG. 26 (wavelength of laser beam: 780 nm, spot diameter 80 μm), followed by development and transfer to obtain images. All of the images obtained were free from any interference fringe pattern observed and proved to be satisfactory for practical application.

EXAMPLE 175

Except for changing NO gas employed in Example 172 to N$_2$O gas, following the same conditions and procedure as in Example 172, a-Si type light-receiving members for electrophotography were prepared.

The light-receiving member for electrophotography as prepared above were subjected to image exposure by means of a device as shown in FIG. 26 (wavelength of laser beam: 780 nm, spot diameter 80 μm), followed by development and transfer to obtain images. All of the images obtained were free from any interference fringe pattern observed and proved to be satisfactory for practical application.

EXAMPLE 176

Except for the conditions as shown in Table 2M, in the same manner as in Example 172, a-Si type light-receiving members for electrophotography were prepared following various procedures by means of the film deposition device as shown in FIG. 20.

In preparation of the first layer of a-SiGe:H:B:N layer, the mass flow controllers 2008 and 2007 for GeH$_4$ and SiH$_4$ were controlled by a computer (HP9845B) so that the flow rates of GeH$_4$ and SiH$_4$ might be as shown in FIG. 24.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 177

Except for the conditions as shown in Table 2M, in the same manner as in Example 172, a-Si type light-receiving members for electrophotography were prepared following various procedures by means of the film deposition device as shown in FIG. 20.

In preparation of the first layer of a-SiGe:H:B:N layer, the mass flow controllers 2008 and 2007 for GeH$_4$ and SiH$_4$ were controlled by a computer (HP9845B) so that the flow rates of GwH$_4$ and SiH$_4$ might be as shown in FIG. 25.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 178

Except for changing NH$_3$ gas employed in Example 176 to NO gas, following the same conditions and procedure as in Example 176, an a-Si type light-receiving member for electrophotography was prepared.

The light-receiving member for electrophotography as prepared above was subjected to image exposure by means of a device as shown in FIG. 26 (wavelength of laser beam: 780 nm, spot diameter 80 μm), followed by development and transfer to obtain images. The image obtained was free from any interference fringe pattern observed and proved to be satisfactory for practical application.

EXAMPLE 179

Except for changing NH$_3$ gas employed in Example 176 to N$_2$O gas, following the same conditions and procedure as in Example 176, an a-Si type light-receiving member for electrophotography was prepared.

The light-receiving member for electrophotography as prepared above was subjected to image exposure by means of a device as shown in FIG. 26 (wavelength of laser beam: 780 nm, spot diameter 80 μm), followed by development and transfer to obtain images. The image obtained was free from any interference fringe pattern observed and proved to be satisfactory for practical application.

EXAMPLE 180

Except for the conditions as shown in Table 3M, in the same manner as in Example 172, a-Si type light-receiving members for electrophotography were prepared following various procedures by means of the film deposition device as shown in FIG. 20.

In preparation of the first layer of a-SiGe:H:B:O:N layer, the mass flow controllers 2008 and 2007 for GeH$_4$ and SiH$_4$ were controlled by a computer (HP9845B) so that the flow rates of GeH$_4$ and SiH$_4$ might be as shown in FIG. 24.

N₂O gas flow rate was changed relative to the sum of GeH₄ gas flow rate and SiH₄ gas flow rate according to change rate curve as shown in FIG. 72.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 181

Except for changing N₂O gas employed in Example 180 to NO gas, following the same conditions and procedure as in Example 180, a-Si type light-receiving members for electrophotography were prepared.

The light-receiving members for electrophotography as prepared above were subjected to image exposure by means of a device as shown in FIG. 26 (wavelength of laser beam: 780 nm, spot diameter 80 μm), followed by development and transfer to obtain images. All of the images obtained were free from any interference fringe pattern observed and proved to be satisfactory for practical application.

EXAMPLE 182

Except for changing N₂O gas employed in Example 180 to NH₃ gas, following the same conditions and procedure as in Example 180, a-Si type light-receiving members for electrophotography were prepared.

The light-receiving members for electrophotography as prepared above were subjected to image exposure by means of a device as shown in FIG. 26 (wavelength of laser beam: 780 nm, spot diameter 80 μm), followed by development and transfer to obtain images. All of the images obtained were free from any interference fringe pattern observed and proved to be satisfactory for practical application.

EXAMPLE 183

Except for the conditions as shown in Table 4M, in the same manner as in Example 172, light-receiving members for electrophotography were prepared following various procedures by means of the film deposition device as shown in FIG. 20.

In preparation of the first layer, a-SiGe:H:B:O layer, the mass flow controllers 2008 and 2007 for GeH₄ and SiH₄ were controlled by a computer (HP9845B) so that the flow rates of GeH₄ and SiH₄ might be as shown in FIG. 24.

NO gas flow rate was changed relative to the sum of GeH₄ gas flow rate and SiH₄ gas flow rate according to change rate curve as shown in FIG. 58.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 184

By means of a lathe, an aluminum substrate (length (L): 357 mm, outer diameter (r): 80 mm) was worked to have the surface characteristic as shown in FIG. 78, and light-receiving member for electrophotography was prepared by means of the deposition device as shown in FIG. 20 under the same conditions as in Example 172 except for under the conditions as shown in Table 5M.

In preparation of the first layer, a-SiGe:H:B:N layer, the mass flow controllers 2008 and 2007 for GeH₄ and SiH₄ were controlled by a computer (HP9845B) so that the flow rates of GeH₄ and SiH₄ might be as shown in FIG. 25.

NH₃ gas flow rate was changed relative to the sum of GeH₄ gas flow rate and SiH₄ gas flow rate according to change rate curve as shown in FIG. 80.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 185

By means of a lathe, an aluminum substrate (length (L): 357 mm, outer diameter (r): 80 mm) was worked to have the surface characteristic as shown in FIG. 79, and a light-receiving member for electrophotography was prepared by means of the deposition device as shown in FIG. 20 under the same conditions as in Example 172 except for under the conditions as shown in Table 6M.

In preparation of the first layer, a-SiGe:H:B:O:N layer, the mass flow controllers 2008 and 2007 for GeH₄ and SiH₄ were controlled by a computer (HP9845B) so that the flow rates of GeH₄ and SiH₄ might be as shown in FIG. 23.

Figure 83:
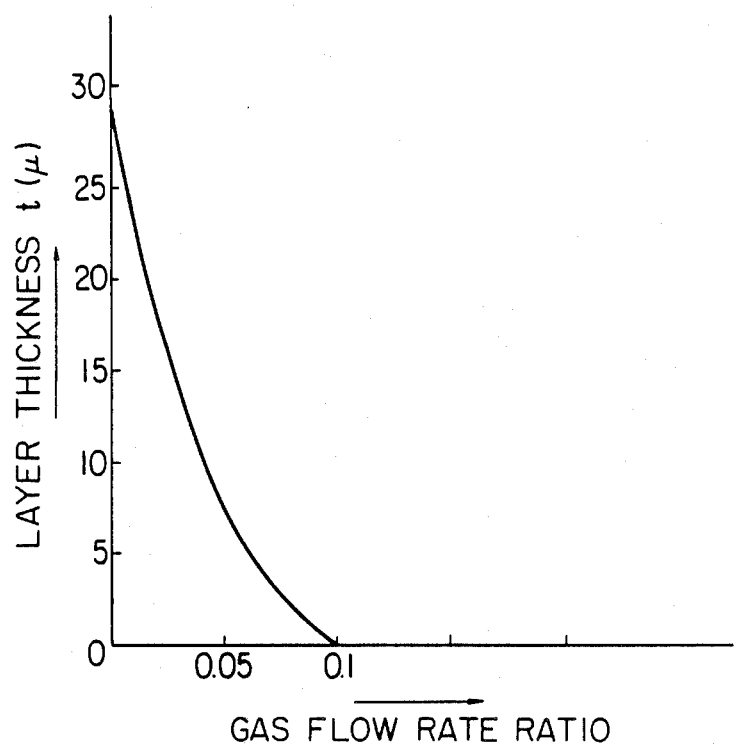

N₂O gas flow rate was changed relative to the sum of GeH₄ gas flow rate and SiH₄ gas flow rate according to change rate curve as shown in FIG. 83.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 186

Examples 172 to 185 were repeated except that PH₃ gas diluted to 3000 vol ppm with H₂ was employed in place of B₂H₆ gas diluted to 3000 vom ppm with H₂ to prepare light-receiving members for electrophotography respectively.

Other preparation conditions were the same as in Examples 172 to 185.

For these light-receiving members for electrophotography, image exposure was effected by means of an image exposure device as shown in FIG. 26 (wavelength of laser beam: 780 nm, spot diameter 80 μm), followed by development and transfer, to obtain images. All of the images were free from interference fringe pattern and practically satisfactory.

EXAMPLE 187

Using a substrate of Example 172, a-Si type light-receiving members for electrophotography was prepared following the same conditions and procedure as in Example 172 except for varying the gas flow rate ratio of SiH₄ gas to CH₄ gas during surface layer formation as shown in Table 7M to change the content ratio of silicon atoms to carbon atoms in the surface layer (Sample No. 2701M–2708M).

The light-receiving members for electrophotography were subjected to image exposure by means of a device as shown in FIG. 26 (wavelength of laser beam: 780 nm, spot diameter 80 μm), and the steps of image formation, development and cleaning were repeated 50,000 times, followed by image evaluation to obtain the results as shown in Table 7M.

EXAMPLE 188

Using a substrate of Example 172, a-Si type light-receiving members for electrophotography was prepared following the same conditions and procedure as in Example 187 except for using SiH4 gas, CH4 gas and SiF4 as starting gases during surface layer formation and varying the gas flow rate ratio of these gases during surface layer formation as shown in Table 8M (Sample No. 2801M–2808M).

The light-receiving members for electrophotography were subjected to image exposure by means of a device as shown in FIG. 26 (wavelength of laser beam: 780 nm, spot diameter 80 μm), and the steps of image formation, development and cleaning were repeated 50,000 times, followed by image evaluation to obtain the results as shown in Table 8M.

EXAMPLE 189

Except for using the substrate as used in Example 172 and forming the surface layer according to the sputtering method, a-Si type light-receiving members for electrophotography were prepared according to the same procedure and under the same conditions as in Example 172.

Formation of the surface layer was carried out as follows. That is, after formation of the second layer, the substrate having formed layers to said layer was taken out from the deposition device as shown in FIG. 20, the hydrogen (H2) bomb was replaced with argon (Ar) gas bomb, the deposition device cleaned and the target for sputtering comprising Si with a thickness of 5 mm and the target for sputtering comprising graphite with a thickness of 5 mm were placed on the entire surface of the cathode electrode so that the area ratio may be the value as shown in Table 9M. Then, the substrate having formed layers to the second layer was set and, after reduction of pressure, argon gas was introduced to about $5 \times 10^{-3}$ Torr and glow discharging excited at a high frequency power of 300 W to sputter the surface layer material on the cathode electrode, thereby forming the surface layer.

For these light-receiving members for electrophotography, image exposure was effected by means of the device as shown in FIG. 26 (wavelength of laser beam 780 nm, spot diameter 80 μm), and the steps of image formation, development and cleaning were repeated 50,000 times, followed by image evaluation. The results as shown in Table 9M were obtained.

EXAMPLE 190

By means of a lathe, an aluminum substrate (length (L): 357 mm, outer diameter (r): 80 mm) was worked to have the surface characteristic as shown in FIG. 64(B).

Next, an a-Si type light-receiving member for electrophotography was deposited on the above aluminum substrate following predetermined procedures using the film deposition device as shown in FIG. 20 under the conditions as shown in Table 1N. Deposition of the surface layer formed primarily of silicon atoms and carbon atoms was carried out as follows.

That is, after deposition of the second layer, the mass flow controllers corresponding to the respective gases were set so that the flow rate ratio of CH4 gas to SiH4 gas became SiH4/CH4 = 1/30 as shown in Table 1N, and the surface layer was formed by exciting glow discharging at a high frequency power of 300 W.

The surface state of the light-receiving member for electrophotography thus prepared was as shown in FIG. 64(C). In this case, the difference in average layer thickness between the center and the both ends of the aluminum substrate was found to be 2 μm.

The light-receiving member for electrophotography as prepared above was subjected to image exposure by means of a device as shown in FIG. 26 (wavelength of laser beam: 780 nm, spot diameter 80 μm), followed by development and transfer to.obtain an image. The image was free from any interference fringe pattern observed and proved to be satisfactory for practical application.

EXAMPLE 191

Except for the conditions as shown in Table 2N, in the same manner as in Example 190, a-Si type light-receiving members for electrophotography were prepared following various procedures by means of the film deposition device as shown in FIG. 20.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 192

Except for the conditions as shown in Table 3N, in the same manner as in Example 190, a-Si type light-receiving members for electrophotography were prepared following various procedures by means of the film deposition device as shown in FIG. 20.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 193

By means of a lathe, aluminum substrate (length (L): 357 mm, outer diameter (r): 80 mm) were worked to have the three kinds of surface characteristics as shown in FIG. 64 (B), FIG. 78 and FIG. 79.

Next, under the conditions as shown in Table 4N, a-Si type light-receiving members for electrophotography were prepared following various procedures by means of the film deposition device as shown in FIG. 20. The surface layer was prepared in the same manner as in Example 192.

The light-receiving members for electrophotography as prepared above were subjected to image exposure by means of a device as shown in FIG. 26 (wavelength of laser beam: 780 nm, spot diameter 80 μm), followed by development and transfer to obtain images. All of the images obtained were free from any interference fringe pattern observed and proved to be satisfactory for practical application.

EXAMPLE 194

Except for changing N$_2$O gas employed in Example 192 to NH$_3$ gas, following the same conditions and procedure as in Example 192, a-Si type light-receiving members for electrophotography were prepared.

The light-receiving members for electrophotography as prepared above were subjected to image exposure by means of a device as shown in FIG. 26 (wavelength of laser beam: 780 nm, spot diameter 80 μm), followed by development and transfer to obtain images. All of the images obtained were free from any interference fringe pattern observed and proved to be satisfactory for practical application.

EXAMPLE 195

Except for changing NO gas employed in Example 193 to N$_2$O gas, following the same conditions and procedure as in Example 193, a-Si type light-receiving members for electrophotography were prepared.

The light-receiving members for electrophotography as prepared above were subjected to image exposure by means of a device as shown in FIG. 26 (wavelength of laser beam: 780 nm, spot diameter 80 μm), followed by development and transfer to obtain images. All of the images obtained were free from any interference fringe pattern observed and proved to be satisfactory for practical application.

EXAMPLE 196

By means of a lathe, an aluminum substrate (length (L): 357 mm, outer diameter (r): 80 mm) was worked to have the surface characteristic as shown in FIG. 64 (B).

Next, using this substrate an a-Si type light-receiving member for electrophotography was prepared similarly as in Example 190 following predetermined procedures using the film deposition device as shown in FIG. 20 except for under the conditons as shown in Table 5N.

Figure 56:
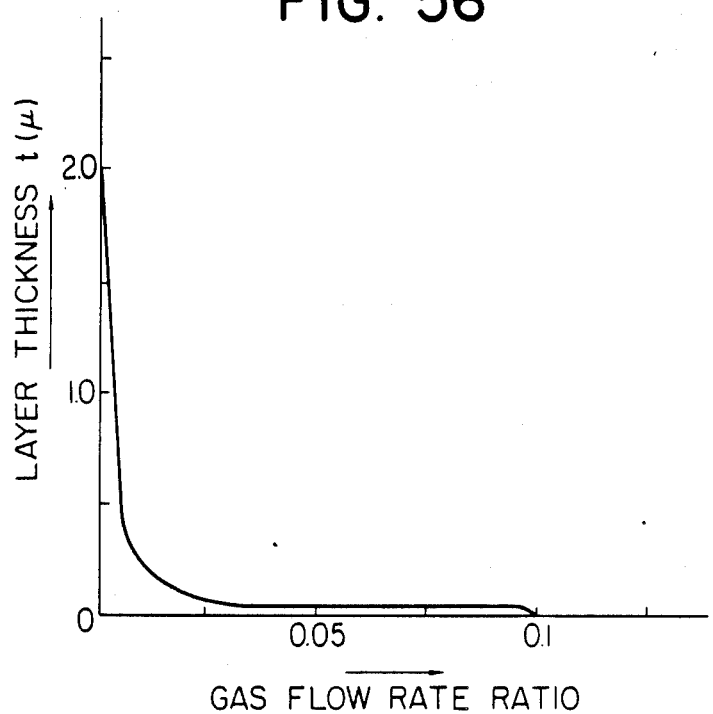

The boron-containing layer was formed by controlling the mass flow controller 2010 and 2009 for B$_2$H$_6$/H$_2$ and NH$_3$ by means of a computer (HP9845B) so that the flow rates of B$_2$H$_6$/H$_2$ and NH$_3$ might be as shown in FIG. 60 and FIG. 56, respectively.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 197

Except for changing NH$_3$ gas employed in Example 196 to NO gas, following the same conditions and procedure as in Example 196, an a-Si type light-receiving member for electrophotography was prepared.

The light-receiving member for electrophotography as prepared above was subjected to image exposure by means of a device as shown in FIG. 26 (wavelength of laser beam: 780 nm, spot diameter 80 μm), followed by development and transfer to obtain images. The image obtained was free from any interference fringe pattern observed and proved to be satisfactory for practical application.

EXAMPLE 198

Except for changing NH$_3$ gas employed in Example 196 to N$_2$O gas, following the same conditions and procedure as in Example 196, an a-Si type light-receiving member for electrophotography was prepared.

The light-receiving member for electrophotography as prepared above was subjected to image exposure by means of a device as shown in FIG. 26 (wavelength of laser beam: 780 nm, spot diameter 80 μm), followed by development and transfer to obtain images. The image obtained was free from any interference fringe pattern observed and proved to be satisfactory for practical application.

EXAMPLE 199

By means of lathe, an aluminum substrate (length (L): 357 mm, outer diameter (r): 80 mm) was worked to have the surface characteristic as shown in FIG. 64 (B).

Next, using this substrate an a-Si type light-receiving member for electrophotography was prepared similarly as in Example 190 following predetermined procedures using the film deposition device as shown in FIG. 20 except for under the conditions as shown in Table 6N.

The boron-containing layer was formed by controlling the mass flow controller 2010 and 2009 for B$_2$H$_6$/H$_2$ and N$_2$O by means of a computer (HP9845B) so that the flow rates of B$_2$H$_6$/H$_2$ and N$_2$O might be as shown in FIG. 61 and FIG. 57, respectively.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 200

Except for changing N$_2$O gas employed in Example 199 to NO gas, following the same conditions and procedure as in Example 199, an a-Si type light-receiving member for electrophotography was prepared.

The light-receiving member for electrophotography as prepared above was subjected to image exposure by means of a device as shown in FIG. 26 (wavelength of laser beam: 780 nm, spot diameter 80 μm), followed by development and transfer to obtain images. The image obtained was free from any interference fringe pattern observed and proved to be satisfactory for practical application.

EXAMPLE 201

Except for changing N$_2$O gas employed in Example 199 to NH$_3$ gas, following the same conditions and procedure as in Example 199, an a-Si type light-receiving member for electrophotography was prepared.

The light-receiving member for electrophotography as prepared above was subjected to image exposure by means of a device as shown in FIG. 26 (wavelength of laser beam: 780 nm, spot diameter 80 μm), followed by development and transfer to obtain images. The image obtained was free from any interference fringe pattern observed and proved to be satisfactory for practical application.

EXAMPLE 202

By means of a lathe, an aluminum substrate (length (L): 357 mm, outer diameter (r): 80 mm) was worked to have the surface characteristic as shown in FIG. 64 (B).

Next, using this substrate, a light-receiving member for electrophotography was prepared similarly as in Example 190 following predetermined procedures using the film deposition device as shown in FIG. 20 except for under the conditions as shown in Table 7N.

Figure 62:
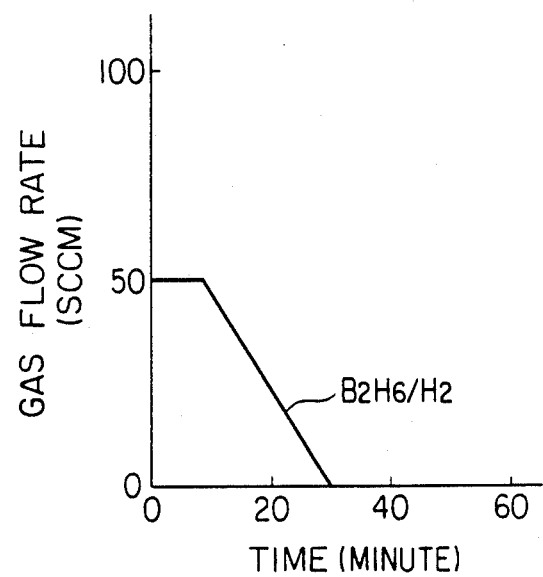

The boron-containing layer was formed by controlling the mass flow controller 2010 and 2009 for $B_2H_6/H_2$ and NO by means of a computer (HP9845B) so that the flow rates of $B_2H_6/H_2$ and NO might be as shown in FIG. 62 and FIG. 58, respectively.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 203

Except for changing NO gas employed in Example 202 to $NH_3$ gas, following the same conditions and procedure as in Example 202, an a-Si type light-receiving member for electrophotography was prepared.

The light-receiving member for electrophotography as prepared above was subjected to image exposure by means of a device as shown in FIG. 26 (wavelength of laser beam: 780 nm, spot diameter 80 μm), followed by development and transfer to obtain images. The image obtained was free from any interference fringe pattern observed and proved to be satisfactory for practical application.

EXAMPLE 204

Except for changing NO gas employed in Example 202 to $N_2O$ gas, following the same conditions and procedure as in Example 202, an a-Si type light-receiving member for electrophotography was prepared.

The light-receiving member for electrophotography as prepared above was subjected to image exposure by means of a device as shown in FIG. 26 (wavelength of laser beam: 780 nm, spot diameter 80 μm), followed by development and transfer to obtain images. The image obtained was free from any interference fringe pattern observed and proved to be satisfactory for practical application.

EXAMPLE 205

By means of a lathe, an aluminum substrate (length (L): 357 mm, outer diameter (r): 80 mm) was worked to have the surface characteristic as shown in FIG. 64 (B).

Next, using this substrate, a light-receiving member for electrophotography was prepared similarly as in Example 190 following predetermined procedures using the film deposition device as shown in FIG. 20 except for under the conditions as shown in Table 8N.

Figure 59:
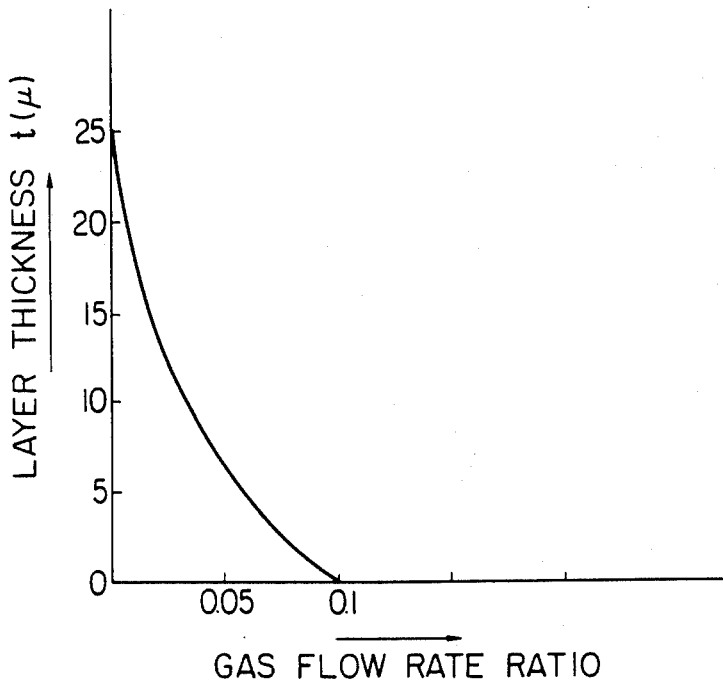

The boron-containing layer was formed by controlling the mass flow controller 2010 and 2009 for $B_2H_6/H_2$ and $NH_3$ by means of a computer (HP9845B) so that the flow rates of $B_2H_6/H_2$ and $NH_3$ might be as shown in FIG. 39 and FIG. 59, respectively.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference pattern observed and proved to be satisfactory for practical application.

EXAMPLE 206

Except for changing $NH_3$ gas employed in Example 205 to NO gas, following the same conditions and procedure as in Example 205, an a-Si type light-receiving member for electrophotography was prepared.

The light-receiving member for electrophotography as prepared above was subjected to image exposure by means of a device as shown in FIG. 26 (wavelength of laser beam: 780 nm, spot diameter 80 μm), followed by development and transfer to obtain images. The image obtained was free from any interference pattern observed and proved to be satisfactory for practical application.

EXAMPLE 207

Except for changing $NH_3$ gas employed in Example 205 to $N_2O$ gas, following the same conditions and procedure as in Example 205, an a-Si type light-receiving member for electrophotography was prepared.

The light-receiving member for electrophotography as prepared above was subjected to image exposure by means of a device as shown in FIG. 26 (wavelength of laser beam: 780 nm, spot diameter 80 μm), followed by development and transfer to obtain images. The image obtained was free from any interference pattern observed and proved to be satisfactory for practical application.

EXAMPLE 208

Examples 190 to 207 were repeated except that $PH_3$ gas diluted to 3000 vol ppm with $H_2$ was employed in place of $B_2H_6$ gas diluted to 3000 vol ppm with $H_2$ to prepare light-receiving members for electrophotography respectively.

Other preparation conditions were the same as in Examples 190 to 207.

For these light-receiving members for electrophotography, image exposure was effected by means of an image exposure device as shown in FIG. 26 (wavelength of laser beam: 780 nm, spot diameter 80 μm), followed by development and transfer, to obtain images. All of the images were free from interference fringe pattern and practically satisfactory.

EXAMPLE 209

By means of a lathe, an aluminum substrate (length (L): 357 mm, outer diameter (r): 80 mm) was worked to have the surface characteristic as shown in FIG. 64 (B), and using this substrate a-Si type light-receiving members for electrophotography was prepared following the same conditions and procedure as in Exmaple 190 except for varying the gas flow rate ratio of $SiH_4$ gas to $CH_4$ gas during surface layer formation as shown in Table 9N (Sample No. 2701N–2708N).

The light-receiving members for electrophotography were subjected to image exposure by means of a device as shown in FIG. 26 (wavelength of laser beam: 780 nm, spot diameter 80 μm), and the steps of image formation, development and cleaning were repeated 50,000 times, followed by image evaluation to obtain the results as shown in Table 9N.

EXAMPLE 210

By means of a lathe, an aluminum substrate (length (L): 357 mm, outer diameter (r): 80 mm) was worked to have the surface characteristic as shown in FIG. 64 (B), and using this substrate, a-Si type light-receiving members for electrophotography was prepared following the same conditions and procedure as in Example 209 except for using $SiH_4$ gas, $CH_4$ gas and $SiF_4$ as starting gases during surface layer formation and varying the gas flow rate ratio of these gases during surface layer formation as shown in Table 10N (Sample No. 2801N–2808N).

The light-receiving members for electrophotography were subjected to image exposure by means of a device as shown in FIG. 26 (wavelength of laser beam: 780 nm, spot diameter 80 μm), and the steps of image formation, development and cleaning were repeated 50,000 times, followed by image evaluation to obtain the results as shown in Table 10N.

EXAMPLE 211

Except for using the aluminum substrate to have the surface characteristic as shown in FIG. 64 (B) (length (L): 357 mm, outer diameter (r): 80 mm), a-Si type light-receiving members for electrophotography were prepared according to the same procedure and under the same conditions as in Example 190. During this operation, the areas of Si target and C target were varied to vary the contents of Si and C as shown in Table 11N, respectively (Sample Nos. 2901N–2908N).

That is, after formation of the second layer, the substrate having formed layers to said layer was taken out from the deposition device as shown in FIG. 20, the hydrogen ($H_2$) bomb was replaced with argon (Ar) gas bomb, the deposition device cleaned and the target for sputtering comprising Si with a thickness of 5 mm and the target for sputtering comprising graphite with a thickness of 5 mm were placed on the entire surface of the cathode electrode so that the area ratio may be the value as shown in Table 17N. Then, the substrate having formed layers to the second layer was set and, after reduction of pressure, argon gas was introduced and glow discharging excited at a high frequency power of 300 W to sputter the surface layer material on the cathode electrode to the surface of the second layer, thereby forming the surface layer consisting of silicon atoms and carbon atoms at a desired ratio.

For these light-receiving members for electrophotography, image exposure was effected by means of the device as shown in FIG. 26 (wavelength of laser beam: 780 nm, spot diameter 80 μm), and the steps of image formation, development and cleaning were repeated 50,000 times, followed by image evaluation. The results as shown in Table 11N were obtained.

EXAMPLE 212

By means of a lathe, an aluminum substrate (length (L): 357 mm, outer diameter (r): 80 mm) was worked to have the surface characteristic as shown in FIG. 64 (B).

Next, an a-Si type light-receiving member for electrophotography was deposited on the above aluminum substrate following predetermined procedures using the film deposition device as shown in FIG. 20 under the conditions as shown in Table 1 P.

In preparation of the first layer, the mass flow controllers 2007, 2008 and 2010 for $GeH_4$, $SiH_4$ and $B_2H_6/H_2$ were controlled by a computer (HP9845B) so that the flow rates of $GeH_4$, $SiH_4$ and $B_2H_6/H_2$ might be as shown in FIG. 22 and FIG. 36. Deposition of the surface layer formed primarily of silicon atoms and carbon atoms was carried out as follows. That is, after deposition of the second layer, the mass controllers corresponding to the respective gases were set so that the flow rate ratio of $CH_4$ gas to $SiH_4$ gas became $SiH_4/CH_4 = 1/30$ as shown in Table 1 P, and the surface layer was formed by exciting glow discharging at a high frequency power of 300 W.

The surface state of the light-receiving member for electrophotography thus prepared was as shown in FIG. 64 (C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference pattern observed and proved to be satisfactory for practical application.

EXAMPLE 213

In the same manner as in Example 212, a-Si type light-receiving members for electrophotography were prepared except for during preparation of the first layer, the mass flow controllers 2007, 2008 and 2010 were controlled by a computer (HP9845B) so that the flow rates of $GeH_4$, $SiH_4$ and $B_2H_6/H_2$ might be as shown in FIG. 23 and FIG. 37.

The light-receiving member for electrophotography as prepared above was subjected to image exposure similarly in Example 212 by means of a device as shown in FIG. 26 (wavelength of laser beam: 780 nm, spot diameter 80 μm), followed by development and transfer to obtain an image. The image was free from any interference pattern observed and proved to be satisfactory for practical application.

EXAMPLE 214

Except for the conditions as shown in Table 2 P, in the same manner as in Example 212, a-Si type light-receiving members for electrophotography were prepared following various procedures by means of the film deposition device as shown in FIG. 20.

In preparation of the first layer, the mass flow controllers 2007, 2008 and 2010 were controlled by a computer (HP9845B) so that the flow rates of $GeH_4$, $SiH_4$ and $B_2H_6/H_2$ might be as shown in FIG. 24 and FIG. 38.

The light-receiving member for electrophotography as prepared above was subjdeted to image exposure by means of a device as shown in FIG. 26 (wavelength of laser beam: 780 nm, spot diameter 80 μm), followed by development and transfer to obtain an image in the same way as in Example 212. The image was free from any interference pattern observed and proved to be satisfactory for practical application.

EXAMPLE 215

Under the same conditions as shown in Example 214, a-Si type light-receiving members for electrophotography were prepared except for during the preparation of the first layer, the mass flow controllers 2007, 2008 and 2010 were controlled by a computer (HP9845B) so that the flow rates of $GeH_4$, $SiH_4$ and $B_2H_6/H_2$ might be as shown in FIG. 25 and FIG. 39.

The light-receiving member for electrophotography as prepared above was subjected to image exposure by means of a device as shown in FIG. 26 (wavelength of laser beam: 780 nm, spot diameter 80 μm), followed by development and transfer to obtain an image in a way similar to Example 212. The image was free from any interference pattern observed and proved to be satisfactory for practical application.

EXAMPLE 216

Except for the conditions as shown in Table 3P, in the same manner as in Example 139, a-Si type light-receiving members for electrophotography were prepared following various procedures by means of the film deposition device as shown in FIG. 20.

In preparation of the first layer and A layer, the mass flow controllers 2007, 2008 and 2010 were controlled by a computer (HP9845B) so that the flow rates of GeH$_4$, SiH$_4$ and B$_2$H$_6$/H$_2$ might be as shown in FIG. 40.

The light-receiving member for electrophotography as prepared above was subjected to image exposure by means of a device as shown in FIG. 26 (wavelength of laser beam: 780 nm, spot diameter 80 μm), similarly as in Example 212 followed by development and transfer to obtain an image. The image was free from any interference pattern observed and proved to be satisfactory for practical application.

EXAMPLE 217

Except for the conditions as shown in Table 4P, in the same manner as in Example 212, a-Si type light-receiving members for electrophotography were prepared following various procedures by means of the film deposition device as shown in FIG. 20.

In preparation of the first layer and A layer, the mass flow controllers 2007, 2008 and 2010 were controlled by a computer (HP9845B) so that the flow rates of GeH$_4$, SiH$_4$ and B$_2$H$_6$/H$_2$ might be as shown in FIG. 41.

The light-receiving member for electrophotography as prepared above was subjected to image exposure by means of a device as shown in FIG. 26 (wavelength of laser beam: 780 nm, spot diameter 80 μm), similarly as in Example 212 followed by development and transfer to obtain an image. The image was free from any interference pattern observed and proved to be satisfactory for practical application.

EXAMPLE 218

Except for the conditions as shown in Table 5P, in the same manner as in Example 212, a-Si type light-receiving members for electrophotography were prepared following various procedures by means of the film deposition device as shown in FIG. 20.

In preparation of the first layer and A layer, the mass flow controllers 2007, 2008 and 2010 were controlled by a computer (HP9845B) so that the flow rates of GeH$_4$, SiH$_4$ and B$_2$H$_6$/H$_2$ might be as shown in FIG. 42.

The light-receiving member for electrophotography as prepared above was subjected to image exposure by means of a device as shown in FIG. 26 (wavelength of laser beam: 780 nm, spot diameter 80 μm), similarly as in Example 212 followed by development and transfer to obtain an image. The image was free from any interference pattern observed and proved to be satisfactory for practical application.

EXAMPLE 219

Except for changing NO gas employed in Example 212 to NH$_3$ gas, following the same conditions and procedure as in Example 212, an a-Si type light-receiving member for electrophotography was prepared.

The light-receiving member for electrophotography as prepared above was subjected to image exposure similarly in Example 212 by means of a device as shown in FIG. 26 (wavelength of laser beam: 780 nm, spot diameter 80 μm), followed by development and transfer to obtain images. The image obtained was free from any interference pattern observed and proved to be satisfactory for practical application.

EXAMPLE 220

Except for changing NO gas employed in Example 212 to N$_2$O gas, following the same conditions and procedure as in Example 212, an a-Si type light-receiving member for electrophotography was prepared.

The light-receiving member for electrophotography as prepared above was subjected to image exposure similarly in Example 212 by means of a device as shown in FIG. 26 (wavelength of laser beam: 780 nm, spot diameter 80 μm), followed by development and transfer to obtain images. The image obtained was free from any interference pattern observed and proved to be satisfactory for practical application.

EXAMPLE 221

Except for changing NH$_3$ gas employed in Example 214 to NO gas, following the same conditions and procedure as in Example 214, an a-Si type light-receiving member for electrophotography was prepared.

The light-receiving member for electrophotography as prepared above was subjected to image exposure similarly as in Example 212 by means of a device as shown in FIG. 26 (wavelength of laser beam: 780: spot diameter 80 μm), followed by development and transfer to obtain images. The image obtained was free from any interference pattern observed and proved to be satisfactory for practical application.

EXAMPLE 222

Except for changing NH$_3$ gas employed in Example 214 to N$_2$O gas, following the same conditions and procedure as in Example 214, an a-Si type light-receiving member for electrophotography was prepared.

The light-receiving member for electrophotography as prepared above was subjected to image exposure similarly as in Example 212 by means of a device as shown in FIG. 26 (wavelength of laser beam: 780 nm, spot diameter 80 μm), followed by development and transfer to obtain images. The image obtained was free from any interference pattern observed and proved to be satisfactory for practical application.

EXAMPLE 223

Except for changing N$_2$O gas employed in Example 216 to NO gas, following the same conditions and procedure as in Example 216, an a-Si type light-receiving member for electrophotography was prepared.

The light-receiving member for electrophotography as prepared above was subjected to image exposure similarly as in Example 212 by means of a device as shown in FIG. 26 (wavelength of laser beam: 780 nm, spot diameter 80 μm), followed by development and transfer to obtain images. The image obtained was free from any interference pattern observed and proved to be satisfactory for practical application.

EXAMPLE 224

Except for changing N$_2$O gas employed in Example 216 to NH$_3$ gas, following the same conditions and procedure as in Example 216, an a-Si type light-receiving member for electrophotography was prepared.

The light-receiving member for electrophotography as prepared above was subjected to image exposure similarly as in Exmaple 212 by means of a device as shown in FIG. 26 (wavelength of laser beam: 780 nm, spot diameter 80 μm), followed by development and transfer to obtain images. The image obtained was free from any interference pattern observed and proved to be satisfactory for practical application.

EXAMPLE 225

Except for the conditions as shown in Table 6P, in the same manner as in Example 212, a light-receiving member for electrophotography was prepared following various procedures by means of the film deposition device as shown in FIG. 20.

Figure 52:
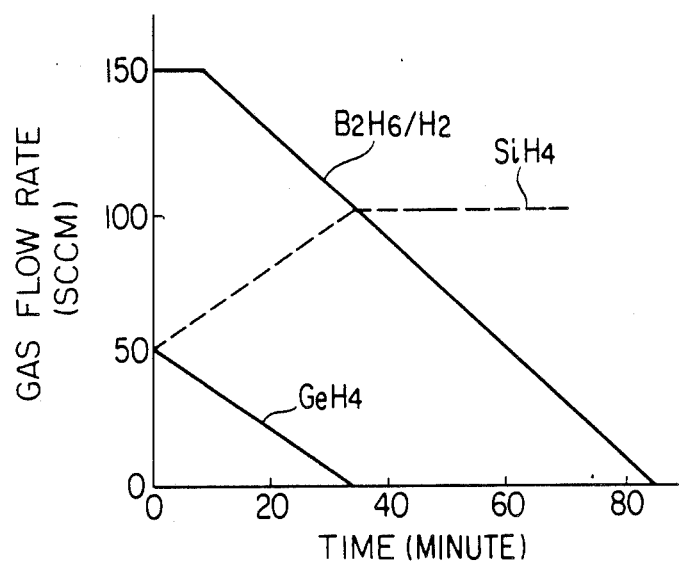

The mass flow controllers 2007, 2008, 2010 and 2009 for SiH$_4$, GeH$_4$, B$_2$H$_6$/H$_2$ and NH$_3$ were controlled by a computer (HP9845B) so that the flow rates of SiH$_4$, GeH$_4$ and B$_2$H$_6$/H$_2$ might be as shown in FIG. 52 and the flow rate of NH$_3$ in the layer containing nitrogen as shown in FIG. 56.

The light-receiving member for electrophotography as prepared above was subjected to image exposure similarly as in Example 212 by means of a device as shown in FIG. 26 (wavelength of laser beam: 780 nm, spot diameter 80 μm), followed by development and transfer to obtain an image. The image was free from any interference pattern observed and proved to be satisfactory for practical application.

EXAMPLE 226

Except for changing NH$_3$ gas employed in Example 225 to NO gas, following the same conditions and procedure as in Example 225, an a-Si type light-receiving member for electrophotography was prepared.

The light-receiving member for electrophotography as prepared above was subjected to image exposure similarly as in Example 212 by means of a device as shown in FIG. 26 (wavelength of laser beam: 780 nm, spot diameter 80 μm), followed by development and transfer to obtain images. The image obtained was free from any interference pattern observed and proved to be satisfactory for practical application.

EXAMPLE 227

Except for changing NH$_3$ gas employed in Example 225 to N$_2$O gas, following the same conditions and procedure as in Example 225, an a-Si type light-receiving member for electrophotography was prepared.

The light-receiving member for electrophotography as prepared above was subjected to image exposure similarly as in Example 212 by means of a device as shown in FIG. 26 (wavelength of laser beam: 780 nm, spot diameter 80 μm), followed by development and transfer to obtain images. The image obtained was free from any interference pattern observed and proved to be satisfactory for practical application.

EXAMPLE 228

By means of a lathe, an aluminum substrate (length (L): 357 mm, outer diameter (r): 80 mm) was worked to have the surface characteristic as shown in FIG. 78. Next, a light-receiving member for electrophotography was prepared by means of the deposition device as shown in FIG. 20 under the conditions as shown in Table 7P.

Figure 53:
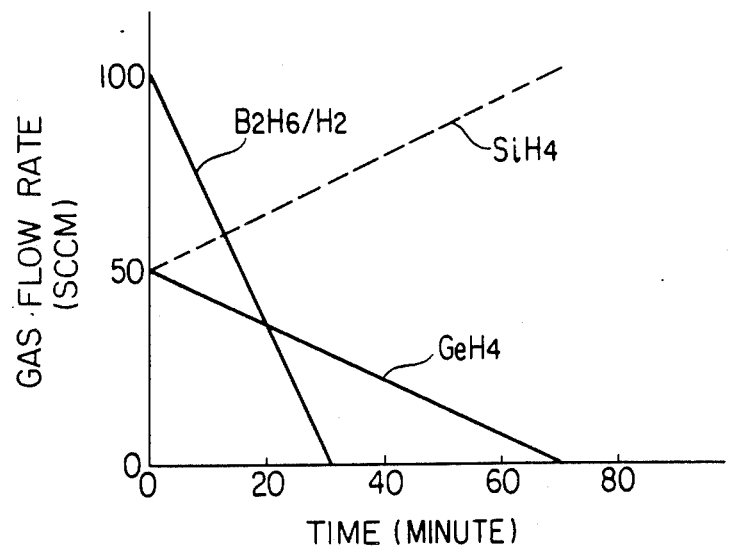

The mass flow controllers 2007, 2008, 2010 and 2009 for SiH$_4$, GeH$_4$, B$_2$H$_6$/H$_2$ and N$_2$O were controlled by a computer (HP9845B) so that the flow rates of SiH$_4$, GeH$_4$ and B$_2$H$_6$/H$_2$ might be as shown in FIG. 53 and the flow rate of N$_2$O in the layer containing carbon atoms as shown in FIG. 57. The surface layer was formed in the same manner as in Example 212.

The light-receiving member for electrophotography as prepared above was subjected to image exposure similarly as in Example 212 by means of a device as shown in FIG. 26 (wavelength of laser beam: 780 nm, spot diameter 80 μm), followed by development and transfer to obtain an image. The image was free from any interference pattern observed and proved to be satisfactory for practical application.

EXAMPLE 229

Except for changing N$_2$O gas employed in Example 228 to NO gas, following the same conditions and procedure as in Example 228, an a-Si type light-receiving member for electrophotography was prepared.

The light-receiving member for electrophotography as prepared above was subjected to image exposure by means of a device as shown in FIG. 26 (wavelength of laser beam: 780 nm, spot diameter 80 μm), followed by development and transfer to obtain images. The image obtained was free from any interference pattern observed and proved to be satisfactory for practical application.

EXAMPLE 230

Except for changing N$_2$O gas employed in Example 228 to NH$_3$ gas, following the same conditions and procedure as in Example 228, an a-Si type light-receiving member for electrophotography was prepared.

The light-receiving member for electrophotography as prepared above was subjected to image exposure similarly as in Example 212 by means of a device as shown in FIG. 26 (wavelength of laser beam: 780 nm, spot diameter 80 μm), followed by development and transfer to obtain images. The image obtained was free from any interference pattern observed and proved to be satisfactory for practical application.

EXAMPLE 231

By means of a lathe, an aluminum substrate (length (L): 357 mm, outer diameter (r): 80 mm) was worked to have the surface characteristic as shown in FIG. 79. Next, a light-receiving member for electrophotography was prepared by means of the deposition device as shown in FIG. 20 under the conditions as shown in Table 8P.

Figure 54:
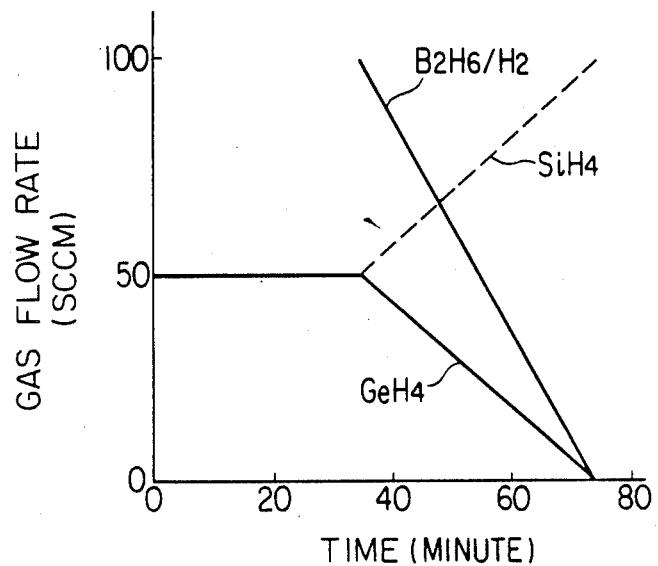

The mass flow controllers 2007, 2008, 2010 and 2009 for SiH$_4$, GeH$_4$, B$_2$H$_6$/H$_2$ and NO were controlled by a computer (HP9845B) so that the flow rates of SiH$_4$, GeH$_4$ and B$_2$H$_6$/H$_2$ might be as shown in FIG. 54 and the flow rate of NO in the layer containing oxygen as shown in FIG. 58. The surface layer was formed in the same manner as in Example 212.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference pattern observed and proved to be satisfactory for practical application.

EXAMPLE 232

Except for changing NO gas employed in Example 231 to NH₃ gas, following the same conditions and procedure as in Example 231, an a-Si type light-receiving member for electrophotography was prepared.

The light-receiving member for electrophotography as prepared above was subjected to image exposure similarly as in Example 212 by means of a device as shown in FIG. 26 (wavelength of laser beam: 780 nm, spot diameter 80 $\mu$m), followed by development and transfer to obtain images. The image obtained was free from any interference pattern observed and proved to be satisfactory for practical application.

EXAMPLE 233

Except for changing NO gas employed in Example 231 to N₂O gas, following the same conditions and procedure as in Example 231, an a-Si type light-receiving member for electrophotography was prepared.

The light-receiving member for electrophotography as prepared above was subjected to image exposure by means of a device as shown in FIG. 26 (wavelength of laser beam: 780 nm, spot diameter 80 $\mu$m), followed by development and transfer to obtain images. The image obtained was free from any interference pattern observed and proved to be satisfactory for practical application.

EXAMPLE 234

By means of a lathe, an aluminum substrate (length (L): 357 mm, outer diameter (r): 80 mm) was worked to have the surface characteristic as shown in FIG. 64. Next, a light-receiving member for electrophotography was prepared by means of the deposition device as shown in FIG. 20 under the conditions as shown in Table 9P.

Figure 55:
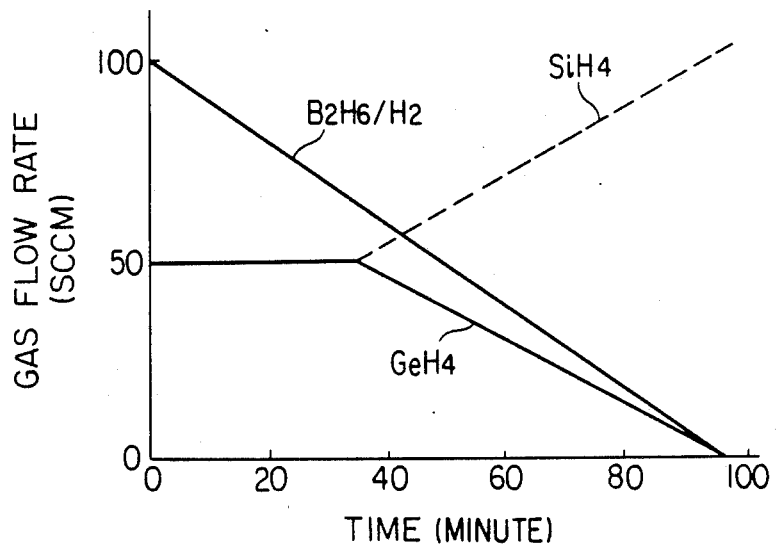

The mass flow controllers 2007, 2008, 2010 and 2009 for SiH₄, GeH₄, B₂H₆/H₂ and NH₃ were controlled by a computer (HP9845B) so that the flow rates of SiH₄, GeH₄ and B₂H₆/H₂ might be as shown in FIG. 55 and the flow rate of NH₃ in the layer containing nitrogen as shown in FIG. 59. The surface layer was formed in the same manner as in Example 212.

The light-receiving member for electrophotography as prepared above was subjected to image exposure similarly as in Example 212 by means of a device as shown in FIG. 26 (wavelength of laser beam: 780 nm, spot diameter 80 $\mu$m), followed by development and transfer to obtain an image. The image was free from any interference pattern observed and proved to be satisfactory for practical application.

EXAMPLE 235

Except for changing NH₃ gas employed in Example 234 to NO gas, following the same conditions and procedure as in Example 234, an a-Si type light-receiving member for electrophotography was prepared.

The light-receiving member for electrophotography as prepared above was subjected to image exposure similarly as in Example 212 by means of a device as shown in FIG. 26 (wavelength of laser beam: 780 nm, spot diameter 80 $\mu$m), followed by development and transfer to obtain images. The image obtained was free from any interference pattern observed and proved to be satisfactory for practical application.

EXAMPLE 236

Except for changing NH₃ gas employed in Example 234 to N₂O gas, following the same conditions and procedure as in Example 234, an a-Si type light-receiving member for electrophotography was prepared.

The light-receiving member for electrophotography as prepared above was subjected to image exposure similarly as in Example 212 by means of a device as shown in FIG. 26 (wavelength of laser beam; 780 nm, spot diameter 80 $\mu$m), followed by development and transfer to obtain images. The image obtained was free from any interference pattern observed and proved to be satisfactory for practical application.

EXAMPLE 237

Examples 212 to 236 were repeated except that PH₃ gas diluted to 3000 vol ppm with H₂ was employed in place of B₂H₆ gas diluted to 3000 vol ppm with H₂ to prepare light-receiving members for electrophotography respectively (Sample Nos. 2601P-2700P).

Other preparation conditions were the same as in Examples 212 to 236.

For these light-receiving members for electrophotography, image exposure was effected by means of an image exposure device as shown in FIG. 26 (wavelength of laser beam: 780 nm, spot diameter 80 $\mu$m), followed by development and transfer, to obtain images. All of the images were free from interference fringe pattern and practically satisfactory.

EXAMPLE 238

By means of a lathe, an aluminum substrate (length (L): 357 mm, outer diameter (r): 80 mm) was worked to have the surface characteristic as shown in FIG. 64 (B), and using this substrate, a-Si type light-receiving members for electrophotography was prepared following the same conditions and procedure as in Example 212 except for varying the gas flow rate ratio of SiH₄ gas to CH₄ gas during surface layer formation as shown in Table 11P to change the content ratio of silicon atoms to carbon atoms in the surface layer (Sample No. 2701P-2708P).

The light-receiving members for electrophotography were subjected to image exposure by means of a device as shown in FIG. 26 (wavelength of laser beam: 780 nm, spot diameter 80 $\mu$m), and the steps of image formation, development and cleaning were repeated 50,000 times, followed by image evaluation to obtain the results as shown in Table 11P.

EXAMPLE 239

By means of a lathe, an aluminum substrate (length (L): 357 mm, outer diameter (r): 80 mm) was worked to have the surface characteristic as shown in FIG. 64 (B), and using this substrate, a-Si type light-receiving members for electrophotography was prepared following the same conditions and procedure as in Example 238 except for using SiH₄ gas, CH₄ gas and SiF₄ as starting gases during surface layer formation and varying the gas flow rate ratio of these gases during surface layer formation as shown in Table 12P (Sample Nos. 2801P-2808P).

The light-receiving members for electrophotography were subjected to image exposure by means of a device as shown in FIG. 26 (wavelength of laser beam: 780 nm, spot diameter 80 $\mu$m), and the steps of image formation, development and cleaning were repeated 50,000 times, followed by image evaluation to obtain the results as shown in Table 12P.

EXAMPLE 240

Except for using the aluminum substrate worked with a lathe to have the surface characteristic as shown in FIG. 64 (B) (length (L): 357 mm, outer diameter (r): 80 mm) and forming the surface layer according to the sputtering method, a-Si type light-receiving members for electrophotography were prepared according to the same procedure and under the same conditions as in Example 212 (Sample Nos. 2901P–2907P).

Formation of the surface layer was carried out as follows. That is, after formation of the second layer, the substrate having formed layers to said layer was taken out from the deposition device as shown in FIG. 20, the hydrogen (H$_2$) bomb was replaced with argon (Ar) gas bomb, the deposition device cleaned and the target for sputtering comprising Si with a thickness of 5 mm and the target for sputtering comprising graphite with a thickness of 5 mm were placed on the entire surface of the cathode electrode so that the area ratio may be the value as shown in Table 13P. Then, the substrate having formed layers to the second layer was set and, after reduction of pressure, argon gas was introduced and glow discharging excited at a high frequency power of 300 W to sputter the surface layer material on the cathode electrode, thereby forming the surface layer.

For these light-receiving members for electrophotography, image exposure was effected by means of the device as shown in FIG. 26 (wavelength of laser beam 780 nm, spot diameter 80 μm), and the steps of image formation, development and cleaning were repeated 50,000 times, followed by image evaluation. The results as shown in Table 13P were obtained.

TABLE 1A

| Sample No. | 101A | 102A | 103A | 104A | 105A | 106A | 107A |
|---|---|---|---|---|---|---|---|
| Si:C Target (Area ratio) | 9:1 | 8.5:3.5 | 4:6 | 2:8 | 1:9 | 0.5:9.5 | 0.2:8.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | O | ⊚ | ⊚ | O | Δ | X |

⊚: Very good
O: Good
Δ: Practically satisfactory
X: Image defect formed

TABLE 2A

| Sample No. | 201A | 202A | 203A | 204A | 205A | 206A | 207A | 208A |
|---|---|---|---|---|---|---|---|---|
| SiH$_4$:CH$_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | O | ⊚ | ⊚ | ⊚ | O | Δ | X |

⊚: Very good
O: Good
Δ: Practically satisfactory
X: Image defect formed

TABLE 3A

| Sample No. | 301A | 302A | 303A | 304A | 305A | 306A | 307A | 308A |
|---|---|---|---|---|---|---|---|---|
| SiH$_4$:SiF$_4$:CH$_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | O | ⊚ | ⊚ | ⊚ | O | Δ | X |

⊚: Very good
O: Good
Δ: Practically satisfactory
X: Image defect formed

TABLE 4A

| Sample No. | Thickness of surface layer (μm) | Results |
|---|---|---|
| 4001A | 0.001 | Image defect liable to be formed |
| 4002A | 0.02 | No image defect formed up to successive copying for 20,000 times |
| 4003A | 0.05 | Stable up to successive copying for 50,000 times |
| 4004A | 1 | Stable up to successive copying for 200,000 times |

TABLE 5A

| Layer constitution | Gases employed | Flow rate (SCCM) | Flow rate ratio | Discharging power (W) | Layer formation rate (Å/sec) | Layer thickness (μm) |
|---|---|---|---|---|---|---|
| Charge injection preventive layer | $SiH_4$ $B_2H_6/H_2$ (= 3000 ppm) NO | 300 | $B_2H_6/SiH_4$ = 1600 ppm $NO/SiH_4$ = 3.4% | 150 | 10 | 5 |
| Photosensitive layer | $SiH_4$ $H_2$ | 300 300 | $SiH_4/H_2$ = 1 | 300 | 20 | 20 |
| Surface layer | $SiH_4$ $CH_4$ | 20 600 | $SiH_4/CH_4$ = 1/30 | 300 | 1 | 0.32 |

TABLE 6A

| Layer constitution | Gases employed | Flow rate (SCCM) | Flow rate ratio | Discharging power (W) | Layer formation rate (Å/sec) | Layer thickness (μm) |
|---|---|---|---|---|---|---|
| Charge injection preventive layer | $SiH_4$ NO | 50 60 | $SiH_4/NO$ = 5/6 | 100 | 3 | 0.2 |
| Photosensitive layer | $SiH_4$ $H_2$ | 300 300 | $SiH_4/H_2$ = 1 | 300 | 20 | 20 |
| Surface layer | $SiH_4$ $CH_4$ | 20 600 | $SiH_4/CH_4$ = 1/30 | 300 | 1 | 0.5 |

TABLE 7A

| Layer constitution | Gases employed | Flow rate (SCCM) | Flow rate ratio | Discharging power (W) | Layer formation rate (Å/sec) | Layer thickness (μm) |
|---|---|---|---|---|---|---|
| Charge injection preventive layer | $SiH_4$ $NH_3$ | 30 200 | $SiH_4/NH_3$ = 3/20 | 200 | 3 | 0.2 |
| Photosensitive layer | $SiH_4$ $H_2$ | 300 300 | $SiH_4/H_2$ = 1 | 300 | 20 | 20 |
| Surface layer | $SiH_4$ $CH_4$ | 20 600 | $SiH_4/CH_4$ = 1/30 | 300 | 1 | 0.5 |

TABLE 8A

| Layer constitution | Gases employed | Flow rate (SCCM) | Flow rate ratio | Discharging power (W) | Layer formation rate (Å/sec) | Layer thickness (μm) |
|---|---|---|---|---|---|---|
| Charge injection preventive layer | $SiH_4$ $CH_4$ | 30 600 | $SiH_4/CH_4$ = 1/20 | 300 | 3 | 0.3 |
| Photosensitive layer | $SiH_4$ $H_2$ | 300 300 | $SiH_4/H_2$ = 1 | 300 | 20 | 20 |
| Surface layer | $SiH_4$ $CH_4$ | 20 600 | $SiH_4/CH_4$ = 1/30 | 300 | 1 | 0.7 |

TABLE 1B

| Sample No. | 101B | 102B | 103B | 104B | 105B | 106B | 107B |
|---|---|---|---|---|---|---|---|
| Si:C Target (Area ratio) | 9:1 | 8.5:3.5 | 4:6 | 2:8 | 1:9 | 0.5:9.5 | 0.2:8.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | ○ | ⊚ | ⊚ | ○ | Δ | X |

⊚: Very good
○: Good
Δ: Practically satisfactory
X: Image defect formed

TABLE 2B

| Sample No. | 201B | 202B | 203B | 204B | 205B | 206B | 207B | 208B |
|---|---|---|---|---|---|---|---|---|
| SiH$_4$:CH$_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | ∆ | ○ | ⊚ | ⊚ | ⊚ | ○ | ∆ | X |

⊚: Very good
○: Good
∆: Practically satisfactory
X: Image defect formed

TABLE 3B

| Sample No. | 301B | 302B | 303B | 304B | 305B | 306B | 307B | 308B |
|---|---|---|---|---|---|---|---|---|
| SiH$_4$:SiF$_4$:CH$_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | ∆ | ○ | ⊚ | ⊚ | ⊚ | ○ | ∆ | X |

⊚: Very good
○: Good
∆: Practically satisfactory
X: Image defect formed

TABLE 4B

| Sample No. | Thickness of surface layer (µm) | Results |
|---|---|---|
| 4001B | 0.001 | Image defect liable to be formed |
| 4002B | 0.02 | No image defect formed up to successive copying for 20,000 times |
| 4003B | 0.05 | Stable up to successive copying for 50,000 times |
| 4004B | 1 | Stable up to successive copying for 200,000 times |

TABLE 5B

| Layer constitution | Gases employed | Flow rate (SCCM) | Flow rate ratio | Discharging power (W) | Layer formation rate (Å/sec) | Layer thickness (µm) |
|---|---|---|---|---|---|---|
| Charge injection preventive layer | H$_2$ SiH$_4$ NH$_3$ B$_2$H$_6$ | 300 150 30 0.24 | B$_2$H$_6$/SiH$_4$ = 1600 ppm NH$_3$/SiH$_4$ = 20% | 150 | 10 | 5 |
| Photosensitive layer | SiH$_4$ H$_2$ | 300 300 | SiH$_4$/CH$_4$ = 1 | 300 | 20 | 20 |
| Surface layer | SiH$_4$ CH$_4$ | 20 600 | SiH$_4$/CH$_4$ = 1/30 | 300 | 1 | 0.32 |

TABLE 6B

| Layer constitution | Gases employed | Flow rate (SCCM) | Flow rate ratio | Discharging power (W) | Layer formation rate (Å/sec) | Layer thickness (µm) |
|---|---|---|---|---|---|---|
| Charge injection preventive layer | H$_2$ SiH$_4$ NH$_3$ B$_2$H$_6$ | 300 150 15 0.3 | NH$_3$/SiH$_4$ = 10% | 100 | 3 | 0.2 |
| Photosensitive layer | SiH$_4$ H$_2$ | 300 300 | SiH$_4$/H$_2$ = 1 | 300 | 20 | 20 |
| Surface layer | SiH$_4$ CH$_4$ | 20 600 | SiH$_4$/CH$_4$ = 1/30 | 300 | | 0.5 |

TABLE 7B

| Layer constitution | Gases employed | Flow rate (SCCM) | Flow rate ratio | Discharging power (W) | Layer formation rate (Å/sec) | Layer thickness (µm) |
|---|---|---|---|---|---|---|
| Charge | H$_2$ | 300 | CH$_4$/SiH$_4$ = 10% | 200 | 3 | 0.2 |

TABLE 7B-continued

| Layer constitution | Gases employed | Flow rate (SCCM) | Flow rate ratio | Discharging power (W) | Layer formation rate (Å/sec) | Layer thickness (μm) |
|---|---|---|---|---|---|---|
| injection preventive layer | $SiH_4$ $CH_4$ $B_2H_6$ | 150 15 0.45 | | | | |
| Photosensitive layer | $SiH_4$ $H_2$ | 300 300 | $SiH_4/H_2 = 1$ | 300 | 20 | 20 |
| Surface layer | $SiH_4$ $CH_4$ | 20 600 | $SiH_4/CH_4 = 1/30$ | 300 | 1 | 0.5 |

TABLE 8B

| Layer constitution | Gases employed | Flow rate (SCCM) | Flow rate ratio | Discharging power (W) | Layer formation rate (Å/sec) | Layer thickness (μm) |
|---|---|---|---|---|---|---|
| Charge injection preventive layer | $H_2$ $SiH_4$ $CH_4$ $B_2H_6$ | 300 160 16 0.4 | $CH_4/SiH_4 = 10\%$ | 300 | 3 | 0.3 |
| Photosensitive layer | $SiH_4$ $H_2$ | 300 300 | $SiH_4/H_2 = 1$ | 300 | 20 | 20 |
| Surface layer | $SiH_4$ $CH_4$ | 20 600 | $SiH_4/CH_4 = 1/30$ | 300 | 1 | 0.7 |

TABLE 1C

| Sample No. | 101C | 102C | 103C | 104C | 105C | 106C | 107C |
|---|---|---|---|---|---|---|---|
| Si:C Target (Area ratio) | 9:1 | 8.5:3.5 | 4:6 | 2:8 | 1:9 | 0.5:9.5 | 0.2:8.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | ○ | ⊚ | ⊚ | ○ | Δ | X |

⊚: Very good
○: Good
Δ: Practically satisfactory
X: Image defect formed

TABLE 2C

| Sample No. | 201C | 202C | 203C | 204C | 205C | 206C | 207C | 208C |
|---|---|---|---|---|---|---|---|---|
| $SiH_4:CH_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊚ | ⊚ | ⊚ | ○ | Δ | X |

⊚: Very good
○: Good
Δ: Practically satisfactory
X: Image defect formed

TABLE 3C

| Sample No. | 301C | 302C | 303C | 304C | 305C | 306C | 307C | 308C |
|---|---|---|---|---|---|---|---|---|
| $SiH_4:SiF_4:CH_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊚ | ⊚ | ⊚ | ○ | Δ | X |

⊚: Very good
○: Good
Δ: Practically satisfactory
X: Image defect formed

TABLE 4C

| Sample No. | Thickness of surface layer (μm) | Results |
|---|---|---|
| 4001C | 0.001 | Image defect liable to be formed |

TABLE 4C-continued

| Sample No. | Thickness of surface layer (μm) | Results |
|---|---|---|
| 4002C | 0.02 | No image defect formed up to successive copying for 20,000 times |
| 4003C | 0.05 | Stable up to successive copying for 50,000 times |
| 4004C | 1 | Stable up to successive copying for 200,000 times |

TABLE 5C

| Layer constitution | Gases employed | Flow rate (SCCM) | Flow rate ratio | Discharging power (W) | Layer formation rate (Å/sec) | Layer thickness (μm) |
|---|---|---|---|---|---|---|
| Charge injection preventive layer | $H_2$<br>$SiH_4$<br>$NH_3$<br>$B_2H_6$ | 300<br>150<br>30<br>0.24 | $B_2H_6/SiH_4 =$ 1600 ppm<br>$NH_3/SiH_4 = 20\%$ | 150 | 10 | 5 |
| Photosensitive layer | $SiH_4$<br>$H_2$ | 300<br>300 | $SiH_4/CH_4 = 1$ | 300 | 20 | 20 |
| Surface layer | $SiH_4$<br>$CH_4$ | 20<br>600 | $SiH_4/CH_4 = 1/30$ | 300 | 1 | 0.32 |

TABLE 6C

| Layer constitution | Gases employed | Flow rate (SCCM) | Flow rate ratio | Discharging power (W) | Layer formation rate (Å/sec) | Layer thickness (μm) |
|---|---|---|---|---|---|---|
| Charge injection preventive layer | $H_2$<br>$SiH_4$<br>$NH_3$<br>$B_2H_6$ | 300<br>150<br>15<br>0.3 | $NH_3/SiH_4 = 10\%$ | 100 | 3 | 0.2 |
| Photosensitive layer | $SiH_4$<br>$H_2$ | 300<br>300 | $SiH_4/H_2 = 1$ | 300 | 20 | 20 |
| Surface layer | $SiH_4$<br>$CH_4$ | 20<br>600 | $SiH_4/CH_4 = 1/30$ | 300 | 2 | 0.5 |

TABLE 7C

| Layer constitution | Gases employed | Flow rate (SCCM) | Flow rate ratio | Discharging power (W) | Layer formation rate (Å/sec) | Layer thickness (μm) |
|---|---|---|---|---|---|---|
| Charge injection preventive layer | $H_2$<br>$SiH_4$<br>$CH_4$<br>$B_2H_6$ | 300<br>150<br>15<br>0.45 | $CH_4/SiH_4 = 10\%$ | 200 | 3 | 0.2 |
| Photosensitive layer | $SiH_4$<br>$H_2$ | 300<br>300 | $SiH_4/H_2 = 1$ | 300 | 20 | 20 |
| Surface layer | $SiH_4$<br>$CH_4$ | 20<br>600 | $SiH_4/CH_4 = 1/30$ | 300 | 1 | 0.5 |

TABLE 8C

| Layer constitution | Gases employed | Flow rate (SCCM) | Flow rate ratio | Discharging power (W) | Layer formation rate (Å/sec) | Layer thickness (μm) |
|---|---|---|---|---|---|---|
| Charge injection preventive layer | $H_2$<br>$SiH_4$<br>$CH_4$<br>$B_2H_6$ | 300<br>160<br>16<br>0.4 | $CH_4/SiH_4 = 10\%$ | 300 | 3 | 0.3 |
| Photosensitive layer | $SiH_4$<br>$H_2$ | 300<br>300 | $SiH_4/H_2 = 1$ | 300 | 20 | 20 |
| Surface layer | $SiH_4$<br>$CH_4$ | 20<br>600 | $SiH_4/CH_4 = 1/30$ | 300 | 1 | 0.7 |

TABLE 9C

| Layer constitution | Gases employed | Flow rate (SCCM) | Flow rate ratio | Discharging power (W) | Layer formation rate (Å/sec) | Layer thickness (μm) |
|---|---|---|---|---|---|---|
| First | $SiH_4/He = 0.05$ | $SiH_4 = 50$ | $NO/SiH_4 = 3/10 \sim 0$ | 150 | 12 | 1 |

TABLE 9C-continued

| Layer constitution | Gases employed | Flow rate (SCCM) | Flow rate ratio | Discharging power (W) | Layer formation rate (Å/sec) | Layer thickness (μm) |
|---|---|---|---|---|---|---|
| layer | NO | | | | | |
| Second layer | $SiH_4/He = 0.05$ | $SiH_4 = 50$ | | 150 | 12 | 20 |

TABLE 10C

| Layer constitution | Gases employed | Flow rate (SCCM) | Flow rate ratio | Discharging power (W) | Layer formation rate (Å/sec) | Layer thickness (μm) |
|---|---|---|---|---|---|---|
| First layer | $SiH_4/He = 0.05$ $B_2H_6/He = 10^{-3}$ NO | $SiH_4 = 50$ | $B_2H_6/SiH_4 = 4 \times 10^{-3}$ $NO/SiH_4 = 2/10 \sim 0$ | 150 | 12 | 0.5 |
| Second layer | $SiH_4/He = 0.05$ | $SiH_4 = 50$ | | 150 | 12 | 20 |

TABLE 11C

| Layer constitution | Gases employed | Flow rate (SCCM) | Flow rate ratio | Discharging power (W) | Layer formation rate (Å/sec) | Layer thickness (μm) |
|---|---|---|---|---|---|---|
| First layer | $SiH_4/He = 0.05$ $B_2H_6/He = 10^{-3}$ NO | $SiH_4 = 50$ | $B_2H_6/SiH_4 = 2 \times 10^{-4}$ $NO/SiH_4 = 1/10 \sim 1/100$ | 160 | 14 | 5 |
| Second layer | $SiH_4/He = 0.05$ NO | $SiH_4 = 50$ | $NO/SiH_4 = 1/100$ | 160 | 14 | 15 |

TABLE 12C

| Layer constitution | Gases employed | Flow rate (SCCM) | Flow rate ratio | Discharging power (W) | Layer formation rate (Å/sec) | Layer thickness (μm) |
|---|---|---|---|---|---|---|
| First layer | $SiH_4/He = 0.05$ $B_2H_6/He = 10^{-3}$ NO | $SiH_4 = 50$ | $B_2H_6/SiH_4 = 2 \times 10^{-4}$ $NO/SiH_4 = 3/10 \sim 0$ | 160 | 14 | 1.0 |
| Second layer | $SiH_4/He = 0.05$ $B_2H_6/He = 10^{-3}$ | $SiH_4 = 50$ | $B_2H_6/SiH_4 = 2 \times 10^{-4}$ | 160 | 12 | 15 |

TABLE 13C

| Layer constitution | Gases employed | Flow rate (SCCM) | Flow rate ratio | Discharging power (W) | Layer formation rate (Å/sec) | Layer thickness (μm) |
|---|---|---|---|---|---|---|
| First layer | $SiH_4/He = 0.05$ $PH_3/He = 10^{-3}$ NO | $SiH_4 = 50$ | $PH_3/SiH_4 = 3 \times 10^{-4}$ $NO/SiH_4 = 3/10 \sim 0$ | 170 | 15 | 1 |
| Second layer | $SiH_4/He = 0.05$ | $SiH_4 = 50$ | | 170 | 15 | 20 |

TABLE 1D

| Sample No. | 101D | 102D | 103D | 104D | 105D | 106D | 107D |
|---|---|---|---|---|---|---|---|
| Si:C Target (Area ratio) | 9:1 | 8.5:3.5 | 4:6 | 2:8 | 1:9 | 0.5:9.5 | 0.2:8.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | ○ | ⊚ | ⊚ | ○ | Δ | X |

⊚: Very good
○: Good
Δ: Practically satisfactory
X: Image defect formed

TABLE 2D

| Sample No. | 201D | 202D | 203D | 204D | 205D | 206D | 207D | 208D |
|---|---|---|---|---|---|---|---|---|
| SiH$_4$:CH$_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | x |

⊙: Very good
○: Good
Δ: Practically satisfactory
x: Image defect formed

TABLE 3D

| Sample No. | 301D | 302D | 303D | 304D | 305D | 306D | 307D | 308D |
|---|---|---|---|---|---|---|---|---|
| SiH$_4$:SiF$_4$:CH$_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | x |

⊙: Very good
○: Good
Δ: Practically satisfactory
x: Image defect formed

TABLE 4D

| Sample No. | Thickness of surface layer (μm) | Results |
|---|---|---|
| 4001D | 0.001 | Image defect liable to be formed |
| 4002D | 0.02 | No image defect formed up to successive copying for 20,000 times |
| 4003D | 0.05 | Stable up to successive copying for 50,000 times |
| 4004D | 1 | Stable up to successive copying for 200,000 times |

TABLE 5D

| | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 10 | 1 |
| | GeH$_4$ | 100 | | | |
| | SiH$_4$ | 50 | | | |
| Second layer | H$_2$ | 300 | 300 | 24 | 20 |
| | SiH$_4$ | 300 | | | |
| Surface layer | SiH$_4$ | 20 | 150 | 1 | 0.5 |
| | CH$_4$ | 600 | | | |

TABLE 6D

| | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 14 | 3 |
| | GeH$_4$ | 100 | | | |
| | SiH$_4$ | 50 | | | |
| Second layer | H$_2$ | 300 | 300 | 24 | 20 |
| | SiH$_4$ | 300 | | | |

TABLE 7D

| | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 12 | 5 |
| | GeH$_4$ | 50 | | | |
| | SiH$_4$ | 100 | | | |
| Second layer | H$_2$ | 300 | 300 | 24 | 20 |
| | SiH$_4$ | 300 | | | |

TABLE 8D

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 8 | 7 |
| | $GeH_4$ | 15 | | | |
| | $SiH_4$ | 135 | | | |
| Second layer | $H_2$ | 300 | 300 | 24 | 20 |
| | $SiH_4$ | 300 | | | |

TABLE 1E

| Sample No. | 101E | 102E | 103E | 104E | 105E | 106E | 107E |
|---|---|---|---|---|---|---|---|
| Si:C Target (Area ratio) | 9:1 | 8.5:3.5 | 4:6 | 2:8 | 1:9 | 0.5:9.5 | 0.2:8.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | ○ | ⊙ | ⊙ | ○ | Δ | x |

⊙: Very good
○: Good
Δ: Practically satisfactory
x: Image defect formed

TABLE 2E

| Sample No. | 201E | 202E | 203E | 204E | 205E | 206E | 207E | 208E |
|---|---|---|---|---|---|---|---|---|
| $SiH_4:CH_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | x |

⊙: Very good
○: Good
Δ: Practically satisfactory
x: Image defect formed

TABLE 3E

| Sample No. | 301E | 302E | 303E | 304E | 305E | 306E | 307E | 308E |
|---|---|---|---|---|---|---|---|---|
| $SiH_4:SiF_4:CH_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | x |

⊙: Very good
○: Good
Δ: Practically satisfactory
x: Image defect formed

TABLE 4E

| Sample No. | Thickness of surface layer (μm) | Results |
|---|---|---|
| 4001E | 0.001 | Image defect liable to be formed |
| 4002E | 0.02 | No image defect formed up to successive copying for 20,000 times |
| 4003E | 0.05 | Stable up to successive copying for 50,000 times |
| 4004E | 1 | Stable up to successive copying for 200,000 times |

TABLE 5E

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |
| | | $GeH_4 + SiH_4 = 100$ | | | |
| Second layer | $H_2$ | 300 | 300 | 24 | 20 |
| | $SiH_4$ | 300 | | | |
| Surface layer | $SiH_4$ | 20 | 150 | 1 | 0.5 |
| | $CH_4$ | 600 | | | |

TABLE 6E

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
|  | $GeH_4$ | 50 → 0 |  |  |  |
|  | $SiH_4$ | 50 → 100 |  |  |  |
|  |  | $GeH_4 + SiH_4 = 100$ |  |  |  |
| Second layer | $H_2$ | 300 | 300 | 24 | 20 |
|  | $SiH_4$ | 300 |  |  |  |

TABLE 1F

| Sample No. | 101F | 102F | 103F | 104F | 105F | 106F | 107F |
|---|---|---|---|---|---|---|---|
| Si:C Target (Area ratio) | 9:1 | 8.5:3.5 | 4:6 | 2:8 | 1:9 | 0.5:9.5 | 0.2:8.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | ○ | ⊚ | ⊚ | ○ | Δ | x |

⊚: Very good
○: Good
Δ: Practically satisfactory
x: Image defect formed

TABLE 2F

| Sample No. | 201F | 202F | 203F | 204F | 205F | 206F | 207F | 208F |
|---|---|---|---|---|---|---|---|---|
| $SiH_4:CH_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊚ | ⊚ | ⊚ | ○ | Δ | x |

⊚: Very good
○: Good
Δ: Practically satisfactory
x: Image defect formed

TABLE 3F

| Sample No. | 301F | 302F | 303F | 304F | 305F | 306F | 307F | 308F |
|---|---|---|---|---|---|---|---|---|
| $SiH_4:SiF_4:CH_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊚ | ⊚ | ⊚ | ○ | Δ | x |

⊚: Very good
○: Good
Δ: Practically satisfactory
x: Image defect formed

TABLE 4F

| Sample No. | Thickness of surface layer (μm) | Results |
|---|---|---|
| 4001F | 0.001 | Image defect liable to be formed |
| 4002F | 0.02 | No image defect formed up to successive copying for 20,000 times |
| 4003F | 0.05 | Stable up to successive copying for 50,000 times |
| 4004F | 1 | Stable up to successive copying for 200,000 times |

TABLE 5F

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 10 | 3 |
|  | $GeH_4$ | 50 |  |  |  |
|  | $SiH_4$ | 50 |  |  |  |
|  | $B_2H_6/H_2$ (= 3000 vol ppm) | 100 |  |  |  |
| Second layer | $H_2$ | 300 | 300 | 24 | 20 |
|  | $SiH_4$ | 300 |  |  |  |
| Surface layer | $SiH_4$ | 20 | 150 | 1 | 0.5 |

TABLE 5F-continued

| Layer constitution | Starting gas | Gas flow rate (SCCM) | Discharging power (W) | Deposition rate (Å/sec) | Layer thickness (μm) |
|---|---|---|---|---|---|
| | CH$_4$ | 600 | | | |

TABLE 6F

| Layer constitution | | Starting gas | Gas flow rate (SCCM) | Discharging power (W) | Deposition rate (Å/sec) | Layer thickness (μm) |
|---|---|---|---|---|---|---|
| First layer | | H$_2$ | 300 | 100 | 10 | 1 |
| | | GeH$_4$ | 50 | | | |
| | | SiH$_4$ | 50 | | | |
| | | B$_2$H$_6$/H$_2$ (= 3000 vol ppm) | 100 | | | |
| Second layer | Layer A | H$_2$ | 300 | 100 | 8 | 5 |
| | | SiH$_4$ | 100 | | | |
| | | B$_2$H$_6$/H$_4$ (= 3000 vol ppm) | 100 | | | |
| | Layer B | H$_2$ | 300 | 300 | 24 | 20 |
| | | SiH$_4$ | 300 | | | |

TABLE 7F

| Layer constitution | | starting gas | Gas flow rate (SCCM) | Discharging power (W) | Deposition rate (Å/sec) | Layer thickness (μm) |
|---|---|---|---|---|---|---|
| First layer | | H$_2$ | 300 | 100 | 10 | 1 |
| | | GeH$_4$ | 75 | | | |
| | | SiH$_4$ | 25 | | | |
| | | B$_2$H$_6$/H$_2$ (= 3000 vol ppm) | 50 | | | |
| Second layer | Layer A | H$_2$ | 300 | 100 | 8 | 5 |
| | | SiH$_4$ | 100 | | | |
| | | B$_2$H$_6$/H$_2$ (= 3000 vol ppm) | 100 | | | |
| | Layer B | H$_2$ | 300 | 300 | 24 | 20 |
| | | SiH$_4$ | 300 | | | |

TABLE 8F

| Layer constitution | | Starting gas | Gas flow rate (SCCM) | Discharging power (W) | Deposition rate (Å/sec) | Layer thickness (μm) |
|---|---|---|---|---|---|---|
| First layer | | H$_2$ | 300 | 100 | 10 | 1 |
| | | GeH$_4$ | 75 | | | |
| | | SiH$_4$ | 25 | | | |
| | | B$_2$H$_6$/H$_2$ (= 3000 vol ppm) | 150 | | | |
| Second layer | Layer A | H$_2$ | 300 | 100 | 8 | 5 |
| | | SiH$_4$ | 100 | | | |
| | | B$_2$H$_6$/H$_2$ (= 3000 vol ppm) | 100 | | | |
| | Layer B | H$_2$ | 300 | 300 | 24 | 20 |
| | | SiH$_4$ | 300 | | | |

TABLE 9F

| Layer constitution | | Starting gas | Gas flow rate (SCCM) | Discharging power (W) | Deposition rate (Å/sec) | Layer thickness (μm) |
|---|---|---|---|---|---|---|
| First layer | | H$_2$ | 300 | 100 | 10 | 1 |
| | | GeH$_4$ | 25 | | | |
| | | SiH$_4$ | 75 | | | |
| Second Layer | Layer A | H$_2$ | 300 | 100 | 8 | 5 |
| | | SiH$_4$ | 100 | | | |
| | | B$_2$H$_6$/H$_2$ (= 3000 vol ppm) | 100 | | | |
| | Layer B | H$_2$ | 300 | 300 | 24 | 20 |
| | | SiH$_4$ | 300 | | | |

TABLE 10F

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | H$_2$ | 300 | 100 | 10 | 2 |
| | | GeH$_4$ | 50 | | | |
| | | SiH$_4$ | 50 | | | |
| | | B$_2$H$_6$/H$_2$ (= 3000 vol ppm) | 100 | | | |
| | Layer B | H$_2$ | 300 | 100 | 10 | 2 |
| | | GeH$_4$ | 50 | | | |
| | | SiH$_4$ | 50 | | | |
| Second layer | | H$_2$ | 300 | 300 | 24 | 20 |
| | | SiH$_4$ | 300 | | | |

TABLE 11F

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | H$_2$ | 300 | 100 | 10 | 2 |
| | | GeH$_4$ | 50 | | | |
| | | SiH$_4$ | 50 | | | |
| | Layer B | H$_2$ | 300 | 100 | 10 | 2 |
| | | GeH$_4$ | 50 | | | |
| | | SiH$_4$ | 50 | | | |
| | | B$_2$H$_6$/H$_2$ (= 3000 vol ppm) | 100 | | | |
| Second layer | | H$_2$ | 300 | 300 | 24 | 20 |
| | | SiH$_4$ | 300 | | | |

TABLE 12F

| Layer constitution | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 10 | 5 |
| | GeH$_4$ | 50 | | | |
| | SiH$_4$ | 50 | | | |
| | B$_2$H$_6$/H$_2$ (= 3000 vol ppm) | 100 | | | |
| Second layer | H$_2$ | 300 | 300 | 24 | 20 |
| | SiH$_4$ | 300 | | | |

TABLE 13F

| Layer constitution | | Starting gas | Gas flow rate (SCCM) | Discharging power (W) | Deposition rate (Å/sec) | Layer thickness (μm) |
|---|---|---|---|---|---|---|
| First Layer | Layer A | H$_2$ | 300 | 100 | 10 | 2 |
| | | GeH$_4$ | 50 | | | |
| | | SiH$_4$ | 50 | | | |
| | | B$_2$H$_6$/H$_2$ (= 3000 vol ppm) | 100 | | | |
| | Layer B | H$_2$ | 300 | 100 | 8 | 3 |
| | | GeH$_4$ | 50 | | | |
| | | SiH$_4$ | 50 | | | |
| | | B$_2$H$_6$/H$_2$ (= 3000 vol ppm) | 100 | | | |
| Second layer | | H$_2$ | 300 | 300 | 24 | 20 |
| | | SiH$_4$ | 300 | | | |

TABLE 14F

| Layer constitution | | Starting gas | Gas flow rate (SCCM) | Discharging power (W) | Deposition rate (Å/sec) | Layer thickness (μm) |
|---|---|---|---|---|---|---|
| First layer | | H$_2$ | 300 | 100 | 10 | 2 |
| | | GeH$_4$ | 50 | | | |
| | | SiH$_4$ | 50 | | | |
| | | B$_2$H$_6$/H$_2$ (= 3000 vol ppm) | 50 | | | |
| Second layer | Layer A | H$_2$ | 300 | 100 | 8 | 3 |
| | | SiH$_4$ | 100 | | | |
| | | B$_2$H$_6$/H$_2$ (= 3000 vol ppm) | 100 | | | |
| | Layer B | H$_2$ | 300 | 300 | 24 | 20 |

TABLE 14F-continued

| Layer constitution | Starting gas | Gas flow rate (SCCM) | Discharging power (W) | Deposition rate (Å/sec) | Layer thickness (μm) |
|---|---|---|---|---|---|
| | SiH₄ | 300 | | | |

TABLE 15F

| Layer constitution | | Starting gas | Gas flow rate (SCCM) | Discharging power (W) | Deposition rate (Å/sec) | Layer thickness (μm) |
|---|---|---|---|---|---|---|
| First layer | | H₂ | 300 | 100 | 10 | 2 |
| | | GeH₄ | 50 | | | |
| | | SiH₄ | 50 | | | |
| | | B₂H₆/H₂ (= 3000 vol ppm) | 150 | | | |
| Second layer | Layer A | H₂ | 300 | 100 | 8 | 3 |
| | | SiH₄ | 100 | | | |
| | | B₂H₆/H₂ (= 3000 vol ppm) | 100 | | | |
| | Layer B | H₂ | 300 | 300 | 24 | 20 |
| | | SiH₄ | 300 | | | |

TABLE 16F

| Layer constitution | | Starting gas | Gas flow rate (SCCM) | Discharging power (W) | Deposition rate (Å sec) | Layer thickness (μm) |
|---|---|---|---|---|---|---|
| First layer | Layer A | H₂ | 300 | 100 | 10 | 2 |
| | | GeH₄ | 50 | | | |
| | | SiH₄ | 50 | | | |
| | Layer B | H₂ | 300 | 100 | 8 | 3 |
| | | GeH₄ | 50 | | | |
| | | SiH₄ | 50 | | | |
| | | B₂H₆/H₂ (= 3000 vol ppm) | 100 | | | |
| Second layer | | H₂ | 300 | 300 | 24 | 20 |
| | | SiH₄ | 300 | | | |

TABLE 17F

| Layer constitution | | Starting gas | Gas flow rate (SCCM) | Discharging power (W) | Deposition rate (Å sec) | Layer thickness (μm) |
|---|---|---|---|---|---|---|
| First layer | Layer A | H₂ | 300 | 100 | 10 | 2 |
| | | GeH₄ | 50 | | | |
| | | SiH₄ | 50 | | | |
| | | B₂H₆/H₂ (= 3000 vol ppm) | 100 | | | |
| | Layer B | H₂ | 300 | 100 | 10 | 2 |
| | | GeH₄ | 50 | | | |
| | | SiH₄ | 50 | | | |
| Second layer | | H₂ | 300 | 300 | 24 | 20 |
| | | SiH₄ | 300 | | | |

TABLE 18F

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | H₂ | 300 | 100 | 10 | 2 |
| | | GeH₄ | 50 | | | |
| | | SiH₄ | 50 | | | |
| | Layer B | H₂ | 300 | 100 | 10 | 2 |
| | | GeH₄ | 50 | | | |
| | | SiH₄ | 50 | | | |
| | | B₂H₆/H₂ (= 3000 vol ppm) | 100 | | | |
| Second layer | | H₂ | 300 | 300 | 24 | 20 |
| | | SiH₄ | 300 | | | |

TABLE 1G

| Sample No. | 101G | 102G | 103G | 104G | 105G | 106G | 107G |
|---|---|---|---|---|---|---|---|
| Si:C | 9:1 | 8.5:3.5 | 4:6 | 2:8 | 1:9 | 0.5:9.5 | 0.2:8.8 |

TABLE 1G-continued

| Sample No. | 101G | 102G | 103G | 104G | 105G | 106G | 107G |
|---|---|---|---|---|---|---|---|
| Target (Area ratio) Si:C | 9.7:0.3 | 8.8:1.2 | 7.3:2.7 | 4.8:5.2 | 3:7 | 2:8 | 0.8:9.2 |
| (Content ratio) Image quality evaluation | Δ | ○ | ⊚ | ⊚ | ○ | Δ | X |

⊚: Very good
○: Good
Δ: Practically satisfactory
X: Image defect formed

TABLE 2G

| Sample No. | 201G | 202G | 203G | 204G | 205G | 206G | 207G | 208G |
|---|---|---|---|---|---|---|---|---|
| SiH$_4$:CH$_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊚ | ⊚ | ⊚ | ○ | Δ | X |

⊚: Very good
○: Good
Δ: Practically satisfactory
X: Image defect formed

TABLE 3G

| Sample No. | 301G | 302G | 303G | 304G | 305G | 306G | 307G | 308G |
|---|---|---|---|---|---|---|---|---|
| SiH$_4$:SiF$_4$:CH$_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊚ | ⊚ | ⊚ | ○ | Δ | X |

⊚: Very good
○: Good
Δ: Practically satisfactory
X: Image defect formed

TABLE 4G

| Sample No. | Thickness of surface layer (μ) | Results |
|---|---|---|
| 4001G | 0.001 | Image defect liable to be formed |
| 4002G | 0.02 | No image defect formed up to successive copying for 20,000 times |
| 4003G | 0.05 | Stable up to successive copying for 50,000 times |
| 4004G | 1 | Stable up to successive copying for 200,000 times |

TABLE 5G

| Layer constitution | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 10 | 3 |
| | GeH$_4$ | 100 → 0 | | | |
| | SiH$_4$ | 0 → 100 | | | |
| | B$_2$H$_6$/H$_2$ = 3000 ppm | GeH$_4$ + SiH$_4$ = 100 | | | |
| Second layer | H$_2$ | 300 | 300 | 24 | 20 |
| | SiH$_4$ | 300 | | | |
| Surface layer | SiH$_4$ | 20 | 150 | 1 | 0.5 |
| | CH$_4$ | 600 | | | |

TABLEL 6G

| Layer constitution | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 10 | 3 |
| | GeH$_4$ | 100 → 0 | | | |
| | SiH$_4$ | 0 → 100 | | | |
| | B$_2$H$_6$/H$_2$ = 3000 ppm | 100 | | | |
| | | GeH$_4$ + SiH$_4$ = 100 | | | |
| Second Layer A | H$_2$ | 300 | 100 | 8 | 5 |

TABLE 6G-continued

| Layer constitution | | Starting gas | Gas flow rate (SCCM) | Discharging power (W) | Deposition rate (Å/sec) | Layer thickness (μm) |
|---|---|---|---|---|---|---|
| layer | | SiH$_4$ | 100 | | | |
| | | B$_2$H$_6$/H$_2$ = 3000 ppm | 100 | | | |
| | Layer B | H$_2$ | 300 | 300 | 24 | 20 |
| | | SiH$_4$ | 300 | | | |

TABLE 7G

| Layer constitution | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 10 | 3 |
| | GeH$_4$ | 100 → 0 | | | |
| | SiH$_4$ | 0 → 100 | | | |
| | B$_2$H$_6$/H$_2$ = 3000 ppm | 100 | | | |
| | | BeH$_4$ + SiH$_4$ = 100 | | | |
| Second layer | H$_2$ | 300 | 300 | 24 | 20 |
| | SiH$_4$ | 300 | | | |

TABLE 8G

| Layer constitution | | Starting gas | Gas flow rate (SCCM) | Discharging power (W) | Deposition rate (Å/sec) | Layer thickness (μm) |
|---|---|---|---|---|---|---|
| First layer | | H$_2$ | 300 | 100 | 10 | 3 |
| | | GeH$_4$ | 50 → 0 | | | |
| | | SiH$_4$ | 50 → 100 | | | |
| | | B$_2$H$_6$/H$_2$ = 3000 ppm | 50 | | | |
| | | | GeH$_4$ + SiH$_4$ = 100 | | | |
| Second layer | Layer A | H$_2$ | 300 | 100 | 8 | 5 |
| | | SiH$_4$ | 100 | | | |
| | | B$_2$H$_6$/H$_2$ = 3000 ppm | 100 | | | |
| | Layer B | H$_2$ | 300 | 300 | 24 | 20 |
| | | SiH$_4$ | 300 | | | |

TABLE 9G

| Layer constitution | | Starting gas | Gas flow rate (SCCM) | Discharging power (W) | Deposition rate (Å/sec) | Layer thickness (μm) |
|---|---|---|---|---|---|---|
| First layer | | H$_2$ | 300 | 100 | 10 | 3 |
| | | GeH$_4$ | 50 → 0 | | | |
| | | SiH$_4$ | 50 → 100 | | | |
| | | | GeH$_4$ + SiH$_4$ = 100 | | | |
| Second layer | Layer A | H$_2$ | 300 | 100 | 8 | 5 |
| | | SiH$_4$ | 100 | | | |
| | | B$_2$H$_6$/H$_2$ = 3000 ppm | 100 | | | |
| | Layer B | H$_2$ | 300 | 300 | 24 | 20 |
| | | SiH$_4$ | 300 | | | |

TABLE 10G

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | H$_2$ | 300 | 100 | 10 | 1.5 |
| | | GeH$_4$ | 100 → 50 | | | |
| | | SiH$_4$ | 0 → 50 | | | |
| | | B$_2$H$_6$/H$_2$ = 3000 ppm | 100 | | | |
| | Layer B | H$_2$ | 300 | 100 | 10 | 1.5 |
| | | GeH$_4$ | 50 → 0 | | | |
| | | SiH$_4$ | 50 → 100 | | | |
| Second layer | | H$_2$ | 300 | 300 | 24 | 20 |
| | | SiH$_4$ | 300 | | | |

TABLE 1H

| Sample No. | 101H | 102H | 103H | 104H | 105H | 106H | 107H |
|---|---|---|---|---|---|---|---|
| Si:C Target (Area ratio) | 9:1 | 8.5:3.5 | 4:6 | 2:8 | 1:9 | 0.5:9.5 | 0.2:8.8 |
| Si:C (Con- | 9.7:0.3 | 8.8:1.2 | 7.3:2.7 | 4.8:5.2 | 3:7 | 2:8 | 0.8:9.2 |

TABLE 1H-continued

| Sample No. | 101H | 102H | 103H | 104H | 105H | 106H | 107H |
|---|---|---|---|---|---|---|---|
| tent ratio) | | | | | | | |
| Image quality evaluation | Δ | ○ | ⊙ | ⊙ | ○ | Δ | X |

⊙: Very good
○: Good
Δ: Practically satisfactory
X: Image defect formed

TABLE 4H

| Sample No. | Thickness of surface layer ($\mu$) | Results |
|---|---|---|
| 4001H | 0.001 | Image defect liable to be formed |
| 4002H | 0.02 | No image defect formed up to successive copying for 20,000 times |
| 4003H | 0.05 | Stable up to successive copying for 50,000 times |
| 4004H | 1 | Stable up to successive copying for 200,000 times |

TABLE 2H

| Sample No. | 201H | 202H | 203H | 204H | 205H | 206H | 207H | 208H |
|---|---|---|---|---|---|---|---|---|
| $SiH_4$:$CH_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality | Δ | ○ | ⊙ | ⊙ | ⊙ | ○ | Δ | X |

⊙: Very good
○: Good
Δ: Practically satisfactory
X: Image defect formed

TABLE 3H

| Sample No. | 301H | 302H | 303H | 304H | 305H | 306H | 307H | 308H |
|---|---|---|---|---|---|---|---|---|
| $SiH_4$:$SiF_4$:$CH_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality | Δ | ○ | ⊙ | ⊙ | ⊙ | ○ | Δ | X |

⊙: Very good
○: Good
Δ: Practically satisfactory
X: Image defect formed

TABLE 5H

| Layer constitution | Starting gas | Gas flow rate (SCCM) | Discharging power (W) | Deposition rate (Å/sec) | Layer thickness ($\mu$m) |
|---|---|---|---|---|---|
| First layer | $H_2$<br>$GeH_4$<br>$SiH_4$<br>$B_2H_6$/$H_2$ = 3000 ppm | 300<br>100<br>100<br>$B_2H_6$/($GeH_4$ + $SiH_4$) = 3/100 → 0 | 100 | 10 | 1 |
| Second layer | $H_2$<br>$SiH_4$ | 300<br>300 | 300 | 24 | 20 |
| Surface layer | $SiH_4$<br>$CH_4$ | 20<br>600 | 150 | 1 | 0.5 |

TABLE 6H

| Layer constitution | Starting gas | Gas flow rate (SCCM) | Discharging power (W) | Deposition rate (Å/sec) | Layer thickness ($\mu$m) |
|---|---|---|---|---|---|
| First layer | $H_2$<br>$GeH_4$<br>$SiH_4$<br>$B_2H_6$/$H_2$ = 3000 ppm | 300<br>100<br>50<br>$B_2H_6$/($GeH_4$ + $SiH_4$) = 5/100 → 0 | 100 | 14 | 3 |
| Second layer | $H_2$<br>$SiH_4$ | 300<br>300 | 300 | 24 | 20 |

TABLE 7H

| Layer constitution | Starting gas | Gas flow rate (SCCM) | Discharging power (W) | Deposition rate (Å/sec) | Layer thickness ($\mu$m) |
|---|---|---|---|---|---|
| First | $H_2$ | 300 | 100 | 12 | 5 |

TABLE 7H-continued

| Layer constitution | Starting gas | Gas flow rate (SCCM) | Discharging power (W) | Deposition rate (Å/sec) | Layer thickness (μm) |
|---|---|---|---|---|---|
| layer | GeH$_4$ | 50 | | | |
| | SiH$_4$ | 100 | | | |
| | B$_2$H$_6$/H$_2$ = 3000 ppm | B$_2$H$_6$/(GeH$_4$ + SiH$_4$) = 1/100 → 0 | | | |
| Second layer | H$_2$ | 300 | 300 | 24 | 20 |
| | SiH$_4$ | 300 | | | |

TABLE 8H

| Layer constitution | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 8 | 7 |
| | GeH$_4$ | 15 | | | |
| | SiH$_4$ | 135 | | | |
| | B$_2$H$_6$/H$_2$ = 3000 ppm | B$_2$H$_6$/(GeH$_4$ + SiH$_4$) = 1/100 → 0 | | | |
| Second layer | H$_2$ | 300 | 300 | 24 | 20 |
| | SiH$_4$ | 300 | | | |

TABLE 9H

| Layer constitution | | Starting gas | Gas flow rate (SCCM) | Discharging power (W) | Deposition rate (Å/sec) | Layer thickness (μm) |
|---|---|---|---|---|---|---|
| First layer | | H$_2$ | 300 | 100 | 10 | 2 |
| | | GeH$_4$ | 50 | | | |
| | | SiH$_4$ | 50 | | | |
| | | B$_2$H$_6$/H$_2$ = 3000 ppm | 150 → 110 | | | |
| Second layer | Layer A | H$_2$ | 300 | 100 | 10 | 3 |
| | | SiH$_4$ | 100 | | | |
| | | B$_2$H$_6$/H$_2$ = 3000 ppm | 110 → 0 | | | |
| | Layer B | H$_2$ | 300 | 300 | 24 | 20 |
| | | SiH$_4$ | 300 | | | |

TABLE 10H

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | H$_2$ | 300 | 100 | 10 | 2 |
| | | GeH$_4$ | 50 | | | |
| | | SiH$_4$ | 50 | | | |
| | | B$_2$H$_6$/H$_2$ = 3000 ppm | 100 → 0 | | | |
| | Layer B | H$_2$ | 300 | 100 | 10 | 2 |
| | | GeH$_4$ | 50 | | | |
| | | SiH$_4$ | 50 | | | |
| Second layer | | H$_2$ | 300 | 300 | 24 | 20 |
| | | SiH$_4$ | 300 | | | |

TABLE 11H

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | H$_2$ | 300 | 100 | 10 | 2 |
| | | GeH$_4$ | 50 | | | |
| | | SiH$_4$ | 50 | | | |
| | Layer B | H$_2$ | 300 | 100 | 10 | 2 |
| | | GeH$_4$ | 50 | | | |
| | | SiH$_4$ | 50 | | | |
| | | B$_2$H$_6$/H$_2$ = 3000 ppm | 50 → 0 | | | |
| Second layer | | H$_2$ | 300 | 300 | 24 | 20 |
| | | SiH$_4$ | 300 | | | |

TABLE 12H

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | H$_2$ | 300 | 100 | 10 | 2 |

TABLE 12H-continued

| Layer constitution | Starting gas | Gas flow rate (SCCM) | Discharging power (W) | Deposition rate (Å/sec) | Layer thickness (μm) |
|---|---|---|---|---|---|
| layer | GeH$_4$ | 50 | | | |
| | SiH$_4$ | 50 | | | |
| | B$_2$H$_6$/H$_2$ = 3000 ppm | 50 → 25 | | | |
| Layer B | H$_2$ | 300 | 100 | 8 | 3 |
| | GeH$_4$ | 50 | | | |
| | SiH$_4$ | 50 | | | |
| | B$_2$H$_6$/H$_2$ = 3000 ppm | 25 → 0 | | | |
| Second layer | H$_2$ | 300 | 300 | 24 | 20 |
| | SiH$_4$ | 300 | | | |

TABLE 1I

| Sample No. | 101I | 102I | 103I | 104I | 105I | 106I | 107I |
|---|---|---|---|---|---|---|---|
| Si:C Target (Area ratio) | 9:1 | 8.5:3.5 | 4:6 | 2:8 | 1:9 | 0.5:9.5 | 0.2:8.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | ○ | ⊚ | ⊚ | ○ | Δ | X |

⊚: Very good
○: Good
Δ: Practically satisfactory
X: Image defect formed

TABLE 2I

| Sample No. | 201I | 202I | 203I | 204I | 205I | 206I | 207I | 208I |
|---|---|---|---|---|---|---|---|---|
| SiH$_4$:CH$_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊚ | ⊚ | ⊚ | ○ | Δ | X |

⊚: Very good
○: Good
Δ: Practically satisfactory
X: Image defect formed

TABLE 3I

| Sample No. | 301I | 302I | 303I | 304I | 305I | 306I | 307I | 308I |
|---|---|---|---|---|---|---|---|---|
| SiH$_4$:SiF$_4$:CH$_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊚ | ⊚ | ⊚ | ○ | Δ | X |

⊚: Very good
○: Good
Δ: Practically satisfactory
X: Image defect formed

TABLE 4I

| Sample No. | Thickness of surface layer (μ) | Results |
|---|---|---|
| 4001I | 0.001 | Image defect liable to be formed |
| 4002I | 0.02 | No image defect formed up to successive copying for 20,000 times |
| 4003I | 0.05 | Stable up to successive copying for 50,000 times |
| 4004I | 1 | Stable up to successive copying for 200,000 times |

TABLE 5I

| Layer constitution | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 9 | 3 |
| | GeH$_4$ | 100 → 0 | | | |
| | SiH$_4$ | 0 → 100 | | | |
| | B$_2$H$_6$/H$_2$ = 3000 ppm | GeH$_4$ + SiH$_4$ = 100 | | | |
| Second layer | H$_2$ | 300 | 300 | 24 | 20 |
| | SiH$_4$ | 300 | | | |
| Surface layer | SiH$_4$ | 20 | 150 | 1 | 0.5 |
| | CH$_4$ | 600 | | | |

TABLE 6I

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 50 → 0 | | | |
| | $SiH_4$ | 50 → 100 | | | |
| | | 50 → 0 | | | |
| | $B_2H_6/H_2$ = 3000 ppm | $GeH_4 + SiH_4$ = 100 | | | |
| Second layer | $H_2$ | 300 | 300 | 24 | 20 |
| | $SiH_4$ | 300 | | | |

TABLE 7I

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$ | 300 | 100 | 10 | 2 |
| | | $GeH_4$ | 50 → 0 | | | |
| | | $SiH_4$ | 50 → 100 | | | |
| Second layer | Layer A | $H_2$ | 300 | 100 | 10 | 3 |
| | | $SiH_4$ | 100 | | | |
| | | $B_2H_6/H_2$ = 3000 ppm | 100 → 0 | | | |
| | Layer B | $H_2$ | 300 | 300 | 24 | 20 |
| | | $SiH_4$ | 300 | | | |

TABLE 8I

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$ | 300 | | | |
| | | $GeH_4$ | 50 → 0 | | | |
| | | $SiH_4$ | 50 → 100 | 100 | 10 | 2 |
| | | $B_2H_6/H_2$ = 3000 ppm | 100 | | | |
| Second layer | Layer A | $H_2$ | 300 | | | |
| | | $SiH_4$ | 100 | | | |
| | | $B_2H_6/H_2$ = 3000 ppm | 100 → 0 | 100 | 10 | 3 |
| | Layer B | $H_2$ | 300 | 300 | 24 | 20 |
| | | $SiH_4$ | 300 | | | |

TABLE 9I

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | $H_2$ | 300 | | | |
| | | $GeH_4$ | 50 → 25 | | | |
| | | $SiH_4$ | 50 → 75 | 100 | 10 | 2 |
| | | $B_2H_6/H_2$ = 3000 ppm | 100 → 0 | | | |
| | Layer B | $H_2$ | 300 | | | |
| | | $GeH_4$ | 25 → 0 | 100 | 10 | 2 |
| | | $SiH_4$ | 75 → 100 | | | |
| Second layer | | $H_2$ | 300 | 300 | 24 | 20 |
| | | $SiH_4$ | 300 | | | |

TABLE 1aJ

| Layer | Starting gas | Gas flow rate (SCCM) | Discharging power (W) | Layer thickness (μm) |
|---|---|---|---|---|
| First layer | $H_2$ | 300 | | |
| | $GeH_4$ | 50 | | |
| | $SiH_4$ | 100 | 160 | 5 |
| | NO | | | |
| Second layer | $H_2$ | 300 | 150 | 20 |
| | $SiH_4$ | 300 | | |
| Surface layer | $SiH_4$ | 20 | 300 | 0.32 |
| | $CH_4$ | 600 | | |

TABLE 1J

| Layer | Starting gas | Flow rate (SCCM) | High frequency power (W) | Layer thickness (μm) |
|---|---|---|---|---|
| First layer | $H_2$ | 300 | 160 | 3 |
| | $SiH_4$ | 100 | | |
| | $GeH_4$ | 50 | | |
| | $NH_3$ | 30 | | |
| Second layer | $H_2$ | 300 | 300 | 20 |
| | $SiH_4$ | 300 | | |
| Surface layer | $SiH_4$ | 20 | 300 | 0.32 |
| | $CH_4$ | 600 | | |

TABLE 2J

| Layer | Starting gas | Flow rate (SCCM) | High frequency power (W) | Layer thickness (μm) |
|---|---|---|---|---|
| First layer | $H_2$ | 300 | | |
| | $SiH_4$ | 100 | 160 | 5 |
| | $GeH_4$ | 50 | | |
| | $NH_3$ | 15 | | |
| Second layer | $H_2$ | 300 | | |
| | $SiH_4$ | 300 | 200 | 20 |
| | $NH_3$ | 15 | | |
| Surface layer | $SiH_4$ | 20 | 300 | 0.32 |
| | $CH_4$ | 600 | | |

TABLE 3J

| Layer | Starting gas | Flow rate (SCCM) | High frequency power (W) | Layer thickness (μm) |
|---|---|---|---|---|
| First layer | $H_2$ | 300 | | |
| | $SiH_4$ | 50 | 170 | 2.8 |
| | $GeH_4$ | 100 | | |
| | $N_2O$ | 15 | | |
| Second layer | $H_2$ | 300 | | |
| | $SiH_4$ | 300 | 200 | 21 |
| | $N_2O$ | 15 | | |
| Surface layer | $SiH_4$ | 20 | 300 | 0.32 |
| | $CH_4$ | 600 | | |

TABLE 4J

| Layer | Starting gas | Flow rate (SCCM) | High frequency power (W) | Layer thickness (μm) |
|---|---|---|---|---|
| First layer | $H_2$ | 300 | | |
| | $SiH_4$ | 100 | 170 | 5.1 |
| | $GeH_4$ | 60 | | |
| | $N_2O$ | 16 | | |
| Second layer | $H_2$ | 300 | 230 | 22 |
| | $SiH_4$ | 300 | | |
| Surface layer | $SiH_4$ | 20 | 300 | 0.32 |
| | $CH_4$ | 600 | | |

TABLE 5J

| Layer | Starting gas | Flow rate (SCCM) | High frequency power (W) | Layer thickness (μm) |
|---|---|---|---|---|
| First layer | $H_2$ | 300 | | |
| | $SiH_4$ | 50 | 160 | 3 |
| | $GeH_4$ | 100 | | |
| | $NH_3$ | 30~0 | | |
| Second layer | $H_2$ | 300 | 300 | 20 |
| | $SiH_4$ | 300 | | |
| Surface layer | $SiH_4$ | 20 | 300 | 0.32 |
| | $CH_4$ | 600 | | |

TABLE 6J

| Layer | Starting gas | Flow rate (SCCM) | High frequency power (W) | Layer thickness (μm) |
|---|---|---|---|---|
| First layer | $H_2$ | 300 | | |
| | $SiH_4$ | 100 | 160 | 5 |
| | $GeH_4$ | 50 | | |
| | $NH_3$ | 15~0 | | |
| Second layer | $H_2$ | 300 | 200 | 20 |
| | $SiH_4$ | 300 | | |
| | $NH_3$ | | | |
| Surface layer | $SiH_4$ | 20 | 300 | 0.32 |
| | $CH_4$ | 600 | | |

TABLE 7J

| Layer | Starting gas | Flow rate (SCCM) | High frequency power (W) | Layer thickness (μm) |
|---|---|---|---|---|
| First layer | $H_2$ | 300 | | |
| | $SiH_4$ | 100 | 170 | 2.8 |
| | $GeH_4$ | 50 | | |
| | $N_2O$ | 15~0 | | |
| Second layer | $H_2$ | 300 | 200 | 21 |
| | $SiH_4$ | 300 | | |
| Surface layer | $SiH_4$ | 20 | 300 | 0.32 |
| | $CH_4$ | 600 | | |

TABLE 8J

| Layer | Starting gas | Flow rate (SCCM) | High frequency power (W) | Layer thickness (μm) |
|---|---|---|---|---|
| First layer | $H_2$ | 300 | | |
| | $SiH_4$ | 100 | 170 | 5.1 |
| | $GeH_4$ | 60 | | |
| | $N_2O$ | 16~0 | | |
| Second layer | $H_2$ | 300 | | |
| | $SiH_4$ | 300 | 230 | 22 |
| | $N_2O$ | | | |
| Surface layer | $SiH_4$ | 20 | 300 | 0.32 |
| | $CH_4$ | 600 | | |

TABLE 9J

| Layer constitution | Gases employed | Flow rate (SCCM) | Flow rate ratio | Discharging power (W) | Layer formation rate (Å/sec) | Layer thickness (μ) |
|---|---|---|---|---|---|---|
| First layer | $SiH_4/He$ = 0.05 | $SiH_4 + GeH_4$ = 50 | $NO/(SiH_4 + GeH_4)$ = 3/10~0 | 150 | 12 | 1 |
| | $GeH_4/He$ = 0.05 | | | | | |
| | NO | | | | | |
| Second layer | $SiH_4/He$ = 0.05 | $SiH_4$ = 50 | | 150 | 12 | 20 |
| Surface layer | $SiH_4$ | 20 | | 300 | 1 | 0.32 |
| | $CH_4$ | 600 | | | | |

TABLE 10J

| Layer constitution | Gases employed | Flow rate (SCCM) | Flow rate ratio | Discharging power (W) | Layer formation rate (Å/sec) | Layer thickness (μ) |
|---|---|---|---|---|---|---|
| First layer | $SiH_4/He$ = 0.05 | $SiH_4 + GeH_4$ = 50 | $NO/(SiH_4 + GeH_4)$ = 2/10~0 | 150 | 12 | 0.5 |
| | $GeH_4/He$ = 0.05 | | | | | |
| | NO | | | | | |
| Second layer | $SiH_4/He$ = 0.05 | $SiH_4$ = 50 | | 150 | 12 | 20 |
| Surface layer | $SiH_4$ | 20 | | 300 | 1 | 0.32 |

TABLE 10J-continued

| Layer constitution | Gases employed | Flow rate (SCCM) | Flow rate ratio | Discharging power (W) | Layer formation rate (Å/sec) | Layer thickness (μ) |
|---|---|---|---|---|---|---|
| | CH$_4$ | 600 | | | | |

TABLE 11J

| Layer constitution | Gases employed | Flow rate (SCCM) | Flow rate ratio | Discharging power (W) | Layer formation rate (Å/sec) | Layer thickness (μ) |
|---|---|---|---|---|---|---|
| First layer | SiH$_4$/He = 0.05<br>GeH$_4$/He = 0.05<br>NO | SiH$_4$ + GeH$_4$ = 50 | NO/(SiH$_4$ + GeH$_4$) = 1/10~1/100 | 160 | 14 | 5 |
| Second layer | SiH$_4$/He = 0.05 | SiH$_4$ = 50 | | 160 | 14 | 15 |
| Surface layer | SiH$_4$<br>CH$_4$ | 20<br>600 | | 300 | 1 | 0.32 |

TABLE 12J

| Layer constitution | Gases employed | Flow rate (SCCM) | Flow rate ratio | Discharging power (W) | Layer formation rate (Å/sec) | Layer thickness (μ) |
|---|---|---|---|---|---|---|
| First layer | SiH$_4$/He = 0.05<br>GeH$_4$/He = 0.05<br>NO | SiH$_4$ + GeH$_4$ = 50 | NO/(SiH$_4$ + GeH$_4$) = 3/10~0 | 160 | 14 | 1.0 |
| Second layer | SiH$_4$/He = 0.05 | SiH$_4$ = 50 | | 160 | 12 | 15 |
| Surface layer | SiH$_4$<br>CH$_4$ | 20<br>600 | | 300 | 1 | 0.32 |

TABLE 13J

| Layer constitution | Gases employed | Flow rate (SCCM) | Flow rate ratio | Discharging power (W) | Layer formation rate (Å/sec) | Layer thickness (μ) |
|---|---|---|---|---|---|---|
| First layer | SiH$_4$/He = 0.05<br>GeH$_4$/He = 0.05<br>NO | SiH$_4$ + GeH$_4$ = 50 | NO/(SiH$_4$ + GeH$_4$) = 3/10~0 | 170 | 15 | 1 |
| Second layer | SiH$_4$/He = 0.05 | SiH$_4$ = 50 | | 170 | 15 | 20 |
| Surface layer | SiH$_4$<br>CH$_4$ | 20<br>600 | | 300 | 1 | 0.32 |

TABLE 14J

| Layer constitution | Gases employed | Flow rate (SCCM) | Flow rate ratio | Discharging power (W) | Layer formation rate (Å/sec) | Layer thickness (μ) |
|---|---|---|---|---|---|---|
| First layer | SiH$_4$/He = 0.05<br>GeH$_4$/He = 0.05<br>NH$_3$ | SiH$_4$ + GeH$_4$ = 50 | NH$_3$/(SiH$_4$ + GeH$_4$) = 1/10~1/100 | 160 | 14 | 5 |
| Second layer | SiH$_4$/He = 0.05<br>NH$_3$ | SiH$_4$ = 50 | NH$_3$/SiH$_4$ = 1/100 | 160 | 14 | 15 |
| Surface layer | SiH$_4$<br>CH$_4$ | 20<br>600 | | 300 | 1 | 0.32 |

TABLE 15J

| Layer constitution | Gases employed | Flow rate (SCCM) | Flow rate ratio | Discharging power (W) | Layer formation rate (Å/sec) | Layer thickness (μ) |
|---|---|---|---|---|---|---|
| First layer | SiH$_4$/He = 0.05<br>GeH$_4$/He = 0.05<br>N$_2$O | SiH$_4$ + GeH$_4$ = 50 | CH$_4$/(SiH$_4$ + GeH$_4$) = 1/10~1/100 | 160 | 14 | 5 |
| Second layer | SiH$_4$/He = 0.05<br>N$_2$O | SiH$_4$ = 50 | CH$_4$/SiH$_4$ = 1/100 | 160 | 14 | 15 |
| Surface layer | SiH$_4$<br>CH$_4$ | 20<br>600 | | 300 | 1 | 0.32 |

TABLE 16J

| Sample No. | 2901J | 2902J | 2903J | 2904J | 2905J | 2906J | 2907J |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | ◯ | ⊙ | ⊙ | ◯ | Δ | X |

⊙: Very good
◯: Good
Δ: Practically satisfactory
X: Image defect formed

TABLE 17J

| Sample No. | 3001J | 3002J | 3003J | 3004J | 3005J | 3006J | 3007J | 3008J |
|---|---|---|---|---|---|---|---|---|
| $SiH_4:CH_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ◯ | ⊙ | ⊙ | ⊙ | ◯ | Δ | X |

⊙: Very good
◯: Good
Δ: Practically satisfactory
X: Image defect formed

TABLE 18J

| Sample No. | 3101J | 3102J | 3103J | 3104J | 3105J | 3106J | 3107J | 3108J |
|---|---|---|---|---|---|---|---|---|
| $SiH_4:SiF_4:CH_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ◯ | ⊙ | ⊙ | ⊙ | ◯ | Δ | X |

⊙: Very good
◯: Good
Δ: Practically satisfactory
X: Image defect formed

TABLE 19J

| Sample No. | Thickness of surface layer (μ) | Results |
|---|---|---|
| 3201J | 0.001 | Image defect liable to be formed |
| 3202J | 0.02 | No image defect formed up to successive copying for 20,000 times |
| 3203J | 0.05 | Stable up to successive copying for 50,000 times |
| 3204J | 1 | Stable up to successive copying for 200,000 times |

TABLE 1K

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |
| | | $GeH_4 + SiH_4 = 100$ | | | |
| | NO | 10 | | | |
| Second layer | $H_2$ | 300 | 300 | 24 | 20 |
| | $SiH_4$ | 300 | | | |
| Surface layer | $SiH_4$ | 20 | 300 | 1 | 0.32 |
| | $CH_4$ | 600 | | | |

TABLE 2K

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |

TABLE 2K-continued

|  | Starting gas | Gas flow rate (SCCM) | Discharging power (W) | Deposition rate (Å/sec) | Layer thickness (μm) |
|---|---|---|---|---|---|
|  |  | GeH$_4$ + SiH$_4$ = 100 |  |  |  |
|  | N$_2$O | 10 |  |  |  |
| Second | H$_2$ | 300 | 300 | 24 | 20 |
| layer | SiH$_4$ | 300 |  |  |  |
| Surface | SiH$_4$ | 20 | 300 | 1 | 0.32 |
| layer | CH$_4$ | 600 |  |  |  |

TABLE 3K

|  | Starting gas | Gas flow rate (SCCM) | Discharging power (W) | Deposition rate (Å/sec) | Layer thickness (μm) |
|---|---|---|---|---|---|
| First | H$_2$ | 300 | 100 | 9 | 3 |
| layer | GeH$_4$ | 50 → 0 |  |  |  |
|  | SiH$_4$ | 50 → 100 |  |  |  |
|  |  | GeH$_4$ + SiH$_4$ = 100 |  |  |  |
|  | NH$_3$ | 10 |  |  |  |
| Second | H$_2$ | 300 | 300 | 24 | 20 |
| layer | SiH$_4$ | 300 |  |  |  |
| Surface | SiH$_4$ | 20 | 300 | 1 | 0.32 |
| layer | CH$_4$ | 600 |  |  |  |

TABLE 4K

|  | Starting gas | Gas flow rate (SCCM) | Discharging power (W) | Deposition rate (Å/sec) | Layer thickness (μm) |
|---|---|---|---|---|---|
| First | H$_2$ | 300 | 100 | 9 | 3 |
| layer | GeH$_4$ | 50 → 0 |  |  |  |
|  | SiH$_4$ | 50 → 100 |  |  |  |
|  |  | GeH$_4$ + SiH$_4$ = 100 |  |  |  |
|  | NH$_3$ | 6 |  |  |  |
| Second | H$_2$ | 300 | 300 | 24 | 20 |
| layer | SiH$_4$ | 300 |  |  |  |
|  | NH$_3$ | 6 |  |  |  |
| Surface | SiH$_4$ | 20 | 300 | 1 | 0.32 |
| layer | CH$_4$ | 600 |  |  |  |

TABLE 5K

|  | Starting gas | Gas flow rate (SCCM) | Discharging power (W) | Deposition rate (Å/sec) | Layer thickness (μm) |
|---|---|---|---|---|---|
| First | H$_2$ | 300 | 100 | 9 | 3 |
| layer | GeH$_4$ | 100 → 0 |  |  |  |
|  | SiH$_4$ | 0 → 100 |  |  |  |
|  |  | GeH$_4$ + SiH$_4$ = 100 |  |  |  |
|  | NO | 20 → 0 |  |  |  |
| Second | H$_2$ | 300 | 300 | 24 | 20 |
| layer | SiH$_4$ | 300 |  |  |  |
| Surface | SiH$_4$ | 20 | 300 | 1 | 0.32 |
| layer | CH$_4$ | 600 |  |  |  |

TABLE 6K

|  | Starting gas | Gas flow rate (SCCM) | Discharging power (W) | Deposition rate (Å/sec) | Layer thickness (μm) |
|---|---|---|---|---|---|
| First | H$_2$ | 300 | 100 | 9 | 3 |
| layer | GeH$_4$ | 100 → 0 |  |  |  |
|  | SiH$_4$ | 0 → 100 |  |  |  |
|  |  | GeH$_4$ + SiH$_4$ = 100 |  |  |  |
|  | NH$_3$ | 20 → 0 |  |  |  |
| Second | H$_2$ | 300 | 300 | 24 | 20 |
| layer | SiH$_4$ | 300 |  |  |  |
| Surface | SiH$_4$ | 20 | 300 | 1 | 0.32 |
| layer | CH$_4$ | 600 |  |  |  |

TABLE 7K

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |
| | | $GeH_4 + SiH_4 = 100$ | | | |
| | NO | 10 → * | | | |
| Second layer | $H_2$ | 300 | 300 | 24 | 20 |
| | $SiH_4$ | 300 | | | |
| | NO | * → 0 | | | |
| Surface layer | $SiH_4$ | 20 | 300 | 1 | 0.32 |
| | $CH_4$ | 600 | | | |

Note:
The symbol * represents continuity of change in the gas flow rate.
The same note applies to the subsequent other tables.

TABLE 8K

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |
| | | $GeH_4 + SiH_4 = 100$ | | | |
| | $N_2O$ | 10 → 0 | | | |
| Second layer | $H_2$ | 300 | 300 | 24 | 20 |
| | $SiH_4$ | 300 | | | |
| Surface layer | $SiH_4$ | 20 | 300 | 1 | 0.32 |
| | $CH_4$ | 600 | | | |

TABLE 9K

| Sample No. | 2701K | 2702K | 2703K | 2704K | 2705K | 2706K | 2707K | 2708K |
|---|---|---|---|---|---|---|---|---|
| $SiH_4$:$CH_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ◎ | ◎ | ◎ | ○ | Δ | X |

◎: Very good
○: Good
Δ: Practically satisfactory
X: Image defect formed

TABLE 10K

| Sample No. | 2801K | 2802K | 2803K | 2804K | 2805K | 2806K | 2807K | 2808K |
|---|---|---|---|---|---|---|---|---|
| $SiH_4$:$SiF_4$:$CH_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ◎ | ◎ | ◎ | ○ | Δ | X |

◎: Very good
○: Good
Δ: Practically satisfactory
X: Image defect formed

TABLE 11K

| Sample No. | 2901K | 2902K | 2903K | 2904K | 2905K | 2906K | 2907K |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | ○ | ◎ | ◎ | ○ | Δ | X |

◎: Very good
○: Good
Δ: Practically satisfactory
X: Image defect formed

TABLE 1L

| | Starting gas | Gas flow rate (SCCM) | Discharging power (W) | Deposition rate (Å/sec) | Layer thickness (μm) |
|---|---|---|---|---|---|
| First layer | $H_2$ | 300 | | | |
| | $GeH_4$ | 50 | | | |
| | $SiH_4$ | 50 | 100 | 10 | 3 |
| | $B_2H_6/H_2$ (= 3000 vol ppm) | 100 | | | |
| | NO | 10 | | | |
| Second layer | $H_2$ | 300 | | | |
| | $SiH_4$ | 300 | 300 | 24 | 20 |
| Surface layer | $SiH_4$ | 20 | | | |
| | $CH_4$ | 600 | 300 | 1 | 0.32 |

TABLE 2L

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$ | 300 | | | |
| | | $GeH_4$ | 50 | | | |
| | | $SiH_4$ | 50 | 100 | 10 | 1 |
| | | $B_2H_6/H_2$ (= 3000 vol ppm) | 100 | | | |
| | | $NH_3$ | 11 | | | |
| Second layer | Layer A | $H_2$ | 300 | | | |
| | | $SiH_4$ | 100 | 100 | 8 | 5 |
| | | $B_2H_6/H_2$ (= 3000 vol ppm) | 100 | | | |
| | Layer B | $H_2$ | 300 | 300 | 24 | 20 |
| | | $SiH_4$ | 300 | | | |
| Surface layer | | $SiH_4$ | 20 | | | |
| | | $CH_4$ | 600 | 300 | 1 | 0.32 |

TABLE 3L

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$ | 300 | | | |
| | | $GeH_4$ | 50 | | | |
| | | $SiH_4$ | 50 | 100 | 10 | 1 |
| | | $B_2H_6/H_2$ (= 3000 vol ppm) | 50 | | | |
| | | $N_2O$ | 10 | | | |
| Second layer | Layer A | $H_2$ | 300 | | | |
| | | $SiH_4$ | 100 | 100 | 8 | 5 |
| | | $B_2H_6/H_2$ (= 3000 vol ppm) | 100 | | | |
| | Layer B | $H_2$ | 300 | 300 | 24 | 20 |
| | | $SiH_4$ | 300 | | | |
| Surface layer | | $SiH_4$ | 20 | | | |
| | | $CH_4$ | 600 | 300 | 1 | 0.32 |

TABLE 4L

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$ | 300 | | | |
| | | $GeH_4$ | 50 | | | |
| | | $SiH_4$ | 50 | 100 | 10 | 1 |
| | | $B_2H_6/H_2$ (= 3000 vol ppm) | 150 | | | |
| | | NO | 10 | | | |
| Second layer | Layer A | $H_2$ | 300 | | | |
| | | $SiH_4$ | 100 | 100 | 8 | 5 |
| | | $B_2H_6/H_2$ (= 3000 vol ppm) | 100 | | | |
| | | NO | 10 | | | |
| | Layer B | $H_2$ | 300 | | | |
| | | $SiH_4$ | 300 | 300 | 24 | 20 |
| | | NO | 10 | | | |
| Surface layer | | $SiH_4$ | 20 | | | |
| | | $CH_4$ | 600 | 300 | 1 | 0.32 |

TABLE 5L

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$ | 300 | | | |
| | | $GeH_4$ | 50 | | | |
| | | $SiH_4$ | 50 | 100 | 10 | 1 |
| | | $NH_3$ | 12 | | | |
| Second layer | Layer A | $H_2$ | 300 | | | |
| | | $SiH_4$ | 100 | | | |
| | | $B_2H_6/H_2$ (= 3000 vol ppm) | 100 | 100 | 8 | 5 |
| | | $NH_3$ | 12 | | | |
| | Layer B | $H_2$ | 300 | | | |
| | | $SiH_4$ | 300 | 300 | 24 | 20 |
| | | $NH_3$ | 12 | | | |
| Surface layer | | $SiH_4$ | 20 | | | |
| | | $CH_4$ | 600 | 300 | 1 | 0.32 |

TABLE 6L

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | $H_2$ | 300 | | | |
| | | $GeH_4$ | 100 | | | |
| | | $B_2H_6/H_2$ (= 3000 vol ppm) | 100 | 100 | 10 | 2 |
| | | $N_2O$ | 8 | | | |
| | Layer B | $H_2$ | 300 | | | |
| | | $GeH_4$ | 50 | 100 | 10 | 2 |
| | | $SiH_4$ | 50 | | | |
| | | $N_2O$ | 8 | | | |
| Second layer | | $H_2$ | 300 | | | |
| | | $SiH_4$ | 300 | 300 | 24 | 20 |
| | | $N_2O$ | 8 | | | |
| Surface layer | | $SiH_4$ | 20 | | | |
| | | $CH_4$ | 600 | 300 | 1 | 0.32 |

TABLE 7L

| Layer constitution | | Starting Gas | Gas flow rate (SCCM) | Discharging power (W) | Deposition rate (Å/sec) | Layer thickness (μm) |
|---|---|---|---|---|---|---|
| First layer | Layer A | $H_2$ | 300 | | | |
| | | $GeH_4$ | 100 | 100 | 10 | 2 |
| | | $N_2O$ | 10–* | | | |
| | Layer B | $H_2$ | 300 | | | |
| | | $GeH_4$ | 50 | | | |
| | | $SiH_4$ | 50 | 100 | 10 | 2 |
| | | $B_2H_6/H_2$ (= 3000 vol ppm) | 100 | | | |
| | | $N_2O$ | *–0 | | | |
| Second layer | | $H_2$ | 300 | 300 | 24 | 20 |
| | | $SiH_4$ | 300 | | | |
| Surface layer | | $SiH_4$ | 20 | | | |
| | | $CH_4$ | 600 | 300 | 1 | 0.32 |

TABLE 8L

| | Starting gas | Gas flow rate (SCCM) | Discharging power (W) | Deposition rate (Å/sec) | Layer thickness (μm) |
|---|---|---|---|---|---|
| First layer | $H_2$ | 300 | | | |
| | $GeH_4$ | 50 | | | |
| | $SiH_4$ | 50 | 100 | 10 | 5 |
| | $B_2H_6/H_2$ (= 3000 vol ppm) | 100 | | | |
| | NO | 10–0 | | | |
| Second layer | $H_2$ | 300 | | | |
| | $SiH_4$ | 300 | 300 | 24 | 20 |
| Surface layer | $SiH_4$ | 20 | | | |
| | $CH_4$ | 600 | 300 | 1 | 0.32 |

TABLE 9L

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | | | |
| | $GeH_4$ | 50 | | | |
| | $SiH_4$ | 50 | 100 | 10 | 2 |

TABLE 9L-continued

| Layer constitution | | Starting gas | Gas flow rate (SCCM) | Discharging power (W) | Deposition rate (Å/sec) | Layer thickness (μm) |
|---|---|---|---|---|---|---|
| | | B₂H₆/H₂ (= 3000 vol ppm) | 100 | | | |
| | | NH₃ | 10–0 | | | |
| Second layer | Layer A | H₂ | 300 | | | |
| | | SiH₄ | 100 | 100 | 8 | 3 |
| | | B₂H₆/H₂ (= 3000 vol ppm) | 100 | | | |
| | Layer B | H₂ | 300 | | | |
| | | SiH₄ | 300 | 300 | 24 | 20 |
| Surface layer | | SiH₄ | 20 | | | |
| | | CH₄ | 600 | 300 | 1 | 0.32 |

TABLE 10L

| Layer constitution | | Starting gas | Gas flow rate (SCCM) | Discharging power (W) | Deposition rate (Å/sec) | Layer thickness (μm) |
|---|---|---|---|---|---|---|
| First layer | | H₂ | 300 | | | |
| | | GeH₄ | 50 | | | |
| | | SiH₄ | 50 | 100 | 10 | 2 |
| | | B₂H₆/H₂ (= 3000 vol ppm) | 50 | | | |
| | | N₂O | 10–* | | | |
| Second layer | Layer A | H₂ | 300 | | | |
| | | SiH₄ | 100 | | | |
| | | B₂H₆/H₂ (= 3000 vol ppm) | 100 | 100 | 8 | 3 |
| | | N₂O | *–** | | | |
| | Layer B | H₂ | 300 | | | |
| | | SiH₄ | 300 | 300 | 24 | 20 |
| | | N₂O | **–0 | | | |
| Surface layer | | SiH₄ | 20 | | | |
| | | CH₄ | 600 | 300 | 1 | 0.32 |

Note:
The symbols * and ** represent continuity of change in the gas flow rate respectively.
The same note applies to the subsequent other tables.

TABLE 11L

| Layer constitution | | Starting gas | Gas flow rate (SCCM) | Discharging power (W) | Deposition rate (Å/sec) | Layer thickness (μm) |
|---|---|---|---|---|---|---|
| First layer | | H₂ | 300 | | | |
| | | GeH₄ | 50 | | | |
| | | SiH₄ | 50 | 100 | 10 | 2 |
| | | B₂H₆/H₂ (= 3000 vol ppm) | 150 | | | |
| | | NO | 10~* | | | |
| Second layer | Layer A | H₂ | 300 | | | |
| | | SiH₄ | 100 | | | |
| | | B₂H₆/H₂ (= 3000 vol ppm) | 100 | 100 | 8 | 3 |
| | | NO | *~** | | | |
| | Layer B | H₂ | 300 | | | |
| | | SiH₄ | 300 | 300 | 24 | 20 |
| | | NO | **~0 | | | |
| Surface layer | | SiH₄ | 20 | | | |
| | | CH₄ | 600 | 300 | 1 | 0.32 |

TABLE 12L

| Layer constitution | | Starting gas | Gas flow rate (SCCM) | Discharging power (W) | Deposition rate (Å/sec) | Layer thickness (μm) |
|---|---|---|---|---|---|---|
| First layer | | H₂ | 300 | | | |
| | | GeH₄ | 50 | | | |
| | | SiH₄ | 50 | 100 | 10 | 2 |
| | | NH₃ | 10~* | | | |
| Second layer | Layer A | H₂ | 300 | | | |
| | | SiH₄ | 100 | | | |
| | | B₂H₆/H₂ (= 3000 vol ppm) | 100 | 100 | 8 | 3 |
| | | NH₃ | *~** | | | |
| | Layer B | H₂ | 300 | | | |
| | | SiH₄ | 300 | 300 | 24 | 20 |
| | | NH₃ | **~0 | | | |
| Surface layer | | SiH₄ | 20 | | | |

TABLE 12L-continued

| Layer constitution | Starting gas | Gas flow rate (SCCM) | Discharging power (W) | Deposition rate (Å/sec) | Layer thickness (μm) |
|---|---|---|---|---|---|
| | $CH_4$ | 600 | 300 | 1 | 0.32 |

TABLE 13L

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 100 | | | |
| | | NO | 8 | | | |
| | Layer B | $H_2$ | 300 | 100 | 10 | 2 |
| | | $GeH_4$ | 50 | | | |
| | | $SiH_4$ | 50 | | | |
| Second layer | | $H_2$ | 300 | 300 | 24 | 20 |
| | | $SiH_4$ | 300 | | | |
| Surface layer | | $SiH_4$ | 20 | 300 | 1 | 0.32 |
| | | $CH_4$ | 600 | | | |

TABLE 14L

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | $H_2$ | 300 | 100 | 10 | 2 |
| | | $GeH_4$ | 50 | | | |
| | | $SiH_4$ | 50 | | | |
| | | $NH_3$ | 11 | | | |
| | Layer B | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 100 | | | |
| Second layer | | $H_2$ | 300 | 300 | 24 | 20 |
| | | $SiH_4$ | 300 | | | |
| Surface layer | | $SiH_4$ | 20 | 300 | 1 | 0.32 |
| | | $CH_4$ | 600 | | | |

TABLE 15L

| Sample No. | 2701L | 2702L | 2703L | 2704L | 2705L | 2706L | 2707L | 2708L |
|---|---|---|---|---|---|---|---|---|
| $SiH_4:CH_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | X |

⊙: Very good
○: Good
Δ: Practically satisfactory
X: Image defect formed

TABLE 16L

| Sample No. | 2801L | 2802L | 2803L | 2804L | 2805L | 2806L | 2807L | 2808L |
|---|---|---|---|---|---|---|---|---|
| $SiH_4:SiF_4:CH_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | X |

⊙: Very good
○: Good
Δ: Practically satisfactory
X: Image defect formed

TABLE 17L

| Sample No. | 2901L | 2902L | 2903L | 2904L | 2905L | 2906L | 2907L |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C | 9.7:0.3 | 8.8:1.2 | 7.3:2.7 | 4.8:5.2 | 3:7 | 2:8 | 0.8:9.2 |

TABLE 17L-continued

| Sample No. | 2901L | 2902L | 2903L | 2904L | 2905L | 2906L | 2907L |
|---|---|---|---|---|---|---|---|
| (Content ratio) Image quality evaluation | Δ | O | ⊙ | ⊙ | O | Δ | X |

⊙: Very good
O: Good
Δ: Practically satisfactory
X: Image defect formed

TABLE 1M

| Layer constitution | Starting gas | Gas flow rate (SCCM) | Discharging power (W) | Deposition rate (Å/sec) | Layer thickness (μm) |
|---|---|---|---|---|---|
| First layer | H₂ | 300 | 100 | 9 | 3 |
| | GeH₄ | 100 → 0 | | | |
| | SiH₄ | 0 → 100 | | | |
| | B₂H₆/H₂ | GeH₄ + SiH₄ = | | | |
| | (= 3000 vol ppm) | 100 | | | |
| | NO | 12 | | | |
| Second layer | H₂ | 300 | 300 | 24 | 20 |
| | SiH₄ | 300 | | | |
| Surface layer | SiH₄ | | 20 | 1 | 0.32 |
| | CH₄ | | 600 | | |

TABLE 2M

| Layer constitution | Starting gas | Gas flow rate (SCCM) | Discharging power (W) | Deposition rate (Å/sec) | Layer thickness (μm) |
|---|---|---|---|---|---|
| First layer | H₂ | 300 | 100 | 10 | 3 |
| | GeH₄ | 50 → 0 | | | |
| | SiH₄ | 50 → 100 | | | |
| | B₂H₆/H₂ | 100 | | | |
| | (= 3000 vol ppm) | GeH₄ + SiH₄ = 100 | | | |
| | NH₃ | 8 | | | |
| Second layer Layer A | H₂ | 300 | 100 | 8 | 5 |
| | SiH₄ | 100 | | | |
| | B₂H₆/H₂ | 100 | | | |
| | (= 3000 vol ppm) | | | | |
| | NH₃ | 8 | | | |
| Layer B | H₂ | 300 | 300 | 24 | 20 |
| | SiH₄ | 300 | | | |
| | NH₃ | 8 | | | |
| Surface layer | SiH₄ | | 20 | 1 | 0.32 |
| | CH₄ | | 600 | | |

TABLE 3M

| Layer constitution | Starting gas | Gas flow rate (SCCM) | Discharging power (W) | Deposition rate (Å/sec) | Layer thickness (μm) |
|---|---|---|---|---|---|
| First layer | H₂ | 300 | 100 | 10 | 3 |
| | GeH₄ | 100 → 0 | | | |
| | SiH₄ | 0 → 100 | | | |
| | B₂H₆/H₂ | 100 | | | |
| | (= 3000 vol ppm) | GeH₄ + SiH₄ = 100 | | | |
| | N₂O | 10 → 0 | | | |
| Second layer | H₂ | 300 | 300 | 24 | 20 |
| | SiH₄ | 300 | | | |
| Surface layer | SiH₄ | | 20 | 1 | 0.32 |
| | CH₄ | | 600 | | |

TABLE 4M

| Layer constitution | Starting gas | Gas flow rate (SCCM) | Discharging power (W) | Deposition rate (Å/sec) | Layer thickness (μm) |
|---|---|---|---|---|---|
| First layer | H₂ | 300 | 100 | 10 | 3 |
| | GeH₄ | 50 → 0 | | | |
| | SiH₄ | 50 → 100 | | | |
| | B₂H₆/H₂ | 50 | | | |
| | (= 3000 vol ppm) | GeH₄ + SiH₄ = 100 | | | |
| | NO | 10 → * | | | |
| Second layer Layer A | H₂ | 300 | 100 | 8 | 5 |
| | SiH₄ | 100 | | | |
| | B₂H₆/H₂ | 100 | | | |

TABLE 4M-continued

| Layer constitution | Starting gas | Gas flow rate (SCCM) | Discharging power (W) | Deposition rate (Å/sec) | Layer thickness (μm) |
|---|---|---|---|---|---|
| | (= 3000 vol ppm) | | | | |
| | NO | * → ** | | | |
| Layer B | H₂ | 300 | 300 | 24 | 20 |
| | SiH₄ | 300 | | | |
| | NO | ** → 0 | | | |
| Surface layer | SiH₄ | 20 | | 1 | 0.32 |
| | CH₄ | 600 | | | |

TABLE 5M

| Layer constitution | | Starting gas | Gas flow rate (SCCM) | Discharging power (W) | Deposition rate (Å/sec) | Layer thickness (μm) |
|---|---|---|---|---|---|---|
| First layer | | H₂ | 300 | 100 | 10 | 3 |
| | | GeH₄ | 50 → 0 | | | |
| | | SiH₄ | 50 → 100 | | | |
| | | | GeH₄ + SiH₄ = 100 | | | |
| | | NH₃ | 10 → * | | | |
| Second layer | Layer A | H₂ | 300 | 100 | 8 | 5 |
| | | SiH₄ | 100 | | | |
| | | B₂H₆/H₂ | 100 | | | |
| | | (= 3000 vol ppm) | | | | |
| | | NH₃ | * → ** | | | |
| | Layer B | H₂ | 300 | 300 | 24 | 20 |
| | | SiH₄ | 300 | | | |
| | | NH₃ | ** → 0 | | | |
| Surface layer | | SiH₄ | 20 | | 1 | 0.32 |
| | | CH₄ | 600 | | | |

TABLE 6M

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | H₂ | 300 | 100 | 10 | 1.5 |
| | | GeH₄ | 100 → 0 | | | |
| | | SiH₄ | 0 → 100 | | | |
| | | B₂H₆/H₂ | 100 | | | |
| | | (= 3000 vol ppm) | | | | |
| | | N₂O | 10 → * | | | |
| | Layer B | H₂ | 300 | 100 | 10 | 1.5 |
| | | GeH₄ | 50 → 0 | | | |
| | | SiH₄ | 50 → 100 | | | |
| | | N₂O | * → ** | | | |
| Second layer | | H₂ | 300 | 300 | 24 | 20 |
| | | SiH₄ | 300 | | | |
| | | N₂O | ** → 0 | | | |
| Surface layer | | SiH₄ | 20 | | 1 | 0.32 |
| | | CH₄ | 600 | | | |

TABLE 7M

| Sample No. | 2701M | 2702M | 2703M | 2704M | 2705M | 2706M | 2707M | 2708M |
|---|---|---|---|---|---|---|---|---|
| SiH₄:CH₄ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | O | ⊙ | ⊙ | ⊙ | O | Δ | X |

⊙: Very good
O: Good
Δ: Practically satisfactory
X: Image defect formed

TABLE 8M

| Sample No. | 2801M | 2802M | 2803M | 2804M | 2805M | 2806M | 2807M | 2808M |
|---|---|---|---|---|---|---|---|---|
| SiH₄:SiF₄:CH₄ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality | Δ | O | ⊙ | ⊙ | ⊙ | O | Δ | X |

TABLE 8M-continued

| Sample No. | 2801M | 2802M | 2803M | 2804M | 2805M | 2806M | 2807M | 2808M |
|---|---|---|---|---|---|---|---|---|
| evaluation | | | | | | | | |

⊙: Very good
○: Good
Δ: Practically satisfactory
X: Image defect formed

TABLE 9M

| Sample No. | 2901M | 2902M | 2903M | 2904M | 2905M | 2906M | 2907M |
|---|---|---|---|---|---|---|---|
| Si:C Target (Area Ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | ○ | ⊙ | ⊙ | ○ | Δ | X |

⊙: Very good
○: Good
Δ: Practically satisfactory
X: Image defect formed

TABLE 1N

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 10 | 1 |
| | $GeH_4$ | 100 | | | |
| | $SiH_4$ | 100 | | | |
| | $B_2H_6/H_2$ | $B_2H_6/(GeH_4 + SiH_4) =$ | | | |
| | (= 3000 vol ppm) | 3/100 → 0 | | | |
| | NO | 12 | | | |
| Second layer | $H_2$ | 300 | 300 | 24 | 20 |
| | $SiH_4$ | 300 | | | |
| Surface layer | $SiH_4$ | 20 | 300 | 1 | 0.32 |
| | $CH_4$ | 600 | | | |

TABLE 2N

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 14 | 3 |
| | $GeH_4$ | 100 | | | |
| | $SiH_4$ | 50 | | | |
| | $B_2H_6/H_2$ | $B_2H_6/(GeH_4 + SiH_4) =$ | | | |
| | (= 3000 vol ppm) | 5/100 → 0 | | | |
| | $NH_3$ | 10 | | | |
| Second layer | $H_2$ | 300 | 300 | 24 | 20 |
| | $SiH_4$ | 300 | | | |
| | $NH_3$ | 10 | | | |
| Surface layer | $SiH_4$ | 20 | 300 | 1 | 0.32 |
| | $CH_4$ | 600 | | | |

TABLE 3N

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 12 | 5 |
| | $GeH_4$ | 50 | | | |
| | $SiH_4$ | 100 | | | |
| | $B_2H_6/H_2$ | $B_2H_6/(GeH_4 + SiH_4) =$ | | | |
| | (= 3000 vol ppm) | 1/100 → 0 | | | |
| | $N_2O$ | 15 | | | |
| Second layer | $H_2$ | 300 | 300 | 24 | 20 |
| | $SiH_4$ | 300 | | | |
| Surface layer | $SiH_4$ | 20 | 300 | 1 | 0.32 |
| | $CH_4$ | 600 | | | |

TABLE 4N

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 8 | 7 |
| | $GeH_4$ | 15 | | | |
| | $SiH_4$ | 135 | | | |

TABLE 4N-continued

| | Starting gas | Gas flow rate (SCCM) | Discharging power (W) | Deposition rate (Å/sec) | Layer thickness (μm) |
|---|---|---|---|---|---|
| | $B_2H_6/H_2$ (= 3000 vol ppm) | $B_2H_6/(GeH_4 + SiH_4)$ = $1/100 \to 0$ | | | |
| | NO | 15 | | | |
| Second layer | $H_2$ | 300 | 300 | 24 | 20 |
| | $SiH_4$ | 300 | | | |
| | NO | 15 | | | |
| Surface layer | $SiH_4$ | 20 | 300 | 1 | 0.32 |
| | $CH_4$ | 600 | | | |

TABLE 5N

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | $100 \to 110$ | | | |
| | | $NH_3$ | $10 \to 0$ | | | |
| Second layer | Layer A | $H_2$ | 300 | 100 | 10 | 3 |
| | | $SiH_4$ | 100 | | | |
| | | $B_2H_6/H_2$ (= 3000 vol ppm) | $110 \to 0$ | | | |
| | Layer B | $H_2$ | 300 | 300 | 24 | 20 |
| | | $SiH_4$ | 300 | | | |
| Surface layer | | $SiH_4$ | 20 | 300 | 1 | 0.32 |
| | | $CH_4$ | 600 | | | |

TABLE 6N

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 100 | | | |
| | | $N_2O$ | $10 \to 0$ | | | |
| | Layer B | $H_2$ | 300 | 100 | 10 | 2 |
| | | $GeH_4$ | 50 | | | |
| | | $SiH_4$ | 50 | | | |
| Second layer | | $H_2$ | 300 | 300 | 24 | 20 |
| | | $SiH_4$ | 300 | | | |
| Surface layer | | $SiH_4$ | 20 | 300 | 1 | 0.32 |
| | | $CH_4$ | 600 | | | |

TABLE 7N

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | $H_2$ | 300 | 100 | 10 | 2 |
| | | $SiH_4$ | 50 | | | |
| | | $GeH_4$ | 50 | | | |
| | | NO | $10 \to *$ | | | |
| | Layer B | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 100 | | | |
| | | NO | $* \to **$ | | | |
| Second layer | | $H_2$ | 300 | 300 | 24 | 20 |
| | | $SiH_4$ | 300 | | | |
| | | NO | $** \to 0$ | | | |
| Surface layer | | $SiH_4$ | 20 | 300 | 1 | 0.32 |
| | | $CH_4$ | 600 | | | |

TABLE 8N

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 10 | 2 |
| | $SiH_4$ | 50 | | | |
| | $GeH_4$ | 50 | | | |
| | $B_2H_6/H_2$ | $100 \to 110$ | | | |

TABLE 8N-continued

| Layer constitution | | Starting gas | Gas flow rate (SCCM) | Discharging power (W) | Deposition rate (Å/sec) | Layer thickness (μm) |
|---|---|---|---|---|---|---|
| Second layer | Layer A | NH$_3$ (= 3000 vol ppm) H$_2$ GeH$_4$ SiH$_4$ B$_2$H$_6$/H$_2$ (= 3000 vol ppm) | 10 → * 300 50 50 100 | 100 | 8 | 3 |
| | Layer B | NH$_3$ H$_2$ SiH$_4$ | * → ** 300 300 | 300 | 24 | 20 |
| Surface layer | | NH$_3$ SiH$_4$ CH$_4$ | ** → 0 20 600 | 300 | 1 | 0.32 |

TABLE 9N

| Sample No. | 2701N | 2702N | 2703N | 2704N | 2705N | 2706N | 2707N | 2708N |
|---|---|---|---|---|---|---|---|---|
| SiH$_4$:CH$_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | O | ⊙ | ⊙ | ⊙ | O | Δ | X |

⊙: Very good
O: Good
Δ: Practically satisfactory
X: Image defect formed

TABLE 10N

| Sample No. | 2801N | 2802N | 2803N | 2804N | 2805N | 2806N | 2807N | 2808N |
|---|---|---|---|---|---|---|---|---|
| SiH$_4$:SiF$_4$:CH$_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | O | ⊙ | ⊙ | ⊙ | O | Δ | X |

⊙: Very good
O: Good
Δ: Practically satisfactory
X: Image defect formed

TABLE 11N

| Sample No. | 2901N | 2902N | 2903N | 2904N | 2905N | 2906N | 2907N |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | O | ⊙ | ⊙ | O | Δ | X |

⊙: Very good
O: Good
Δ: Practically satisfactory
X: Image defect formed

TABLE 1P

| Layer constitution | Starting gas | Gas flow rate (SCCM) | Discharging power (W) | Deposition rate (Å/sec) | Layer thickness (μm) |
|---|---|---|---|---|---|
| First layer | H$_2$ GeH$_4$ SiH$_4$ B$_2$H$_6$/H$_2$ (= 3000 vol ppm) NO | 300 100 → 0 0 → 100 GeH$_4$ + SiH$_4$ = 100 150 → 0 12 | 100 | 9 | 3 |
| Second layer | H$_2$ SiH$_4$ | 300 300 | 300 | 24 | 20 |
| Surface layer | SiH$_4$ CH$_4$ | 20 600 | 300 | 1 | 0.32 |

TABLE 2P

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 50 → 0 | | | |
| | $SiH_4$ | 50 → 100 | | | |
| | | $GeH_4 + SiH_4 = 100$ | | | |
| | $B_2H_6/H_2$ (= 3000 vol ppm) | 50 → 0 | | | |
| | $NH_3$ | 12 | | | |
| Second layer | $H_2$ | 300 | 300 | 24 | 20 |
| | $SiH_4$ | 300 | | | |
| | $NH_3$ | 12 | | | |
| Surface layer | $SiH_4$ | 20 | 300 | 1 | 0.32 |
| | $CH_4$ | 600 | | | |

TABLE 3P

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 10 | 2 |
| | $GeH_4$ | 50 → 0 | | | |
| | $SiH_4$ | 50 → 100 | | | |
| | $N_2O$ | 15 | | | |
| Second layer Layer A | $H_2$ | 300 | 100 | 10 | 3 |
| | $SiH_4$ | 100 | | | |
| | $B_2H_6/H_2$ (= 3000 vol ppm) | 100 → 0 | | | |
| Layer B | $H_2$ | 300 | 300 | 24 | 20 |
| | $SiH_4$ | 300 | | | |
| Surface layer | $SiH_4$ | 20 | 300 | 1 | 0.32 |
| | $CH_4$ | 600 | | | |

TABLE 4P

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 10 | 2 |
| | $GeH_4$ | 50 → 0 | | | |
| | $SiH_4$ | 50 → 100 | | | |
| | $B_2H_6/H_2$ (= 3000 vol ppm) | 100 | | | |
| | NO | 10 | | | |
| Second layer Layer A | $H_2$ | 300 | 100 | 10 | 3 |
| | $SiH_4$ | 100 | | | |
| | $B_2H_6/H_2$ (= 3000 vol ppm) | 100 → 0 | | | |
| | NO | 10 | | | |
| Layer B | $H_2$ | 300 | 300 | 24 | 20 |
| | $SiH_4$ | 300 | | | |
| | NO | 10 | | | |
| Surface layer | $SiH_4$ | 20 | 300 | 1 | 0.32 |
| | $CH_4$ | 600 | | | |

TABLE 5P

| Layer constitution | Starting gas | Gas flow rate (SCCM) | Discharging power (W) | Deposition rate (Å/sec) | Layer thickness (μm) |
|---|---|---|---|---|---|
| First layer Layer A | $H_2$ | 300 | 100 | 10 | 2 |
| | $GeH_4$ | 50 → 25 | | | |
| | $SiH_4$ | 50 → 75 | | | |
| | $B_2H_6/H_2$ (= 3000 vol ppm) | 100 → 0 | | | |
| | $NH_3$ | 10 | | | |
| Layer B | $H_2$ | 300 | 100 | 10 | 2 |
| | $GeH_4$ | 25 → 0 | | | |
| | $SiH_4$ | 75 → 100 | | | |
| | $NH_3$ | 10 | | | |
| Second layer | $H_2$ | 300 | 300 | 24 | 20 |
| | $SiH_4$ | 300 | | | |
| Surface layer | $SiH_4$ | 20 | 300 | 1 | 0.32 |
| | $CH_4$ | 600 | | | |

TABLE 6P

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 10 | 2 |
| | $GeH_4$ | 50→0 | | | |
| | $SiH_4$ | 50→100 | | | |
| | $B_2H_6/H_2$ | 100→110 | | | |
| | (=3000 vol ppm) | | | | |
| | $NH_3$ | 10→0 | | | |
| Second layer | | | | | |
| Layer A | $H_2$ | 300 | | | |
| | $SiH_4$ | 100 | 100 | 10 | 3 |
| | $B_2H_6/H_2$ | 110→0 | | | |
| | (=3000 vol ppm) | | | | |
| Layer B | $H_2$ | 300 | 300 | 24 | 20 |
| | $SiH_4$ | 300 | | | |
| Surface layer | $SiH_4$ | 20 | 300 | 1 | 0.32 |
| | $CH_4$ | 600 | | | |

TABLE 7P

| Layer constitution | Starting gas | Gas flow rate (SCCM) | Discharging power (W) | Deposition rate (Å/sec) | Layer thickness (μm) |
|---|---|---|---|---|---|
| First layer | | | | | |
| Layer A | $H_2$ | 300 | 100 | 10 | 2 |
| | $GeH_4$ | 50→* | | | |
| | $SiH_4$ | 50→** | | | |
| | $B_2H_6/H_2$ | 100 | | | |
| | (=3000 vol ppm) | | | | |
| | $N_2O$ | 10→0 | | | |
| Layer B | $H_2$ | 300 | 100 | 10 | 2 |
| | $GeH_4$ | *→0 | | | |
| | $SiH_4$ | **→100 | | | |
| Second layer | $H_2$ | 300 | 300 | 24 | 20 |
| | $SiH_4$ | 300 | | | |
| Surface layer | $SiH_4$ | 20 | 300 | 1 | 0.32 |
| | $CH_4$ | 600 | | | |

TABLE 8P

| Layer constitution | Starting gas | Gas flow rate (SCCM) | Discharging power (W) | Deposition rate (Å/sec) | Layer thickness (μm) |
|---|---|---|---|---|---|
| First layer | | | | | |
| Layer A | $H_2$ | 300 | 100 | 10 | 2 |
| | $GeH_4$ | 50 | | | |
| | $SiH_4$ | 50 | | | |
| | NO | 10→* | | | |
| Layer B | $H_2$ | 300 | 100 | 10 | 2 |
| | $GeH_4$ | 50→0 | | | |
| | $SiH_4$ | 50→100 | | | |
| | $B_2H_6/H_2$ | 100 | | | |
| | (=3000 vol ppm) | | | | |
| | NO | *→** | | | |
| Second layer | $H_2$ | 300 | 300 | 24 | 20 |
| | $SiH_4$ | 300 | | | |
| | NO | **→0 | | | |
| Surface layer | $SiH_4$ | 20 | 300 | 1 | 0.32 |
| | $CH_4$ | 600 | | | |

TABLE 9P

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 10 | 2 |
| | $GeH_4$ | 50 | | | |
| | $SiH_4$ | 50 | | | |
| | $B_2H_6/H_2$ | 100 | | | |
| | (=3000 vol ppm) | | | | |
| | $NH_3$ | 10→* | | | |
| Second layer | | | | | |
| Layer A | $H_2$ | 300 | 100 | 8 | 3 |
| | $GeH_4$ | 50→0 | | | |
| | $SiH_4$ | 50→100 | | | |
| | $B_2H_6/H_2$ | 100 | | | |
| | (=3000 vol ppm) | | | | |
| | $NH_3$ | *→** | | | |
| Layer B | $H_2$ | 300 | 300 | 24 | 20 |

TABLE 9P-continued

| Layer constitution | Starting gas | Gas flow rate (SCCM) | Discharging power (W) | Deposition rate (Å/sec) | Layer thickness (μm) |
|---|---|---|---|---|---|
| Surface layer | SiH$_4$<br>NH$_3$<br>SiH$_4$<br>CH$_4$ | 300<br>**→0<br>20<br>600 | 300 | 1 | 0.32 |

TABLE 10P

| Sample No. | 2701P | 2702P | 2703P | 2704P | 2705P | 2706P | 2707P | 2708P |
|---|---|---|---|---|---|---|---|---|
| SiH$_4$:CH$_4$ (Flow rate ratio) | 9:1 | 3:4 | 4:3 | 1:10 | 1:30 | 1:60 | 1:100 | 1:150 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | X |

⊙: Very good
○: Good
Δ: Practically satisfactory
X: Image defect formed

TABLE 11P

| Sample No. | 2801P | 2802P | 2803P | 2804P | 2805P | 2806P | 2807P | 2808P |
|---|---|---|---|---|---|---|---|---|
| SiH$_4$:SiF$_4$:CH$_4$ (Flow rate ratio) | 5:4:1 | 3:3.5:3.5 | 1:1:6 | 1:1:20 | 1:0.4:30 | 1:1:100 | 1:0.5:150 | 1:1:200 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | X |

⊙: Very good
○: Good
Δ: Practically satisfactory
X: Image defect formed

TABLE 12P

| Sample No. | 2901P | 2902P | 2903P | 2904P | 2905P | 2906P | 2907P |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | ○ | ⊙ | ⊙ | ○ | Δ | X |

⊙: Very good
○: Good
Δ: Practically satisfactory
X: Image defect formed

What we claim is:

1. A light-receiving member comprising a substrate having a large number of protruding portions on a surface thereof, each of said protruding portions having at a predetermined cut position a sectional shape comprising a main projection and a subprojection, the main projection and the subprojection overlapping each other, and a light-receiving layer comprising a layer comprising an amorphous material containing silicon atoms, at least a part of the layer region of which has photosensitivity and a surface layer comprising an amorphous material containing silicon atoms and carbon atoms.

2. A light-receiving member, which comprises a substrate having a large number of protruding portions on a surface thereof, each of said protruding portions having at a predetermined cut position a sectional shape comprising a main projection and a subprojection, the main projection and the subprojection overlapping each other, and a light-receiving layer of a multi-layer structure having a first layer comprising an amorphous material containing silicon atoms and germanium atoms, a second layer comprising an amorphous material containing silicon atoms and exhibiting photoconductivity, and a surface layer comprising an amorphous material containing silicon atoms and carbon atoms provided on said substrate successively from the substrate side.

3. An electrophotographic system comprising a light-receiving member comprising a substrate having a large number of protruding portions on a surface thereof, each of said protruding portions having at a predetermined cut position a sectional shape comprising a main projection and a subprojection, the main projection and the subprojection overlapping each other, and a light-receiving layer of a multi-layer structure having a first layer comprising an amorphous material containing silicon atoms and germanium atoms and a second layer comprising an amorphous material containing silicon atoms and exhibiting photoconductivity, and a surface layer comprising an amorphous material containing silicon atoms and carbon atoms provided on said substrate successively from the substrate side.

4. The invention according to claim 2 or 3, wherein hydrogen atoms are contained in at least one of the first layer and the second layer.

5. The invention according to claim 2 or 3, wherein halogen atoms are contained in at least one of the first layer and the second layer.

6. The invention according to claim 2 or 3, wherein the distribution state of germanium atoms in the first layer is nonuniform in the layer thickness direction.

7. The invention according to claim 2 or 3, the nonuniform distribution state of germanium atoms is such that the distribution concentration is enriched on the substrate side.

8. The invention according to claim 2 or 3, wherein a substance for controlling conductivity is contained in the first layer.

9. The invention according to claim 2 or 3, wherein the substance for controlling conductivity is an atom belonging to the group III or the group V of the periodic table.

10. The invention according to claim 2 or 3, wherein a substance for controlling conductivity is contained in the second layer.

11. The invention according to claim 8 or 10, wherein the substance for controlling conductivity is an atom belonging to the group III or the group V of the periodic table.

12. The invention according to claim 2 or 3, wherein the light-receiving layer has a layer region (PN) containing a substance for controlling conductivity.

13. The invention according to claim 12, wherein the distribution state of the substance for controlling conductivity in the layer region (PN) is nonuniform in the layer thickness direction.

14. The invention according to claim 12, wherein the distribution state of the substance for controlling conductivity in the layer region (PN) is uniform in the layer thickness direction.

15. The invention according to claim 12, wherein the substance for controlling conductivity is an atom belonging to the group III or the group V of the periodic table.

16. The invention according to claim 12, wherein the layer region (PN) is provided in the first layer.

17. The invention according to claim 12, wherein the layer region (PN) is provided in the second layer.

18. The invention according to claim 12, wherein the layer region (PN) is provided at the end portion on the substrate side of the light-receiving layer.

19. The invention according to claim 12, wherein the layer region (PN) is provided extending over the first layer and the second layer.

20. The invention according to claim 12, wherein the layer region (PN) occupies a part of the layer region in the light-receiving layer.

21. The invention according to claim 20, wherein the content of the substance for controlling conductivity in the layer region (PN) is 0.01 to $5 \times 10^4$ atomic ppm.

22. The invention according to claim 2 or 3, wherein 0.01 to 40 atomic % of hydrogen atoms are contained in the first layer.

23. The invention according to claim 2 or 3, wherein 0.01 to 40 atomic % of halogen atoms are contained in the first layer.

24. The invention according to claim 2 or 3, wherein 0.01 to 40 atomic % as a total of hydrogen atoms and halogen atoms are contained in the first layer.

25. The invention according to claim 2 or 3, wherein 1 to 40 atomic % of hydrogen atoms are contained in the second layer.

26. The invention according to claim 2 or 3, wherein 1 to 40 atomic % of halogen atoms are contained in the second layer.

27. The invention according claim 2 or 3, wherein 1 to 40 atomic % as a total of hydrogen atoms and halogen atoms are contained in the second layer.

28. The invention according to claim 2 or 3, wherein the light-receiving layer contains at least one kind of atoms selected from oxygen atoms and nitrogen atoms.

29. The invention according to claim 2 or 3, wherein the light-receiving layer has a layer region (ON) containing at least one kind of atoms selected from oxygen atoms and nitrogen atoms.

30. The invention according to claim 29, wherein the layer region (ON) is provided at the end portion on the substrate side of the light-receiving layer.

31. The invention according to claim 30, wherein the layer region (ON) contains 0.001 to 50 atomic % of oxygen atoms.

32. The invention according to claim 30, wherein the layer region (ON) contains 0.001 to 50 atomic % of nitrogen atoms.

33. The invention according to claim 29, wherein the layer region (ON) contains oxygen atoms in nonuniform distribution state in the layer thickness direction.

34. The invention according to claim 29, wherein the layer region (ON) contains oxygen atoms in uniform distribution state in the layer thickness direction.

35. The invention according to claim 29, wherein the layer region (ON) contains nitrogen atoms in nonuniform distribution state in the layer thickness direction.

36. The invention according to claim 29, wherein the layer region (ON) contains nitrogen atoms in uniform distribution state in the layer thickness direction.

37. The invention according to claim 2 or 3, wherein the first layer has a layer thickness of 30 Å to 50 $\mu$.

38. The invention according to claim 2 or 3, wherein the second layer has a layer thickness of 0.5 to 90 $\mu$.

39. The invention according to claim 2 or 3, wherein the light-receiving layer has a layer thickness of 1 to 100 $\mu$.

40. The invention according to claim 2 or 3, wherein the thickness $T_B$ of the first layer and the thickness T of the second layer satisfy the relationship of $T_B/T \leq 1$.

41. An electrophotographic system comprising a light-receiving member comprising a substrate having a large number of protruding portions on a surface thereof, each of said protruding portions having at a predetermined cut position a sectional shape comprising a main projection and a subprojection, the main projection and the sub-projection overlapping each other, and a light-receiving layer comprising a layer comprising an amorphous material containing silicon atoms, at least a part of the layer region of which has photosensitivity and a surface layer comprising an amorphous material containing silicon atoms and carbon atoms.

42. The invention according to claim 1, 2, 3 or 41, wherein said protruding portions are arranged regularly.

43. The invention according to claim 1, 2, 3 or 41, wherein said protruding portions are arranged in cycles.

44. The invention according to claim 1, 2, 3 or 41, wherein each of said protruding portions has the same shape as the first order approximation.

45. The invention according to claim 1, 2, 3 or 41, wherein said protruding portions have a plurality of subprojections.

46. The invention according to claim 1, 2, 3 or 41, wherein said sectional shape of said protruding portion is symmetrical with the main projection as its center.

47. The invention according to claim 1, 2, 3 or 41, wherein said sectional shape of said protruding portion is asymmetrical with the main projection as its center.

48. The invention according to claim 1, 2, 3 or 41, wherein said protruding portion is formed by mechanical working.

49. The invention according to claim 1 or 41, wherein the layer at least a part of the layer region of which has photosensitivity contains at least one kind of atoms selected from oxygen atoms and nitrogen atoms in uniform distribution state in the layer thickness direction.

50. The invention according to claim 1 or 41, wherein the layer at least a part of the layer region of which has photosensitivity contains at least one kind of atoms selected from oxygen atoms and nitrogen atoms in nonuniform distribution state in the layer thickness direction.

51. The invention according to claim 50, wherein the nonuniform distribution state is such that the distribution concentration curve has a portion in which the distribution concentration is decreased toward the free surface side of the layer at least a part of the layer region of which has photosensitivity.

52. The invention according to claim 50, wherein the nonuniform distribution state is such that the distribution concentration curve has a portion in which the distribution concentration is increased toward the side of the substrate.

53. The invention according to claim 50, wherein the nonuniform distribution state is such that the distribution concentration curve has a maximum distribution concentration in the end layer region on the substrate side of the layer at least a part of the layer region of which has photosensitivity.

54. The invention according to claim 1 or 41, wherein a substance (C) for controlling conductivity is contained in the layer at least a part of the layer region of which has photosensitivity.

55. The invention according to claim 54 wherein a substance (C) for controlling conductivity is an atom belonging to the Group III or the Group V of the periodic table.

56. The invention according to claim 54, wherein the substance (C) for controlling conductivity is an atom selected from among B, Al, Ga In, Tl, P, As, Sb and Bi.

57. The invention according to claim 1 or 41, wherein the layer at least a part of the layer region of which has photosensitivity has a layer region (PN) containing a substance for controlling conductivity.

58. The invention according to claim 57, wherein the distribution state of the substance for controlling conductivity in the layer region (PN) is uniform in the layer thickness direction.

59. The invention according to claim 57, wherein the substance for controlling conductivity is an atom belonging to the group III or the group V of the periodic table.

60. The invention according to claim 57, wherein the layer region (PN) is provided at the end portion on the substrate side of the layer at least a part of the layer region of which has photosensitivity.

61. The invention according to claim 57, wherein the layer region (PN) occupies a part of the layer region in the layer at least a part of the layer region of which has photosensitivity.

62. The invention according to claim 61, wherein the content of the substance for controlling conductivity in the layer region (PN) is 0.01 to $5 \times 10^4$ atomic ppm.

63. The invention according to claim 1 or 41, wherein at least either hydrogen atoms or halogen atoms are contained in the layer at least a part of the layer region of which has photosensitivity.

64. The invention according to claim 1 or 41, wherein 0.01 to 40 atomic % of hydrogen atoms are contained in the layer at least a part of the layer region of which has photosensitivity.

65. The invention according to claim 1 or 41, wherein 0.01 to 40 atomic % of halogen atoms are contained in the layer at least of a part of the layer region of which has photosensitivity.

66. The invention according to claim 1 or 41, wherein 0.01 to 40 atomic % as a total of hydrogen atoms and halogen atoms are contained in the layer at least a part of the layer region of which has photosensitivity.

67. The invention according to claim 1 or 41, wherein the layer at least a part of the layer region of which has photosensitivity has a layer region (ON) containing at least one kind of atoms selected from oxygen atoms and nitrogen atoms.

68. The invention according to claim 67, wherein the layer region (ON) is provided at the end portion on the substrate side of the layer at least a part of the layer region of which has photosensitivity.

69. The invention according to claim 68, wherein the layer region (ON) contains 0.001 to 50 atomic % of oxygen atoms.

70. The invention according to claim 68, wherein the layer region (ON) contains 0.001 to 50 atomic % of nitrogen atoms.

71. The invention according to claim 67, wherein the layer region (ON) contains oxygen atoms in nonuniform distribution state in the layer thickness direction.

72. The invention according to claim 67, wherein the layer region (ON) contains oxygen atoms in uniform distribution state in the layer thickness direction.

73. The invention according to claim 67, wherein the layer region (ON) contains nitrogen atoms in nonuniform distribution state in the layer thickness direction.

74. The invention according to claim 67, wherein the layer region (ON) contains nitrogen atoms in uniform distribution state in the layer thickness direction.

75. The invention according to claim 1 or 41, wherein the layer at least a part of the layer region of which has photosensitivity has a layer thickness of 1 to 100 $\mu$.

76. The invention according to claim 1, 2, 3 or 41, wherein the surface layer is comprised of a-$(Si_xC_{1-x})_y(H,X)_{1-y}$ (wherein $0 < x$, $y \leq 1$).

77. The invention according to claim 1, 2, 3 or 41, wherein the amount of carbon atoms contains in the surface layer is $1 \times 10^{-3}$ to 90 atomic %.

78. The invention according to claim 1, 2, 3 or 41, wherein hydrogen atoms are contained in the surface layer.

79. The invention according to claim 1, 2, 3 or 41, halogen atoms are contained in the surface layer.

80. The invention according to claim 1, 2, 3 or 41, wherein the surface layer has a layer thickness of 0,003 to 30 $\mu$.

81. An electrophotographic image forming process comprising:
 (a) applying a charging treatment to the light receiving member of claim 1 or 2;
 (b) irradiating the light receiving member with a laser beam carrying information to form an electrostatic latent image; and
 (c) developing said electrostatic latent image.

* * * * *

UNITED STATES PATENT AND TRADEMARK OFFICE
CERTIFICATE OF CORRECTION

PATENT NO. : 4,705,734
DATED : November 10, 1987
INVENTOR(S) : KEISHI SAITOH, ET AL.

Page 1 of 17

It is certified that error appears in the above-identified patent and that said Letters Patent is hereby corrected as shown below:

On the title page

AT [22]

"Filed: Jun. 30, 1985" should read
--Filed: Jun. 3, 1985--.

AT [56] IN THE REFERENCES

U.S. Patent Documents, "Shirnizu et al." should read
--Shimizu et al.--.

COLUMN 1

Line 11, "726,768," should read --726,768;--.
Line 11, "739,867," should read --739,867;--.
Line 11, "740,714;" should be deleted.
Line 16, "light receiving-member" should read
 --light-receiving member--.

COLUMN 2

Line 2, "ohotosensitive" should read --photosensitive--.
Line 9, "easiness" should read --ease--.

COLUMN 3

Line 14, "sized" should read --sizes--.

COLUMN 4

Line 5, "so much" should read --greatly--.

UNITED STATES PATENT AND TRADEMARK OFFICE
CERTIFICATE OF CORRECTION

PATENT NO. : 4,705,734
DATED : November 10, 1987
INVENTOR(S) : KEISHI SAITOH, ET AL.

Page 2 of 17

It is certified that error appears in the above-identified patent and that said Letters Patent is hereby corrected as shown below:

COLUMN 5

Line 49, "illustration" should read --illustrations--.

COLUMN 6

Line 16, "accompnaying" should read --accompanying--.
Line 68, "difraction" should read --diffraction--.

COLUMN 7

Line 44, "a" should read --an--.
Line 59, "bite" should read --bit--.

COLUMN 8

Line 27, "in" should be deleted.
Line 52, "more" should be deleted.
Line 53, "is" should read --in--.

COLUMN 9

Line 31, "quality of" should read --quality, of--.
Line 44, "now" should read --now to--.
Line 57, "Pd etc." should read --Pd, etc.--.

COLUMN 10

Line 19, "lightreceiving" should read --light-receiving--.
Line 53, "be suitably be" should read --suitably be--.

UNITED STATES PATENT AND TRADEMARK OFFICE
CERTIFICATE OF CORRECTION

PATENT NO. : 4,705,734
DATED : November 10, 1987
INVENTOR(S) : KEISHI SAITOH, ET AL.

It is certified that error appears in the above-identified patent and that said Letters Patent is hereby corrected as shown below:

COLUMN 12

Lines 1-2, "so called" should read --so-called--.
Line 12, "embodient" should read --embodiment--.
Line 15, "substrate" should read --substrate 1001--.
Line 16, "1001," should read --1004,--.
Line 36, "layer 1001)." should read --layer 1000).--.
Line 55, "g" should be deleted.
Line 59, "as" should be deleted.
Line 61, "great," should read --greatly,--.

COLUMN 15

Line 3, "are" should read --is--.
Line 43, "bormine" should read --bromine--.

COLUMN 16

Line 10, "easiness" should read --ease--.
Line 18, "easiness" should read --ease--.
Line 39, "so called" should read --so-called--.

COLUMN 17

Line 1, "ion plating" should read --ion-plating--.

COLUMN 19

Line 9, "depending on" should be deleted.
Line 39, "so called" should read --so-called--.
Line 42, "condutivity" should read --conductivity--.
Line 57, "be suitably be" should read --suitably be--.

UNITED STATES PATENT AND TRADEMARK OFFICE
CERTIFICATE OF CORRECTION

PATENT NO. : 4,705,734
DATED : November 10, 1987
INVENTOR(S) : KEISHI SAITOH, ET AL.

It is certified that error appears in the above-identified patent and that said Letters Patent is hereby corrected as shown below:

COLUMN 20

Line 49, "so called" should read --so-called--.
Lines 54-55, "so called" should read --so-called--.
Line 67, "($1<i<90$ or Ci ($1<i<17$)" should read --($1\leq i\leq 90$ or Ci ($1\leq i\leq 17$)--.

COLUMN 21

Line 64, "substance C" should read --substance (C)--.

COLUMN 22

Line 18, "shown" should read --shown in--.
Line 20, "tc" should read --to--.
Line 58, "Typical" should read --As typical--.
Line 60, "for *" should read --for--.

COLUMN 23

Line 45, "ihterface" should read --interface--.

COLUMN 27

Line 4, "Si" should read --$Si_3N_4$--.

COLUMN 29

Line 38, "in to" should read --into--.
Line 51, "a a" should read --a--.
Line 58, "sunstances" should read --substances--.

UNITED STATES PATENT AND TRADEMARK OFFICE
CERTIFICATE OF CORRECTION

PATENT NO. : 4,705,734
DATED : November 10, 1987
INVENTOR(S) : KEISHI SAITOH, ET AL.

It is certified that error appears in the above-identified patent and that said Letters Patent is hereby corrected as shown below:

COLUMN 30

Line 35, "disired" should read --desired--.
Line 38, "prererably" should read --preferably--.

COLUMN 31

Line 59, "0.82-0.99," should read --0.82 to 0.99,--.
Line 66, "be also" should read --also be--.

COLUMN 32

Line 12, "borne" should read --formed--.
Line 28, "an" should be deleted.

COLUMN 33

Line 32, "2002 to 2006, there" should read --2002 to 2006 and 2045, there--.
Line 37, "contaiing" should read --containing--.
Line 65, "2029 2030" should read --2029, 2030--.

COLUMN 34

Line 56, "The present inven-" should be deleted.
Line 57 should be deleted.
Line 58, "ples." should be deleted.

UNITED STATES PATENT AND TRADEMARK OFFICE
CERTIFICATE OF CORRECTION

PATENT NO. : 4,705,734

DATED : November 10, 1987

INVENTOR(S) : KEISHI SAITOH, ET AL.

It is certified that error appears in the above-identified patent and that said Letters Patent is hereby corrected as shown below:

COLUMN 35

Line 22, "205" should read --1205--.
Line 35, "SiH$_4$ gas in 1261" should read --SiH$_4$ gas in 1262--.
Line 45, "is" should read --was--.

COLUMN 36

Line 7, "light-receiivng" should read --light-receiving--.
Line 51, "member" should read --members--.

COLUMN 37

Line 13, "exposured" should read --exposure--.
Line 23, "exposured" should read --exposure--.
Line 59, "pattern" should read --fringe pattern--.

COLUMN 38

Lines 8-9, "quality images." should read --quality.--.

COLUMN 39

Line 21, "1261-1266" should read --1261-1265--.
Line 29, "SiH$_4$ gas in 1261" should read --SiH$_4$ gas in 1262--.
Line 59, "st" should read --set--.

UNITED STATES PATENT AND TRADEMARK OFFICE
CERTIFICATE OF CORRECTION

PATENT NO. : 4,705,734
DATED : November 10, 1987
INVENTOR(S) : KEISHI SAITOH, ET AL.

It is certified that error appears in the above-identified patent and that said Letters Patent is hereby corrected as shown below:

COLUMN 40

Lines 9-10, "semicondcutor" should read --semiconductor--.
Line 47, "member" should read --members--.
Line 64, "exposured" should read --exposure--.

COLUMN 41

Line 10, "exposured" should read --exposure--.
Line 20, "exposured" should read --exposure--.
Line 62, "FIG. 5B" should read --Table 5B--.

COLUMN 42

Lines 5-6, "quality images." should read --quality.--.

COLUMN 43

Line 26, "SiH$_4$ gas in 1261" should read --SiH$_4$ gas in 1262--.
Line 44, "and a" should read --and an--.

COLUMN 44

Line 10, "photography" should be deleted.
Line 27, "are" should read --were--.
Line 48, "member" should read --members--.

UNITED STATES PATENT AND TRADEMARK OFFICE
CERTIFICATE OF CORRECTION

PATENT NO. : 4,705,734

DATED : November 10, 1987

INVENTOR(S) : KEISHI SAITOH, ET AL.

It is certified that error appears in the above-identified patent and that said Letters Patent is hereby corrected as shown below:

COLUMN 45

Line 10, "exposured" should read --exposure--.
Line 20, "exposured" should read --exposure--.

COLUMN 46

Lines 9-10, "quality images." should read --quality.--.

COLUMN 47

Line 4, "FIG. 26," should read --FIG. 66--.
Line 7, "member" should read --members--.

COLUMN 48

Lines 11-12, "electropotography" should read --electrophotography--.
Line 38, "electrography" should read --electrophotography--.

COLUMN 49

Line 3, "member" should read --members--.
Line 6, "tranfer" should read --transfer--.
Line 42, "exposured" should read --exposure--.
Lines 43-44, "forming" should read --formation--.

UNITED STATES PATENT AND TRADEMARK OFFICE
CERTIFICATE OF CORRECTION

PATENT NO. : 4,705,734

DATED : November 10, 1987

INVENTOR(S) : KEISHI SAITOH, ET AL.

It is certified that error appears in the above-identified patent and that said Letters Patent is hereby corrected as shown below:

COLUMN 51

Lines 28-54, "Deposition of the surface layer . . . on the entire surface layer" should be inserted in Column 51, line 1, between "FIG. 22." and "of the cathod electrode".

Line 37, "electrography" should read --electrophotography--.

COLUMN 52

Line 4, "exposured" should read --exposure--.
Line 14, "exposured" should read --exposure--.
Line 51, "tarnsfer" should read --transfer--.

COLUMN 53

Line 17, "cylidrical" should read --cylindrical--.
Line 52, "mass" should read --mass flow--.
Line 67, "interference pattern" should read --interference fringe pattern--.

COLUMN 54

Line 24, "member" should read --members--.
Line 53, "exposured" should read --exposure--.
Line 56, "reuslts." should read --results--.
Line 64, "exposured" should read --exposure--.
Line 66, "repeated times" should read --repeated about 50,000 times--.

UNITED STATES PATENT AND TRADEMARK OFFICE
CERTIFICATE OF CORRECTION

PATENT NO. : 4,705,734

DATED : November 10, 1987

INVENTOR(S) : KEISHI SAITOH, ET AL.

It is certified that error appears in the above-identified patent and that said Letters Patent is hereby corrected as shown below:

COLUMN 59

Line 41, "electrography" should read --electrophotography--.
Line 48, "interference" should read --interference fringe--.

COLUMN 60

Line 4, "member" should read --members--.
Line 6, "with laser" should be deleted.
Line 33, "exposured" should read --exposure--.
Line 43, "exposured" should read --exposure--.

COLUMN 61

Line 64, "EXAMPLE 86" should be centered.

COLUMN 63

Line 59, "interference" should read --interference fringe--.
Line 67, "are" should read --were--.

COLUMN 64

Line 10, "tartet" should read --target--.
Line 15, "member" should read --members--.
Line 45, "exposured" should read --exposure--.
Line 55, "exposured" should read --exposure--.

COLUMN 66

Lines 67-68, "other wise" should read --otherwise--.

UNITED STATES PATENT AND TRADEMARK OFFICE
CERTIFICATE OF CORRECTION

PATENT NO. : 4,705,734
DATED : November 10, 1987
INVENTOR(S) : KEISHI SAITOH, ET AL.

It is certified that error appears in the above-identified patent and that said Letters Patent is hereby corrected as shown below:

COLUMN 67

Line 56, "electrography" should read --electrophotography--.

COLUMN 68

Line 3, "are" should read --were--.
Line 14, "tartet" should read --target--.
Line 19, "member" should read --members--.

COLUMN 71

Line 13, "electrography" should read --electrophotography--.

COLUMN 72

Line 63, "electrography" should read --electrophotography--.

COLUMN 75

Lines 13-14, "Table 16," should read --Table 16J,--.
Line 49, "exposured" should read --exposure--.

COLUMN 76

Line 36, "outerdiameter" should read --outer diameter--.
Line 67, "interference" should read --interference fringe--.

COLUMN 77

Line 43, "outerdiameter" should read --outer diameter--.

UNITED STATES PATENT AND TRADEMARK OFFICE
CERTIFICATE OF CORRECTION

PATENT NO. : 4,705,734
DATED : November 10, 1987
INVENTOR(S) : KEISHI SAITOH, ET AL.

It is certified that error appears in the above-identified patent and that said Letters Patent is hereby corrected as shown below:

COLUMN 78

Line 47, "outerdiameter" should read --outer diameter--.

COLUMN 79

Line 67, "outerdiameter" should read --outer diameter--.

COLUMN 81

Line 22, "electrography" should read --electrophotography--.

COLUMN 82

Lines 62-63, "under the same conditions" should read --similarly--.

COLUMN 83

Lines 16-17, "under the same conditions" should read --similarly--.
Lines 39-40, "under the same conditions" should read --similarly--.

COLUMN 84

Line 33, "outerdiameter" should read --outer diameter--.
Line 56, "outerdiameter" should read --outer diameter--.

COLUMN 85

Line 45, "was" should read --were--.

UNITED STATES PATENT AND TRADEMARK OFFICE
CERTIFICATE OF CORRECTION

PATENT NO. : 4,705,734
DATED : November 10, 1987
INVENTOR(S) : KEISHI SAITOH, ET AL.

It is certified that error appears in the above-identified patent and that said Letters Patent is hereby corrected as shown below:

COLUMN 87

Line 48, "member" should read --members--.

COLUMN 88

Line 19, "GwH4" should read --GeH$_4$--.

COLUMN 90

Line 2, "under the same conditions" should read --similarly--.
Line 27, "under the same conditions" should read --similarly--.
Line 49, "vom" should read --vol--.
Line 64, "was" should read --were--.

COLUMN 91

Line 13, "was" should read --were--.

COLUMN 94

Line 18, "of lathe," should read --of a lathe,--.

COLUMN 96

Line 57, "was" should read --were--.

UNITED STATES PATENT AND TRADEMARK OFFICE
CERTIFICATE OF CORRECTION

PATENT NO. : 4,705,734
DATED : November 10, 1987
INVENTOR(S) : KEISHI SAITOH, ET AL.

It is certified that error appears in the above-identified patent and that said Letters Patent is hereby corrected as shown below:

COLUMN 97

Line 7, "was" should read --were--.
Line 65, "Table 1 P." should read --Table 1P.--.

COLUMN 98

Line 8, "Table 1 P," should read --Table 1P,--.
Line 40, "Tabe 2 P," should read --Table 2P,--.
Line 51, "subjedted" should read --subjected--.

COLUMN 99

Line 5, "interference" should read --interference fringe--.

COLUMN 100

Line 28, "$NH_3$gas" should read --$NH_3$ gas--.
Line 43, "$NH_3$gas" should read --$NH_3$ gas--.

COLUMN 101

Line 9, "Exmaple" should read --Example--.
Line 13, "interference" should read --interference fringe--.
Line 34, "interference" should read --interference fringe--.
Line 48, "interference" should read --interference fringe--.
Line 52, "$NH_3$gas" should read --$NH_3$ gas--.
Line 62, "interference" should read --interference fringe--.

UNITED STATES PATENT AND TRADEMARK OFFICE
CERTIFICATE OF CORRECTION

PATENT NO. : 4,705,734
DATED : November 10, 1987
INVENTOR(S) : KEISHI SAITOH, ET AL.

It is certified that error appears in the above-identified patent and that said Letters Patent is hereby corrected as shown below:

COLUMN 102

Line 18, "interference" should read --interference fringe--.
Line 31, "interference" should read --interference fringe--.
Line 46, "interference" should read --interference fringe--.

COLUMN 103

Line 1, "interference" should read --interference fringe--.
Line 28, "interference" should read --interference fringe--.
Line 53, "interference" should read --interference fringe--.
Line 57, "NH3gas" should read --$NH_3$ gas--.
Line 67, "interference" should read --interference fringe--.

COLUMN 104

Line 3, "NH3gas" should read --$NH_3$ gas--.
Line 13, "interference" should read --interference fringe--.

COLUMN 110

Table 6B, the layer formation rate for the surface layer under (Å/sec) should read --1--.

COLUMN 119

Table 2E, "SIH$_4$:CH$_4$" should read --$SiH_4$:$CH_4$--.

COLUMN 123

Table 6F, "$B_2H_6$/H$_4$" should read --$B_2H_6$/$H_2$--.
Table 7F, "starting gas" should read --Starting gas--.

UNITED STATES PATENT AND TRADEMARK OFFICE
CERTIFICATE OF CORRECTION

PATENT NO. : 4,705,734
DATED : November 10, 1987
INVENTOR(S) : KEISHI SAITOH, ET AL.

Page 16 of 17

It is certified that error appears in the above-identified patent and that said Letters Patent is hereby corrected as shown below:

COLUMN 128

Table 16F, "Deposition           should read  --Deposition--.
                rate                             rate
                (Åsec)                           (Å/sec)

Table 17F, "Deposition"          should read  --Deposition--.
                rate                             rate
                (Åsec)                           (Å/sec)

COLUMN 133

Table 2H, "Image Quality" should read --Image Quality--.
                                         Evaluation
Table 3H, "Image Quality" should read --Image Quality--.
                                         Evaluation

COLUMN 175

Line 7, "3, the" should read --3, wherein the--.

COLUMN 176

Line 4, "according" should read --according to--.
Line 52, "sub-projection" should read --subprojection--.

COLUMN 177

Line 42, "claim 54" should read --claim 54,--.
Line 48, "Ga In," should read --Ga, In,--.

UNITED STATES PATENT AND TRADEMARK OFFICE
CERTIFICATE OF CORRECTION

PATENT NO. : 4,705,734
DATED : November 10, 1987
INVENTOR(S) : KEISHI SAITOH, ET AL.

It is certified that error appears in the above-identified patent and that said Letters Patent is hereby corrected as shown below:

<u>COLUMN 178</u>

Line 51, "contains" should read --contained--.
Line 56, "halogen" should read --wherein halogen--.
Line 58, "0,003" should read --0.003--.

Signed and Sealed this

Eighth Day of November, 1988

Attest:

DONALD J. QUIGG

Attesting Officer    Commissioner of Patents and Trademarks